US008185808B2

(12) United States Patent
Lee et al.

(10) Patent No.: US 8,185,808 B2
(45) Date of Patent: May 22, 2012

(54) TRANSMITTING/RECEIVING SYSTEM AND METHOD OF PROCESSING BROADCAST SIGNAL IN TRANSMITTING/RECEIVING SYSTEM

(75) Inventors: Hyoung Gon Lee, Seoul (KR); Byoung Gill Kim, Seoul (KR); Won Gyu Song, Seoul (KR); In Hwan Choi, Gyeonggi-do (KR); Jin Woo Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 447 days.

(21) Appl. No.: 12/614,015

(22) Filed: Nov. 6, 2009

(65) Prior Publication Data

US 2010/0122144 A1 May 13, 2010

Related U.S. Application Data

(60) Provisional application No. 61/112,197, filed on Nov. 7, 2008.

(51) Int. Cl.
*H03M 13/00* (2006.01)

(52) U.S. Cl. ........................................ 714/784; 714/758

(58) Field of Classification Search .................. 714/758, 714/784

See application file for complete search history.

(56) References Cited

U.S. PATENT DOCUMENTS

| | | | | |
|---|---|---|---|---|
| 7,979,883 | B2 * | 7/2011 | Song et al. | 725/62 |
| 8,040,920 | B2 * | 10/2011 | Choi et al. | 370/487 |
| 2009/0044073 | A1 * | 2/2009 | Cho et al. | 714/758 |

* cited by examiner

*Primary Examiner* — Charles Ehne

(74) *Attorney, Agent, or Firm* — Lee, Hong, Degerman, Kang & Waimey

(57) ABSTRACT

A receiving system and a method of processing broadcast signal are disclosed herein. The receiving system includes a signal receiving unit, a signaling decoder, a block decoder, and an RS frame decoder. When a parade change command ordering parade change from a first parade to a second parade is generated, the signal receiving unit receives a broadcast signal including data groups of the second parade starting from a generation point of the parade change command. The signaling decoder decodes signaling information included in the data groups and outputting RS frame-related information. The block decoder performs turbo-decoding in block units on data of a portion included in the data groups. And the RS frame decoder inserts null data in data positions of a portion included in non-received data group within an RS frame of the second parade, while configuring the RS frame of the second parade by collecting data of the turbo-decoded portions based upon the RS frame-related information. The RS frame decoder also performs CRC-decoding by indicating the existence of errors on CRC error flags of each row including the null data within the RS frame, and performs RS-decoding on the CRC-decoded RS frame.

16 Claims, 72 Drawing Sheets

| Type Indicator (3) | Error Indicator (1) | Stuff Indicator (1) | Pointer Field (11) | Payload (N-2) bytes |
|---|---|---|---|---|

FIG. 17
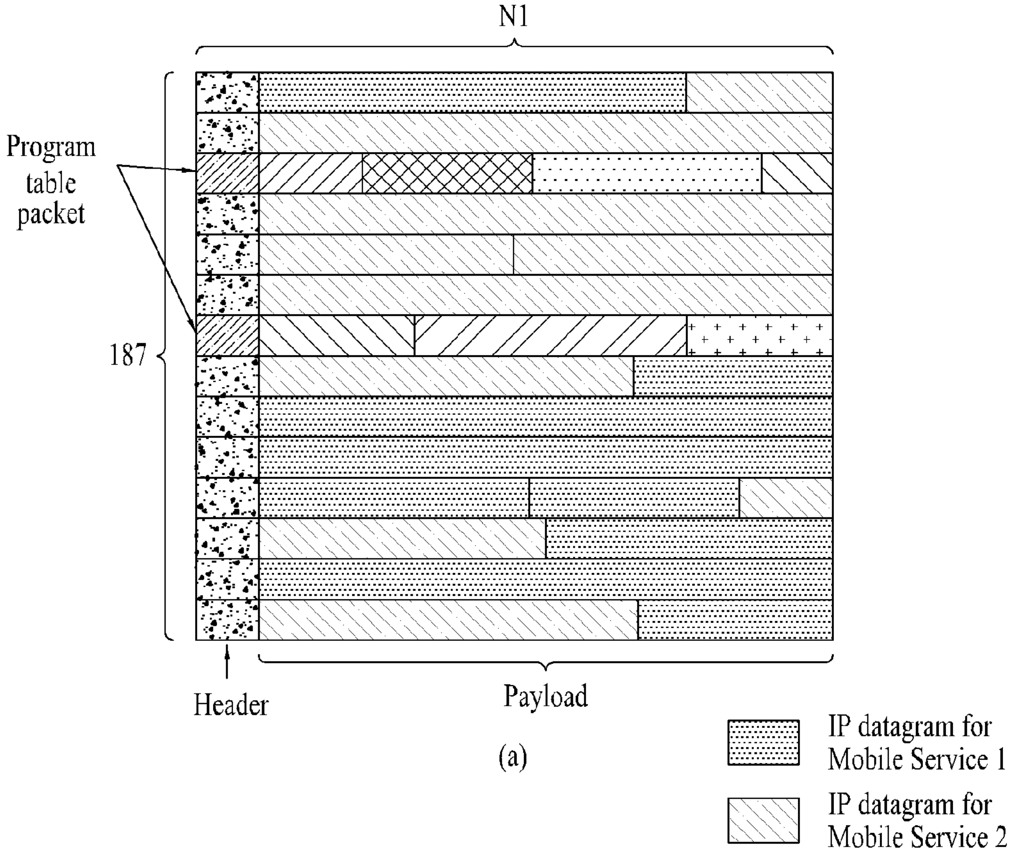
(a)
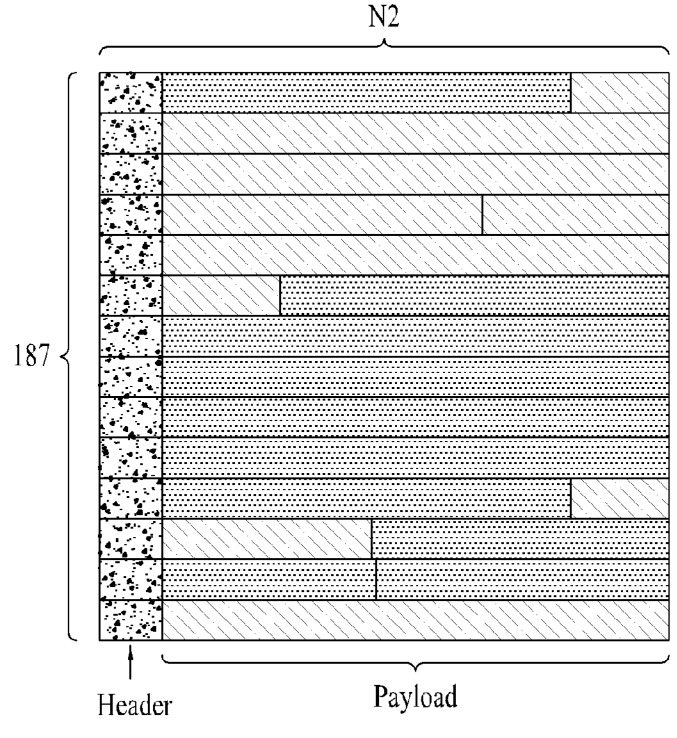
(b)

FIG. 23
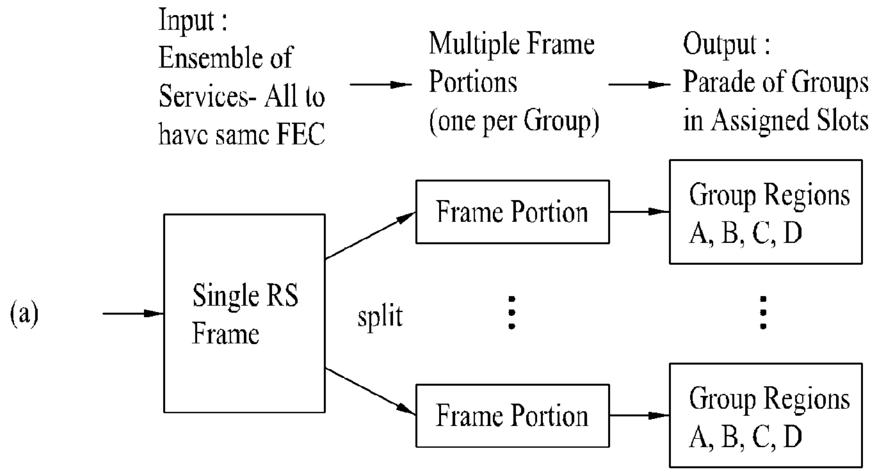
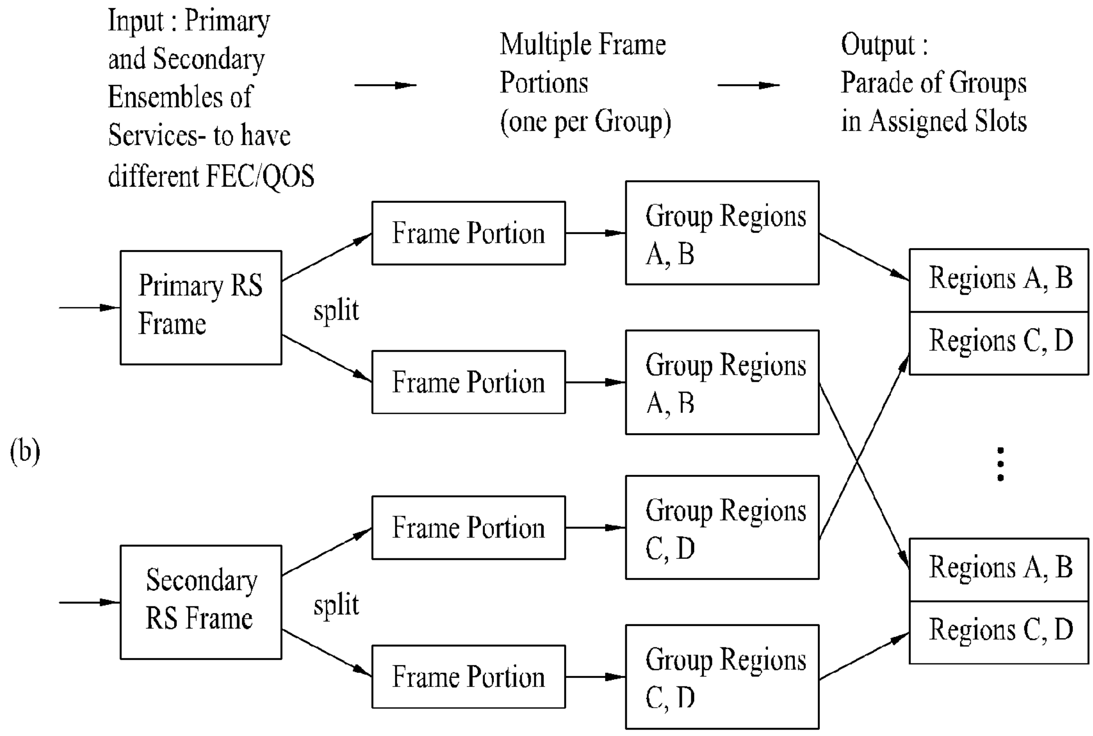

FIG. 30

| i | 0 | 1 | 2 | 3 | 4 | 5 | 6 | 7 | 8 | 9 | 10 | 11 | 12 | 13 | 14 | 15 | ... | 2110 | 2111 |
|---|---|---|---|---|---|---|---|---|---|---|---|---|---|---|---|---|---|---|---|
| P'(i) | 0 | 89 | 267 | 534 | 890 | 1335 | 1869 | 2492 | 3204 | 4005 | 799 | 1778 | 2846 | 4003 | 1153 | 2488 | ... | 2809 | 2272 |
| P(i) | 0 | 89 | 267 | 534 | 890 | 1335 | 1869 | 799 | 1778 | 1153 | 1329 | 526 | 79 | 2037 | 253 | 874 | ... | 444 | 2048 |

N : Normal mode, I : Initialization mode

FIG. 35

| Syntax | No. of bits | Format |
|---|---|---|
| TPC_data { | | |
| Sub-Frame_number | 3 | uimsbf |
| Slot_number | 4 | uimsbf |
| Parade_id | 7 | uimsbf |
| starting_Group_number | 4 | uimsbf |
| number_of_Groups | 3 | uimsbf |
| Parade_repetition_cycle | 3 | uimsbf |
| RS_Frame_mode | 2 | bslbf |
| RS_code_mode_primary | 2 | bslbf |
| RS_code_mode_secondary | 2 | bslbf |
| SCCC_Block_mode | 2 | bslbf |
| SCCC_outer_code_mode_A | 2 | bslbf |
| SCCC_outer_code_mode_B | 2 | bslbf |
| SCCC_outer_code_mode_C | 2 | bslbf |
| SCCC_outer_code_mode_D | 2 | bslbf |
| FIC_version | 5 | uimsbf |
| Parade_continuity_counter | 4 | uimsbf |
| TNoG | 5 | uimsbf |
| reserved | 26 | bslbf |
| } | | |

FIG. 57

| TP | Group Format |
| --- | --- |
| 0 | 4446666666666659999922666666666666666666666666666666666666666666665<br>9999922666666666666666666666666666666666666666666659999922666666666<br>6666666666666666666666666666666666665999992666666666666666266666666<br>666666 |
| 1 | 4446666666666655999992666666666666666666666666666666666666666666665<br>5999992666666666666666666666666666666666666666666655999992666666666<br>6666666666666666666666666666666666665199999266666666666662666666666<br>666666 |
| 2 | 4446666666666655199999666666666666666666666666666666666666666666665<br>5199999666666666666666666666666666666666666666666655199999666666666<br>6666666666666666666666666666666666665119999966666666666662666666666<br>666666 |
| 3 | 4446666666666655119999966666666666666666666666666666666666666666665<br>5159999966666666666666666666666666666666666666666655159999966666666<br>6666666666666666666666666666666666665115999996666666666662666666666<br>666666 |
| 4 | 4446666666666655115999996666666666666666666666666666666666666666665<br>5155999996666666666666666666666666666666666666666655156999996666666<br>6666666666666666666666666666666666665115699999666666666662666666666<br>666666 |
| 5 | 4446666666666655115699999666666666666666666666666666666666666666665<br>5155699999666666666666666666666666666666666666666655156699999666666<br>6666666666666666666666666666666666665115669999966666666666666666666<br>666666 |
| 6 | 4446666666666655115669999966666666666666666666666666666666666666665<br>5155669999966666666666666666666666666666666666666655156669999966666<br>6666666666666666666666666666666666665115666999996666666666666666666<br>666666 |
| 7 | 4446666666666655115666999996666666666666666666666666666666666666665<br>5155666999996666666666666666666666666666666666666655156666999996666<br>6666666666666666666666666666666666665115666699999666666666666666666<br>666666 |
| 8 | 4446666666666655115666699999666666666666666666666666666666666666665<br>5155666699999666666666666666666666666666666666666655156666699999666<br>6666666666666666666666666666666666665115666669999966666666666666666<br>666666 |
| 9 | 4446666666666655115666669999966666666666666666666666666666666666665<br>5155666669999966666666666666666666666666666666666655156666669999966<br>6666666666666666666666666666666666665115666666999996666666666666666<br>666666 |
| 10 | 4446666666666655115666666999996666666666666666666666666666666666665<br>5155666666999996666666666666666666666666666666666655156666666999996<br>6666666666666666666666666666666666665115666666699999666666666666666<br>666666 |
| 11 | 4446666666666655115666666699999666666666666666666666666666666666665<br>5155666666699999666666666666666666666666666666666655156666666699999<br>9666666666666666666666666666666666665115666666669999966666666666666<br>666666 |
| 12 | 4446666666666655115666666669999966666666666666666666666666666666665 |

FIG. 58

| | |
|---|---|
| | 5155666666669999966666666666666666666666666666666666655156666666669999<br>996666666666666666666666666666666666651156666666669999966666666666666<br>666666 |
| 13 | 4446666666666655115666666666999996666666666666666666666666666666665<br>5155666666666999996666666666666666666666666666666666551566666666669 9<br>9996666666666666666666666666666666666511566666666669999966666666666 6<br>666666 |
| 14 | 4446666666666655115666666666699999666666666666666666666666666666665<br>5155666666666699999666666666666666666666666666666665515666666666669<br>9999666666666666666666666666666666665115666666666669999966666666666<br>666666 |
| 15 | 4446666666666655115666666666669999966666666666666666666666666666665<br>5155666666666669999966666666666666666666666666666665515666666666666<br>9999966666666666666666666666666666665115666666666666999996666666666<br>666666 |
| 16 | 4446666666666655115666666666665999996666666666666666666666666666665<br>5155666666666665999996666666666666666666666666666665515666666666666<br>5999996666666666666666666666666666665115666666666666599999666666666<br>666666 |
| 17 | 4446666666666655115666666666665599999666666666666666666666666666665<br>5155666666666665599999666666666666666666666666666665515666666666666<br>5599999666666666666666666666666666665515666666666666569999966666666<br>666666 |
| 18 | 4446666666666655115666666666665569999966666666666666666666666666665<br>5155666666666665569999966666666666666666666666666665515666666666666<br>5569999966666666666666666666666666665515666666666666566999996666666<br>666666 |
| 19 | 4446666666666655115666666666665566999996666666666666666666666666665<br>5155666666666665566999996666666666666666666666666665515666666666666<br>5566999996666666666666666666666666665515666666666666566699999666666<br>666666 |
| 20 | 4446666666666655115666666666665566699999666666666666666666666666665<br>5155666666666665566699999666666666666666666666666665515666666666666<br>5566699999666666666666666666666666665515666666666666566669999966666<br>666666 |
| 21 | 4446666666666655115666666666665566669999966666666666666666666666665<br>5155666666666665566669999966666666666666666666666665515666666666666<br>5566669999966666666666666666666666665515666666666666566666999996666<br>666666 |
| 22 | 4446666666666655115666666666665566666999996666666666666666666666665<br>5155666666666665566666999996666666666666666666666665515666666666666<br>5566666999996666666666666666666666665515666666666666566666699999666<br>666666 |
| 23 | 4446666666666655115666666666665566666699999666666666666666666666665<br>5155666666666665566666699999666666666666666666666665515666666666666<br>5566666699999666666666666666666666665515666666666666566666669999966<br>666666 |
| 24 | 4446666666666655115666666666665566666669999966666666666666666666665<br>5155666666666665566666669999966666666666666666666665515666666666666<br>5566666669999966666666666666666666665515666666666666566666666999996<br>666666 |
| 25 | 4446666666666655115666666666665566666666999996666666666666666666665<br>5155666666666665566666666999996666666666666666666665515666666666666<br>5566666666999996666666666666666666665515666666666666566666666699999<br>666666 |
| 26 | 4446666666666655115666666666665566666666699999666666666666666666665<br>5155666666666665566666666699999666666666666666666665515666666666666<br>5566666666699999666666666666666666665515666666666666566666666669999<br>966666 |
| 27 | 4446666666666655115666666666665566666666669999966666666666666666665<br>5155666666666665566666666669999966666666666666666665515666666666666<br>5566666666669999966666666666666666665515666666666666566666666666999<br>996666 |
| 28 | 4446666666666655115666666666665566666666666999996666666666666666665 |

FIG. 59

| | |
|---|---|
| | 5155666666666665566666666666999996666666666666666665515666666666666<br>5566666666666999996666666666666666665515666666666666566666666666699<br>999666 |
| 29 | 4446666666666655115666666666665566666666666699996666666666666666665<br>5155666666666665566666666666699999666666666666666665515666666666666<br>5566666666666699999666666666666666665515666666666666566666666666669<br>999966 |
| 30 | 4446666666666655115666666666665566666666666669999666666666666666665<br>5155666666666665566666666666669999966666666666666665515666666666666<br>5566666666666669999966666666666666665515666666666666566666666666666<br>999996 |
| 31 | 4446666666666655115666666666665566666666666666999966666666666666665<br>5155666666666665566666666666666999996666666666666665515666666666666<br>5566666666666666999996666666666666665515666666666666566666666666666<br>699999 |
| 32 | 4446666666666655115666666666665566666666666666599996666666666666665<br>5155666666666665566666666666666599999666666666666665515666666666666<br>5566666666666669599999666666666666665515666666666666566666666666666<br>659999 |
| 33 | 4446666666666655115666666666665566666666666666559999666666666666665<br>5155666666666665566666666666666559999666666666666665515666666666666<br>5566666666699999559999666666666666665515666666666666566666666666666<br>656999 |
| 34 | 4446666666666655115666666666665566666666666666556999666666666666665<br>5155666666666665566666666666666556999666666666666665515666666666666<br>5566666699999999559999666666666666665515666666666666566666666666666<br>656699 |
| 35 | 4446666666666655115666666666665566666666666666556699666666666666665<br>5155666666666665566666666666666556699666666666666665515666666666666<br>5566699999999999559999666666666666665515666666666666566666666666666<br>656669 |
| 36 | 4446666666666655115666666666665566666666666666556669266666666666665<br>5155666666666665566666666666666556669666666666666665515666666666666<br>5599999999999999559999666666666666665515666666666666566666666666666<br>656666 |
| 37 | 4446666666666635115666666666665566666666666666556666266666666666665<br>5155666666666665566666666666666556666666666666666665515666666666699<br>5599999999999999559999666666666666665515666666666666566666666666666<br>656666 |
| 38 | 4446666666666635115666666666665566666666666666556666666666666666665<br>5155666666666665566666666666666556666666666666666665515666666666669<br>5599999999999999559999966666666666665515666666666666566666666666666<br>656666 |
| 39 | 4446666666666635115666666666663566666666666666556666666666666666665<br>5155666666666665566666666666666556666666666666666665515666666666666<br>5599999999999999559999996666666666665515666666666666566666666666666<br>656666 |
| 40 | 4446666666666635115666666666663566666666666666556666666666666666665<br>5155666666666665566666666666666556666666666666666665515566666666666<br>5569999999999999559999999666666666665515666666666666566666666666666<br>656666 |
| 41 | 4446666666666635115666666666663566666666666666556666666666666666665<br>5155666666666665566666666666666556666666666666666665515566666666666<br>5566999999999999559999999966666666665515666666666666566666666666666<br>656666 |
| 42 | 4446666666666635115666666666663566666666666666556666666666666666665<br>5155666666666665566666666666666556666666666666666665515566666666666<br>5566699999999999559999999996666666665515666666666666566666666666666<br>656666 |
| 43 | 4446666666666635115666666666663566666666666666556666666666666666665<br>5135666666666665566666666666666556666666666666666665515566666666666<br>5566669999999999559999999999666666665515666666666666566666666666666<br>656666 |
| 44 | 4446666666666635115666666666663566666666666666556666666666666666665 |

FIG. 60

| | |
|---|---|
| | 5135666666666665566666666666666556666666666666666665515566666666666<br>5566666999999995599999999999966666665515666666666666566666666666666<br>656666 |
| 45 | 4446666666666635115666666666663566666666666666556666666666666666665<br>5135666666666665566666666666666556666666666666666665515566666666666<br>5566666699999995599999999999996666665515666666666666566666666666666<br>656666 |
| 46 | 4446666666666635115666666666663566666666666666556666666666666666665<br>5135666666666665566666666666666556666666666666666665515566666666666<br>5566666669999995599999999999999666665515666666666666566666666666666<br>656666 |
| 47 | 4446666666666635115666666666663566666666666666556666666666666666665<br>5135666666666665566666666666666556666666666666666665515566666666666<br>5566666669999995599999999999999966665515666666666666566666666666666<br>656666 |
| 48 | 4446666666566635115666666666663566666666666666556666666666666656665<br>5135666666666665566666666666666556666666666666656665515566666666666<br>5566666666999995599999999999999956665515666666666666566666666666666<br>656666 |
| 49 | 4446666666556665115666666666663566666666666666556666666666666655665<br>5135666666666665566666666666666556666666666666655665515566666666666<br>5566666666999995599999999999999959665515666666666665566666666666666<br>656666 |
| 50 | 4446666666556665115666666666663566666666666666556666666666666655665<br>5135666666666665566666666666666556666666666666655665515566666666666<br>5566666666699995599999999999999959965515666666666665566666666666666<br>656666 |
| 51 | 4446666666556665115666666666662566666666666666556666666666666655665<br>5135666666666665566666666666666556666666666666655665515566666666666<br>5566666666669995599999999999999959995515666666666665566666666666666<br>656666 |
| 52 | 4446666666556665115666666666662566666666666666556666666666666655666<br>5135666666666665566666666666666556666666666666655666515566666666666<br>5566666666666995599999999999999959999515666666666665566666666666666<br>656666 |
| 53 | 4446666666556666115666666666666566666666666666556666666666666655666<br>6135666666666665566666666666666556666666666666655666615566666666666<br>5566666666666695599999999999999959999915666666666665566666666666666<br>656666 |
| 54 | 4446666666556666615666666666666566666666666666556666666666666655666<br>6635666666666665566666666666666556666666666666655666665566666666666<br>5566666666666665599999999999999959999995666666666665566666666666666<br>656666 |
| 55 | 4446666666556666665666666666666566666666666666556666666666666655666<br>6665666666666665566666666666666556666666666666655666666566666666666<br>5566666666666665569999999999999959999999666666666665566666666666666<br>656666 |
| 56 | 4446666666556666666666666666666566666666666666556666666666666655666<br>6666666666666665566666666666666556666666666666655666666666666666666<br>5566666666666665566999999999999959999999966666666665566666666666666<br>656666 |
| 57 | 4446666666556666666666666666666566666666666666556666666666666655666<br>6666666666666665566666666666666556666666666666655666666666666666666<br>5566666666666665566699999999999959999999996666666665566666666666666<br>656666 |
| 58 | 4446666666556666666666666666666566666666666666556666666666666655666<br>6666666666666665566666666666666556666666666666655666666666666666666<br>5566666666666665566669999999999959999999999666666665566666666666666<br>656666 |
| 59 | 4446666666556666666666666666666566666666666666556666666666666655666<br>6666666666666665566666666666666556666666666666655666666666666666666<br>5566666666666665566666999999999959999999999966666665566666666666666<br>656666 |
| 60 | 4446666666556666666666666666666566666666666666556666666666666655666 |

FIG. 61

| | |
|---|---|
| | 6666666666666665566666666666666556666666666666556666666666666666666<br>5566666666666666556666669999999959999999999996666666556666666666666<br>656666 |
| 61 | 4446666666556666666666666666666566666666666666556666666666666655666<br>6666666666666665566666666666666556666666666666556666666666666666666<br>5566666666666666556666669999999955999999999999666666556666666666666<br>656666 |
| 62 | 4446666666556666666666666666666566666666666666556666666666666655666<br>6666666666666665566666666666666556666666666666556666666666666666666<br>5566666666666666556666666999999955999999999999966666556666666666666<br>656666 |
| 63 | 4446666666556666666666666666666566666666666666556666666666666655666<br>6666666666666665566666666666666556666666666666556666666666666666666<br>5566666666666666556666666699999955999999999999996666556666666666666<br>656666 |
| 64 | 4446666666556666666666666656666566666666666666356666666666666655666<br>6666666666656665566666666666666556666666666666556666666666666665666<br>5566666666666666556666666699999955999999999999995666556666666666666<br>656666 |
| 65 | 4446666666556666666666666655666566666666666666356666666666666655666<br>6666666666655665566666666666666556666666666666556666666666666665566<br>5566666666666666556666666669999955999999999999995966556666666666666<br>656666 |
| 66 | 4446666666556666666666666655966566666666666666356666666666666655566<br>6666666666655965566666666666666556666666666666556666666666666665596<br>5566666666666666556666666666666955999999999999995996556666666666666<br>656666 |
| 67 | 4446666663566666666666666655996566666666666666356666666666666655666<br>6666666666655995566666666666666556666666666666556666666666666665599<br>5566666666666666556666666666666655666999999999995999556666666666666<br>656666 |
| 68 | 4446666663566666666666666655999566666666666666356666666666666655666<br>6666666666655999566666666666666556666666666666556666666666666665599<br>9566666666666666556666666666666655666666669999995999956666666666666<br>656666 |
| 69 | 4446666663566666666666666655999966666666666666356666666666666655666<br>6666666666655999966666666666666556666666666666556666666666666665599<br>9966666666666666556666666666666655666666666669995999996666666666666<br>656666 |
| 70 | 4446666663566666666666666655999996666666666666356666666666666655666<br>6666666666655999996666666666666556666666666666556666666666666665599<br>9996666666666666556666666666666655666666666666665699999666666666666<br>656666 |
| 71 | 4446666663566666666666666655699999666666666666356666666666666655666<br>6666666666655699999666666666666556666666666666556666666666666665569<br>9999666666666666556666666666666655666666666666665669999966666666666<br>656666 |
| 72 | 4446666663566666666666666655669999966666666666356666666666666655666<br>6666666666655669999966666666666556666666666666556666666666666665566<br>9999966666666666556666666666666655666666666666665666999996666666666<br>656666 |
| 73 | 4446666663566666666666666655666999996666666666356666666666666655666<br>6666666666655666999996666666666556666666666666556666666666666665566<br>6999996666666666556666666666666655666666666666665666699999666666666<br>656666 |
| 74 | 4446666663566666666666666655666699999666666666356666666666666655666<br>6666666666655666699999666666666556666666666666556666666666666665566<br>6699999666666666556666666666666655666666666666665666669999966666666<br>656666 |
| 75 | 4446666663566666666666666655666669999966666666356666666666666655666<br>6666666666655666669999966666666556666666666666556666666666666665566<br>6669999966666666556666666666666655666666666666665666666999996666666<br>656666 |
| 76 | 4446666663566666666666666635666666999996666666256666666666666655666 |

FIG. 62

| | |
|---|---|
| | 66666666666556666669999966666665566666666666666556666666666666665566<br>66669999966666665566666666666666556666666666666656666666699999666666<br>656666 |
| 77 | 44466666663566666666666666356666666999996666662566666666666666655666<br>66666666666556666666999996666665566666666666666556666666666666665566<br>66666999996666665566666666666666556666666666666656666666669999966666<br>656666 |
| 78 | 44466666663566666666666666356666666699999666666566666666666666655666<br>66666666666556666666699999666665566666666666666556666666666666665566<br>66666699999666665566666666666666556666666666666656666666666999996666<br>656666 |
| 79 | 44466666662566666666666666356666666669999966666566666666666666655666<br>66666666666556666666669999966665566666666666666556666666666666665566<br>66666669999966665566666666666666556666666666666656666666666699999666<br>656666 |
| 80 | 44466666662566666666666666356666666666999996666566666666666666655666<br>66666666666556666666666999996665566666666666666556666666666666665566<br>66666666999996665566666666666666556666666666666656666666666669999966<br>656666 |
| 81 | 44466666666566666666666666356666666666699999666566666666666666655666<br>66666666666556666666666699999665566666666666666556666666666666665566<br>66666666699999665566666666666666556666666666666656666666666666999996<br>655666 |
| 82 | 44466666666566666666666666356666666666669999966566666666666666655666<br>66666666666556666666666669999965566666666666666556666666666666665566<br>66666666669999965566666666666666556666666666666656666666666666699999<br>655666 |
| 83 | 44466666666566666666666666356666666666666999996566666666666666655666<br>66666666666556666666666666999995566666666666666556666666666666665566<br>66666666666999995566666666666666556666666666666656666666666666669999<br>955666 |
| 84 | 44466666666566666666666666356666666666666699999566666666666666655666<br>66666666666556666666666666699999566666666666666556666666666666665566<br>66666666666699999566666666666666556666666666666656666666666666666999<br>995666 |
| 85 | 44466666666566666666666666356666666666666669999966666666666666655666<br>66666666666556666666666666669999966666666666666556666666666666665566<br>66666666666669999966666666666666556666666666666656666666666666666699<br>999666 |
| 86 | 44466666666566666666666666356666666666666666999996666666666666655666<br>66666666666556666666666666666999996666666666666556666666666666665566<br>66666666666662999996666666666666556666666666666656666666666666666669<br>999966 |
| 87 | 44466666666566666666666666356666666666666666699999666666666666655666<br>66666666666556666666666666666699999666666666666556666666666666665566<br>66666666666662699999666666666666556666666666666656666666666666666666<br>999996 |
| 88 | 44466666666566666666666666656666666666666666669999966666666666655666<br>66666666666556666666666666666669999966666666666556666666666666665566<br>66666666666662669999966666666666556666666666666656666666666666666666<br>699999 |
| 89 | 44466666666566666666666666656666666666666666666999996666666666655666<br>66666666666556666666666666666666999996666666666556666666666666665566<br>66666666666662666999996666666666556666666666666656666666666666666666<br>699999 |
| 90 | 44466666666566666666666666656666666666666666666699999666666666655666<br>66666666666556666666666666666666699999666666666556666666666666665566<br>66666666666662666699999666666666556666666666666656666666666666666666<br>699999 |
| 91 | 44466666666566666666666666656666666666666666666669999966666666655666<br>66666666666556666666666666666666669999966666666556666666666666665566<br>66666666666662666669999966666666556666666666666656666666666666666666<br>699999 |
| 92 | 44466666666566666666666666656666666666666666666666999996666666655666 |

FIG. 63

| | |
|---|---|
| | 6666666666655666666666666666666666699999666666655666666666666665566<br>6666666666666266666699999666666655666666666666656666666666666666666<br>699999 |
| 93 | 4449666666656666666666666665666666666666666666666669999966666655666<br>6666666666655666666666666666666666669999966666655666666666666665566<br>6666666666666266666669999966666655666666666666655666666666666666666<br>669999 |
| 94 | 4449966666656666666666666665666666666666666666666666999996666655666<br>6666666666655666666666666666666666666999996666655666666666666665566<br>6666666666666266666666999996666655666666666666655666666666666666666<br>666999 |
| 95 | 4449996666656666666666666665666666666666666666666666699999666655666<br>6666666666655666666666666666666666666699999666655666666666666665566<br>6666666666666266666666699999666655666666666666655666666666666666666<br>666699 |
| 96 | 4449999666656666666666666665666666666666666666666666669999966655666<br>6666666666655666666666666666666666666669999966655666666666666665566<br>6666666666666266666666669999966655666666666666655666666666666666666<br>666669 |
| 97 | 4449999966656666666666666665666666666666666666666666666999996655666<br>6666666666655666666666666666666666666666999996655666666666666665566<br>6666666666666666666666666999996655666666666666655666666666666666666<br>666666 |
| 98 | 4446999996656666666666666665666666666666666666666666666699999655666<br>6666666666655666666666666666666666666666699999655666666666666665566<br>6666666666666666666666666699999655666666666666655666666666666666666<br>666666 |
| 99 | 4446699999656666666666666665666666666666666666666666666669999955666<br>6666666666655666666666666666666666666666669999955666666666666665566<br>6666666666666666666666666669999955666666666666655666666666666666666<br>666666 |
| 100 | 4446669999956666666666666665666666666666666666666666666666999995666<br>6666666666655666666666666666666666666666666999995666666666666665566<br>6666666666666666666666666666999995666666666666655666666666666666666<br>666666 |
| 101 | 4446666999996666666666666665666666666666666666666666666666699999666<br>6666666666655666666666666666666666666666666699999666666666666665566<br>6666666666666666666666666666699999666666666666655666666666666666666<br>666666 |
| 102 | 4446666699999666666666666665666666666666666666666666666666669999966<br>6666666666655666666666666666666666666666666669999966666666666665566<br>6666666666666666666666666666669999966666666666655666666666666666666<br>666666<br>103 4446666669999966666666666665666666666666666666666666666666666999996<br>6666666666655666666666666666666666666666666666999996666666666665566<br>6666666666666666666666666666666999996666666666655666666666666666666<br>666666 |
| 104 | 4446666666999996666666666665666666666666666666666666666666666699999<br>6666666666655666666666666666666666666666666666699999666666666665566<br>6666666666666666666666666666666699999666666666655666666666666666666<br>666666 |
| 105 | 4446666666699999666666666665666666666666666666666666666666666669999<br>9666666666655666666666666666666666666666666666669999966666666665566<br>6666666666666666666666666666626669999966666666655666666666666666666<br>666666 |
| 106 | 4446666666669999966666666665666666666666666666666666666666666666999<br>9966666666655666666666666666666666666666666666666999996666666665566<br>6666666666666666666666666666626666999996666666655666666666666666666<br>666666 |
| 107 | 4446666666666999996666666665666666666666666666666666666666666666699<br>9996666666655666666666666666666666666666666666666699999666666665566<br>6666666666666666666666666666626666699999666666655666666666666666666<br>666666 |
| 108 | 4446666666666699999666666665666666666666666666666666666666666666669 |

FIG. 64

| | |
|---|---|
| | 9999666666655666666666666666666666666666666666666669999966666665566<br>6666666666666666666666666666626666669999966666665566666666666666666<br>666666 |
| 109 | 4446666666666669999966666665666666666666666666666666666666666666666<br>9999966666655666666666666666666666666666666666666666999996666665566<br>6666666666666666666666666666626666666999996666665566666666666666666<br>666666 |
| 110 | 4446666666666666999996666665666666666666666666666666666666666666666<br>6999996666655666666666666666666666666666666666666666699999666665566<br>6666666666666666666666666666626666666699999666665566666666666666666<br>666666 |
| 111 | 4446666666666666699999666665666666666666666666666666666666666666666<br>6699999666655666666666666666666666666666666666666666669999966665566<br>6666666666666666666666666666626666666669999966665566666666666666666<br>666666 |
| 112 | 4446666666666666669999966665666666666666666666666666666666666666666<br>6669999966655666666666666666666666666666666666666666666999996665566<br>6666666666666666666666666666666666666666999996665566666666666666666<br>666666 |
| 113 | 4446666666666666666999996665666666666666666666666666666666666666666<br>6666999996655666666666666666666666666666666666666666666699999665566<br>6666666666666666666666666666666666666666699999665566666666666666666<br>666666 |
| 114 | 4446666666666666666699999665666666666666666666666666666666666666666<br>6666699999655666666666666666666666666666666666666666666669999965566<br>6666666666666666666666666666666666666666669999965566666666666666666<br>666666 |
| 115 | 4446666666666666666669999965666666666666666666666666666666666666666<br>6666669999955666666666666666666666666666666666666666666666999995566<br>6666666666666666666666666666666666666666666999995566666666666666666<br>666666 |
| 116 | 4446666666666666666666999995666666666666666666666666666666666666666<br>6666666999995666666666666666666666666666666666666666666666699999566<br>6666666666666666666666666666666666666666666699999566666666666666666<br>666666 |
| 117 | 4446666666666666666666669999966666666666666666666666666666666666666<br>6666666299999666666666666666666666666666666666666666666666629999966<br>6666666666666666666666666666666666666666666629999966666666666666666<br>666666 |

FIG. 65

| seg | Group Format |
|---|---|
| 0 | 000000000000000900000000000000000000000000000000000000000000000000<br>090000000000000000000000000000000000000000000000000009000000000000<br>000000000000000000000000000000000000000900000000000000000000000000<br>000000000 |
| 1 | 000000000000000099000000000000000000000000000000000000000000000000<br>009900000000000000000000000000000000000000000000000000990000000000<br>000000000000000000000000000000000000000099000000000000000000000000<br>000000000 |
| 2 | 000000000000000009990000000000000000000000000000000000000000000000<br>000999000000000000000000000000000000000000000000000000099900000000<br>000000000000000000000000000000000000000009990000000000000000000000<br>000000000 |
| 3 | 000000000000000000999900000000000000000000000000000000000000000000<br>000099990000000000000000000000000000000000000000000000009999000000<br>000000000000000000000000000000000000000000999900000000000000000000<br>000000000 |
| 4 | 000000000000000000099999000000000000000000000000000000000000000000<br>000009999900000000000000000000000000000000000000000000000999990000<br>000000000000000000000000000000000000000000099999000000000000000000<br>000000000 |
| 5 | 000000000000000000009999920000000000000000000000000000000000000000<br>000000999992000000000000000000000000000000000000000000000099999200<br>000000000000000000000000000000000000000000009999920000000000000000<br>000000000 |
| 6 | 000000000000000000000999992200000000000000000000000000000000000000<br>000000099999220000000000000000000000000000000000000000000009999922<br>000000000000000000000000000000000000000000000999992600000000000000<br>000000000 |
| 7 | 000000000000000000000099999666000000000000000000000000000000000000<br>000000009999966600000000000000000000000000000000000000000000999996<br>660000000000000000000000000000000000000000000099999666000000000000<br>000000000 |
| 8 | 000000000000000000000009999966660000000000000000000000000000000000<br>000000000999996666000000000000000000000000000000000000000000099999<br>666600000000000000000000000000000000000000000009999966660000000000<br>000000000 |
| 9 | 000000000000000000000000999996666600000000000000000000000000000000<br>000000000099999666660000000000000000000000000000000000000000009999<br>966666000000000000000000000000000000000000000000999996666600000000<br>000000000 |
| 10 | 000000000000000000000000099999666666000000000000000000000000000000<br>000000000009999966666600000000000000000000000000000000000000000999<br>996666660000000000000000000000000000000000000000099999666666000000<br>000000000 |
| 11 | 000000000000000000000000009999966666660000000000000000000000000000<br>000000000000999996666666000000000000000000000000000000000000000099 |

FIG. 66

| | |
|---|---|
| | 999666666600000000000000000000000000000000000000009999966666660000<br>000000000 |
| 12 | 000000000000000000000000000999996666666600000000000000000000000000<br>000000000000099999666666660000000000000000000000000000000000000009<br>999966666666000000000000000000000000000000000000000999996666666600<br>000000000 |
| 13 | 000000000000000000000000000099999666666666000000000000000000000000<br>000000000000009999966666666600000000000000000000000000000000000000<br>999996666666660000000000000000000000000000000000000099999666666666<br>000000000 |
| 14 | 000000000000000000000000000009999966666666660000000000000000000000<br>000000000000000999996666666666000000000000000000000000000000000000<br>099999666666666600000000000000000000000000000000000009999966666666<br>660000000 |
| 15 | 000000000000000000000000000000999996666666666600000000000000000000<br>000000000000000099999666666666660000000000000000000000000000000000<br>009999966666666666000000000000000000000000000000000000999996666666<br>666600000 |
| 16 | 000000000000000000000000000000099999666666666666000000000000000000<br>000000000000000009999966666666666600000000000000000000000000000000<br>000999996666666666660000000000000000000000000000000000099999666666<br>666666000 |
| 17 | 000000000000000000000000000000009999966666666666660000000000000000<br>000000000000000000999996666666666666000000000000000000000000000000<br>000099999666666666666600000000000000000000000000000000009999966666<br>666666660 |
| 18 | 000000000000000000000000000000000999996666666666666600000000000000<br>000000000000000000099999666666666666660000000000000000000000000000<br>000009999966666666666666000000000000000000000000000000000999996666<br>666666666 |
| 19 | 600000000000000000000000000000000099999666666666666666000000000000<br>000000000000000000009999966666666666666600000000000000000000000000<br>000000999996666666666666660000000000000000000000000000000099999666<br>666666666 |
| 20 | 666000000000000000000000000000000009999966666666666666660000000000<br>000000000000000000000999996666666666666666000000000000000000000000<br>000000099999666666666666666600000000000000000000000000000009999966<br>666666666 |
| 21 | 222220000000000000000000000000000000999996666666666666666600000000<br>000000000000000000000099999666666666666666660000000000000000000000<br>000000009999966666666666666666000000000000000000000000000000999996<br>666666666 |
| 22 | 666666600000000000000000000000000000099999666666666666666666000000<br>000000000000000000000009999966666666666666666600000000000000000000<br>000000000999996666666666666666660000000000000000000000000000099999<br>666666666 |
| 23 | 666666666000000000000000000000000000009999966666666666666666660000<br>000000000000000000000000999996666666666666666666000000000000000000<br>000000000099999666666666666666666600000000000000000000000000009999<br>966666666 |
| 24 | 666666666660000000000000000000000000000999996666666666666666666600<br>000000000000000000000000099999666666666666666666660000000000000000<br>000000000009999966666666666666666666000000000000000000000000000999<br>996666666 |
| 25 | 666666666666600000000000000000000000000099999666666666666666666666<br>000000000000000000000000009999966666666666666666666600000000000000<br>000000000000999996666666666666666666660000000000000000000000000099<br>999666666 |
| 26 | 666666666666666000000000000000000000000000999996666666666666666666<br>660000000000000000000000000999996666666666666666666666000000000000<br>000000000000099999666666666666666666666600000000000000000000000009<br>999966666 |
| 27 | 666666666666666660000000000000000000000000999996666666666666666666<br>666600000000000000000000000099999666666666666666666666660000000000 |

FIG. 67

| | |
|---|---|
| | 000000000000009999966666666666666666666666000000000000000000000000<br>999996666 |
| 28 | 666666666666666666600000000000000000000000099999666666666666666666<br>666666000000000000000000000009999966666666666666666666666600000000<br>000000000000000999996666666666666666666666660000000000000000000000<br>099999666 |
| 29 | 666666666666666666666000000000000000000000009999966666666666666666<br>666666660000000000000000000000999996666666666666666666666666000000<br>000000000000000099999666666666666666666666666600000000000000000000<br>009999966 |
| 30 | 666666666666666666666660000000000000000000000999996666666666666666<br>666666666600000000000000000000099999666666666666666666666666660000<br>000000000000000009999966666666666666666666666666000000000000000000<br>000999996 |
| 31 | 666666666666666666666666600000000000000000000099999666666666666666<br>666666666666000000000000000000009999966666666666666666666666666600<br>000000000000000000999996666666666666666666666666660000000000000000<br>000099999 |
| 32 | 666666666666666666666666666000000000000000000009999966666666666666<br>666666666666660000000000000000000999996666666666666666666666666666<br>000000000000000000099999666666666666666666666666666600000000000000<br>000009999 |
| 33 | 966666666666666666666666666660000000000000000000999996666666666666<br>666666666666666600000000000000000099999666666666666666666666666666<br>660000000000000000009999966666666666666666666666666666000000000000<br>000000999 |
| 34 | 996666666666666666666666666666600000000000000000099999666666666666<br>666666666666666666000000000000000009999966666666666666666666666666<br>666600000000000000000999996666666666666666666666666666660000000000<br>000000099 |
| 35 | 999666666666666666666666666666666000000000000000009999966666666666<br>666666666666666666660000000000000000999996666666666666666666666666<br>666666000000000000000099999666666666666666666666666666666600000000<br>000000009 |
| 36 | 999966666666666666666666666666666660000000000000000999996666666666<br>666666666666666666666666000000000000000999996666666666666666666666<br>666666660000000000000009999966666666666666666666666666666666000000<br>000000000 |
| 37 | 444444444444444444444444444444444444440000000000000022666666666666<br>666666666666666666666666000000000000006666666666666666666666666666<br>666666666600000000000000666666666666666666666666666666666666660000<br>000000000 |
| 38 | 044444444444444444444444444444444444444000000000000006666666666666<br>666666666666666666666666660000000000000666666666666666666666666666<br>666666666666000000000000066666666666666666666666666666666666666600<br>000000000 |
| 39 | 004444444444444444444444444444444444444400000000000006666666666666<br>666666666666666666666666666600000000000006666666666666666666666666<br>666666666666660000000000000666666666666666666666666666666666666666<br>000000000 |
| 40 | 000666666666666666666666666666666666666666600000000000006666666666<br>666666666666666666666666666666000000000000666666666666666666666666<br>666666666666666600000000000006666666666666666666666666666666666666<br>660000000 |
| 41 | 000066666666666666666666666666666666666666660000000000000666666666<br>666666666666666666666666666666660000000000006666666666666666666666<br>666666666666666666000000000000066666666666666666666666666666666666<br>666600000 |
| 42 | 000006666666666666666666666666666666666666666000000000000066666666<br>666666666666666666666666666666666600000000000066666666666666666666<br>666666666666666666660000000000000666666666666666666666666666666666<br>666666000 |
| 43 | 000000666666666666666666666666666666666666666600000000000006666666<br>666666666666666666666666666666666666000000000000666666666666666666 |

FIG. 68

| | |
|---|---|
| | 666666666666666666666600000000666666666666666666666666666666666666<br>666666660 |
| 44 | 000000066666666666666666666666666666666666666666666600000006666666<br>666666666666666666666666666666666666660000000666666666666666666666<br>666666666666666666666666000000066666666666666666666666666666666666<br>666666666 |
| 45 | 600000006666666666666666666666666666666666666666666666000000666666<br>666666666666666666666666666666666666666600000066666666666666666666<br>666666666666666666666666660000006666666666666666666666666666666666<br>666666666 |
| 46 | 666000000666666666666666666666666666666666666666666666660000066666<br>666666666666666666666666666666666666666666000006666666666666666666<br>666666666666666666666666666600000666666666666666666666666666666666<br>666666666 |
| 47 | 666660000066666666666666666666666666666666666666666666666600006666<br>666666666666666666666666666666666666666666660000666666666666666666<br>666666666666666666666666666666000066666666666666666666666666666666<br>666666666 |
| 48 | 666666600006666666666666666666666666666666666666666666666666000666<br>666666666666666666666666666666666666666666666600066666666666666666<br>666666666666666666666666666666660006666666666666666666666666666666<br>666666666 |
| 49 | 666666666000666666666666666666666666666666666666666666666666660066<br>666666666666666666666666666666666666666666666666006666666666666666<br>666666666666666666666666666666666600666666666666666666666666666666<br>666666666 |
| 50 | 666666666660066666666666666666666666666666666666666666666666666606<br>666666666666666666666666666666666666666666666666660666666666666666<br>666666666666666666666666666666666666066666666666666666666666666666<br>666666666 |
| 51 | 666666666666606663333333333355555555555555555555555555555555555555<br>555555555555555555555555555555555555555555555555555555555555555555<br>555555555555555555555555555555555555555555555555555555555555555555<br>555555555 |
| 52 | 555555555555555555555555555555555555555555555555555555555555555555<br>555555555555555555555555555555555555555555555555555555555555555555<br>555555555555555555555555555555555555555555555555555555555555555555<br>555555555 |
| 53 | 111111111111111111111111111111111111111111111111111111111111111111<br>111111111111111111111111111111111111111111111111111111111111111111<br>111111111111111111111111111111111111111111111111111111111111111111<br>111111111 |
| 54 | 111111111111111111111111111111111111111111111111111111111111111111<br>111333333333333555555555555555555555555555555555555555555555555555<br>555555555555555555555555555555555555555555555555555555555555555555<br>555555555 |
| 55 | 555555555555555555555555555555555555555555555555555555555555555555<br>555555555555555555555555555555555555555555555555555555555555555555<br>555555666666666666666666666666666666666666666666666666666666666666<br>666666666 |
| 56 | 666666666666666666666666666666666666666666666666666666666666666666<br>666666666666666666666666666666666666666666666666666666666666666666<br>666666666666666666666666666666666666666666666666666666666666666666<br>666666666 |
| 57 | 666666666666666666666666666666666666666666666666666666666666666666<br>666666666666666666666666666666666666666666666666666666666666666666<br>666666666666666666666666666666666666666666666666666666666666666666<br>666666666 |
| 58 | 666666666666666666666666666666666666666666666666666666666666666666<br>666666666666666666666666666666666666666666666666666666666666666666<br>666666666666666666666666666666666666666666666666666666666666666666<br>666666666 |
| 59 | 666666666666666666666666666666666666666666666666666666666666666666<br>666666666666666666666666666666666666666666666666666666666666666666 |

FIG. 69

| | |
|---|---|
| | 666666666666666666666666666666666666666666666666666666666666666666<br>666666666 |
| 60 | 666666666666666666666666666666666666666666666666666666666666666666<br>666666666666666666666666666666666666666666666666666666666666666666<br>666666666666666666666666666666666666666666666666666666666666666666<br>666666666 |
| 61 | 666666666666666666666666666666666666666666666666666666666666666666<br>666666666666666666666666666666666666666666666666666666666666666666<br>666666666666666666666666666666666666666666666666666666666666666666<br>666666666 |
| 62 | 666666666666666666666666666666666666666666666666666666666666666666<br>666666666666666666666666666666666666666666666666666666666666666666<br>666666666666666666666666666666666666666666666666666666666666666666<br>666666666 |
| 63 | 666666666666666666666666666666666666666666666666666666666666666666<br>666666666666666666666666666666666666666666666666666666666666666666<br>666666666666666666666666666666666666666666666666666666666666666666<br>666666666 |
| 64 | 666666666666666666666666666666666666666666666666666666666666666666<br>666666666666666666666666666666666666666666666666666666666666666666<br>666666666666666666666666666666666666666666666666666666666666666666<br>666666666 |
| 65 | 666666666666666666666666666666666666666666666666666666666666666666<br>666666666666666666666666666666666666666666666666666666666666666666<br>666666666666666666666666666696666666666666666666666666666666666666<br>666666666 |
| 66 | 666666666666666666666666666666666666666666666666666666666666666666<br>666666666666666666666666666666666666666666666666666666666666666666<br>666666666666666666666666666669966666666666666666666666666666666666<br>666666666 |
| 67 | 666666666666666666666666666666666666666666666223333333333335555555<br>555555555555555555555555555555555555555555555555555555555555555555<br>555555555555555555555555555555555555555555555555555555555555555555<br>555555555 |
| 68 | 555555555555555555555555555555555555555555555555555555555555555555<br>555555555555555555555555555555555555555555555555555555555555555555<br>555555555555555555555555555555555555555555555555555555555555555555<br>555555555 |
| 69 | 666666666666666666666666666666666666666666666666666666666666666666<br>666666666666666666666666666666666666666666666666666666666666666666<br>666666666666666666666666666666666699996666666666666666666666666666<br>666666666 |
| 70 | 666666666666666666666666666666666666666666666666666666666666666666<br>666666666666666666666666666666666666666666666666666666666666666666<br>666666666666666666666666666666666669999966666666666666666666666666<br>666666666 |
| 71 | 666666666666666666666666666666666666666666666666666666666666666666<br>666666666666666666666666666666666666666666666666666666666666666666<br>666666666666666666666666666666666666999999666666666666666666666666<br>666666666 |
| 72 | 666666666666666666666666666666666666666666666666666666666666666666<br>666666666666666666666666666666666666666666666666666666666666666666<br>666666666666666666666666666666666666699999999666666666666666666666<br>666666666 |
| 73 | 666666666666666666666666666666666666666666666666666666666666666666<br>666666666666666666666666666666666666666666666666666666666666666666<br>666666666666666666666666666666666666669999999996666666666666666666<br>666666666 |
| 74 | 666666666666666666666666666666666666666666666666666666666666666666<br>666666666666666666666666666666666666666666666666666666666666666666<br>666666666666666666666666666666666666666999999999966666666666666666<br>666666666 |
| 75 | 666666666666666666666666666666666666666666666666666666666666666666<br>666666666666666666666666666666666666666666666666666666666666666666 |

FIG. 70

| | |
|---|---|
| | 66666666666666666666666666666666666666699999999999966666666666666<br>666666666 |
| 76 | 66666666666666666666666666666666666666666666666666666666666666666<br>66666666666666666666666666666666666666666666666666666666666666666<br>66666666666666666666666666666666666666669999999999999666666666666<br>666666666 |
| 77 | 66666666666666666666666666666666666666666666666666666666666666666<br>66666666666666666666666666666666666666666666666666666666666666666<br>66666666666666666666666666666666666666669999999999999996666666666<br>666666666 |
| 78 | 66666666666666666666666666666666666666666666666666666666666666666<br>66666666666666666666666666666666666666666666666666666666666666666<br>66666666666666666666666666666666666666666999999999999999996666666<br>666666666 |
| 79 | 66666666666666666666666666666666666666666666666666666666666666666<br>66666666666666666666666666666666666666666666666666666666666666666<br>66666666666666666666666666666666666666666699999999999999999966666<br>666666666 |
| 80 | 66666666666666666666666666666666666666666666666666666666666666666<br>66666666666666666666666666666666666666666666666666666666666666666<br>66666666666666666666666666666666666666666669999999999999999999666<br>666666666 |
| 81 | 66666666666666666666666666666666666666666666666666666666666666666<br>66666666666666666666666666666666666666666666666666666666666666666<br>66666666666666666666666666666666666666666666999999999999999999996<br>666666666 |
| 82 | 66666666666666666666666666666666666666666666666666666666666666666<br>66666666666666666666666666666666666666666666666666666666666666666<br>66666666666666666666666666666666666666666666699999999999999999999<br>996666666 |
| 83 | 66666666666666666666666666666666666666666666666666622333333333333<br>55555555555555555555555555555555555555555555555555555555555555555<br>55555555555555555555555555555555555555555555555555555555555555555<br>555555555 |
| 84 | 55555555555555555555555555555555555555555555555555555555555555555<br>55555555555555555555555555555555555555555555555555555555555555555<br>55555555555555555555555555555555555555555555555555555555555555555<br>555555555 |
| 85 | 66666666666666666666666666666666666666666666666666666666666666666<br>66666666666666666666666666666666666666666666666666666666666666666<br>66666666666666666666666666666666666666666666666666999999999999999<br>999999666 |
| 86 | 66666666666666666666666666666666666666666666666666666666666666666<br>66666666666666666666666666666666666666666666666666666666666666666<br>66666666666666666666666666666666666666666666666666699999999999999<br>999999966 |
| 87 | 66666666666666666666666666666666666666666666666666666666666666666<br>66666666666666666666666666666666666666666666666666666666666666666<br>66666666666666666666666666666666666666666666666666669999999999999<br>999999996 |
| 88 | 66666666666666666666666666666666666666666666666666666666666666666<br>66666666666666666666666666666666666666666666666666666666666666666<br>66666666666666666666666666666666666666666666666666666999999999999<br>999999999 |
| 89 | 44444444444444444444444444444444444444444444444444466666666666666<br>66666666666666666666666666666666666666666666666666666666666666666<br>66666666666666666666666666666666666666666666666666666699999999999<br>999999999 |
| 90 | 94444444444444444444444444444444444444444444444444446666666666666<br>66666666666666666666666666666666666666666666666666666666666666666<br>66666666666666666666666666666666666666666666666666666669999999999<br>999999999 |
| 91 | 99444444444444444444444444444444444444444444444444444666666666666<br>66666666666666666666666666666666666666666666666666666666666666666 |

FIG. 71

| | |
|---|---|
| | 666666666666666666666666666666666666666666666666666666669999999999<br>999999999 |
| 92 | 999666666666666666666666666666666666666666666666666666666666666666<br>666666666666666666666666666666666666666666666666666666666666666666<br>666666666666666666666666666666666666666666666666666666666999999999<br>999999999 |
| 93 | 999966666666666666666666666666666666666666666666666666666666666666<br>666666666666666666666666666666666666666666666666666666666666666666<br>666666666666666666666666666666666666666666666666666666666699999999<br>999999999 |
| 94 | 999996666666666666666666666666666666666666666666666666666666666666<br>666666666666666666666666666666666666666666666666666666666666666666<br>666666666666666666666666666666666666666666666666666666666669999999<br>999999999 |
| 95 | 999999666666666666666666666666666666666666666666666666666666666666<br>666666666666666666666666666666666666666666666666666666666666666666<br>666666666666666666666666666666666666666666666666666666666666999999<br>999999999 |
| 96 | 999999966666666666666666666666666666666666666666666666666666666666<br>666666666666666666666666666666666666666666666666666666666666666666<br>666666666666666666666666666666666666666666666666666666666666669999<br>999999999 |
| 97 | 999999996666666666666666666666666666666666666666666666666666666666<br>666666666666666666666666666666666666666666666666666666666666666666<br>666666666666666666666666666666666666666666666666666666666666666699<br>999999999 |
| 98 | 999999999666666666666666666666666666666666666666666666666666666666<br>666666666666666666666666666666666666666666666666666666666666666666<br>666666666666666666666666666666666666666666666666666666666666666669<br>999999999 |
| 99 | 999999999966666666666666666666222333333333333555555555555555555555555<br>555555555555555555555555555555555555555555555555555555555555555555<br>555555555555555555555555555555555555555555555555555555555555555555<br>555555555 |
| 100 | 555555555555555555555555555555555555555555555555555555555555555555<br>555555555555555555555555555555555555555555555555555555555555555555<br>555555555555555555555555555555555555555555555555555555555555555555<br>555555555 |
| 101 | 999999999999666666666666666666666666666666666666666666666666666666<br>666666666666666666666666666666666666666666666666666666666666666666<br>666666666666666666666666666666666666666666666666666666666666666666<br>666669999 |
| 102 | 999999999999966666666666666666666666666666666666666666666666666666<br>666666666666666666666666666666666666666666666666666666666666666666<br>666666666666666666666666666666666666666666666666666666666666666666<br>666666699 |
| 103 | 999999999999996666666666666666666666666666666666666666666666666666<br>666666666666666666666666666666666666666666666666666666666666666666<br>666666666666666666666666666666666666666666666666666666666666666666<br>666666666 |
| 104 | 999999999999999666666666666666666666666666666666666666666666666666<br>666666666666666666666666666666666666666666666666666666666666666666<br>666666666666666666666666666666666666666666666666666666666666666666<br>666666666 |
| 105 | 699999999999999966666666666666666666666666666666666666666666666666<br>666666666666666666666666666666666666666666666666666666666666666666<br>666666666666666666666666666666666666666666666666666666666666666666<br>666666666 |
| 106 | 666999999999999996666666666666666666666666666666666666666666666666<br>666666666666666666666666666666666666666666666666666666666666666666<br>666666666666666666666666666666666666666666666666666666666666666666<br>666666666 |
| 107 | 666669999999999999666666666666666666666666666666666666666666666666<br>666666666666666666666666666666666666666666666666666666666666666666 |

FIG. 72

| | |
|---|---|
| | 66666666666666666666666666666666666666666666666666666666666666666<br>666666666 |
| 108 | 6666666999999999999666666666666666666666666666666666666666666666666<br>66666666666666666666666666666666666666666666666666666666666666666<br>66666666666666666666666666666666666666666666666666666666666666666<br>666666666 |
| 109 | 66666666999999999999666666666666666666666666666666666666666666666<br>66666666666666666666666666666666666666666666666666666666666666666<br>66666666666666666666666666666666666666666666666666666666666666666<br>666666666 |
| 110 | 66666666669999999999966666666666666666666666666666666666666666666<br>66666666666666666666666666666666666666666666666666666666666666666<br>66666666666666666666666666666666666666666666666666666666666666666<br>666666666 |
| 111 | 66666666666699999999996666666666666666666666666666666666666666666<br>66666666666666666666666666666666666666666666666666666666666666666<br>66666666666666666666666666666666666666666666666666666666666666666<br>666666666 |
| 112 | 66666666666666999999999666666666666666666666666666666666666666666<br>66666666666666666666666666666666666666666666666666666666666666666<br>66666666666666666666666666666666666666666666666666666666666666666<br>666666666 |
| 113 | 66666666666666699999999966666666666666666666666666666666666666666<br>66666666666666666666666666666666666666666666666666666666666666666<br>66666666666666666666666666666666666666666666666666666666666666666<br>666666666 |
| 114 | 66666666666666666999999996666666666666666666666666666666666666666<br>66666666666666666666666666666666666666666666666666666666666666666<br>66666666666666666666666666666666666666666666666666666666666666666<br>666666666 |
| 115 | 66666666666666666669999999666666666666666666666666666333333333333<br>55555555555555555555555555555555555555555555555555555555555555555<br>55555555555555555555555555555555555555555555555555555555555555555<br>555555555 |
| 116 | 55555555555555555555555555555555555555555555555555555555555555555<br>55555555555555555555555555555555555555555555555555555555555555555<br>55555555555555555555555555555555555555555555555555555555555555555<br>555555555 |
| 117 | 66666666666666666666666999996666666666666666666666666666666666666<br>66666666699999666666666666666666666666666666666666666666666699999<br>66666666666666666666666666666666666666666666669999966666666666666<br>666666666 |
| 118 | 66666666666666666666666699999066666666666666666666666666666666666<br>66666666669999906666666666666666666666666666666666666666666669999<br>90666666666666666666666666666666666666666666669999906666666666666<br>666666666 |
| 119 | 66666666666666666666666669999900666666666666666666666666666666666<br>66666666666999990066666666666666666666666666666666666666666666999<br>99006666666666666666666666666666666666666666666699999006666666666<br>666666666 |
| 120 | 66666666666666666666666666999990006666666666666666666666666666666<br>66666666666699999000666666666666666666666666666666666666666666699<br>99900066666666666666666666666666666666666666666669999900066666666<br>666666666 |
| 121 | 66666666666666666666666666699999000066666666666666666666666666666<br>66666666666669999900006666666666666666666666666666666666666666669<br>99990000666666666666666666666666666666666666666666999990000666666<br>666666666 |
| 122 | 66666666666666666666666666669999900000666666666666666666666666666<br>66666666666666999990000066666666666666666666666666666666666666666<br>99999000006666666666666666666666666666666666666666699999000006666<br>666666666 |
| 123 | 66666666666666666666666666666999990000006666666666666666666666666<br>66666666666666699999000000666666666666666666666666666666666666666 |

FIG. 73

| | |
|---|---|
| | 699999000000666666666666666666666666666666666666666669999900000066<br>666666666 |
| 124 | 666666666666666666666666666666999990000000666666666666666666666666<br>666666666666666699999000000066666666666666666666666666666666666666<br>669999900000006666666666666666666666666666666666666666999990000000<br>666666666 |
| 125 | 666666666666666666666666666666699999000000006666666666666666666666<br>666666666666666669999900000000666666666666666666666666666666666666<br>666999990000000066666666666666666666666666666666666666699999000000<br>006666666 |
| 126 | 666666666666666666666666666666669999900000000066666666666666666666<br>666666666666666666999990000000006666666666666666666666666666666666<br>666699999000000000666666666666666666666666666666666666669999900000<br>000066666 |
| 127 | 666666666666666666666666666666666999990000000000666666666666666666<br>666666666666666666699999000000000066666666666666666666666666666666<br>666669999900000000006666666666666666666666666666666666666999990000<br>000000666 |
| 128 | 666666666666666666666666666666666699999000000000006666666666666666<br>666666666666666666669999900000000000666666666666666666666666666666<br>666666999990000000000066666666666666666666666666666666666699999000<br>000000006 |
| 129 | 666666666666666666666666666666666669999900000000000066666666666666<br>666666666666666666666999990000000000006666666666666666666666666666<br>666666699999000000000000666666666666666666666666666666666669999900<br>000000000 |
| 130 | 066666666666666666666666666666666666999990000000000000666666666666<br>666666666666666666666699999000000000000066666666666666666666666666<br>666666669999900000000000006666666666666666666666666666666666999990<br>000000000 |
| 131 | 000666666666666666666666666666666666699999000000000000006666666666<br>666666666666666666666669999900000000000000666666666666666666666666<br>666666666999990000000000000066666666666666666666666666666666699999<br>000000000 |
| 132 | 000006666666666666666666666666666666669999900000000000000066666666<br>666666666666666666666666999990000000000000006666666666666666666666<br>666666666699999000000000000000666666666666666666666222222222229999<br>900000000 |
| 133 | 000000066666666666666666666666666666666999990000000000000000666666<br>666666666666666666666666699999000000000000000066666666666666666666<br>666666666669999900000000000000006666666666666666666666666666666999<br>990000000 |
| 134 | 000000000666666666666666666666666666666699999000000000000000006666<br>666666666666666666666666669999900000000000000000666666666666666666<br>666666666666999990000000000000000066666666666666666666666666666699<br>999000000 |
| 135 | 000000000006666666666666666666666666666669999900000000000000000066<br>666666666666666666666666666999990000000000000000006666666666666666<br>666666666666699999000000000000000000666666666666666666666666666669<br>999900000 |
| 136 | 000000000000066666666666666666666666669999999990000000000000000000<br>666666666666666666666666666699999000000000000000000066666666666666<br>666666666666669999900000000000000000006666666666666666666666666666<br>999990000 |
| 137 | 000000000000000666666666666666666666666999999999000000000000000000<br>006666666666666666666666666669999900000000000000000000666666666666<br>666666666666666999990000000000000000000066666666666666666666666666<br>699999000 |
| 138 | 000000000000000006666666666666666666666699999999900000000000000000<br>000066666666666666666666666666999990000000000000000000006666666666<br>666666666666666699999000000000000000000000666666666666666666666666<br>669999900 |
| 139 | 000000000000000000066666666666666666666669999999990000000000000000<br>000000666666666666666666666666699999000000000000000000000066666666 |

FIG. 74

| | |
|---|---|
| | 666666666666666669999900000000000000000000000066666666666666666666666666<br>666999990 |
| 140 | 000000000000000000000666666666666666666666669999999990000000000000000<br>000000006666666666666666666666666999990000000000000000000000000666666<br>666666666666666666999990000000000000000000000000666666666666666666666<br>666699999 |
| 141 | 000000000000000000000000444444444444444444444444444444000000000000000<br>000000000066666666666666666666666999990000000000000000000000000006666<br>666666666666666666699999000000000000000000000000066666666666666666666<br>666669999 |
| 142 | 900000000000000000000000004444444444444444444444444444440000000000000<br>000000000000666666666666666666666666999990000000000000000000000000066<br>666666666666666666669999900000000000000000000000000666666666666666666<br>666666999 |
| 143 | 990000000000000000000000000044444444444444444444444444440000000000000<br>000000000000006666666666666666666666699999000000000000000000000000000<br>666666666666666666666999990000000000000000000000000066666666666666666<br>666666699 |
| 144 | 999000000000000000000000000000666666666666666666669999900000000000000<br>000000000000000066666666666666666666999990000000000000000000000000000<br>006666666666666666666699999000000000000000000000000000066666666666666<br>666666669 |
| 145 | 999900000000000000000000000000000066666666666666666669999900000000000<br>000000000000000000666666666666666666699999000000000000000000000000000<br>000066666666666666666669999900000000000000000000000000000066666666666<br>666666666 |
| 146 | 999990000000000000000000000000000000666666666666666666999990000000000<br>000000000000000000006666666666666666669999900000000000000000000000000<br>000000666666666666666666999990000000000000000000000000000000066666666<br>666666666 |
| 147 | 699999000000000000000000000000000000666666666666666669999900000000000<br>000000000000000000000066666666666666666999990000000000000000000000000<br>000000006666666666666666699999000000000000000000000000000000666666<br>666666666 |
| 148 | 669999900000000000000000000000000000006666666666666666999990000000000<br>000000000000000000000000666666666666666699999000000000000000000000000<br>000000000066666666666666669999900000000000000000000000000000000006666<br>662222222 |
| 149 | 666999990000000000000000000000000000000066666666666666699999000000<br>000000000000000000000000006666666666666669999900000000000000000000<br>000000000000666666666666666999990000000000000000000000000000000066<br>666666666 |
| 150 | 666699999000000000000000000000000000000000666666666666669999900000<br>000000000000000000000000000066666666666666999990000000000000000000<br>000000000000006666666666666699999000000000000000000000000000000000<br>666666666 |
| 151 | 666669999900000000000000000000000000000000006666666666666999990000<br>000000000000000000000000000000666666666666699999000000000000000000<br>000000000000000066666666666669999900000000000000000000000000000000<br>006666666 |
| 152 | 666666999990000000000000000000000000000000000066666666666699999000<br>000000000000000000000000000000006666666666669999900000000000000000<br>000000000000000000666666666666999990000000000000000000000000000000<br>000066666 |
| 153 | 666666699999000000000000000000000000000000000000666666666669999900<br>000000000000000000000000000000000066666666666999990000000000000000<br>000000000000000000006666666666699999000000000000000000000000000000<br>000000666 |
| 154 | 666666669999900000000000000000000000000000000000006666666666999990<br>000000000000000000000000000000000000666666666699999000000000000000<br>000000000000000000000066666666669999900000000000000000000000000000<br>000000006 |
| 155 | 666666666999990000000000000000000000000000000000000066666666699999<br>000000000000000000000000000000000000006666666669999900000000000000 |

FIG. 75

| | |
|---|---|
| | 000000000000000000000000666666666999990000000000000000000000000000<br>000000000 |
| 156 | 066666666699999000000000000000000000000000000000000000666666669999<br>900000000000000000000000000000000000000006666666699999000000000000<br>000000000000000000000000006666666699999000000000000000000000000000<br>000000000 |
| 157 | 000666666669999900000000000000000000000000000000000000006666666999<br>990000000000000000000000000000000000000000666666699999000000000000<br>000000000000000000000000000066666669999900000000000000000000000000<br>000000000 |
| 158 | 000006666666999990000000000000000000000000000000000000000066666699<br>999000000000000000000000000000000000000000006666669999900000000000<br>000000000000000000000000000000666666999990000000000000000000000000<br>000000000 |
| 159 | 000000066666699999000000000000000000000000000000000000000000666669<br>999900000000000000000000000000000000000000000066666999990000000000<br>000000000000000000000000000000006666699999000000000000000000000000<br>000000000 |
| 160 | 000000000666669999900000000000000000000000000000000000000000006666<br>999990000000000000000000000000000000000000000000666699999000000000<br>000000000000000000000000000000000066669999900000000000000000000000<br>000000000 |
| 161 | 000000000006666999990000000000000000000000000000000000000000000066<br>699999000000000000000000000000000000000000000000006669999900000000<br>000000000000000000000000000000000000666999990000000000000000000000<br>000000000 |
| 162 | 000000000000066699999000000000000000000000000000000000000000000000<br>669999900000000000000000000000000000000000000000000066999990000000<br>000000000000000000000000000000000000006699999000000000000000000000<br>000000000 |
| 163 | 000000000000000669999900000000000000000000000000000000000000000000<br>006999990000000000000000000000000000000000000000000000299999000000<br>000000000000000000000000000000000000000029999900000000000000000000<br>000000000 |
| 164 | 000000000000000002999990000000000000000000000000000000000000000000<br>000099999000000000000000000000000000000000000000000000009999900000<br>000000000000000000000000000000000000000000999990000000000000000000<br>000000000 |
| 165 | 000000000000000000099999000000000000000000000000000000000000000000<br>000000999900000000000000000000000000000000000000000000000099990000<br>000000000000000000000000000000000000000000009999000000000000000000<br>000000000 |
| 166 | 000000000000000000000999900000000000000000000000000000000000000000<br>000000009990000000000000000000000000000000000000000000000000999000<br>000000000000000000000000000000000000000000000099900000000000000000<br>000000000 |
| 167 | 000000000000000000000009990000000000000000000000000000000000000000<br>000000000099000000000000000000000000000000000000000000000000009900<br>000000000000000000000000000000000000000000000000990000000000000000<br>000000000 |
| 168 | 000000000000000000000000099000000000000000000000000000000000000000<br>000000000000900000000000000000000000000000000000000000000000000090<br>000000000000000000000000000000000000000000000000009000000000000000<br>000000000 |
| 169 | 000000000000000000000000000900000000000000000000000000000000000000<br>000000000000000000000000000000000000000000000000000000000000000000<br>000000000000000000000000000000000000000000000000000000000000000000<br>000000000 |

FIG. 76

| | |
|---|---|
| 1st Training Sequence (397Bytes) | 08 03 09 07 0A 0E 04 01 0E 0E 06 05 FD 93 4E BF F8 CC 6D 37 01 0F C4 36 44 6E 4B BA 32 A4<br>90 5E F3 A2 00 DF EE B4 F0 2D 64 AD 69 E6 36 3B A0 2B A9 02 90 BF 92 0B 02 42 42 D2 92 D9<br>BF F4 2F FF 64 49 D9 DB 6D FF 4B 2F F6 9B FD 6F BF 0B 00 40 BF F6 DB D0 DB F6 09 6D 64 42<br>90 2F D2 40 64 00 6D 6F 02 2F 99 F6 99 6D D0 2D 00 02 02 49 DB D9 90 DB 02 26 92 00 0B 49<br>F4 00 49 B4 00 49 F4 FF 40 26 FD 99 2D BF 09 02 BD 9B BF D2 B4 F4 99 92 09 6F 0B 64 90 6D<br>6F 4B 9B 99 BF 6D 92 64 6F B4 02 0B F6 D2 DB 2D 40 BD F4 09 49 0B 66 D2 6F 42 D0 90 24 9B<br>B4 BF 24 66 6F 4B DB 66 B6 BF 90 49 00 40 66 42 6F F6 BF 00 09 FD 26 4B F4 24 DB 4B D2 6D<br>40 2D B4 B4 F6 DB 90 02 F4 6F 40 92 92 09 00 92 42 F6 BD D9 0B D2 BD FF 6F 00 2D D9 D2 66<br>09 24 6F 64 BD 49 42 92 2D 2F 66 6F 0B 09 6D 24 BD 99 FD D0 99 66 49 66 FD 00 BD 24 99 B6<br>26 9B 0B FF 24 F6 2F 24 BF 9B 00 F4 D0 66 F6 FF 90 D9 40 2F D0 42 99 24 24 D2 40 F4 09 92<br>BD 66 99 D9 BF BD 2D D2 BF 2D BF 64 99 DB 0B 2D 64 92 2F 6D 66 2D 6F 9B 24 66 D2 2F BD D9<br>42 26 42 0B D2 FD 00 6D D9 66 09 99 F4 DB 6F 6D F6 00 26 0B 26 6D 99 99 00 4B F6 92 42 B6<br>42 F6 40 99 9B 02 B6 D2 4B DB 40 DB 66 D2 99 90 4B 42 6D F4 42 D0 00 64 D0 DB BE BF DE 46<br>9F 9A F7 0E 22 2F 26 |
| 2nd Training Sequence (276Bytes) | 04 0B 0B 0B 0B 02 00 0D 0B 04 06 09 90 42 FF 64 FD 6D B6 26 49 00 66 BF 26 40 DB 99 B4 B6<br>6D 40 2D 92 6F D9 42 24 D9 24 26 F4 02 90 24 40 4B 2D FF 0B 99 BD 6D 92 4B B4 2F 02 4B 99<br>4B FF 26 2F BF 49 6F 02 6F F4 64 2F F6 40 D2 42 4B BD F4 FD 40 00 24 6D 64 26 D0 6F 6D 0B<br>24 BF 9B 09 24 2F 26 64 B6 64 9B D2 99 F6 64 BF BF 64 4B 00 F6 0B DB 6F BF 6D 02 FF 40 90<br>40 B4 FD 64 6D D9 42 99 DB D2 BD 9B EB 34 36 A9 64 6B 7B 7B BB A2 B0 ED 90 42 FF 64 FD 6D<br>B6 26 49 00 66 BF 26 40 DB 99 B4 B6 6D 40 2D 92 6F D9 42 24 D9 24 26 F4 02 90 24 40 4B 2D<br>FF 0B 99 BD 6D 92 4B B4 2F 02 4B 99 4B FF 26 2F BF 49 6F 02 6F F4 64 2F F6 40 D2 42 4B BD<br>F4 FD 40 00 24 6D 64 26 D0 6F 6D 0B 24 BF 9B 09 24 2F 26 64 B6 64 9B D2 99 F6 64 BF BF 64<br>4B 00 F6 0B DB 6F BF 6D 02 FF 40 90 40 B4 FD 64 6D D9 42 99 DB D2 BD 9B E0 3A 35 AF 60 6A<br>75 7F B0 AA B5 EF |
| 3rd Training Sequence (367Bytes) | 0C 0F 05 08 02 09 08 04 00 0D 04 0D 69 F6 F6 2B 20 3B 29 02 90 BF 92 0B 02 42 42 D2 92 D9<br>BF F4 2F FF 64 49 D9 DB 6D FF 4B 2F F6 9B FD 6F BF 0B 00 40 BF F6 DB D0 DB F6 09 6D 64 42<br>90 2F D2 40 64 00 6D 6F 02 2F 99 F6 99 6D D0 2D 00 02 02 49 DB D9 90 DB 02 26 92 00 0B 49<br>F4 00 49 B4 00 49 F4 FF 40 26 FD 99 2D BF 09 02 BD 9B BF D2 B4 F4 99 92 09 6F 0B 64 90 6D<br>6F 4B 9B 99 BF 6D 92 64 6F B4 02 0B F6 D2 DB 2D 40 BD F4 09 49 0B 66 D2 6F 42 D0 90 24 9B<br>B4 BF 24 66 6F 4B DB 66 B6 BF 90 49 00 40 66 42 6F F6 BF 00 09 FD 26 4B F4 24 DB 4B D2 6D<br>40 2D B4 B4 F6 DB 90 02 F4 6F 40 92 92 09 00 92 42 F6 BD D9 0B D2 BD FF 6F 00 2D D9 D2 66<br>09 24 6F 64 BD 49 42 92 2D 2F 66 6F 0B 09 6D 24 BD 99 FD D0 99 66 49 66 FD 00 BD 24 99 B6<br>26 9B 0B FF 24 F6 2F 24 BF 9B 00 F4 D0 66 F6 FF 90 D9 40 2F D0 42 99 24 24 D2 40 F4 09 92<br>BD 66 99 D9 BF BD 2D D2 BF 2D BF 64 99 DB 0B 2D 64 92 2F 6D 66 2D 6F 9B 24 66 D2 2F BD D9<br>42 26 42 0B D2 FD 00 6D D9 66 09 99 F4 DB 6F 6D F6 00 26 0B 26 6D 99 99 00 4B F6 92 42 B6<br>42 F6 40 99 9B 02 B6 D2 4B DB 40 DB 66 D2 99 90 4B 42 6D F4 42 D0 00 64 D0 DB BE BF DE 46<br>9F 9A F7 0E 22 2F 26 |
| 4th Training Sequence (360Bytes) | 04 00 0D 04 0D 09 06 06 0B 00 0B 09 02 90 BF 92 0B 02 42 42 D2 92 D9 BF F4 2F FF 64 49 D9<br>DB 6D FF 4B 2F F6 9B FD 6F BF 0B 00 40 BF F6 DB D0 DB F6 09 6D 64 42 90 2F D2 40 64 00 6D<br>6F 02 2F 99 F6 99 6D D0 2D 00 02 02 49 DB D9 90 DB 02 26 92 00 0B 49 F4 00 49 B4 00 49 F4<br>FF 40 26 FD 99 2D BF 09 02 BD 9B BF D2 B4 F4 99 92 09 6F 0B 64 90 6D 6F 4B 9B 99 BF 6D 92<br>64 6F B4 02 0B F6 D2 DB 2D 40 BD F4 09 49 0B 66 D2 6F 42 D0 90 24 9B B4 BF 24 66 6F 4B DB<br>66 B6 BF 90 49 00 40 66 42 6F F6 BF 00 09 FD 26 4B F4 24 DB 4B D2 6D 40 2D B4 B4 F6 DB 90<br>02 F4 6F 40 92 92 09 00 92 42 F6 BD D9 0B D2 BD FF 6F 00 2D D9 D2 66 09 24 6F 64 BD 49 42<br>92 2D 2F 66 6F 0B 09 6D 24 BD 99 FD D0 99 66 49 66 FD 00 BD 24 99 B6 26 9B 0B FF 24 F6 2F<br>24 BF 9B 00 F4 D0 66 F6 FF 90 D9 40 2F D0 42 99 24 24 D2 40 F4 09 92 BD 66 99 D9 BF BD 2D<br>D2 BF 2D BF 64 99 DB 0B 2D 64 92 2F 6D 66 2D 6F 9B 24 66 D2 2F BD D9 42 26 42 0B D2 FD 00<br>6D D9 66 09 99 F4 DB 6F 6D F6 00 26 0B 26 6D 99 99 00 4B F6 92 42 B6 42 F6 40 99 9B 02 B6<br>D2 4B DB 40 DB 66 D2 99 90 4B 42 6D F4 42 D0 00 64 D0 DB BE BF DE 46 9F 9A F7 0E 22 2F 26 |
| 5th Training Sequence (383Bytes) | 06 0A 07 07 0A 0A 0E 0B 0B 05 02 09 7C 1B 68 92 9E 95 01 D0 2A F9 1C 34 70 AD 34 6D 79 66<br>F6 6B 30 3B F9 02 90 BF 92 0B 02 42 42 D2 92 D9 BF F4 2F FF 64 49 D9 DB 6D FF 4B 2F F6 9B<br>FD 6F BF 0B 00 40 BF F6 DB D0 DB F6 09 6D 64 42 90 2F D2 40 64 00 6D 6F 02 2F 99 F6 99 6D<br>D0 2D 00 02 02 49 DB D9 90 DB 02 26 92 00 0B 49 F4 00 49 B4 00 49 F4 FF 40 26 FD 99 2D BF<br>09 02 BD 9B BF D2 B4 F4 99 92 09 6F 0B 64 90 6D 6F 4B 9B 99 BF 6D 92 64 6F B4 02 0B F6 D2<br>DB 2D 40 BD F4 09 49 0B 66 D2 6F 42 D0 90 24 9B B4 BF 24 66 6F 4B DB 66 B6 BF 90 49 00 40<br>66 42 6F F6 BF 00 09 FD 26 4B F4 24 DB 4B D2 6D 40 2D B4 B4 F6 DB 90 02 F4 6F 40 92 92 09<br>00 92 42 F6 BD D9 0B D2 BD FF 6F 00 2D D9 D2 66 09 24 6F 64 BD 49 42 92 2D 2F 66 6F 0B 09<br>6D 24 BD 99 FD D0 99 66 49 66 FD 00 BD 24 99 B6 26 9B 0B FF 24 F6 2F 24 BF 9B 00 F4 D0 66<br>F6 FF 90 D9 40 2F D0 42 99 24 24 D2 40 F4 09 92 BD 66 99 D9 BF BD 2D D2 BF 2D BF 64 99 DB<br>0B 2D 64 92 2F 6D 66 2D 6F 9B 24 66 D2 2F BD D9 42 26 42 0B D2 FD 00 6D D9 66 09 99 F4 DB<br>6F 6D F6 00 26 0B 26 6D 99 99 00 4B F6 92 42 B6 42 F6 40 99 9B 02 B6 D2 4B DB 40 DB 66 D2<br>99 90 4B 42 6D F4 42 D0 00 64 D0 DB BE BF DE 46 9F 9A F7 0E 22 2F 26 |
| 6th Training Sequence (360Bytes) | 04 00 0D 04 0D 09 06 06 0B 00 0B 09 02 90 BF 92 0B 02 42 42 D2 92 D9 BF F4 2F FF 64 49 D9<br>DB 6D FF 4B 2F F6 9B FD 6F BF 0B 00 40 BF F6 DB D0 DB F6 09 6D 64 42 90 2F D2 40 64 00 6D<br>6F 02 2F 99 F6 99 6D D0 2D 00 02 02 49 DB D9 90 DB 02 26 92 00 0B 49 F4 00 49 B4 00 49 F4<br>FF 40 26 FD 99 2D BF 09 02 BD 9B BF D2 B4 F4 99 92 09 6F 0B 64 90 6D 6F 4B 9B 99 BF 6D 92<br>64 6F B4 02 0B F6 D2 DB 2D 40 BD F4 09 49 0B 66 D2 6F 42 D0 90 24 9B B4 BF 24 66 6F 4B DB<br>66 B6 BF 90 49 00 40 66 42 6F F6 BF 00 09 FD 26 4B F4 24 DB 4B D2 6D 40 2D B4 B4 F6 DB 90<br>02 F4 6F 40 92 92 09 00 92 42 F6 BD D9 0B D2 BD FF 6F 00 2D D9 D2 66 09 24 6F 64 BD 49 42<br>92 2D 2F 66 6F 0B 09 6D 24 BD 99 FD D0 99 66 49 66 FD 00 BD 24 99 B6 26 9B 0B FF 24 F6 2F<br>24 BF 9B 00 F4 D0 66 F6 FF 90 D9 40 2F D0 42 99 24 24 D2 40 F4 09 92 BD 66 99 D9 BF BD 2D<br>D2 BF 2D BF 64 99 DB 0B 2D 64 92 2F 6D 66 2D 6F 9B 24 66 D2 2F BD D9 42 26 42 0B D2 FD 00<br>6D D9 66 09 99 F4 DB 6F 6D F6 00 26 0B 26 6D 99 99 00 4B F6 92 42 B6 42 F6 40 99 9B 02 B6<br>D2 4B DB 40 DB 66 D2 99 90 4B 42 6D F4 42 D0 00 64 D0 DB BE BF DE 46 9F 9A F7 0E 22 2F 26 |

FIG. 77

| | Symbols |
|---|---|
| **1st, 3rd, 4th, 5th, 6th training sequence (1424 symbols)** | 206264224044107176552026041455667471167754447676052515444502546170001037253367626<br>313607447752156772700127536536523723361167111656626321701422636477251463111372621<br>435616742725477616255117064111202304645216532055304016611520365015014663470014613<br>075357015357217357050332574014077022665535043545404604412626461055220430476664740<br>416452341364457413742612475431244623045045602141655673767261305316577455731372154<br>607613463311130014705032653657563544231335576236725321552675743447557760426726517<br>507576574170167475574323330500544425033037110713101357326146411134407372745525341<br>453133704763315336445611673442564254762777055647244513744315646572351721741124642<br>647546366654022106071502672321556473775016216571502102231041136417502351313307210<br>101013754604531554625352711237424327015221451063713503066576312644246616250467101<br>075074011026220042627512123413342203055265362615527767455343660350706772473243130<br>654415011716452033421253057242645673657174123344350452636713317757652223033157573<br>604106754405307012615577701543430074203231443345240671071114165765615161016107773<br>566560320126352222453366207271721071037174521512450407155230233371323204725337026<br>152707062156423444166065365565453100777010303027650763370157053365431420215213320<br>723537066341111640062464305073057753057615007543120737070114463144433723731375221<br>603131414305004341771543603435162722303337340070304300000770007053164744105125436<br>01200502333532714155676674764762020020200206116 |
| **2nd training sequence (528 symbos)** | 244440064224122224072156437376453061713531211106516766335022552466547157577111774<br>463147266051702350466756564447651756136753546415335502012530000534323403157116141<br>111027711565241120212317035013654664433145336661206437365512316334020060501741573<br>724316676235376642452623271233453302046771415300012721433404463421402702661555410<br>143111027444361665360072011263137257125316577517443526720270762745023623154420351<br>361342573561775057475301257547103661654250676275355207672313710173103132673076275<br>144425146077572023655466775456022000222020 |

TRANSMITTING/RECEIVING SYSTEM AND METHOD OF PROCESSING BROADCAST SIGNAL IN TRANSMITTING/RECEIVING SYSTEM

This application claims the benefit of U.S. Provisional Application No. 61/112,197, filed on Nov. 7, 2008, which is hereby incorporated by reference as if fully set forth herein.

BACKGROUND OF THE INVENTION

1. Field of the Invention

The present invention relates to a digital broadcasting system for transmitting and receiving digital broadcast signal, and more particularly, to a transmitting system for processing and transmitting digital broadcast signal, and a receiving system for receiving and processing digital broadcast signal and, a method of processing data in the transmitting system and the receiving system.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a transmitting system and a receiving system and a method of processing broadcast signal that substantially obviate one or more problems due to limitations and disadvantages of the related art.

An object of the present invention is to provide a transmitting system and a receiving system and a method of processing broadcast signal that are highly resistant to channel changes and noise.

Another object of the present invention is to provide a transmitting system and a receiving system and a method of processing broadcast signal that can enhance the receiving performance of the receiving system by performing additional encoding on mobile service data and by transmitting the processed data to the receiving system.

Another object of the present invention is to provide a transmitting system and a receiving system and a method of processing broadcast signal that can also enhance the receiving performance of the receiving system by inserting known data already known in accordance with a pre-agreement between the receiving system and the transmitting system in a predetermined region within a data region.

Another object of the present invention is to provide a receiving system and a method for processing a broadcast signal that can reduce the parade change time, when a parade change command to change from one parade to another parade is generated.

A further object of the present invention is to provide a receiving system and a method for processing a broadcast signal that can ensure continuity in a mobile service that is provided to a user, when a parade change command to change from one parade to another parade is generated.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital broadcast transmitting system may include a service multiplexer and a transmitter. The service multiplexer may multiplex mobile service data and main service data at a predetermined data rate and may transmit the multiplexed data to the transmitter. The transmitter may perform additional encoding on the mobile service data being transmitted from the service multiplexer. The transmitter may also group a plurality of additionally encoded mobile service data packets so as to form a data group. The transmitter may multiplex mobile service data packets including mobile service data and main service data packets including main service data and may transmit the multiplexed data packets to a receiving system.

Herein, the data group may be divided into a plurality of regions depending upon a degree of interference of the main service data. Also, a long known data sequence may be periodically inserted in regions without interference of the main service data. Also, a receiving system according to an embodiment of the present invention may be used for demodulating and channel equalizing the known data sequence.

In another aspect of the present invention, a receiving system includes a signal receiving unit, a signaling decoder, a block decoder, and an RS frame decoder. When a parade change command ordering parade change from a first parade to a second parade is generated, the signal receiving unit receives a broadcast signal including data groups of the second parade starting from a generation point of the parade change command, while receiving the broadcast signal including a transmission frame transmitting the first and second parades. The signaling decoder decodes signaling information included in the data groups and outputting RS frame-related information. The block decoder performs turbo-decoding in block units on data of a portion included in the data groups. And the RS frame decoder inserts null data in data positions of a portion included in non-received data group within an RS frame of the second parade, while configuring the RS frame of the second parade by collecting data of the turbo-decoded portions based upon the RS frame-related information. The RS frame decoder performs CRC-decoding by indicating the existence of errors on CRC error flags of each row including the null data within the RS frame, and performs RS-decoding on the CRC-decoded RS frame.

Herein, the RS frame decoder may count a number of CRC error flags indicating the existence of an error, among the CRC error flags corresponding to each row within the RS frame, thereby estimating a number of CRC errors. The RS frame decoder may also generate a reliability map indicating reliability information on each data within the RS frame, and wherein the reliability information corresponding to the null data is marked to be unreliable.

When the number of CRC errors is less than or equal to a maximum number of errors correctable by RS erasure decoding, the RS frame decoder may perform RS erasure decoding on all columns of the RS frame. And, when the number of CRC errors is greater than a maximum number of errors correctable by RS erasure decoding, the RS frame decoder may refer to the reliability information of the reliability map, and perform any one of general RS-decoding and RS erasure decoding for each column of the RS frame.

When the parade change command ordering the parade change from the first parade to the second parade is generated, the signal receiving unit may receive a broadcast signal including data groups of the second parade from a next transmission frame. The RS frame decoder may collect data of a portion included in data groups of the first parade, the first parade being received until the generation point of the parade change command and being turbo-decoded, so as to configure an RS frame, and insert null data in data positions of a portion included in non-received data groups within the RS frame of the first parade. The RS frame decoder may also perform CRC-decoding by indicating the existence of errors on CRC error flags of each row including the null data within the RS frame of the first parade, and perform RS-decoding on the CRC-decoded RS frame.

In another aspect of the present invention, a method for processing a broadcast signal of a receiving system includes, when a parade change command ordering parade change from a first parade to a second parade is generated, receiving a broadcast signal including data groups of the second parade starting from a generation point of the parade change command, while receiving the broadcast signal including a transmission frame transmitting the first and second parades, decoding signaling information included in the data groups and outputting RS frame-related information, performing turbo-decoding in block units on data of a portion included in the data groups, and inserting null data in data positions of a portion included in non-received data group within an RS frame of the second parade, while configuring the RS frame of the second parade by collecting data of the turbo-decoded portions based upon the RS frame-related information, performing CRC-decoding by indicating the existence of errors on CRC error flags of each row including the null data within the RS frame, and performing RS-decoding on the CRC-decoded RS frame.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 17(*a*) and FIG. 17(*b*) are diagrams illustrating another example of RS frame according to the present invention;

FIG. 23(*a*) and FIG. 23(*b*) illustrate a process of one or two RS frame being divided into several portions, based upon an RS frame mode value, and a process of each portion being assigned to a corresponding region within the respective data group;

FIG. 30 illustrates a symbol interleaver of the block processor;

FIG. 35 illustrates an example of a syntax structure of TPC data according to the present invention;

FIG. 57 to FIG. 64 illustrate an exemplary of a data group format represented using numbers before (prior) data interleaving according to the present invention;

FIG. 65 to FIG. 75 illustrate an exemplary of a data group format represented using numbers before (prior) data interleaving according to the present invention;

FIG. 76 illustrates an example of a training sequence represented using numbers at the byte level according to the present invention; and FIG. 77 illustrates an example of a training sequence represented using numbers at the symbol according to the present invention.

DETAILED DESCRIPTION OF THE INVENTION

Figure 1:
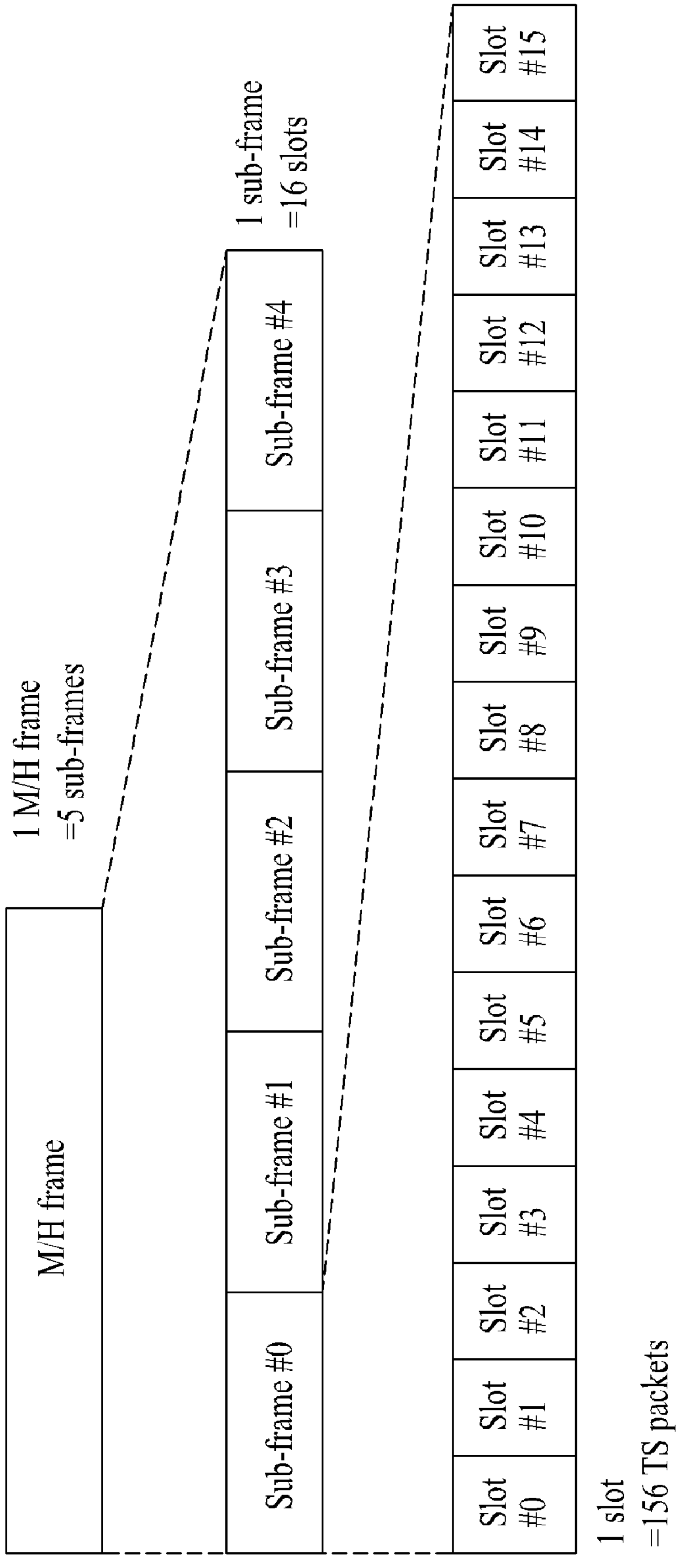
FIG. 1 illustrates a structure of a M/H frame for transmitting and receiving mobile service data according to the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H (or MH)" corresponds to the initials of "mobile" and "handheld" and represents the opposite concept of a fixed-type system. Furthermore, the M/H service data may include at least one of mobile service data and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

M/H Frame Structure

In the embodiment of the present invention, the mobile service data are first multiplexed with main service data in M/H frame units and, then, modulated in a VSB mode and transmitted to the receiving system.

At this point, one M/H frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

FIG. 1 illustrates a structure of an M/H frame for transmitting and receiving mobile service data according to the present invention. In the example shown in FIG. 1, one M/H frame consists of 5 sub-frames, wherein each sub-frame includes 16 slots. In this case, the M/H frame according to the present invention includes 5 sub-frames and 80 slots. Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment.

At this point, two VSB fields are grouped to form a VSB frame.

Figure 2:
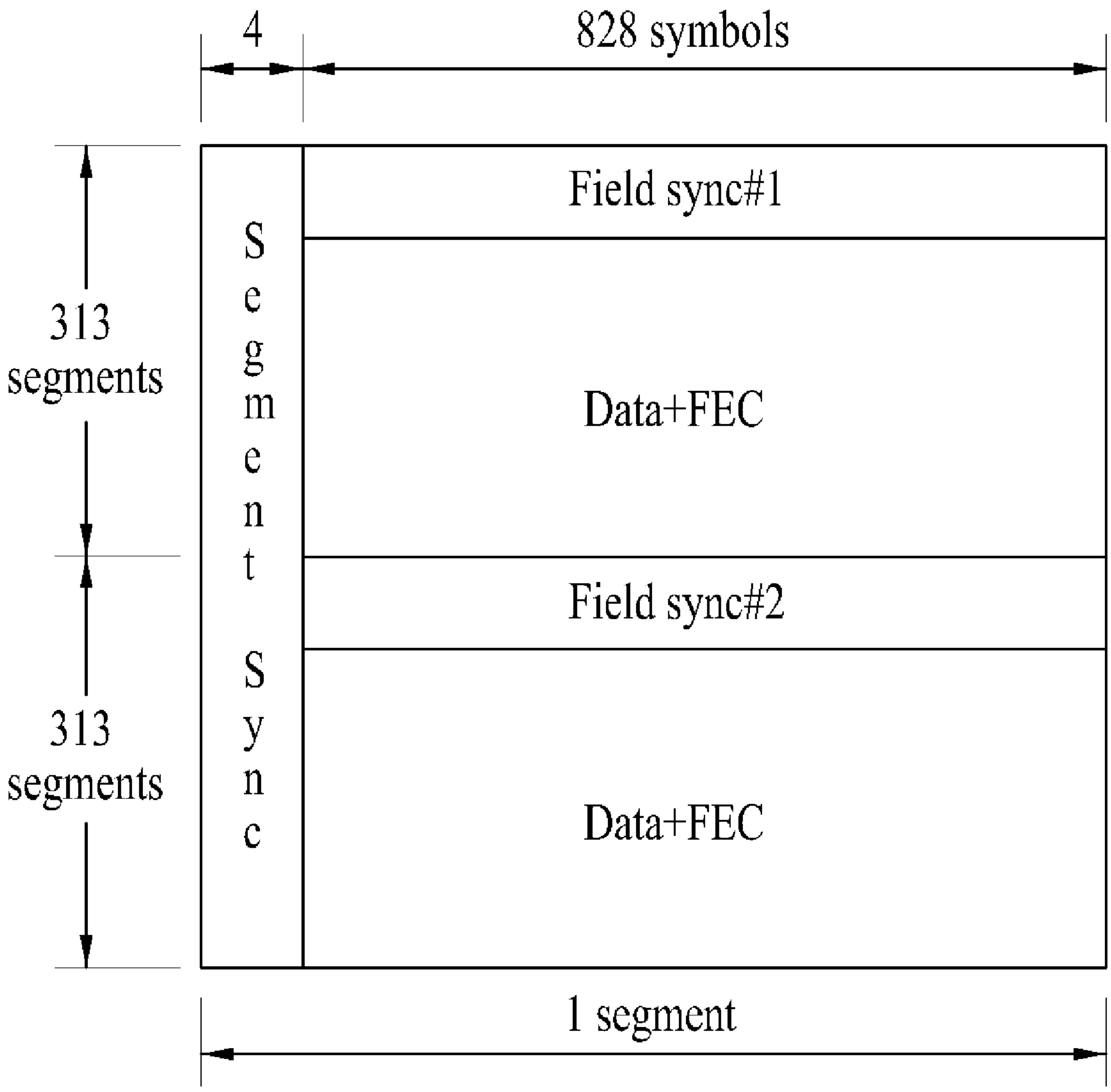
FIG. 2 illustrates an exemplary structure of a VSB frame.

FIG. 2 illustrates an exemplary structure of a VSB frame, wherein one VSB frame consists of 2 VSB fields (i.e., an odd field and an even field). Herein, each VSB field includes a field synchronization segment and 312 data segments.

The slot corresponds to a basic time period for multiplexing the mobile service data and the main service data. Herein, one slot may either include the mobile service data or be configured only of the main service data.

If one M/H frame is transmitted during one slot, the first 118 data packets within the slot correspond to a data group. And, the remaining 38 data packets become the main service data packets. In another example, when no data group exists in a slot, the corresponding slot is configured of 156 main service data packets.

Meanwhile, when the slots are assigned to a VSB frame, an offset exists for each assigned position.

Figure 3:
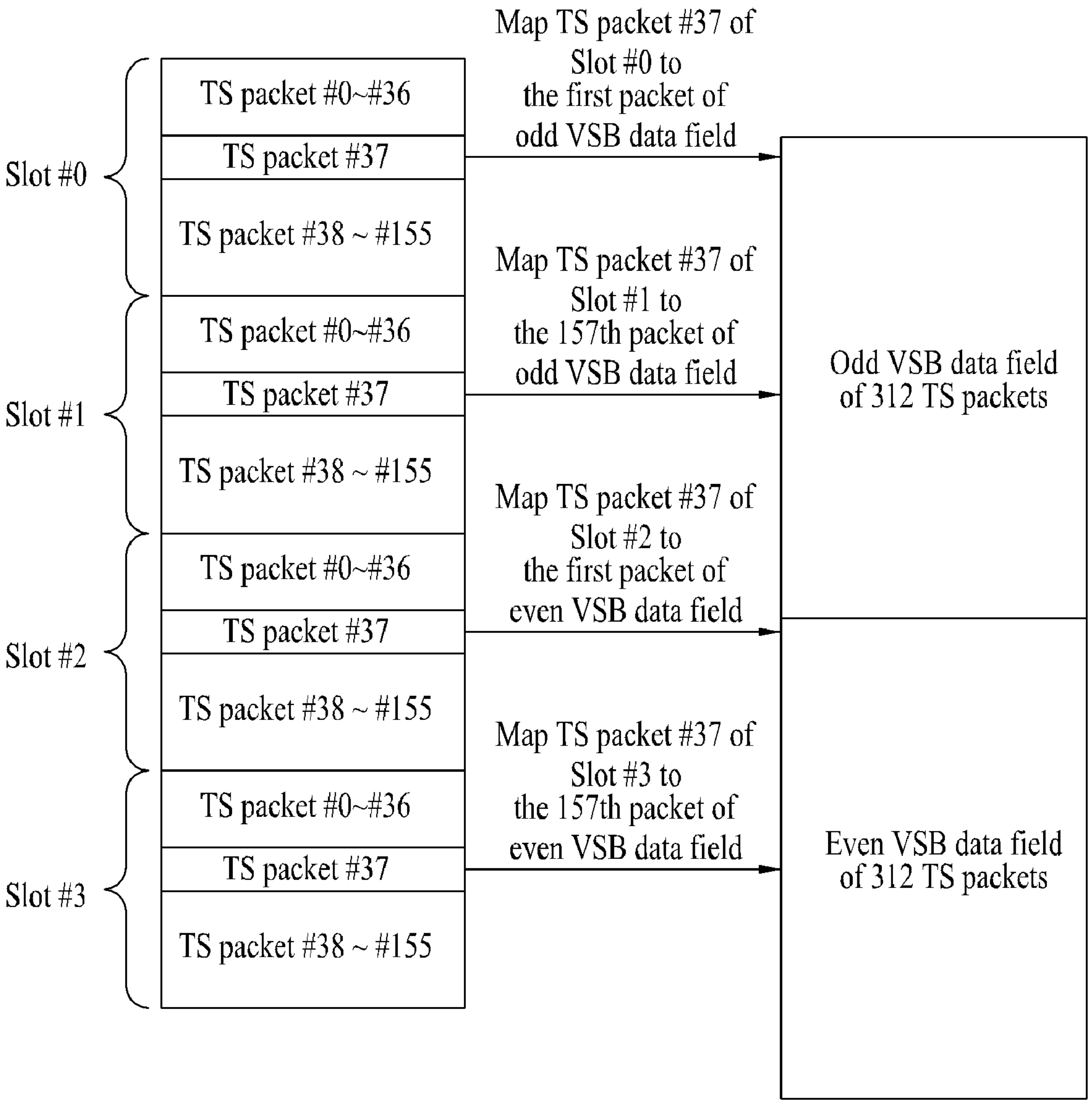
FIG. 3 illustrates a mapping example of the positions to which the first 4 slots of a sub-frame are assigned with respect to a VSB frame in a space region.

FIG. 3 illustrates a mapping example of the positions to which the first 4 slots of a sub-frame are assigned with respect to a VSB frame in a space region. And, FIG. 4 illustrates a mapping example of the positions to which the first 4 slots of a sub-frame are assigned with respect to a VSB frame in a time region.

Figure 4:
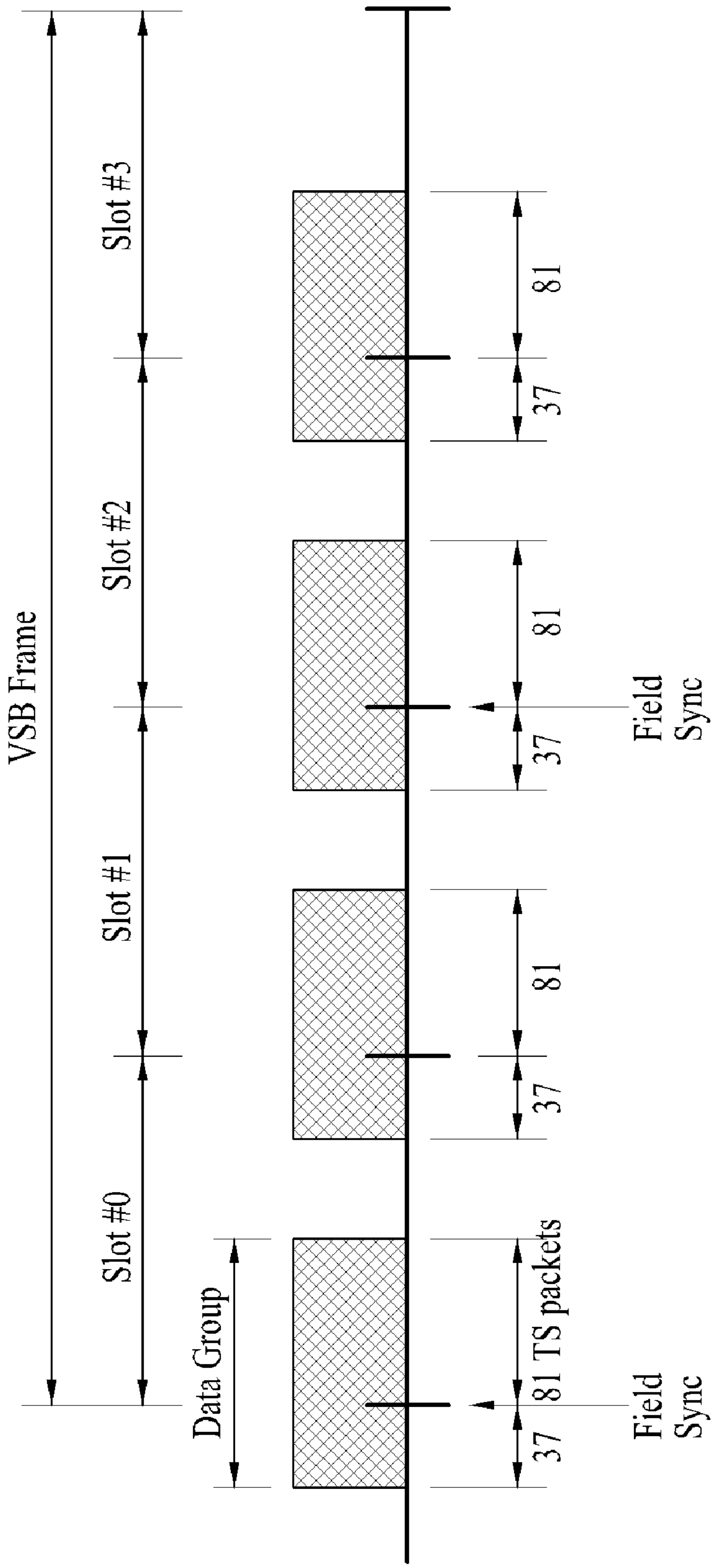
FIG. 4 illustrates a mapping example of the positions to which the first 4 slots of a sub-frame are assigned with respect to a VSB frame in a time region.

Referring to FIG. 3 and FIG. 4, a $38^{th}$ data packet (TS packet #37) of a $1^{st}$ slot (Slot #0) is mapped to the $1^{st}$ data packet of an odd VSB field. A $38^{th}$ data packet (TS packet #37) of a $2^{nd}$ slot (Slot #1) is mapped to the $157^{th}$ data packet of an odd VSB field. Also, a $38^{th}$ data packet (TS packet #37) of a $3^{rd}$ slot (Slot #2) is mapped to the $1^{st}$ data packet of an even VSB field. And, a $38^{th}$ data packet (TS packet #37) of a $4^{th}$ slot (Slot #3) is mapped to the $157^{th}$ data packet of an even VSB field. Similarly, the remaining 12 slots within the corresponding sub-frame are mapped in the subsequent VSB frames using the same method.

Meanwhile, one data group may be divided into at least one or more hierarchical regions. And, depending upon the characteristics of each hierarchical region, the type of mobile service data being inserted in each region may vary. For example, the data group within each region may be divided (or categorized) based upon the receiving performance.

In an example given in the present invention, a data group is divided into regions A, B, C, and D in a data configuration after data interleaving.

Figure 5:
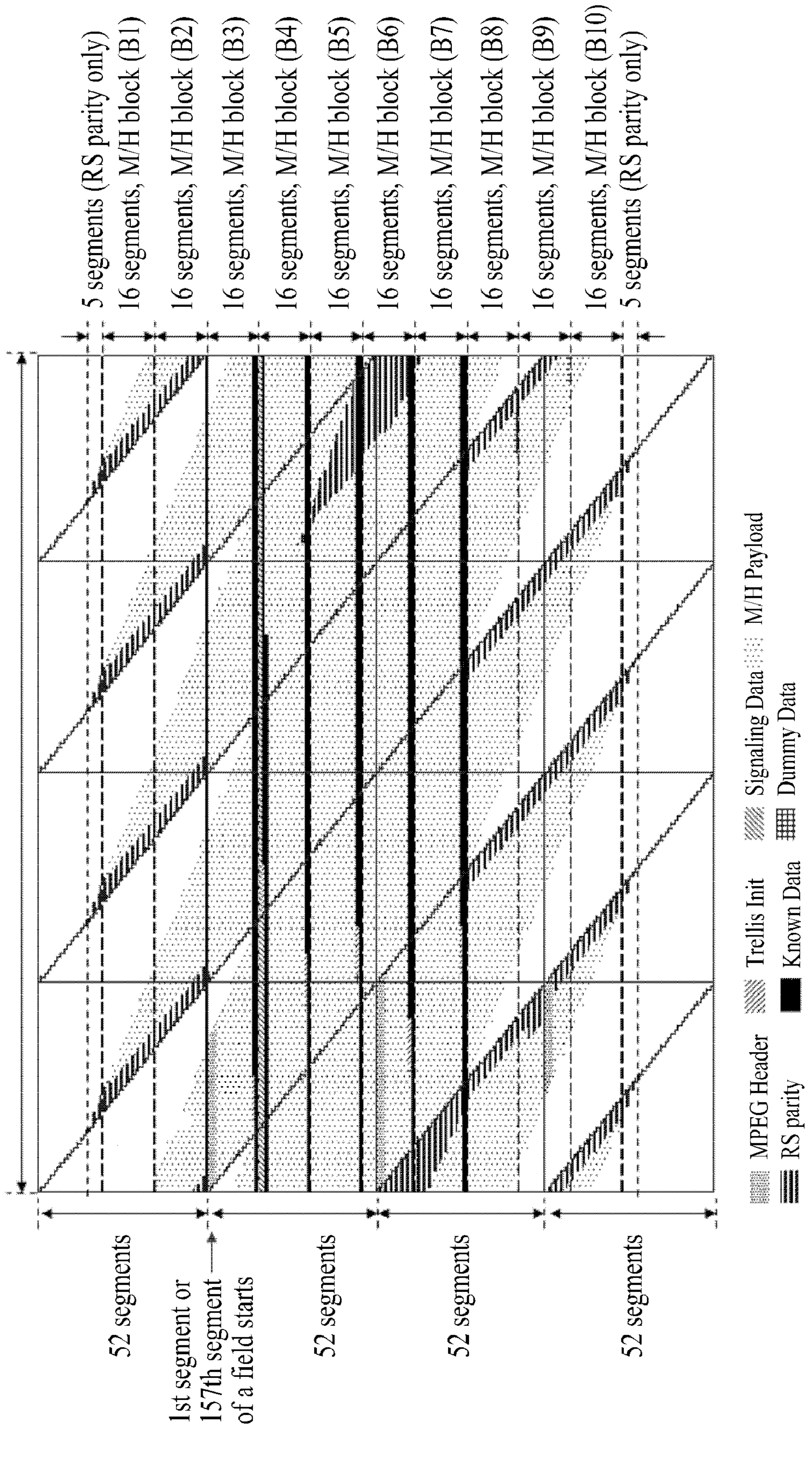
FIG. 5 illustrates an alignment of data after being data interleaved and identified.
Figure 6:
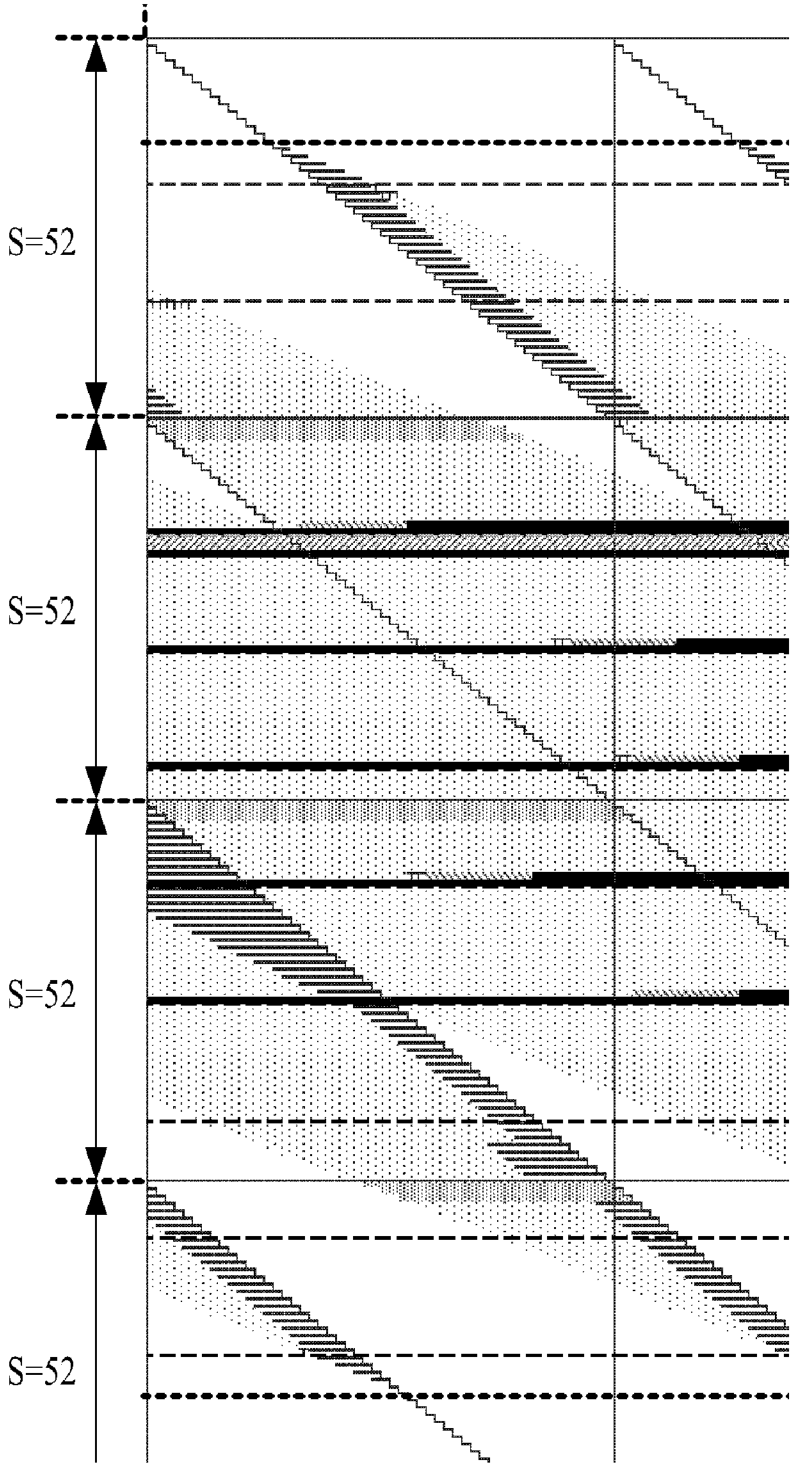
FIG. 6 illustrates an enlarged portion of the data group shown in FIG. 5 for a better understanding of the present invention.
Figure 7:
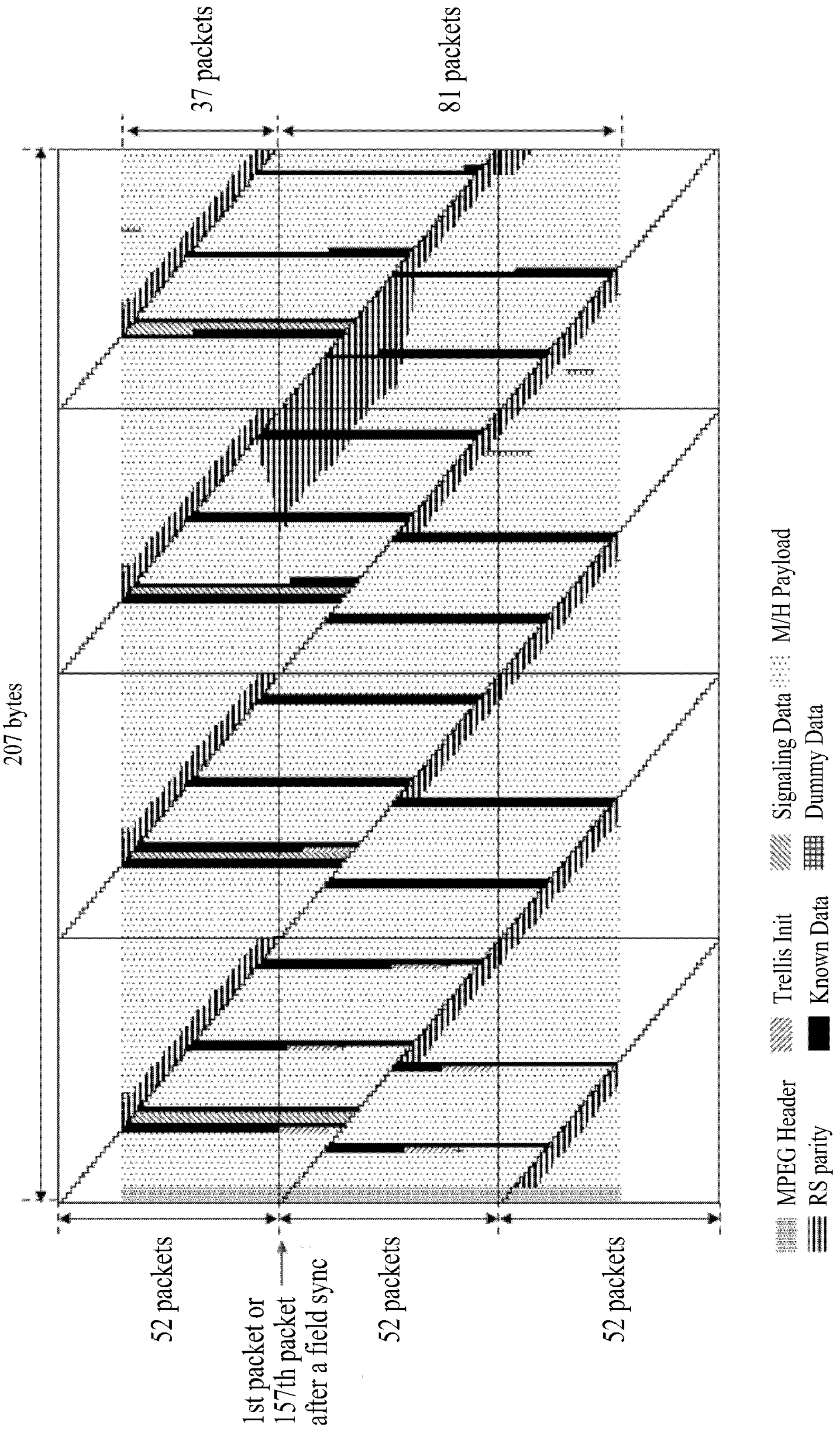
FIG. 7 illustrates an alignment of data before being data interleaved and identified.
Figure 8:
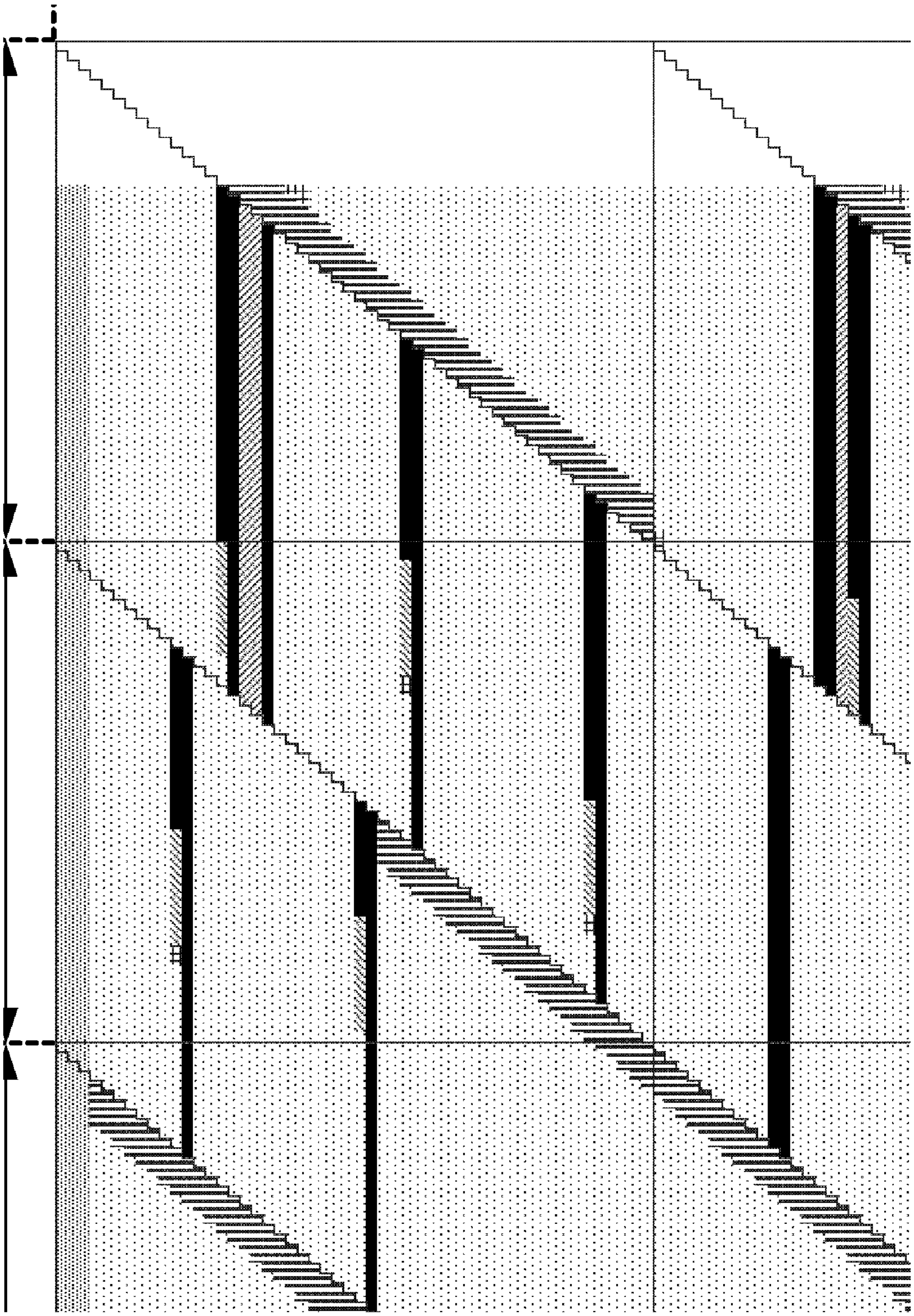
FIG. 8 illustrates an enlarged portion of the data group shown in FIG. 7 for a better understanding of the present invention.

FIG. 5 illustrates an alignment of data after being data interleaved and identified. FIG. 6 illustrates an enlarged portion of the data group shown in FIG. 5 for a better understanding of the present invention. FIG. 7 illustrates an alignment of data before being data interleaved and identified. And, FIG. 8 illustrates an enlarged portion of the data group shown in FIG. 7 for a better understanding of the present invention. More specifically, a data structure identical to that shown in FIG. 5 is transmitted to a receiving system. In other words, one data packet is data-interleaved so as to be scattered to a plurality of data segments, thereby being transmitted to the receiving system. FIG. 5 illustrates an example of one data group being scattered to 170 data segments. At this point, since one 207-byte packet has the same amount of data as one data segment, the packet that is not yet processed with data-interleaving may be used as the data segment.

FIG. 5 shows an example of dividing a data group prior to being data-interleaved into 10 M/H blocks (i.e., M/H block (B1) to M/H block 10 (B10)). In this example, each M/H block has the length of 16 segments. Referring to FIG. 5, only the RS parity data are allocated to a portion of 5 segments before the M/H block 1 (B1) and 5 segments behind the M/H block 10 (B10). The RS parity data are excluded in regions A to D of the data group.

More specifically, when it is assumed that one data group is divided into regions A, B, C, and D, each M/H block may be included in any one of region A to region D depending upon the characteristic of each M/H block within the data group. At this point, according to an embodiment of the present invention, each M/H block may be included in any one of region A to region D based upon an interference level of main service data.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 5, M/H block 4 (B4) to M/H block 7 (B7) correspond to regions without interference of the main service data. M/H block 4 (B4) to M/H block 7 (B7) within the data group shown in FIG. 5 correspond to a region where no interference from the main service data occurs. In this example, a long known data sequence is inserted at both the beginning and end of each M/H block. In the description of the present invention, the region including M/H block 4 (B4) to M/H block 7 (B7) will be referred to as "region A (=B4+B5+B6+B7)". As described above, when the data group includes region A having a long known data sequence inserted at both the beginning and end of each M/H block, the receiving system is capable of performing equalization by using the channel information that can be obtained from the known data. Therefore, the strongest equalizing performance may be yielded (or obtained) from one of region A to region D.

In the example of the data group shown in FIG. 5, M/H block 3 (B3) and M/H block 8 (B8) correspond to a region having little interference from the main service data. Herein, a long known data sequence is inserted in only one side of each M/H block B3 and B8. More specifically, due to the interference from the main service data, a long known data sequence is inserted at the end of M/H block 3 (B3), and another long known data sequence is inserted at the beginning of M/H block 8 (B8). In the present invention, the region including M/H block 3 (B3) and M/H block 8 (B8) will be referred to as "region B(=B3+B8)". As described above, when the data group includes region B having a long known data sequence inserted at only one side (beginning or end) of each M/H block, the receiving system is capable of performing equalization by using the channel information that can be obtained from the known data. Therefore, a stronger equalizing performance as compared to region C/D may be yielded (or obtained).

Referring to FIG. 5, M/H block 2 (B2) and M/H block 9 (B9) correspond to a region having more interference from the main service data as compared to region B. A long known data sequence cannot be inserted in any side of M/H block 2 (B2) and M/H block 9 (B9). Herein, the region including M/H block (B2) and M/H block 9 (B9) will be referred to as "region C(=B2+B9)". Finally, in the example shown in FIG. 5, M/H block 1 (B1) and M/H block 10 (B10) correspond to a region having more interference from the main service data as compared to region C. Similarly, a long known data sequence cannot be inserted in any side of M/H block 1 (B1) and M/H block 10 (B10).

Herein, the region including M/H block 1 (B1) and M/H block 10 (B10) will be referred to as "region D (=B1+B10)". Since region C/D is spaced further apart from the known data sequence, when the channel environment undergoes frequent and abrupt changes, the receiving performance of region C/D may be deteriorated.

FIG. 7 illustrates a data structure prior to data interleaving. More specifically, FIG. 7 illustrates an example of 118 data packets being allocated to a data group. FIG. 7 shows an example of a data group consisting of 118 data packets, wherein, based upon a reference packet (e.g., a $1^{st}$ packet (or data segment) or $157^{th}$ packet (or data segment) after a field synchronization signal), when allocating data packets to a VSB frame, 37 packets are included before the reference packet and 81 packets (including the reference packet) are included afterwards.

In other words, with reference to FIG. 5, a field synchronization signal is placed (or assigned) between M/H block 2 (B2) and M/H block 3 (B3). Accordingly, this indicates that the slot has an off-set of 37 data packets with respect to the corresponding VSB field.

FIG. 57 to FIG. 64 illustrate an exemplary data group format represented using numbers before (prior) data interleaving. In FIG. 57 to FIG. 64, the 207 variable bytes of each 208-byte MPEG-2 transport stream packet are shown. The initial MPEG-2 sync byte of each packet is not shown. Referring to FIG. 57 to FIG. 64, number 0 corresponds to main service data (i.e., normal VSB data), number 1 corresponds to signaling data (or signling bytes or signaling information), number 2 corresponds to dummy data bytes, number 3 corresponds to trellis initialization bytes, number 4 corresponds to MPEG header, number 5 corresponds to known (training) data sequence, number 6 corresponds to mobile service data (i.e., M/H Data), and number 9 corresponds to RS parity bytes.

FIG. 65 to FIG. 75 illustrate an exemplary data group format represented using numbers after data interleaving. In FIG. 65 to FIG. 75, the 207 variable bytes of each 208-byte MPEG-2 transport stream packet are shown. The initial MPEG-2 sync byte of each packet is not shown. In a data group containing a field synchronization segment, the field syncronization segment shall be inserted between data group segments #36 and #37; i.e., 37 data group segments precede a data field syncronization segment. Referring to FIG. 65 to FIG. 75, number 0 corresponds to main service data (i.e., normal VSB data), number 1 corresponds to signaling data (or signling bytes or signaling information), number 2 corresponds to dummy data bytes, number 3 corresponds to trellis initialization bytes, number 4 corresponds to MPEG header, number 5 corresponds to known (training) data sequence, number 6 corresponds to mobile service data (i.e., M/H Data), and number 9 corresponds to RS parity bytes.

The size of the data groups, number of hierarchical regions within the data group, the size of each region, the number of M/H blocks included in each region, the size of each M/H block, and so on described above are merely exemplary. Therefore, the present invention will not be limited to the examples described above.

Figure 9:
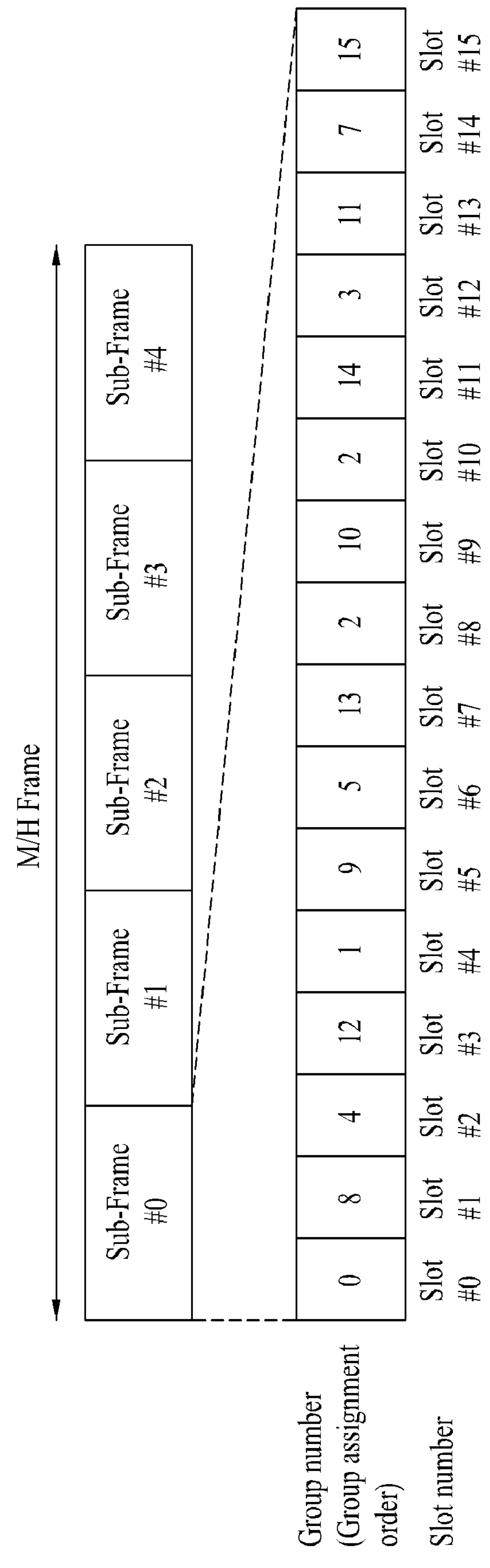
FIG. 9 illustrates an exemplary assignment order of data groups being assigned to one of 5 sub-frames according to the present invention.

FIG. 9 illustrates an exemplary assignment order of data groups being assigned to one of 5 sub-frames, wherein the 5 sub-frames configure an M/H frame. For example, the method of assigning data groups may be identically applied to all M/H frames or differently applied to each M/H frame. Furthermore, the method of assigning data groups may be identically applied to all sub-frames or differently applied to each sub-frame. At this point, when it is assumed that the data groups are assigned using the same method in all sub-frames of the corresponding M/H frame, the total number of data groups being assigned to an M/H frame is equal to a multiple of '5'.

According to the embodiment of the present invention, a plurality of consecutive data groups is assigned to be spaced as far apart from one another as possible within the M/H frame. Thus, the system can be capable of responding promptly and effectively to any burst error that may occur within a sub-frame.

For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively. FIG. 9 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15.

Equation 1 below shows the above-described rule (or pattern) for assigning data groups in a sub-frame.

$$\text{Herein, } j = (4i + 0) \bmod 16 \quad \text{Equation 1}$$

$$0 = 0 \text{ if } i < 4,$$

$$0 = 2 \text{ else if } i < 8,$$

$$0 = 1 \text{ else if } i < 12,$$

$$0 = 3 \text{ else.}$$

Herein, j indicates the slot number within a sub-frame. The value of j may range from 0 to 15 (i.e., 0≦j≦15). Also, value of i indicates the data group number. The value of i may range from 0 to 15 (i.e., 0≦i≦15).

In the present invention, a collection of data groups included in an M/H frame will be referred to as a "parade". Based upon the RS frame mode, the parade transmits data of at least one specific RS frame.

The mobile service data within one RS frame may be assigned either to all of regions A/B/C/D within the corresponding data group, or to at least one of regions A/B/C/D. In the embodiment of the present invention, the mobile service data within one RS frame may be assigned either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another.

In the description of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D within the corresponding data group, one parade transmits one RS frame. In this case, also the RS frame will be referred to as a "primary RS frame". Conversely, when the mobile service data within one RS frame are assigned either to at least one of regions A/B and regions C/D, one parade may transmit up to 2 RS frames.

More specifically, the RS frame mode indicates whether a parade transmits one RS frame, or whether the parade transmits two RS frames. Table 1 below shows an example of the RS frame mode.

TABLE 1

| RS frame mode (2 bits) | Description |
|---|---|
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

As described in the assignment of data groups, the parades are also assigned to be spaced as far apart from one another as possible within the sub-frame. Thus, the system can be capable of responding promptly and effectively to any burst error that may occur within a sub-frame.

Furthermore, the method of assigning parades may be identically applied to all sub-frames or differently applied to each sub-frame. According to the embodiment of the present invention, the parades may be assigned differently for each M/H frame and identically for all sub-frames within an M/H frame. More specifically, the M/H frame structure may vary by M/H frame units. Thus, an ensemble rate may be adjusted on a more frequent and flexible basis.

Figure 10:
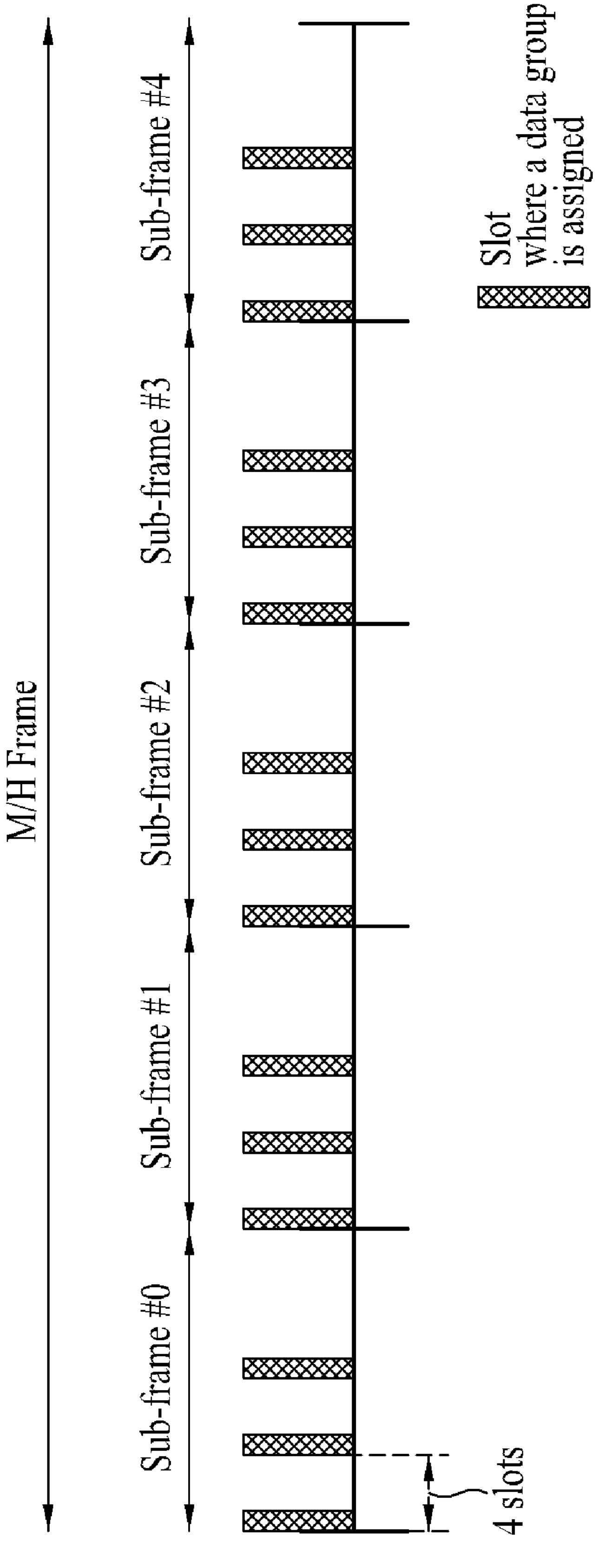
FIG. 10 illustrates an example of assigning a single parade to an M/H frame according to the present invention.

FIG. 10 illustrates an example of multiple data groups of a single parade being assigned (or allocated) to an M/H frame. More specifically, FIG. 10 illustrates an example of a plurality of data groups included in a single parade, wherein the number of data groups included in a sub-frame is equal to '3', being allocated to an M/H frame. Referring to FIG. 10, 3 data groups are sequentially assigned to a sub-frame at a cycle period of 4 slots. Accordingly, when this process is equally performed in the 5 sub-frames included in the corresponding M/H frame, 15 data groups are assigned to a single M/H frame. Herein, the 15 data groups correspond to data groups included in a parade. Therefore, since one sub-frame is configured of 4 VSB frame, and since 3 data groups are included in a sub-frame, the data group of the corresponding parade is not assigned to one of the 4 VSB frames within a sub-frame.

For example, when it is assumed that one parade transmits one RS frame, and that a RS frame encoder located in a later block performs RS-encoding on the corresponding RS frame, thereby adding 24 bytes of parity data to the corresponding RS frame and transmitting the processed RS frame, the parity data occupy approximately 11.37% (=24/(187+24)×100) of the total code word length. Meanwhile, when one sub-frame includes 3 data groups, and when the data groups included in the parade are assigned, as shown in FIG. 10, a total of 15 data groups form an RS frame. Accordingly, even when an error occurs in an entire data group due to a burst noise within a channel, the percentile is merely 6.67% (=1/15×100). Therefore, the receiving system may correct all errors by performing an erasure RS decoding process. More specifically, when the erasure RS decoding is performed, a number of channel errors corresponding to the number of RS parity bytes may be corrected. By doing so, the receiving system may correct the error of at least one data group within one parade. Thus, the minimum burst noise length correctable by a RS frame is over 1 VSB frame.

Meanwhile, when data groups of a parade are assigned as described above, either main service data may be assigned between each data group, or data groups corresponding to different parades may be assigned between each data group. More specifically, data groups corresponding to multiple parades may be assigned to one M/H frame.

Basically, the method of assigning data groups corresponding to multiple parades is very similar to the method of assigning data groups corresponding to a single parade. In other words, data groups included in other parades that are to be assigned to an M/H frame are also respectively assigned according to a cycle period of 4 slots.

At this point, data groups of a different parade may be sequentially assigned to the respective slots in a circular method. Herein, the data groups are assigned to slots starting from the ones to which data groups of the previous parade have not yet been assigned.

For example, when it is assumed that data groups corresponding to a parade are assigned as shown in FIG. 10, data groups corresponding to the next parade may be assigned to a sub-frame starting either from the $12^{th}$ slot of a sub-frame. However, this is merely exemplary. In another example, the data groups of the next parade may also be sequentially assigned to a different slot within a sub-frame at a cycle period of 4 slots starting from the $3^{rd}$ slot.

Figure 11:
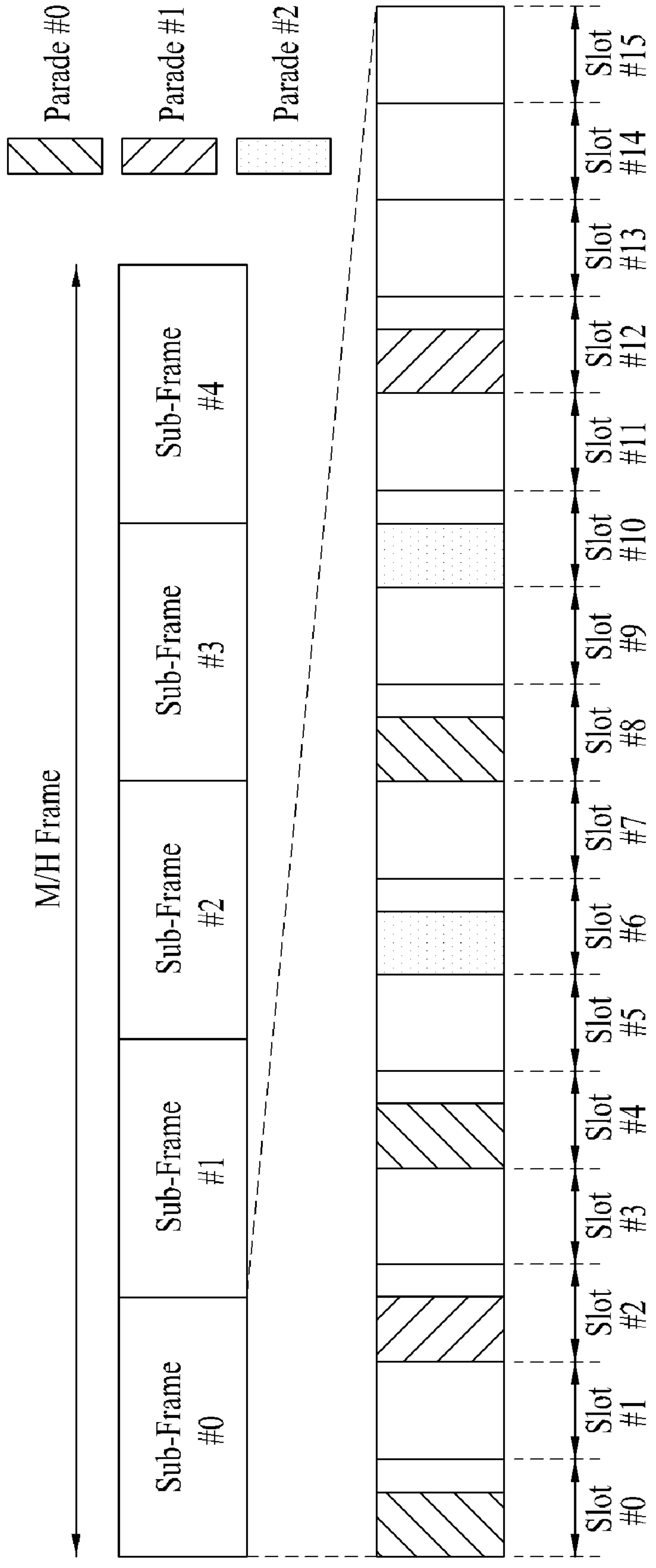
FIG. 11 illustrates an example of assigning 3 parades to an M/H frame according to the present invention.

FIG. 11 illustrates an example of transmitting 3 parades (Parade #0, Parade #1, and Parade #2) to an M/H frame. More specifically, FIG. 11 illustrates an example of transmitting parades included in one of 5 sub-frames, wherein the 5 sub-frames configure one M/H frame.

When the $1^{st}$ parade (Parade #0) includes 3 data groups for each sub-frame, the positions of each data groups within the sub-frames may be obtained by substituting values '0' to '2' for i in Equation 1. More specifically, the data groups of the $1^{st}$ parade (Parade #0) are sequentially assigned to the $1^{st}$, $5^{th}$, and $9^{th}$ slots (Slot #0, Slot #4, and Slot #8) within the sub-frame. Also, when the $2^{nd}$ parade includes 2 data groups for each sub-frame, the positions of each data groups within the sub-frames may be obtained by substituting values '3' and '4' for i in Equation 1.

More specifically, the data groups of the $2^{nd}$ parade (Parade #1) are sequentially assigned to the $2^{nd}$ and $12^{th}$ slots (Slot #3 and Slot #11) within the sub-frame.

Finally, when the $3^{rd}$ parade includes 2 data groups for each sub-frame, the positions of each data groups within the sub-frames may be obtained by substituting values '5' and '6' for i in Equation 1. More specifically, the data groups of the $3^{rd}$ parade (Parade #2) are sequentially assigned to the $7^{th}$ and $11^{th}$ slots (Slot #6 and Slot #10) within the sub-frame.

As described above, data groups of multiple parades may be assigned to a single M/H frame, and, in each sub-frame, the data groups are serially allocated to a group space having 4 slots from left to right. Therefore, a number of groups of one parade per sub-frame (NOG) may correspond to any one integer from '1' to '8'. Herein, since one M/H frame includes 5 sub-frames, the total number of data groups within a parade that can be allocated to an M/H frame may correspond to any one multiple of '5' ranging from '5' to '40'.

Figure 12:
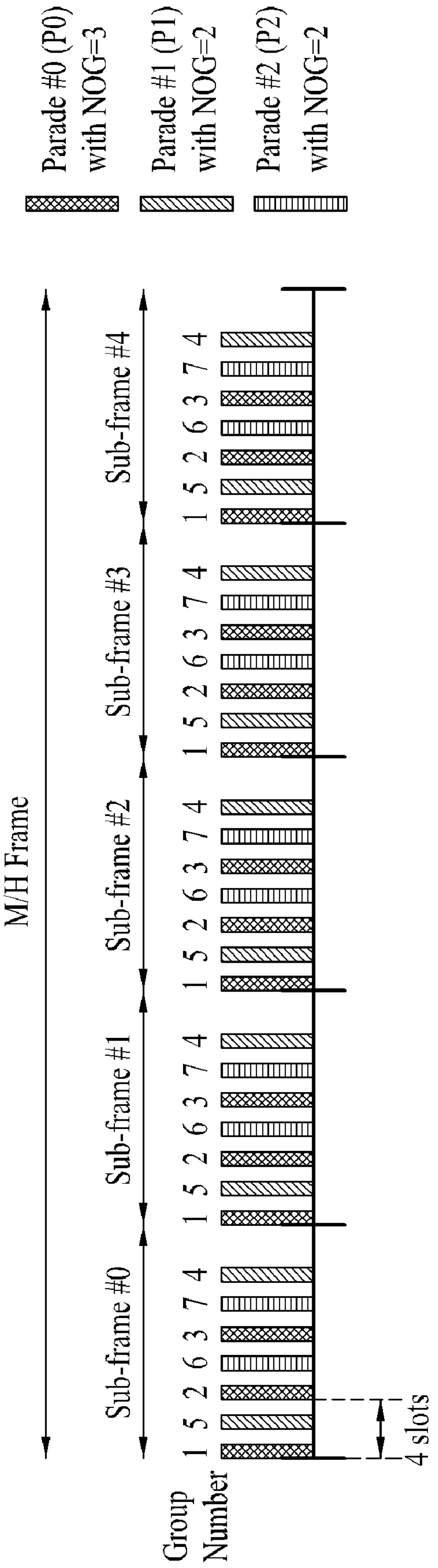
FIG. 12 illustrates an example of expanding the assignment process of 3 parades to 5 sub-frames within an M/H frame.

FIG. 12 illustrates an example of expanding the assignment process of 3 parades, shown in FIG. 11, to 5 sub-frames within an M/H frame.

Figure 13:
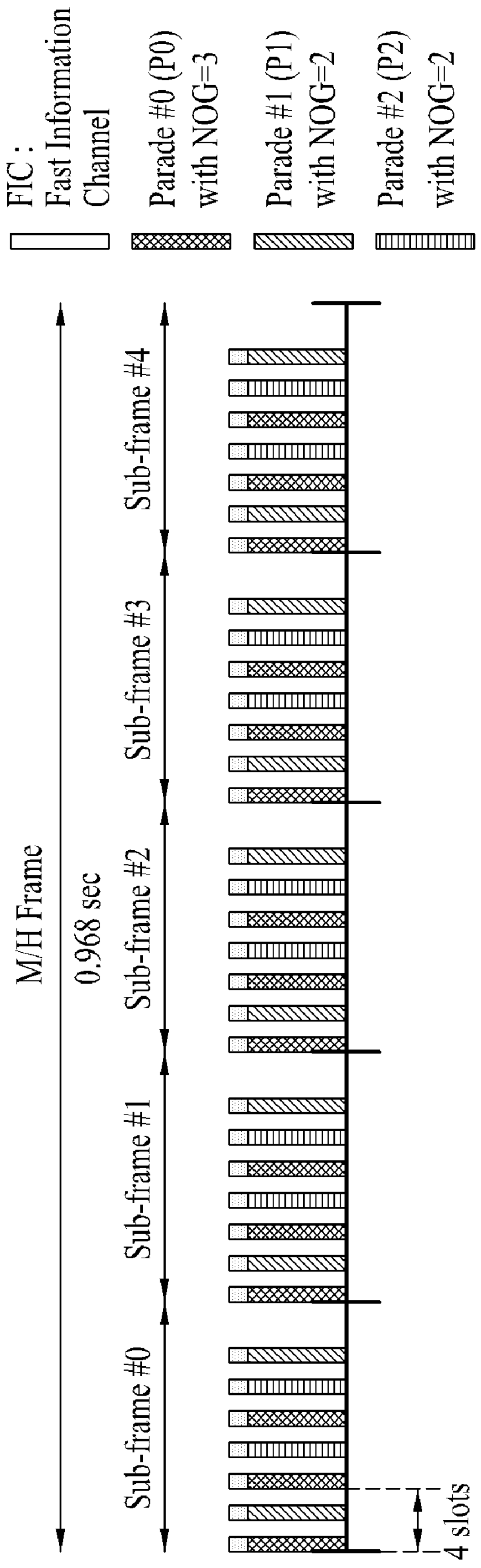
FIG. 13 illustrates a data transmission structure according to an embodiment of the present invention, wherein signaling data are included in a data group so as to be transmitted.

FIG. 13 illustrates a data transmission structure according to an embodiment of the present invention, wherein signaling data are included in a data group so as to be transmitted.

As described above, an M/H frame is divided into 5 sub-frames. Data groups corresponding to a plurality of parades co-exist in each sub-frame. Herein, the data groups corresponding to each parade are grouped by M/H frame units, thereby configuring a single parade.

The data structure shown in FIG. 13 includes 3 parades (parade #0, parade #1, parade #2). Also, a predetermined portion of each data group (i.e., 37 bytes/data group) is used for delivering (or sending) FIC information associated with mobile service data, wherein the FIC information is separately encoded from the RS-encoding process. The FIC region assigned to each data group consists of one FIC segments.

Meanwhile, the concept of an M/H ensemble is applied in the embodiment of the present invention, thereby defining a collection (or group) of services. Each M/H ensemble carries the same QoS and is coded with the same FEC code. Also, each M/H ensemble has the same unique identifier (i.e., ensemble ID) and corresponds to consecutive RS frames.

As shown in FIG. 13, the FIC segment corresponding to each data group described service information of an M/H ensemble to which the corresponding data group belongs.

General Description of the Transmitting System

Figure 14:
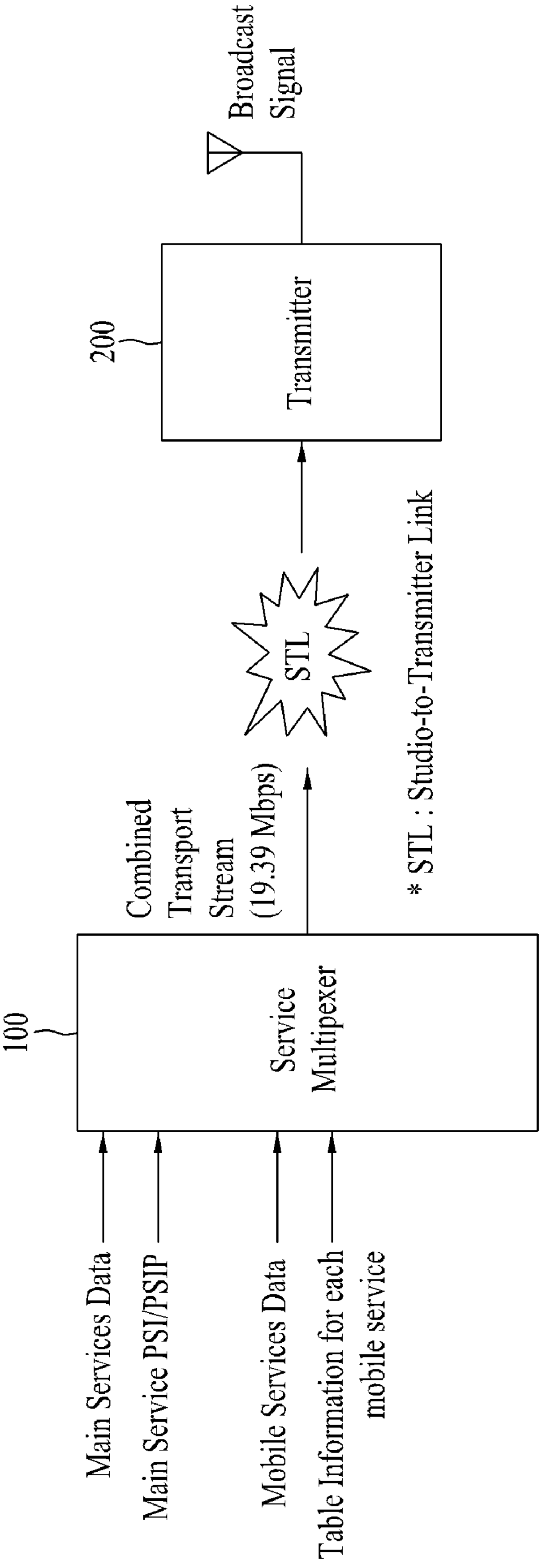
FIG. 14 illustrates a block diagram showing a general structure of a transmitting system according to an embodiment of the present invention.

FIG. 14 illustrates a block diagram showing a general structure of a digital broadcast transmitting system according to an embodiment of the present invention.

Herein, the digital broadcast transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. This corresponds to data transmission using Single Frequency Network (SFN). Accordingly, in the receiving system, a channel equalizer may compensate signal distortion, which is caused by a reflected wave, so as to recover the original signal. In another example, the plurality of transmitters may have different frequencies with respect to the same channel. This corresponds to data transmission using Multi Frequency Network (MFN).

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8VSB mode, the output data rate is 19.39 Mbps, and, in case of the 16VSB mode, the output data rate is 38.78 Mbps. Furthermore, in the conventional 8VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of main service data and table information (e.g., PSI/PSIP table data) for each main service and encapsulates the received data into a transport stream (TS) packet.

Also, according to an embodiment of the present invention, the service multiplexer 100 receives at least one type of mobile service data and table information (e.g., PSI/PSIP table data) for each mobile service and encapsulates the received data into a transport stream (TS) packet.

According to another embodiment of the present invention, the service multiplexer 100 receives a RS frame, which is configured of at least one type of mobile service data and table information for each mobile service, and encapsulates the received RS frame data into mobile service data packets of a transport stream (TS) packet format.

And, the service multiplexer 100 multiplexes the encapsulated TS packets for main service and the encapsulated TS packets for mobile service based upon a predetermined multiplexing rule, thereby outputting the multiplexed TS packets to the transmitter 200.

Figures 15, 16:
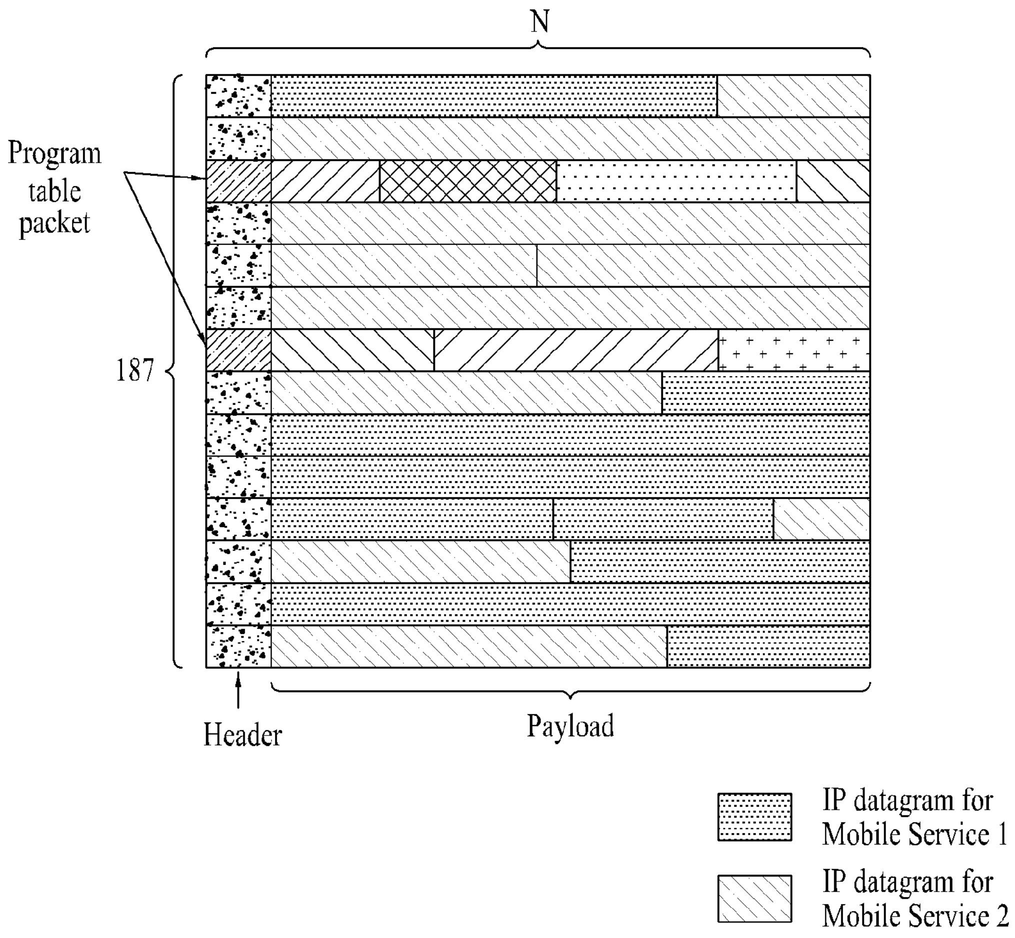
FIG. 15 is a diagram illustrating an example of RS frame according to the present invention.
FIG. 16 is a diagram illustrating a structure of an M/H header within an M/H service data packet according to the present invention.

At this point, the RS frame has the size of N(row)×187 (column), as shown in FIG. 15. Herein, N represents the length of a row (i.e., number of columns), and 187 corresponds to the length of a column (i.e., number of rows.

In the present invention, each row configured of N bytes will be referred to as an M/H service data packet for simplicity. The M/H service data packet may be configured of a 2-byte M/H header and a (N−2)-byte M/H payload. Herein, the assigning 2 bytes to the M/H header region is merely exemplary. The above-described configuration may be altered by the system designer and will, therefore, not be limited only to the example presented in the description of the present invention.

The RS frame is generated by collecting (or gathering) table information and/or mobiles service data collectively corresponding to a size of (N−2) (row)×187 (column) bytes.

According to an embodiment of the present invention, the mobile service data has the form of an IP datagram. Herein, the RS frame may include table information and IP datagram corresponding to at least one mobile service. Also, one RS frame may include table information and IP datagram corresponding to one or more mobile services. For example, IP datagram and table information of two different types of mobile service data, such as news service (e.g., IP datagram for mobile service 1) and stock information service (e.g., IP datagram for mobile service 2), may be included in a single RS frame.

More specifically, either table information of a section structure or an IP datagram of a mobile service data may be assigned to an M/H payload within an M/H service data packet configuring the RS frame. Alternatively, either an IP datagram of table information or an IP datagram of a mobile service data may be assigned to an M/H payload within an M/H service data packet configuring the RS frame.

At this point, the size of the M/H service data packet including the M/H header may not be equal to N bytes.

In this case, stuffing bytes may be assigned to the surplus (or remaining) payload region within the corresponding M/H service data packet. For example, after assigning program table information to an M/H service data packet, when the length of the corresponding M/H service data packet including the M/H header is equal to (N−20) bytes, stuffing bytes may be assigned to the remaining 20-byte region.

The RS frame may be assigned to at least one of regions A/B/C/D within a data group by the transmitter. In the description of the present invention, when the RS frame is assigned to regions A/B/C/D within the data group, or when the RS frame is assigned to regions A/B, the RS frame will be referred to as a primary RS frame. Alternatively, when the RS frame is assigned to regions C/D, the RS frame will be referred to as a secondary RS frame.

FIG. 16 is a diagram illustrating examples of fields allocated to the M/H header region within the M/H service data packet according to the present invention. Examples of the fields include type_indicator field, error_indicator field, stuff_indicator field, and pointer field.

The type_indicator field can allocate 3 bits, for example, and represents a type of data allocated to payload within the corresponding M/H service data packet. In other words, the type_indicator field indicates whether data of the payload is IP datagram or program table information. At this time, each data type constitutes one logical channel. In the logical channel which transmits the IP datagram, several mobile services are multiplexed and then transmitted. Each mobile service undergoes demultiplexing in the IP layer.

The error_indicator field can allocate 1 bit, for example, and represents whether the corresponding M/H service data packet has an error. For example, if the error_indicator field has a value of 0, it means that there is no error in the corresponding M/H service data packet. If the error_indicator field has a value of 1, it means that there may be an error in the corresponding M/H service data packet.

The stuff_indicator field can allocate 1 bit, for example, and represents whether stuffing byte exists in payload of the corresponding M/H service data packet. For example, if the stuff_indicator field has a value of 0, it means that there is no stuffing byte in the corresponding M/H service data packet. If the stuff_indicator field has a value of 1, it means that stuffing byte exists in the corresponding M/H service data packet.

The pointer field can allocate 11 bits, for example, and represents position information where new data (i.e., new signaling information or new IP datagram) starts in the corresponding M/H service data packet.

For example, if IP datagram for mobile service 1 and IP datagram for mobile service 2 are allocated to the first M/H service data packet within the RS frame as illustrated in FIG. 15, the pointer field value represents the start position of the IP datagram for mobile service 2 within the M/H service data packet.

Also, if there is no new data in the corresponding M/H service data packet, the corresponding field value is expressed as a maximum value exemplarily. According to the embodiment of the present invention, since 11 bits are allocated to the pointer field, if 2047 is expressed as the pointer field value, it means that there is no new data in the packet. The point where the pointer field value is 0 can be varied depending on the type_indicator field value and the stuff_indicator field value.

It is to be understood that the order, the position, and the meaning of the fields allocated to the header within the M/H service data packet illustrated in FIG. 16 are exemplarily illustrated for understanding of the present invention. Since the order, the position and the meaning of the fields allocated to the header within the M/H service data packet and the number of additionally allocated fields can easily be modified by those skilled in the art, the present invention will not be limited to the above example.

FIG. 17(*a*) and FIG. 17(*b*) illustrate another examples of RS frame according to the present invention. FIG. 17(*a*) illustrates an example of primary RS frame to be allocated to regions A/B within the data group, and FIG. 17(*b*) illustrates an example of secondary RS frame to be allocated to regions C/D within the data group.

In FIG. 17(*a*) and FIG. 17(*b*), a column length (i.e., the number of rows) of the RS frame to be allocated to the regions A/B and a column length (i.e., the number of rows) of the RS frame to be allocated to the regions C/D are 187 equally. However, row lengths (i.e, the number of columns) may be different from each other.

According to the embodiment of the present invention, when the row length of the primary RS frame to be allocated to the regions A/B within the data group is N1 bytes and the row length of the secondary RS frame to be allocated to the regions C/D within the data group is N2 bytes, a condition of N1>N2 is satisfied. In this case, N1 and N2 can be varied depending on the transmission parameter or a region of the data group, to which the corresponding RS frame will be transmitted.

For convenience of the description, each row of the N1 and N2 bytes will be referred to as the M/H service data packet. The M/H service data packet within the RS frame to be allocated to the regions A/B within the data group can be comprised of M/H header of 2 bytes and payload of N1−2 bytes. Also, the M/H service data packet within the RS frame to be allocated to the regions C/D within the data group can be comprised of M/H header of 2 bytes and payload of N2−2 bytes.

In the present invention, the primary RS frame for the regions A/B within the data group and the secondary RS frame for the regions C/D within the data group can include at least one of program table information and IP datagram. Also, one RS frame can include IP datagram corresponding to one or more mobile services.

Corresponding parts of FIG. 15 can be applied to the other parts, which are not described in FIG. 17(*a*) and FIG. 17(*b*).

Meanwhile, the value of N, which corresponds to the number of columns within an RS frame, can be decided according to Equation 2.

$$N = \left\lfloor \frac{5 \times NoG \times PL}{187 + P} \right\rfloor - 2 \qquad \text{Equation 2}$$

Herein, NoG indicates the number of data groups assigned to a sub-frame. PL represents the number of SCCC payload data bytes assigned to a data group. And, P signifies the number of RS parity data bytes added to each column of the RS frame. Finally, $\lfloor X \rfloor$ is the greatest integer that is equal to or smaller than X.

More specifically, in Equation 2, PL corresponds to the length of an RS frame portion. The value of PL is equivalent to the number of SCCC payload data bytes that are assigned to the corresponding data group. Herein, the value of PL may vary depending upon the RS frame mode, SCCC block mode, and SCCC outer code mode. Table 2 to Table 5 below respectively show examples of PL values, which vary in accordance with the RS frame mode, SCCC block mode, and SCCC outer code mode. The SCCC block mode and the SCCC outer code mode will be described in detail in a later process.

TABLE 2

| SCCC outer code mode | | | | |
|---|---|---|---|---|
| for Region A | for Region B | for Region C | for Region D | PL |
| 00 | 00 | 00 | 00 | 9624 |
| 00 | 00 | 00 | 01 | 9372 |
| 00 | 00 | 01 | 00 | 8886 |
| 00 | 00 | 01 | 01 | 8634 |
| 00 | 01 | 00 | 00 | 8403 |
| 00 | 01 | 00 | 01 | 8151 |
| 00 | 01 | 01 | 00 | 7665 |
| 00 | 01 | 01 | 01 | 7413 |
| 01 | 00 | 00 | 00 | 7023 |
| 01 | 00 | 00 | 01 | 6771 |
| 01 | 00 | 01 | 00 | 6285 |
| 01 | 00 | 01 | 01 | 6033 |
| 01 | 01 | 00 | 00 | 5802 |
| 01 | 01 | 00 | 01 | 5550 |
| 01 | 01 | 01 | 00 | 5064 |
| 01 | 01 | 01 | 01 | 4812 |
| Others | | | | Reserved |

Table 2 shows an example of the PL values for each data group within an RS frame, wherein each PL value varies depending upon the SCCC outer code mode, when the RS frame mode value is equal to '00', and when the SCCC block mode value is equal to '00'. For example, when it is assumed that each SCCC outer code mode value of regions A/B/C/D within the data group is equal to '00' (i.e., the block processor 302 of a later block performs encoding at a coding rate of 1/2), the PL value within each data group of the corresponding RS frame may be equal to 9624 bytes. More specifically, 9624 bytes of mobile service data within one RS frame may be assigned to regions A/B/C/D of the corresponding data group.

TABLE 3

| SCCC outer code mode | PL |
|---|---|
| 00 | 9624 |
| 01 | 4812 |
| Others | Reserved |

Table 3 shows an example of the PL values for each data group within an RS frame, wherein each PL value varies depending upon the SCCC outer code mode, when the RS frame mode value is equal to '00', and when the SCCC block mode value is equal to '01'.

TABLE 4

| SCCC outer code mode | | |
|---|---|---|
| for Region A | for Region B | PL |
| 00 | 00 | 7644 |
| 00 | 01 | 6423 |
| 01 | 00 | 5043 |
| 01 | 01 | 3822 |
| Others | | Reserved |

Table 4 shows an example of the PL values for each data group within a primary RS frame, wherein each PL value varies depending upon the SCCC outer code mode, when the RS frame mode value is equal to '01', and when the SCCC block mode value is equal to '00'. For example, when each SCCC outer code mode value of regions A/B is equal to '00', 7644 bytes of mobile service data within a primary RS frame may be assigned to regions A/B of the corresponding data group.

TABLE 5

| SCCC outer code mode | | |
|---|---|---|
| for Region C | for Region D | PL |
| 00 | 00 | 1980 |
| 00 | 01 | 1728 |
| 01 | 00 | 1242 |
| 01 | 01 | 990 |
| Others | | Reserved |

Table 5 shows an example of the PL values for each data group within a secondary RS frame, wherein each PL value varies depending upon the SCCC outer code mode, when the RS frame mode value is equal to '01', and when the SCCC block mode value is equal to '00'. For example, when each SCCC outer code mode value of regions C/D is equal to '00', 1980 bytes of mobile service data within a secondary RS frame may be assigned to regions C/D of the corresponding data group.

Service Multiplexer

Figure 18:
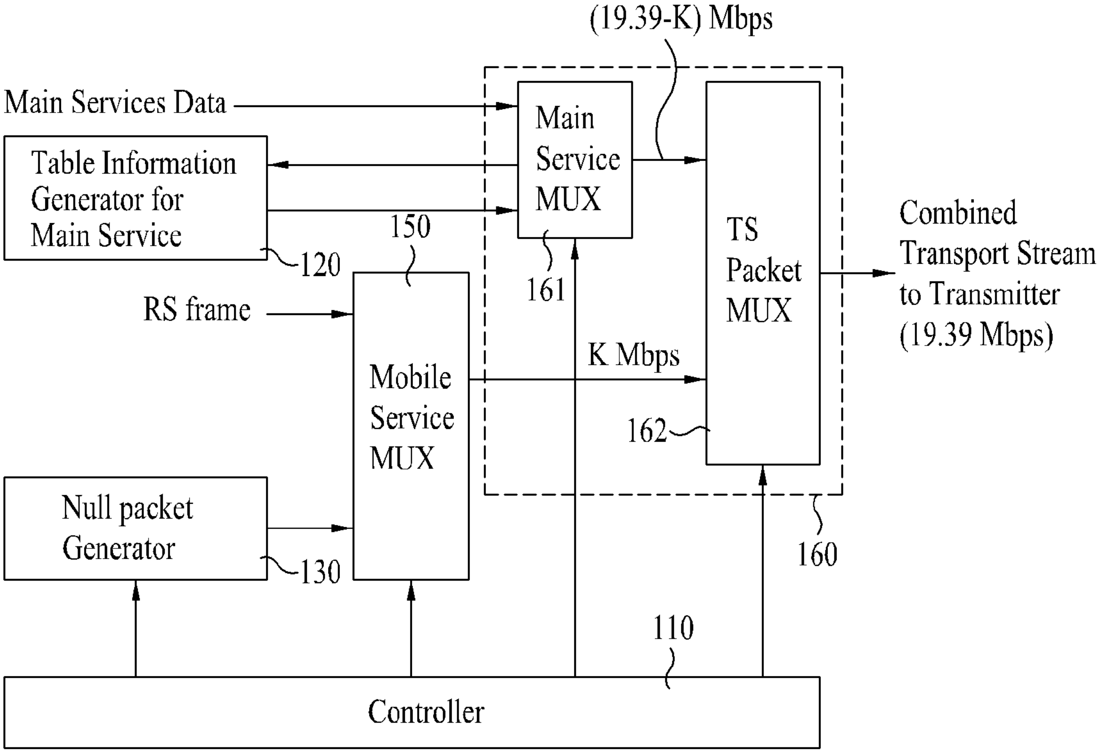
FIG. 18 illustrates a block diagram showing an example of a service multiplexer of FIG. 14.

FIG. 18 illustrates a block diagram showing an example of the service multiplexer. The service multiplexer includes a controller 110 for controlling the overall operations of the service multiplexer, a table information generator 120 for the main service, a null packet generator 130, an OM packet encapsulator 140, a mobile service multiplexer 150, and a transport multiplexer 160.

The transport multiplexer 160 may include a main service multiplexer 161 and a transport stream (TS) packet multiplexer 162.

Referring to FIG. 18, at least one type of compression-encoded main service data and table data generated from the table information generator 120 for the main services are inputted to the main service multiplexer 161 of the transport multiplexer 160. According to the embodiment of the present invention, the table information generator 120 generates PSI/PSIP table data, which is configured in the form of an MPEG-2 private section.

The main service multiplexer 161 respectively encapsulates each of the main service data and the PSI/PSIP table data, which are being inputted, to MPEG-2 TS packet formats, thereby multiplexing the encapsulated TS packets and outputting the multiplexed packets to the TS packet multiplexer 162. Herein, the data packet being outputted from the main service multiplexer 161 will hereinafter be referred to as a main service data packet for simplicity.

The mobile service multiplexer 150 receives and respectively encapsulates at least one type of compression-encoded mobile service data and the table information (e.g., PSI/PSIP table data) for mobile services to MPEG-2 TS packet formats. Then, the mobile service multiplexer 150 multiplexes the encapsulated TS packets, thereby outputting the multiplexed packets to the TS packet multiplexer 162. Hereinafter, the data packet being outputted from the mobile service multiplexer 150 will be referred to as a mobile service data packet for simplicity.

Alternatively, the mobile service multiplexer 150 receives and encapsulates an RS frame, which is generated by using at least one type of compression-encoded mobile service data and the table information for mobile services, to MPEG-2 TS packet formats. Then, the mobile service multiplexer 150 multiplexes the encapsulated TS packets, thereby outputting the multiplexed packets to the TS packet multiplexer 162. Hereinafter, the data packet being outputted from the mobile service multiplexer 150 will be referred to as a mobile service data packet for simplicity.

According to an embodiment of the present invention, the mobile service multiplexer 150 encapsulates an RS frame, which is inputted in any one of the formats shown in FIG. 15, FIG. 17A, or FIG. 17B, to a TS packet format.

At this point, the transmitter 200 requires identification information in order to identify and process the main service data packet and the mobile service data packet. Herein, the identification information may use values pre-decided in accordance with an agreement between the transmitting system and the receiving system, or may be configured of a separate set of data, or may modify predetermined location value with in the corresponding data packet.

As an example of the present invention, a different packet identifier (PID) may be assigned to identify each of the main service data packet and the mobile service data packet. More specifically, by assigning a PID, which does not use for the main service data packet, to the mobile service data packet, the transmitter 200 refers to a PID of data packet inputted, thereby can identify each of the main service data packet and the mobile service data packet.

In another example, by modifying a synchronization data byte within a header of the mobile service data, the service data packet may be identified by using the synchronization data byte value of the corresponding service data packet. For example, the synchronization byte of the main service data packet directly outputs the value decided by the ISO/IEC 13818-1 standard (i.e., 0x47) without any modification. The synchronization byte of the mobile service data packet modifies and outputs the value, thereby identifying the main service data packet and the mobile service data packet. Conversely, the synchronization byte of the main service data packet is modified and outputted, whereas the synchronization byte of the mobile service data packet is directly outputted without being modified, thereby enabling the main service data packet and the mobile service data packet to be identified.

A plurality of methods may be applied in the method of modifying the synchronization byte. For example, each bit of the synchronization byte may be inversed, or only a portion of the synchronization byte may be inversed.

As described above, any type of identification information may be used to identify the main service data packet and the mobile service data packet. Therefore, the scope of the present invention is not limited only to the example set forth in the description of the present invention.

Meanwhile, a transport multiplexer used in the conventional digital broadcasting system may be used as the transport multiplexer 160 according to the present invention. More specifically, in order to multiplex the mobile service data and the main service data and to transmit the multiplexed data, the data rate of the main service is limited to a data rate of (19.39−K) Mbps. Then, K Mbps, which corresponds to the remaining data rate, is assigned as the data rate of the mobile service. Thus, the transport multiplexer which is already being used may be used as it is without any modification.

Herein, the transport multiplexer 160 multiplexes the main service data packet being outputted from the main service multiplexer 161 and the mobile service data packet being outputted from the mobile service multiplexer 150. Thereafter, the transport multiplexer 160 transmits the multiplexed data packets to the transmitter 200.

However, in some cases, the output data rate of the mobile service multiplexer 150 may not be equal to K Mbps. For example, when the service multiplexer 100 assigns K Mbps of the 19.39 Mbps to the mobile service data, and when the remaining (19.39−K) Mbps is, therefore, assigned to the main service data, the data rate of the mobile service data that are multiplexed by the service multiplexer 100 actually becomes lower than K Mbps. This is because, in case of the mobile service data, the pre-processor of the transmitting system performs additional encoding, thereby increasing the amount of data. Eventually, the data rate of the mobile service data, which may be transmitted from the service multiplexer 100, becomes smaller than K Mbps.

For example, since the pre-processor of the transmitter performs an encoding process on the mobile service data at a coding rate of at least 1/2, the amount of the data outputted from the pre-processor is increased to more than twice the amount of the data initially inputted to the pre-processor. Therefore, the sum of the data rate of the main service data and the data rate of the mobile service data, both being multiplexed by the service multiplexer 100, becomes either equal to or smaller than 19.39 Mbps.

In order to set the final output data rate of the mobile service multiplexer 150 to K Mbps, the service multiplexer 100 of the present invention may perform various exemplary operations.

According to an embodiment of the present invention, the null packet generator 130 may generate a null data packet, which is then outputted to the mobile service multiplexer 150. Thereafter, the mobile service multiplexer 150 may multiplex the null data packet and the mobile service data packets, so as to set the output data rate to K Mbps.

At this point, the null data packet is transmitted to the transmitter 200, thereby being discarded. More specifically, the null data packet is not transmitted to the receiving system. In order to do so, identification information for identifying the null data is also required. Herein, the identification information for identifying the null data may also use a value predecided based upon an agreement between the transmitting system and the receiving system and may also be configured of a separate set of data. And, the identification information for identifying the null data may also change a predetermined position value within the null data packet and use the changed value. For example, the null packet generator 130 may modify (or change) a synchronization byte value within the header of the null data packet, thereby using the changed value as the identification information. Alternatively, the transport_error_indicator flag may be set to '1', thereby being used as the identification information. According to the embodiment of the present invention, the transport_error_indicator flag within the header of the null data packet is used as the identification information for identifying the null data packet. In this case, the transport_error_indicator flag of the null data packet is set to '1', and the transport_error_indicator flag for each of the other remaining data packets is reset to '0', so that the null data packet can be identified (or distinguished).

More specifically, when the null packet generator 130 generated a null data packet, and if, among the fields included in the header of the null data packet, the transport_error_indicator flag is set to '1' and then transmitted, the transmitter 200 may identify and discard the null data packet corresponding to the transport_error_indicator flag.

Herein, any value that can identify the null data packet may be used as the identification information for identifying the null data packet. Therefore, the present invention will not be limited only to the example proposed in the description of the present invention.

As another example of setting (or matching) the final output data rate of the mobile service multiplexer 150 to K Mbps, an operations and maintenance (OM) packet (also referred to as OMP) may be used. In this case, the mobile service multiplexer 150 may multiplex the mobile service data packet, the null data packet, and the OM packet, so as to set the output data rate to K Mbps.

Meanwhile, signaling data, such as transmission parameters, are required for enabling the transmitter 200 to process the mobile service data.

According to an embodiment of the present invention, the transmission parameter is inserted in the payload region of the OM packet, thereby being transmitted to the transmitter.

At this point, in order to enable the transmitter 200 to identify the insertion of the transmission parameter in the OM packet, identification information that can identify the insertion of the transmission parameter in the type field of the corresponding OM packet (i.e., OM_type field).

More specifically, an operations and maintenance packet (OMP) is defined for the purpose of operating and managing the transmitting system. For example, the OMP is configured in an MPEG-2 TS packet format, and the value of its respective PID is equal to '0x1FFA'. The OMP consists of a 4-byte header and a 184-byte payload. Among the 184 bytes, the first byte corresponds to the OM_type field indicating the type of the corresponding OM packet (OMP). And, the remaining 183 bytes correspond to an OM_payload field, wherein actual data are inserted.

According to the present invention, among the reserved field values of the OM_type field, a pre-arranged value is used, thereby being capable of indicating that a transmission parameter has been inserted in the corresponding OM packet. Thereafter, the transmitter 200 may locate (or identify) the corresponding OMP by referring to the respective PID. Subsequently, by parsing the OM_type field within the OMP, the transmitter 200 may be able to know (or recognize) whether or not a transmission parameter has been inserted in the corresponding OM packet.

The transmission parameters that can be transmitted to the OM packet include M/H frame information (e.g., M/H frame_index), FIC information (e.g., next_FIC_version_number), parade information (e.g., number_of_parades, parade_id, parade_repetition_cycle, and ensemble_id), group information (e.g., number_of_group and start_group_number), SCCC information (e.g., SCCC_block_mode and SCCC_outer_code_mode), RS frame information (e.g., RS_Frame_mode and RS_frame_continuity_counter), RS encoding information (e.g., RS_code_mode), and so on.

At this point, the OM packet in which the transmission parameter is inserted may be periodically generated by a constant cycle, so as to be multiplexed with the mobile service data packet.

The multiplexing rules and the generation of null data packets of the mobile service multiplexer 150, the main service multiplexer 161, and the TS packet multiplexer 160 are controlled by the controller 110.

The TS packet multiplexer 162 multiplexes a data packet being outputted from the main service multiplexer 161 at (19.39−K) Mbps with a data packet being outputted from the mobile service multiplexer 150 at K Mbps. Thereafter, the TS packet multiplexer 162 transmits the multiplexed data packet to the transmitter 200 at a data rate of 19.39 Mbps.

Transmitter

Figure 19:
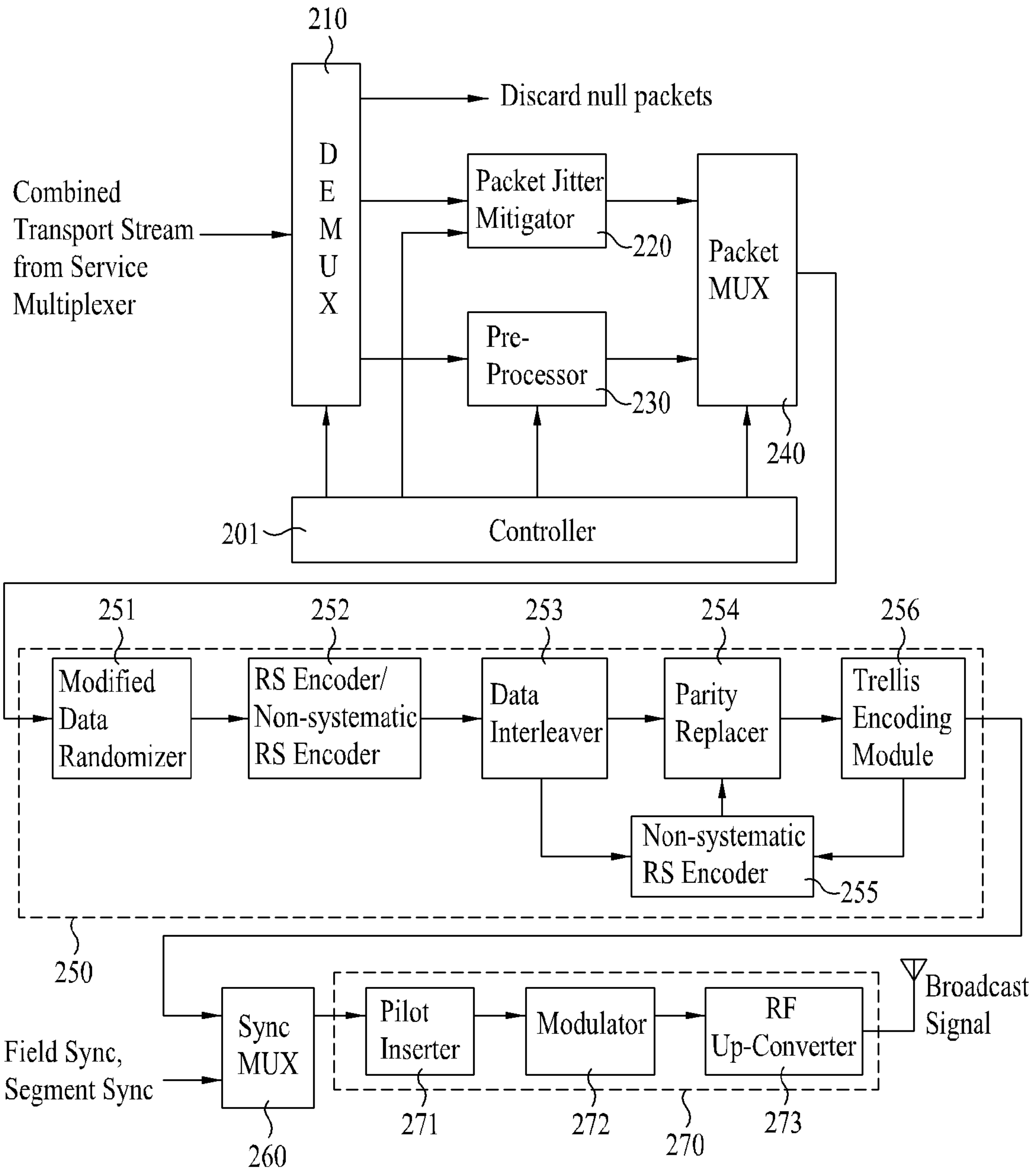
FIG. 19 illustrates a block diagram showing an embodiment of a transmitter of FIG. 14.

FIG. 19 illustrates a block diagram showing an example of the transmitter 200 according to an embodiment of the present invention. Herein, the transmitter 200 includes a controller 201, a demultiplexer 210, a packet jitter mitigator 220, a pre-processor 230, a packet multiplexer 240, a post-processor 250, a synchronization (sync) multiplexer 260, and a transmission unit 270.

Herein, when a data packet is received from the service multiplexer 100, the demultiplexer 210 should identify whether the received data packet corresponds to a main service data packet, a mobile service data packet, a null data packet, or an OM packet.

For example, the demultiplexer 210 uses the PID within the received data packet so as to identify the main service data packet, the mobile service data packet, and the null data packet. Then, the demultiplexer 210 uses a transport_error_indicator field to identify the null data packet.

If an OM packet is included in the received data packet, the OM packet may identify using the PID within the received data packet. And by using the OM_type field included in the identified OM packet, the demultiplexer 210 may be able to know whether or not a transmission parameter is included in the payload region of the corresponding OM packet and, then, received.

The main service data packet identified by the demultiplexer 210 is outputted to the packet jitter mitigator 220, the mobile service data packet is outputted to the pre-processor 230, and the null data packet is discarded. If the transmission parameter is included in the OM packet, the corresponding transmission parameter is extracted, so as to be outputted to the corresponding blocks. Thereafter, the OM packet is discarded. According to an embodiment of the present invention, the transmission parameter extracted from the OM packet is outputted to the corresponding blocks through the controller 201.

The pre-processor 230 performs an additional encoding process of the mobile service data included in the service data packet, which is demultiplexed and outputted from the demultiplexer 210. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes. The pre-processor 230 may also refer to the transmission parameter extracted in the OM packet when performing the additional encoding process.

Also, the pre-processor 230 groups a plurality of mobile service data packets to configure a data group. Thereafter, known data, mobile service data, RS parity data, and MPEG header are allocated to pre-determined regions within the data group.

Pre-Processor within Transmitter

Figure 20:
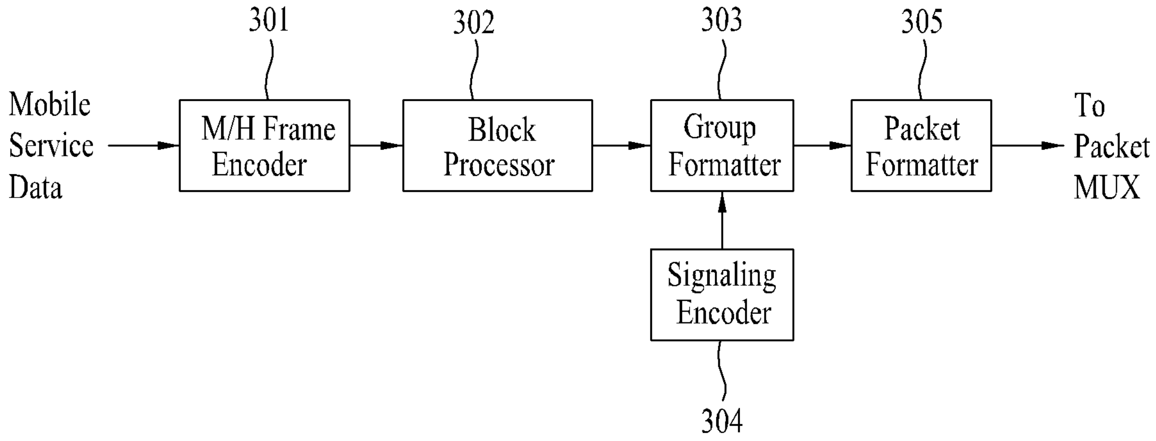
FIG. 20 illustrates a block diagram showing an example of a pre-processor of FIG. 19.

FIG. 20 illustrates a block diagram showing the structure of a pre-processor 230 according to the present invention. Herein, the pre-processor 230 includes an M/H frame encoder 301, a block processor 302, a group formatter 303, a signaling encoder 304, and a packet formatter 305.

The M/H frame encoder 301, which is included in the pre-processor 230 having the above-described structure, data-randomizes the mobile service data that are inputted to the demultiplexer 210, thereby generating a RS frame corresponding an ensemble. Then, the M/H frame encoder 301 performs an encoding process for error correction in RS frame units.

The M/H frame encoder 301 may include at least one RS frame encoder. More specifically, RS frame encoders may be provided in parallel, wherein the number of RS frame encoders is equal to the number of parades within the M/H frame. As described above, the M/H frame is a basic time cycle period for transmitting at least one parade. Also, each parade consists of one or two RS frames.

Figure 21:
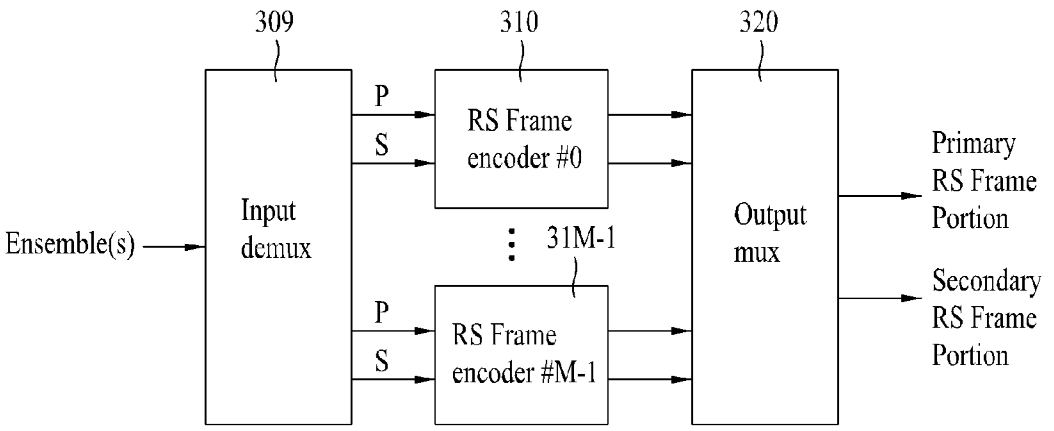
FIG. 21 illustrates a conceptual block diagram of the M/H frame encoder of FIG. 20.

FIG. 21 illustrates a conceptual block diagram of the M/H frame encoder 301 according to an embodiment of the present invention. The M/H frame encoder 301 includes an input demultiplexer (DEMUX) 309, M number of RS frame encoders 310 to 31M-1, and an output multiplexer (MUX) 320. Herein, M represent the number of parades included in one M/H frame.

The input demultiplexer 309 output the inputted mobile service data packet to a corresponding RS frame encoder among M number of RS frame encoders in ensemble units.

At this point, the ensemble may be mapped to the RS frame encoder or a parade. For example, when one parade is configured of one RS frame, each ensemble, RS frame, and parade may be mapped to be in a 1:1:1 (or one-to-one-to-one) correspondence.

According to an embodiment of the present invention, each RS frame encoder groups a plurality of mobile service data packets of the ensemble inputted, so as to configure an RS frame corresponding to the ensemble and, then, to perform an error correction encoding process in RS frame units. Also, each RS frame encoder divides the error-correction-encoded RS frame into a plurality of portions, in order to assign the error-correction-encoded RS frame data to a plurality of data groups. Based upon the RS frame mode of Table 1, data within one RS frame may be assigned either to all of regions A/B/C/D within multiple data groups, or to at least one of regions A/B and regions C/D within multiple data groups.

When the RS frame mode value is equal to '01', i.e., when the data of the primary RS frame are assigned to regions A/B of the corresponding data group and data of the secondary RS frame are assigned to regions C/D of the corresponding data group, each RS frame encoder generates a primary RS frame and a secondary RS frame for each parade. Conversely, when the RS frame mode value is equal to '00', when the data of the primary RS frame are assigned to all of regions A/B/C/D, each RS frame encoder generates a RS frame (i.e., a primary RS frame) for each parade.

Also, each RS frame encoder divides each RS frame into several portions. Each portion of the RS frame is equivalent to a data amount that can be transmitted by a data group. The output multiplexer (MUX) 320 multiplexes portions within M number of RS frame encoders 310 to 310M-1 are multiplexed and then outputted to the block processor 302.

For example, if one parade transmits two RS frames, portions of primary RS frames within M number of RS frame encoders 310 to 310M-1 are multiplexed and outputted. Thereafter, portions of secondary RS frames within M number of RS frame encoders 310 to 310M-1 are multiplexed and transmitted.

The input demultiplexer (DEMUX) 309 and the output multiplexer (MUX) 320 operate based upon the control of the controller 201. The controller 201 may provide necessary (or required) FEC modes to each RS frame encoder. The FEC mode includes the RS code mode, which will be described in detail in a later process.

Figure 22:
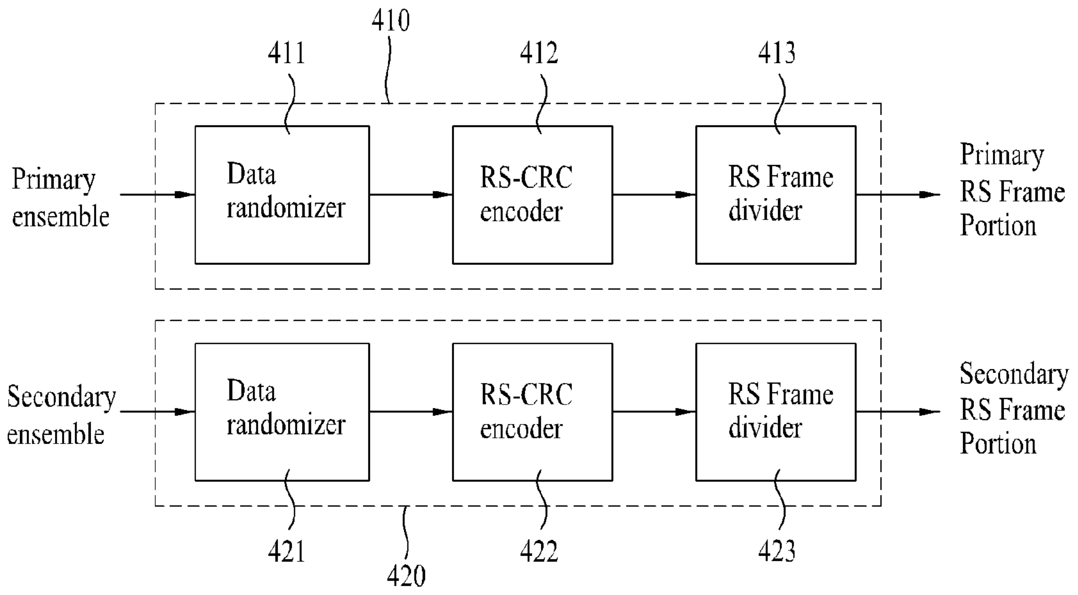
FIG. 22 illustrates a detailed block diagram of an RS frame encoder of FIG. 21.

FIG. 22 illustrates a detailed block diagram of an RS frame encoder among a plurality of RS frame encoders within an M/H frame encoder.

One RS frame encoder may include a primary encoder 410 and a secondary encoder 420. Herein, the secondary encoder 420 may or may not operate based upon the RS frame mode. For example, when the RS frame mode value is equal to '00', as shown in Table 1, the secondary encoder 420 does not operate.

The primary encoder 410 may include a data randomizer 411, a Reed-Solomon-cyclic redundancy check (RS-CRC) encoder (412), and a RS frame divider 413. And, the secondary encoder 420 may also include a data randomizer 421, a RS-CRC encoder (422), and a RS frame divider 423.

More specifically, the data randomizer 411 of the primary encoder 410 receives mobile service data of a primary ensemble outputted from the output demultiplexer (DEMUX) 309. Then, after randomizing the received mobile service data, the data randomizer 411 outputs the randomized data to the RS-CRC encoder 412. At this point, since the data randomizer 411 performs the randomizing process on the mobile service data, the randomizing process that is to be performed by the data randomizer 251 of the post-processor 250 on the mobile service data may be omitted. The data randomizer 411 may also discard the synchronization byte within the mobile service data packet and perform the randomizing process. This is an option that may be chosen by the system designer. In the example given in the present invention, the randomizing process is performed without discarding the synchronization byte within the corresponding mobile service data packet.

The RS-CRC encoder 412 generates a RS frame corresponding to the randomized primary ensemble, and performs forward error collection (FEC)-encoding in the RS frame unit using at least one of a Reed-Solomon (RS) code and a cyclic redundancy check (CRC) code. The RS-CRC encoder 412 outputs the FEC-encoded RS frame to the RS frame divider 413.

The RS-CRC encoder 412 groups a plurality of mobile service data packets that is randomized and inputted, so as to generate a RS frame. Then, the RS-CRC encoder 412 performs at least one of an error correction encoding process and an error detection encoding process in RS frame units. Accordingly, robustness may be provided to the mobile service data, thereby scattering group error that may occur during changes in a frequency environment, thereby enabling the mobile service data to respond to the frequency environment, which is extremely vulnerable and liable to frequent changes. Also, the RS-CRC encoder 412 groups a plurality of RS frame so as to generate a super frame, thereby performing a row permutation process in super frame units. The row permutation process may also be referred to as a "row interleaving process". Hereinafter, the process will be referred to as "row permutation" for simplicity. In the present invention, the row permutation process is optional.

More specifically, when the RS-CRC encoder 412 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process in the RS-CRC encoder 412. When performing the RS-encoding, parity data that are used for the error correction are generated. And, when performing the CRC encoding, CRC data that are used for the error detection are generated. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system.

Herein, the RS-CRC encoder 412 refers to a pre-determined transmission parameter provided by the controller 201 so as to perform operations including RS frame configuration, RS encoding, CRC encoding, super frame configuration, and row permutation in super frame units.

FIG. 23(*a*) and FIG. 23(*b*) illustrate a process of one or two RS frame being divided into several portions, based upon an RS frame mode value, and a process of each portion being assigned to a corresponding region within the respective data group. According to an embodiment of the present invention, the data assignment within the data group is performed by the group formatter 303.

More specifically, FIG. 23(*a*) shows an example of the RS frame mode value being equal to '00'. Herein, only the primary encoder 410 of FIG. 22 operates, thereby forming one RS frame for one parade. Then, the RS frame is divided into several portions, and the data of each portion are assigned to regions A/B/C/D within the respective data group. FIG. 23(*b*) shows an example of the RS frame mode value being equal to '01'. Herein, both the primary encoder 410 and the secondary encoder 420 of FIG. 22 operate, thereby forming two RS frames for one parade, i.e., one primary RS frame and one secondary RS frame. Then, the primary RS frame is divided into several portions, and the secondary RS frame is divided into several portions. At this point, the data of each portion of the primary RS frame are assigned to regions A/B within the respective data group. And, the data of each portion of the secondary RS frame are assigned to regions C/D within the respective data group.

Detailed Description of the RS Frame

Figure 24:
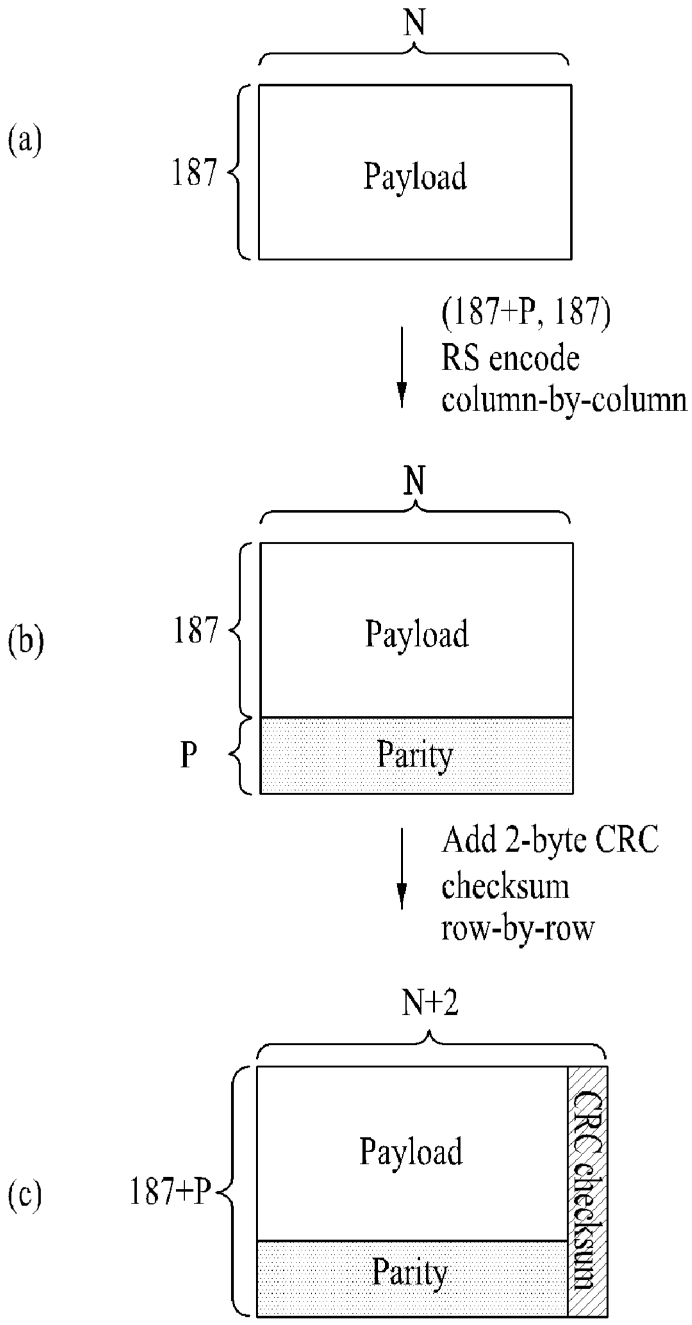
FIG. 24(*a*) to FIG. 24(*c*) illustrate error correction encoding and error detection encoding processes according to an embodiment of the present invention.

FIG. 24(*a*) illustrates an example of an RS frame being generated from the RS-CRC encoder 412 according to the present invention.

When the RS frame is generated, as shown in FIG. 24(*a*), the RS-CRC encoder 412 performs a (Nc,Kc)-RS encoding process on each column, so as to generate Nc−Kc(=P) number of parity bytes. Then, the RS-CRC encoder 412 adds the newly generated P number of parity bytes after the very last byte of the corresponding column, thereby generating a column of (187+P) bytes. Herein, as shown in FIG. 24(*a*), Kc is equal to 187 (i.e., Kc=187), and Nc is equal to 187+P (i.e., Nc=187+P). Herein, the value of P may vary depending upon the RS code mode. Table 6 below shows an example of an RS code mode, as one of the RS encoding information.

TABLE 6

| RS code mode | RS code | Number of Parity Bytes (P) |
|---|---|---|
| 00 | (211, 187) | 24 |
| 01 | (223, 187) | 36 |
| 10 | (235, 187) | 48 |
| 11 | Reserved | Reserved |

Table 6 shows an example of 2 bits being assigned in order to indicate the RS code mode. The RS code mode represents the number of parity bytes corresponding to the RS frame.

For example, when the RS code mode value is equal to '10', (235,187)-RS-encoding is performed on the RS frame of FIG. 24(*a*), so as to generate 48 parity data bytes. Thereafter, the 48 parity bytes are added after the last data byte of the corresponding column, thereby generating a column of 235 data bytes.

When the RS frame mode value is equal to '00' in Table 1 (i.e., when the RS frame mode indicates a single RS frame), only the RS code mode of the corresponding RS frame is indicated. However, when the RS frame mode value is equal to '01' in Table 1 (i.e., when the RS frame mode indicates multiple RS frames), the RS code mode corresponding to a primary RS frame and a secondary RS frame. More specifically, it is preferable that the RS code mode is independently applied to the primary RS frame and the secondary RS frame.

When such RS encoding process is performed on all N number of columns, a RS frame having the size of N(row)×(187+P) (column) bytes may be generated, as shown in FIG. 24(*b*).

Each row of the RS frame is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit.

The RS-CRC encoder 412 may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system.

FIG. 24(*c*) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 3 below corresponds to an exemplary equation for generating a 2-byte CRC checksum for each row being configured of N number of bytes.

$$g(x)=x^{16}+x^{12}+x^5+1 \qquad \text{Equation 3}$$

The process of adding a 2-byte checksum in each row is only exemplary. Therefore, the present invention is not limited only to the example proposed in the description set forth herein. As described above, when the process of RS encoding and CRC encoding are completed, the (N×187)-byte RS frame is expanded to a (N+2)×(187+P)-byte RS frame. Based upon an error correction scenario of a RS frame expanded as described above, the data bytes within the RS frame are transmitted through a channel in a row direction. At this point, when a large number of errors occur during a limited period of transmission time, errors also occur in a row direction within the RS frame being processed with a decoding process in the receiving system. However, in the perspective of RS encoding performed in a column direction, the errors are shown as being scattered. Therefore, error correction may be performed more effectively. At this point, a method of increasing the number of parity data bytes (P) may be used in order to perform a more intense error correction process. However, using this method may lead to a decrease in transmission efficiency. Therefore, a mutually advantageous method is required. Furthermore, when performing the decoding process, an erasure decoding process may be used to enhance the error correction performance.

Additionally, the RS-CRC encoder 412 according to the present invention also performs a row permutation (or interleaving) process in super frame units in order to further enhance the error correction performance when error correction the RS frame.

Figure 25:
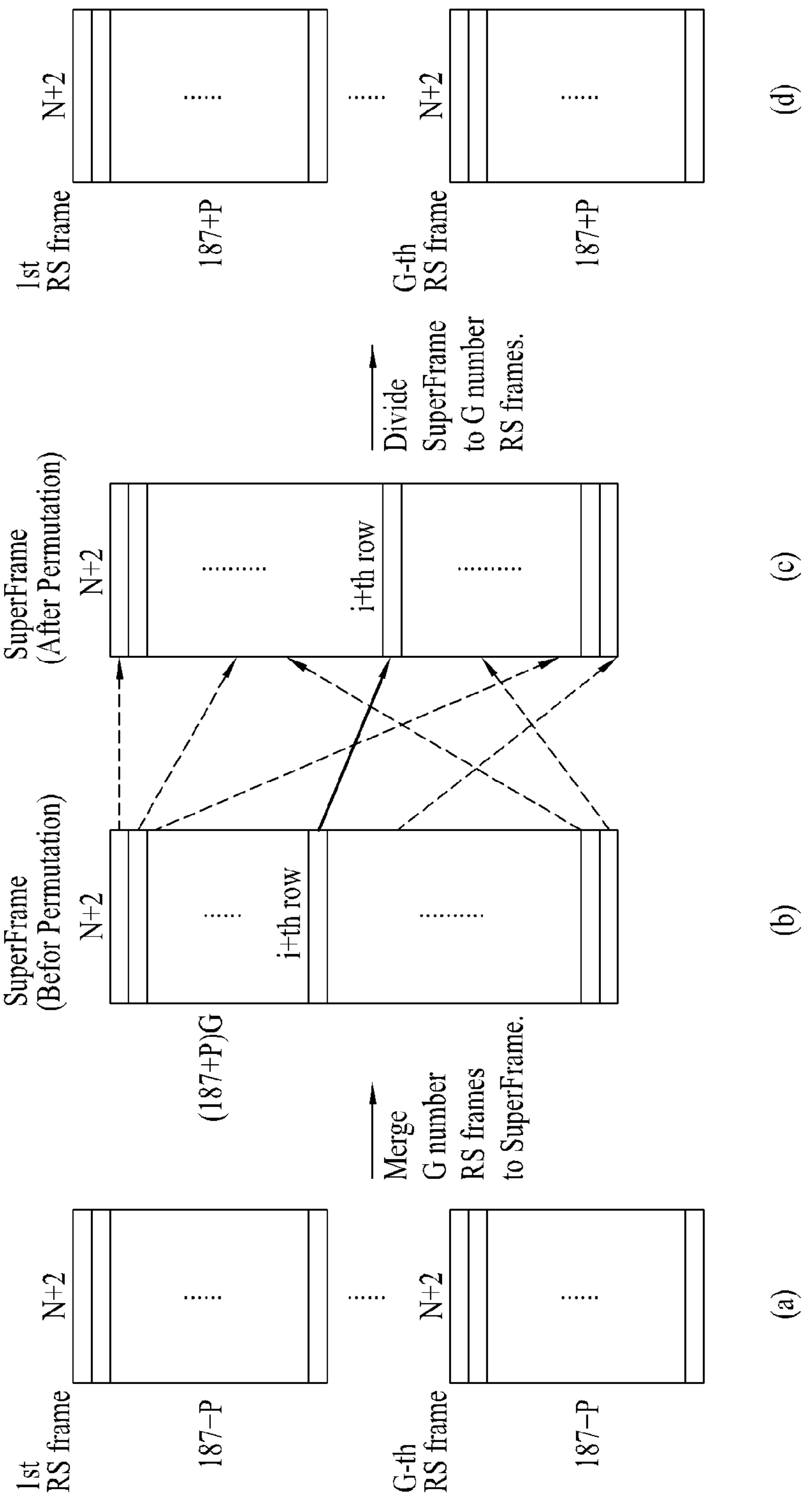
FIG. 25(*a*) to FIG. 25(*d*) illustrate an example of performing a row permutation (or interleaving) process in super frame units according to the present invention.

FIG. 25(*a*) to FIG. 25(*d*) illustrates an example of performing a row permutation process in super frame units according to the present invention. More specifically, G number of RS frames RS-CRC-encoded is grouped to form a super frame, as shown in FIG. 25(*a*). At this point, since each RS frame is formed of (N+2)×(187+P) number of bytes, one super frame is configured to have the size of (N+2)×(187+P)×G bytes.

When a row permutation process permuting each row of the super frame configured as described above is performed based upon a pre-determined permutation rule, the positions of the rows prior to and after being permuted (or interleaved) within the super frame may be altered. More specifically, the $i^{th}$ row of the super frame prior to the interleaving process, as shown in FIG. 25(*b*), is positioned in the $j^{th}$ row of the same super frame after the row permutation process, as shown in FIG. 25(*c*). The above-described relation between i and j can be easily understood with reference to a permutation rule as shown in Equation 4 below.

$$j=G(i \bmod (187+P))+\lfloor i/(187+P)\rfloor$$

$$i=(187+P)(j \bmod G)+\lfloor j/G\rfloor \qquad \text{Equation 4}$$

where $0 \leqq i, j \leqq (187+P)G-1$; or where $0 \leqq i, j < (187+P)G$

Herein, each row of the super frame is configured of (N+2) number of data bytes even after being row-permuted in super frame units.

When all row permutation processes in super frame units are completed, the super frame is once again divided into G number of row-permuted RS frames, as shown in FIG. 25(*d*), and then provided to the RS frame divider 413. Herein, the number of RS parity bytes and the number of columns should be equally provided in each of the RS frames, which configure a super frame. As described in the error correction scenario of a RS frame, in case of the super frame, a section having a large number of error occurring therein is so long that, even when one RS frame that is to be decoded includes an excessive number of errors (i.e., to an extent that the errors cannot be corrected), such errors are scattered throughout the entire super frame. Therefore, in comparison with a single RS frame, the decoding performance of the super frame is more enhanced.

The above description of the present invention corresponds to the processes of forming (or creating) and encoding an RS frame, when a data group is divided into regions A/B/C/D, and when data of an RS frame are assigned to all of regions A/B/C/D within the corresponding data group. More specifically, the above description corresponds to an embodiment of the present invention, wherein one RS frame is transmitted using one parade. In this embodiment, the secondary encoder 420 does not operate (or is not active).

Meanwhile, 2 RS frames are transmitting using one parade, the data of the primary RS frame may be assigned to regions A/B within the data group and be transmitted, and the data of the secondary RS frame may be assigned to regions C/D within the data group and be transmitted. At this point, the primary encoder 410 receives the mobile service data packets that are to be assigned to regions A/B within the data group, so as to form the primary RS frame, thereby performing RS-encoding and CRC-encoding. Similarly, the secondary encoder 420 receives the mobile service data packets that are to be assigned to regions C/D within the data group, so as to form the secondary RS frame, thereby performing RS-encoding and CRC-encoding. More specifically, the primary RS frame and the secondary RS frame are generated independently.

Figure 26:
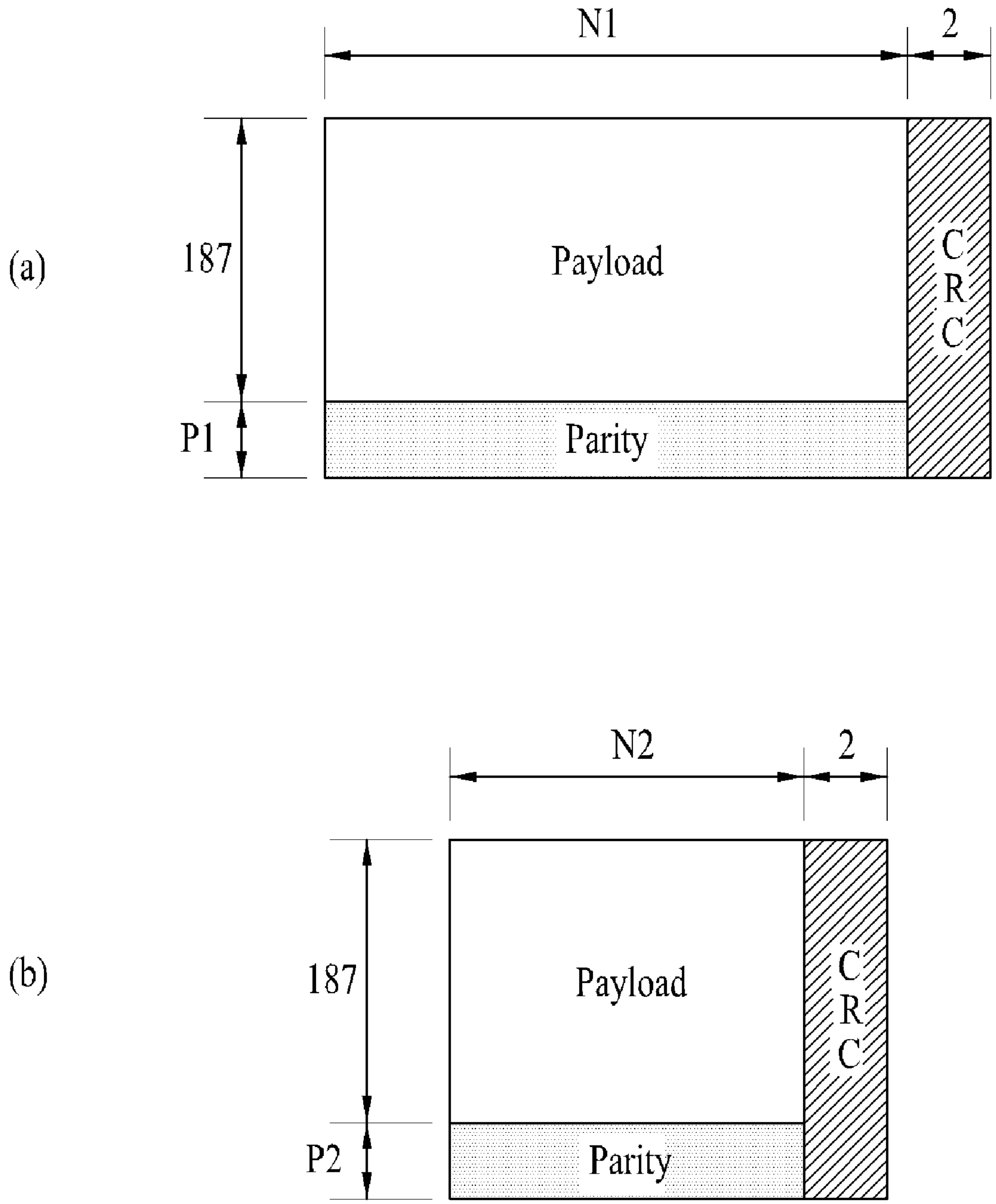
FIG. 26(*a*) and FIG. 26(*b*) illustrate an example which a parade consists of two RS frames.

FIG. 26 illustrates examples of receiving the mobile service data packets that are to be assigned to regions A/B within the data group, so as to form the primary RS frame, and receives the mobile service data packets that are to be assigned to regions C/D within the data group, so as to form the secondary RS frame, thereby performing error correction encoding and error detection encoding on each of the first and secondary RS frames.

More specifically, FIG. 26(*a*) illustrates an example of the RS-CRC encoder 412 of the primary encoder 410 receiving mobile service data packets of the primary ensemble that are to be assigned to regions A/B within the corresponding data group, so as to generated an RS frame having the size of N1(row)x187(column). Then, in this example, the primary encoder 410 performs RS-encoding on each column of the RS frame generated as described above, thereby adding P1 number of parity data bytes in each column. Finally, the primary encoder 410 performs CRC-encoding on each row, thereby adding a 2-byte checksum in each row.

FIG. 26(*b*) illustrates an example of the RS-CRC encoder 422 of the secondary encoder 420 receiving mobile service data packets of the secondary ensemble that are to be assigned to regions C/D within the corresponding data group, so as to generate an RS frame having the size of N2(row)×187(column). Then, in this example, the secondary encoder 420 performs RS-encoding on each column of the RS frame generated as described above, thereby adding P2 number of parity data bytes in each column. Finally, the secondary encoder 420 performs CRC-encoding on each row, thereby adding a 2-byte checksum in each row.

At this point, each of the RS-CRC encoders 412 and 422 may refer to a pre-determined transmission parameter provided by the controller 201, the RS-CRC encoders 412 and 422 may be informed of M/H frame information, FIC information, RS frame information (including RS frame mode information), RS encoding information (including RS code mode), SCCC information (including SCCC block mode information and SCCC outer code mode information), data group information, and region information within a data group. The RS-CRC encoders 412 and 422 may refer to the transmission parameters for the purpose of RS frame configuration, error correction encoding, error detection encoding. Furthermore, the transmission parameters should also be transmitted to the receiving system so that the receiving system can perform a normal decoding process. At this point, as an example of the present invention, the transmission parameter is transmitted through transmission parameter channel (TPC) to a receiving system. The TPC will be described in detail in a later.

The data of the primary RS frame, which is encoded by RS frame units and row-permuted by super frame units from the RS-CRC encoder 412 of the primary encoder 410, are outputted to the RS frame divider 413. If the secondary encoder 420 also operates in the embodiment of the present invention, the data of the secondary RS frame, which is encoded by RS frame units and row-permuted by super frame units from the RS-CRC encoder 422 of the secondary encoder 420, are outputted to the RS frame divider 423. The RS frame divider 413 of the primary encoder 410 divides the primary RS frame into several portions, which are then outputted to the output multiplexer (MUX) 320. Each portion of the primary RS frame is equivalent to a data amount that can be transmitted by one data group. Similarly, the RS frame divider 423 of the secondary encoder 420 divides the secondary RS frame into several portions, which are then outputted to the output multiplexer (MUX) 320.

Hereinafter, the RS frame divider 413 of the primary RS encoder 410 will now be described in detail. Also, in order to simplify the description of the present invention, it is assumed that an RS frame having the size of N(row)×187(column), as shown in FIG. 24(*a*) to FIG. 24(*c*), that P number of parity data bytes are added to each column by RS-encoding the RS frame, and that a 2-byte checksum is added to each row by CRC-encoding the RS frame. Accordingly, the RS frame divider 413 divides (or partitions) the encoded RS frame having the size of (N+2) (row)×187(column) into several portions, each having the size of PL (wherein PL corresponds to the length of the RS frame portion).

At this point, as shown in Table 2 to Table 5, the value of PL may vary depending upon the RS frame mode, SCCC block mode, and SCCC outer coder mode. Also, the total number of data bytes of the RS-encoded and CRC-encoded RS frame is equal to or smaller than 5×NoG×PL. In this case, the RS frame is divided (or partitioned) into ((5×NoG)−1) number of portions each having the size of PL and one portion having a size equal to smaller than PL. More specifically, with the exception of the last portion of the RS frame, each of the remaining portions of the RS frame has an equal size of PL. If the size of the last portion is smaller than PL, a stuffing byte (or dummy byte) may be inserted in order to fill (or replace) the lacking number of data bytes, thereby enabling the last portion of the RS frame to also be equal to PL. Each portion of an RS frame corresponds to the amount of data that are to be SCCC-encoded and mapped into a single data group of a parade.

Figure 27:
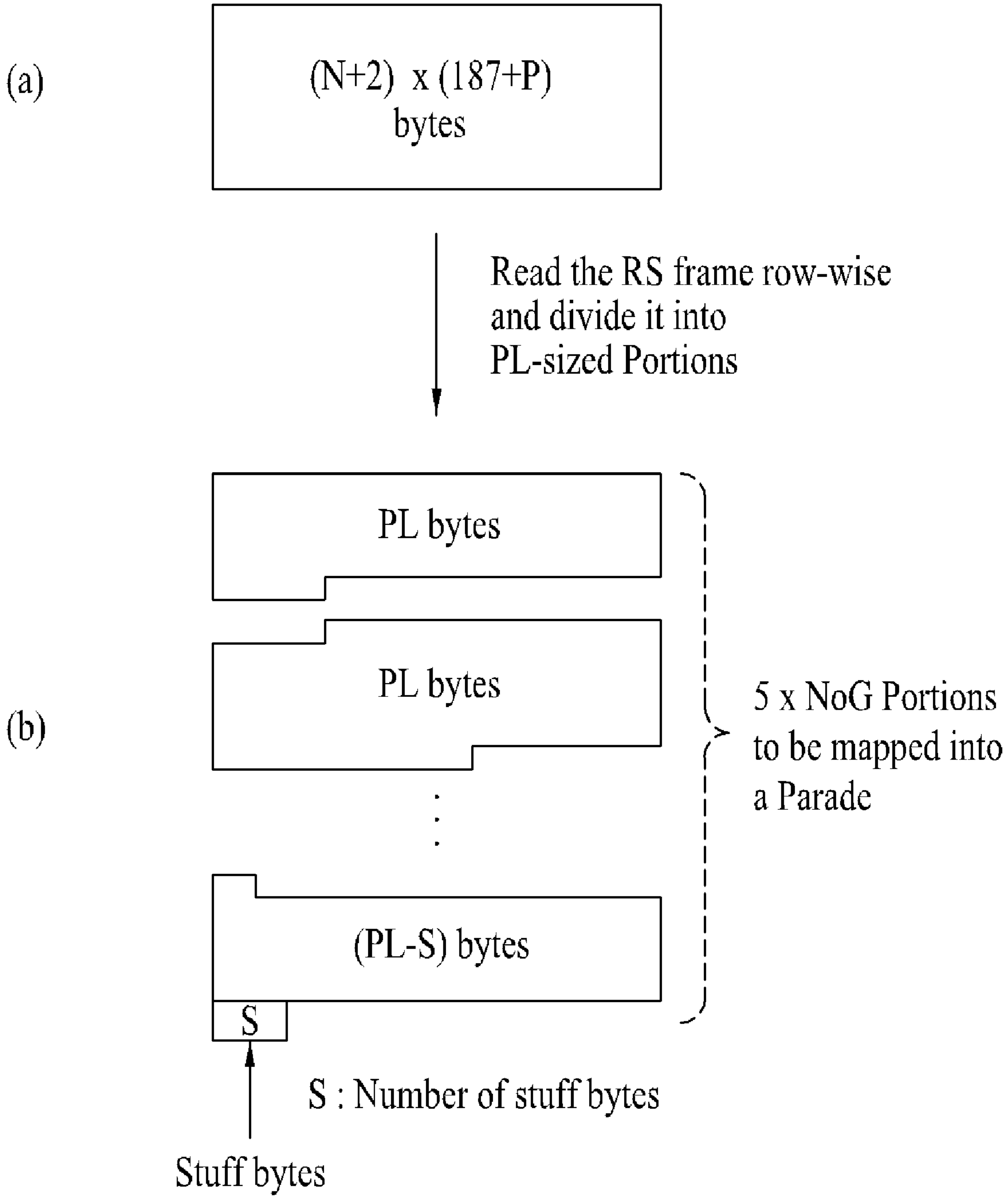
FIG. 27(*a*) and FIG. 27(*b*) illustrate an exemplary process of dividing an RS frame for configuring a data group according to the present invention.

FIG. 27(*a*) and FIG. 27(*b*) respectively illustrate examples of adding S number of stuffing bytes, when an RS frame having the size of (N+2) (row)×(187+P) (column) is divided into 5×NoG number of portions, each having the size of PL. More specifically, the RS-encoded and CRC-encoded RS frame, shown in FIG. 27(*a*), is divided into several portions, as shown in FIG. 27(*b*). The number of divided portions at the RS frame is equal to (5×NoG). Particularly, the first ((S×NoG)−1) number of portions each has the size of PL, and the last portion of the RS frame may be equal to or smaller than PL. If the size of the last portion is smaller than PL, a stuffing byte (or dummy byte) may be inserted in order to fill (or replace) the lacking number of data bytes, as shown in Equation 5 below, thereby enabling the last portion of the RS frame to also be equal to PL.

$$S=(5\times NoG\times PL)-((N+2)\times(187+P)) \qquad \text{Equation 5}$$

Herein, each portion including data having the size of PL passes through the output multiplexer 320 of the M/H frame encoder 301, which is then outputted to the block processor 302.

At this point, the mapping order of the RS frame portions to a parade of data groups in not identical with the group assignment order defined in Equation 1. When given the group positions of a parade in an M/H frame, the SCCC-encoded RS frame portions will be mapped in a time order (i.e., in a left-to-right direction).

For example, as shown in FIG. 11, data groups of the 2$^{nd}$ parade (Parade #1) are first assigned (or allocated) to the 13$^{th}$ slot (Slot #12) and then assigned to the 3$^{rd}$ slot (Slot #2). However, when the data are actually placed in the assigned slots, the data are placed in a time sequence (or time order, i.e., in a left-to-right direction). More specifically, the 1$^{st}$ data group of Parade #1 is placed in Slot #2, and the 2$^{nd}$ data group of Parade #1 is placed in Slot #12.

Block Processor

Meanwhile, the block processor 302 performs an SCCC outer encoding process on the output of the M/H frame encoder 301. More specifically, the block processor 302 receives the data of each error correction encoded portion. Then, the block processor 302 encodes the data once again at a coding rate of 1/H (wherein H is an integer equal to or greater than 2 (i.e., H≧2)), thereby outputting the 1/H-rate encoded data to the group formatter 303. According to the embodiment of the present invention, the input data are encoded either at a coding rate of 1/2 (also referred to as "1/2-rate encoding") or at a coding rate of 1/4 (also referred to as "1/4-rate encoding"). The data of each portion outputted from the M/H frame encoder 301 may include at least one of pure mobile service data, RS parity data, CRC data, and stuffing data. However, in a broader meaning, the data included in each portion may correspond to data for mobile services. Therefore, the data included in each portion will all be considered as mobile service data and described accordingly.

The group formatter 303 inserts the mobile service data SCCC-outer-encoded and outputted from the block processor 302 in the corresponding region within the data group, which is formed in accordance with a pre-defined rule. Also, in association with the data deinterleaving process, the group formatter 303 inserts various place holders (or known data place holders) in the corresponding region within the data group. Thereafter, the group formatter 303 deinterleaves the data within the data group and the place holders.

According to the present invention, with reference to data after being data-interleaved, as shown in FIG. 5, a data groups is configured of 10 M/H blocks (B1 to B10) and divided into 4 regions (A, B, C, and D). Also, as shown in FIG. 5, when it is assumed that the data group is divided into a plurality of hierarchical regions, as described above, the block processor 302 may encode the mobile service data, which are to be inserted to each region based upon the characteristic of each hierarchical region, at different coding rates. For example, the block processor 302 may encode the mobile service data, which are to be inserted in region A/B within the corresponding data group, at a coding rate of 1/2. Then, the group formatter 303 may insert the 1/2-rate encoded mobile service data to region A/B. Also, the block processor 302 may encode the mobile service data, which are to be inserted in region C/D within the corresponding data group, at a coding rate of 1/4having higher (or stronger) error correction ability than the 1/2-coding rate. Thereafter, the group formatter 303 may insert the 1/2-rate encoded mobile service data to region C/D. In another example, the block processor 302 may encode the mobile service data, which are to be inserted in region C/D, at a coding rate having higher error correction ability than the 1/4-coding rate. Then, the group formatter 303 may either insert the encoded mobile service data to region C/D, as described above, or leave the data in a reserved region for future usage.

According to another embodiment of the present invention, the block processor 302 may perform a 1/H-rate encoding process in SCCC block units. Herein, the SCCC block includes at least one M/H block. At this point, when 1/H-rate encoding is performed in M/H block units, the M/H blocks (B1 to B10) and the SCCC block (SCB1 to SCB10) become identical to one another (i.e., SCB1=B1, SCB2=B2, SCB3=B3, SCB4=B4, SCB5=B5, SCB6=B6, SCB7=B7, SCB8=B8, SCB9=B9, and SCB10=B10). For example, the M/H block 1 (B1) may be encoded at the coding rate of 1/2, the M/H block 2 (B2) may be encoded at the coding rate of 1/4, and the M/H block 3 (B3) may be encoded at the coding rate of 1/2. The coding rates are applied respectively to the remaining M/H blocks.

Alternatively, a plurality of M/H blocks within regions A, B, C, and D may be grouped into one SCCC block, thereby being encoded at a coding rate of 1/H in SCCC block units. Accordingly, the receiving performance of region C/D may be enhanced. For example, M/H block 1 (B1) to M/H block 5 (B5) may be grouped into one SCCC block and then encoded at a coding rate of 1/2. Thereafter, the group formatter 303 may insert the 1/2-rate encoded mobile service data to a section starting from M/H block 1 (B1) to M/H block 5 (B5). Furthermore, M/H block 6 (B6) to M/H block 10 (B10) may be grouped into one SCCC block and then encoded at a coding rate of 1/4. Thereafter, the group formatter 303 may insert the 1/4-rate encoded mobile service data to another section starting from M/H block 6 (B6) to M/H block 10 (B10). In this case, one data group may consist of two SCCC blocks.

According to another embodiment of the present invention, one SCCC block may be formed by grouping two M/H blocks. For example, M/H block 1 (B1) and M/H block 6 (B6) may be grouped into one SCCC block (SCB1). Similarly, M/H block 2 (B2) and M/H block 7 (B7) may be grouped into another SCCC block (SCB2). Also, M/H block 3 (B3) and M/H block 8 (B8) may be grouped into another SCCC block (SCB3). And, M/H block 4 (B4) and M/H block 9 (B9) may be grouped into another SCCC block (SCB4). Furthermore, M/H block 5 (B5) and M/H block 10 (B10) may be grouped into another SCCC block (SCB5). In the above-described example, the data group may consist of 10 M/H blocks and 5 SCCC blocks. Accordingly, in a data (or signal) receiving environment undergoing frequent and severe channel changes, the receiving performance of regions C and D, which is relatively more deteriorated than the receiving performance of region A, may be reinforced. Furthermore, since the number of mobile service data symbols increases more and more from region A to region D, the error correction encoding performance becomes more and more deteriorated. Therefore, when grouping a plurality of M/H block to form one SCCC block, such deterioration in the error correction encoding performance may be reduced.

As described-above, when the block processor 302 performs encoding at a 1/H-coding rate, information associated with SCCC should be transmitted to the receiving system in order to accurately recover the mobile service data. Table 7 below shows an example of a SCCC block mode, which indicating the relation between an M/H block and an SCCC block, among diverse SCCC block information.

TABLE 7

| | SCCC Block Mode | | | |
|---|---|---|---|---|
| | 00 | 01 | 10 | 11 |
| | Description | | | |
| SCB | One M/H Block per SCCC Block SCB input, M/H Block | Two M/H Blocks per SCCC Block SCB input, M/H Blocks | Reserved | Reserved |
| SCB1 | B1 | B1 + B6 | | |
| SCB2 | B2 | B2 + B7 | | |
| SCB3 | B3 | B3 + B8 | | |
| SCB4 | B4 | B4 + B9 | | |
| SCB5 | B5 | B5 + B10 | | |
| SCB6 | B6 | — | | |
| SCB7 | B7 | — | | |
| SCB8 | B8 | — | | |
| SCB9 | B9 | — | | |
| SCB10 | B10 | — | | |

More specifically, Table 4 shows an example of 2 bits being allocated in order to indicate the SCCC block mode. For example, when the SCCC block mode value is equal to ‘00’, this indicates that the SCCC block and the M/H block are identical to one another. Also, when the SCCC block mode value is equal to ‘01’, this indicates that each SCCC block is configured of 2 M/H blocks.

As described above, if one data group is configured of 2 SCCC blocks, although it is not indicated in Table 7, this information may also be indicated as the SCCC block mode. For example, when the SCCC block mode value is equal to ‘10’, this indicates that each SCCC block is configured of 5 M/H blocks and that one data group is configured of 2 SCCC blocks. Herein, the number of M/H blocks included in an SCCC block and the position of each M/H block may vary depending upon the settings made by the system designer. Therefore, the present invention will not be limited to the examples given herein. Accordingly, the SCCC mode information may also be expanded.

An example of a coding rate information of the SCCC block, i.e., SCCC outer code mode, is shown in Table 8 below.

TABLE 8

| SCCC outer code mode (2 bits) | Description |
|---|---|
| 00 | Outer code rate of SCCC block is ½ rate |
| 01 | Outer code rate of SCCC block is ¼ rate |
| 10 | Reserved |
| 11 | Reserved |

More specifically, Table 8 shows an example of 2 bits being allocated in order to indicate the coding rate information of the SCCC block. For example, when the SCCC outer code mode value is equal to '00', this indicates that the coding rate of the corresponding SCCC block is 1/2. And, when the SCCC outer code mode value is equal to '01', this indicates that the coding rate of the corresponding SCCC block is 1/4.

If the SCCC block mode value of Table 7 indicates '00', the SCCC outer code mode may indicate the coding rate of each M/H block with respect to each M/H block. In this case, since it is assumed that one data group includes 10 M/H blocks and that 2 bits are allocated for each SCCC block mode, a total of 20 bits are required for indicating the SCCC block modes of the 10 M/H modes. In another example, when the SCCC block mode value of Table 7 indicates '00', the SCCC outer code mode may indicate the coding rate of each region with respect to each region within the data group. In this case, since it is assumed that one data group includes 4 regions (i.e., regions A, B, C, and D) and that 2 bits are allocated for each SCCC block mode, a total of 8 bits are required for indicating the SCCC block modes of the 4 regions. In another example, when the SCCC block mode value of Table 7 is equal to '01', each of the regions A, B, C, and D within the data group has the same SCCC outer code mode.

Meanwhile, an example of an SCCC output block length (SOBL) for each SCCC block, when the SCCC block mode value is equal to '00', is shown in Table 9 below.

TABLE 9

| | | SIBL | |
|---|---|---|---|
| SCCC Block | SOBL | ½ rate | ¼ rate |
| SCB1 (B1) | 528 | 264 | 132 |
| SCB2 (B2) | 1536 | 768 | 384 |
| SCB3 (B3) | 2376 | 1188 | 594 |
| SCB4 (B4) | 2388 | 1194 | 597 |
| SCB5 (B5) | 2772 | 1386 | 693 |
| SCB6 (B6) | 2472 | 1236 | 618 |
| SCB7 (B7) | 2772 | 1386 | 693 |
| SCB8 (B8) | 2508 | 1254 | 627 |
| SCB9 (B9) | 1416 | 708 | 354 |
| SCB10 (B10) | 480 | 240 | 120 |

More specifically, when given the SCCC output block length (SOBL) for each SCCC block, an SCCC input block length (SIBL) for each corresponding SCCC block may be decided based upon the outer coding rate of each SCCC block. The SOBL is equivalent to the number of SCCC output (or outer-encoded) bytes for each SCCC block. And, the SIBL is equivalent to the number of SCCC input (or payload) bytes for each SCCC block. Table 10 below shows an example of the SOBL and SIBL for each SCCC block, when the SCCC block mode value is equal to '01'.

TABLE 10

| | | SIBL | |
|---|---|---|---|
| SCCC Block | SOBL | ½ rate | ¼ rate |
| SCB1 (B1 + B6) | 528 | 264 | 132 |
| SCB2 (B2 + B7) | 1536 | 768 | 384 |
| SCB3 (B3 + B8) | 2376 | 1188 | 594 |
| SCB4 (B4 + B9) | 2388 | 1194 | 597 |
| SCB5 (B5 + B10) | 2772 | 1386 | 693 |

Figure 28:
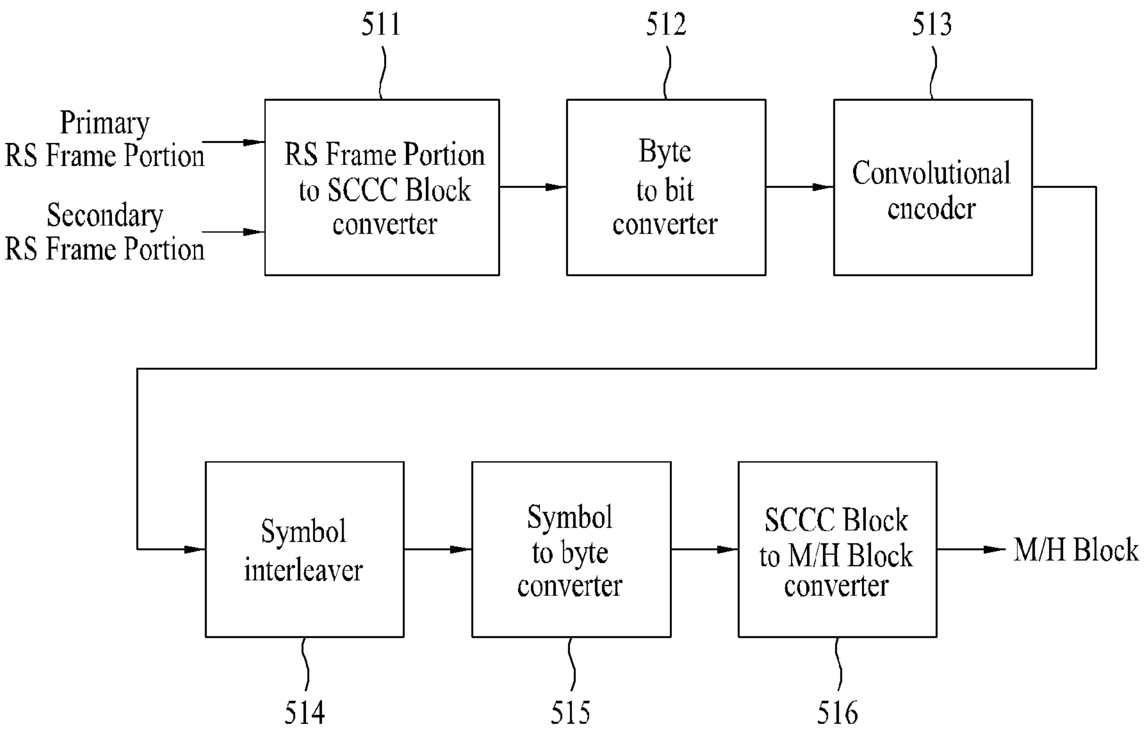
FIG. 28 illustrates a block diagram of a block processor according to an embodiment of the present invention.

In order to do so, as shown in FIG. 28, the block processor 302 includes a RS frame portion-SCCC block converter 511, a byte-bit converter 512, a convolution encoder 513, a symbol interleaver 514, a symbol-byte converter 515, and an SCCC block-M/H block converter 516. The convolutional encoder 513 and the symbol interleaver 514 are virtually concatenated with the trellis encoding module in the post-processor in order to configure an SCCC block. More specifically, the RS frame portion-SCCC block converter 511 divides the RS frame portions, which are being inputted, into multiple SCCC blocks using the SIBL of Table 9 and Table 10 based upon the RS code mode, SCCC block mode, and SCCC outer code mode. Herein, the M/H frame encoder 301 may output only primary RS frame portions or both primary RS frame portions and secondary RS frame portions in accordance with the RS frame mode.

When the RS Frame mode is set to '00', a portion of the primary RS Frame equal to the amount of data, which are to be SCCC outer encoded and mapped to 10 M/H blocks (B1 to B10) of a data group, will be provided to the block processor 302. When the SCCC block mode value is equal to '00', then the primary RS frame portion will be split into 10 SCCC Blocks according to Table 9. Alternatively, when the SCCC block mode value is equal to '01', then the primary RS frame will be split into 5 SCCC blocks according to Table 10.

When the RS frame mode value is equal to '01', then the block processor 302 may receive two RS frame portions. The RS frame mode value of '01' will not be used with the SCCC block mode value of '01'. The first portion from the primary RS frame will be SCCC-outer-encoded as SCCC Blocks SCB3, SCB4, SCB5, SCB6, SCB7, and SCB8 by the block processor 302. The SCCC Blocks SCB3 and SCB8 will be mapped to region B and the SCCC blocks SCB4, SCB5, SCB6, and SCB7 shall be mapped to region A by the group formatter 303. The second portion from the secondary RS frame will also be SCCC-outer-encoded, as SCB1, SCB2, SCB9, and SCB10, by the block processor 302. The group formatter 303 will map the SCCC blocks SCB1 and SCB10 to region D as the M/H blocks B1 and B10, respectively. Similarly, the SCCC blocks SCB2 and SCB9 will be mapped to region C as the M/H blocks B2 and B9.

The byte-bit converter 512 identifies the mobile service data bytes of each SCCC block outputted from the RS frame portion-SCCC block converter 511 as data bits, which are then outputted to the convolution encoder 513. The convolution encoder 513 performs one of 1/2-rate encoding and 1/4-rate encoding on the inputted mobile service data bits.

Figure 29:
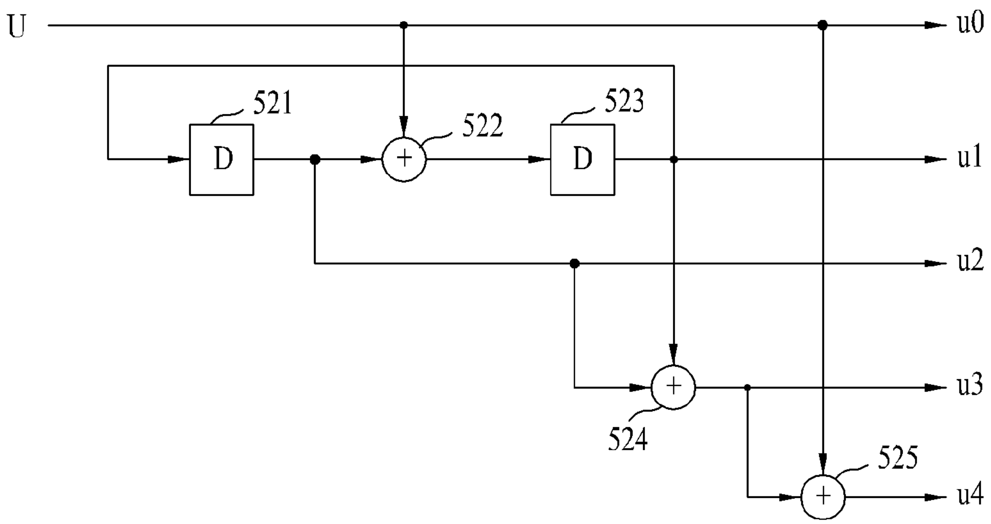
FIG. 29 illustrates a detailed block diagram of a convolution encoder of the block processor.

FIG. 29 illustrates a detailed block diagram of the convolution encoder 513. The convolution encoder 513 includes two delay units 521 and 523 and three adders 522, 524, and 525. Herein, the convolution encoder 513 encodes an input data bit U and outputs the coded bit U to 5 bits (u0 to u4). At this point, the input data bit U is directly outputted as uppermost bit u0 and simultaneously encoded as lower bit u1u2u3u4 and then outputted. More specifically, the input data bit U is directly outputted as the uppermost bit u0 and simultaneously outputted to the first and third adders 522 and 525.

The first adder 522 adds the input data bit U and the output bit of the first delay unit 521 and, then, outputs the added bit to the second delay unit 523. Then, the data bit delayed by a pre-determined time (e.g., by 1 clock) in the second delay unit 523 is outputted as a lower bit u1 and simultaneously fed-back to the first delay unit 521. The first delay unit 521 delays the data bit fed-back from the second delay unit 523 by a pre-determined time (e.g., by 1 clock). Then, the first delay unit 521 outputs the delayed data bit as a lower bit u2 and, at the same time, outputs the fed-back data to the first adder 522 and the second adder 524. The second adder 524 adds the data bits outputted from the first and second delay units 521 and 523 and outputs the added data bits as a lower bit u3. The third adder 525 adds the input data bit U and the output of the second delay unit 523 and outputs the added data bit as a lower bit u4.

At this point, the first and second delay units 521 and 523 are reset to '0', at the starting point of each SCCC block. The convolution encoder 513 of FIG. 29 may be used as a 1/2-rate encoder or a 1/4-rate encoder. More specifically, when a portion of the output bit of the convolution encoder 513, shown in FIG. 29, is selected and outputted, the convolution encoder 513 may be used as one of a 1/2-rate encoder and a 1/4-rate encoder. Table 11 below shown an example of output symbols of the convolution encoder 513.

TABLE 11

| Region | ½ rate | ¼ rate: SCCC block mode = '00' | ¼ rate: SCCC block mode = '01' |
|---|---|---|---|
| A, B<br>C, D | (u0, u1) | (u0, u2), (u1, u3)<br>(u0, u1), (u3, u4) | (u0, u2),<br>(u1, u4) |

For example, at the 1/2-coding rate, 1 output symbol (i.e., u0 and u1 bits) may be selected and outputted. And, at the 1/4-coding rate, depending upon the SCCC block mode, 2 output symbols (i.e., 4 bits) may be selected and outputted. For example, when the SCCC block mode value is equal to '01', and when an output symbol configured of u0 and u2 and another output symbol configured of u1 and u4 are selected and outputted, a 1/4-rate coding result may be obtained.

The mobile service data encoded at the coding rate of 1/2 or 1/4 by the convolution encoder 513 are outputted to the symbol interleaver 514. The symbol interleaver 514 performs block interleaving, in symbol units, on the output data symbol of the convolution encoder 513. More specifically, the symbol interleaver 514 is a type of block interleaver. Any interleaver performing structural rearrangement (or realignment) may be applied as the symbol interleaver 514 of the block processor. However, in the present invention, a variable length symbol interleaver that can be applied even when a plurality of lengths is provided for the symbol, so that its order may be rearranged, may also be used.

FIG. 30 illustrates a symbol interleaver according to an embodiment of the present invention. Particularly, FIG. 30 illustrates an example of the symbol interleaver when B=2112 and L=4096. Herein, B indicates a block length in symbols that are outputted for symbol interleaving from the convolution encoder 513. And, L represents a block length in symbols that are actually interleaved by the symbol interleaver 514. At this point, the block length in symbols B inputted to the symbol interleaver 514 is equivalent to 4×SOBL. More specifically, since one symbol is configured of 2 bits, the value of B may be set to be equal to 4×SOBL.

In the present invention, when performing the symbol-intereleaving process, the conditions of $L=2^m$ (wherein m is an integer) and of $L \geqq B$ should be satisfied. If there is a difference in value between B and L, (L−B) number of null (or dummy) symbols is added, thereby generating an interleaving pattern, as shown in P'(i) of FIG. 30. Therefore, B becomes a block size of the actual symbols that are inputted to the symbol interleaver 514 in order to be interleaved. L becomes an interleaving unit when the interleaving process is performed by an interleaving pattern generated from the symbol interleaver 514.

Equation 6 shown below describes the process of sequentially receiving B number of symbols, the order of which is to be rearranged, and obtaining an L value satisfying the conditions of $L=2^m$ (wherein m is an integer) and of $L \geqq B$, thereby generating the interleaving so as to realign (or rearrange) the symbol order.

In relation to all places, wherein $0 \leqq i \leqq B-1$, $$P'(i)=\{89 \times i \times (i+1)/2\} \bmod L \qquad \text{Equation 6}$$

Herein, $L \geqq B$, $L=2^m$, wherein m is an integer.

As shown in P'(i) of FIG. 30, the order of B number of input symbols and (L−B) number of null symbols is rearranged by using the above-mentioned Equation 6. Then, as shown in P(i) of FIG. 30, the null byte places are removed, so as to rearrange the order. Starting with the lowest value of i, the P(i) are shifted to the left in order to fill the empty entry locations. Thereafter, the symbols of the aligned interleaving pattern P(i) are outputted to the symbol-byte converter 515 in order. Herein, the symbol-byte converter 515 converts to bytes the mobile service data symbols, having the rearranging of the symbol order completed and then outputted in accordance with the rearranged order, and thereafter outputs the converted bytes to the SCCC block-M/H block converter 516. The SCCC block-M/H block converter 516 converts the symbol-interleaved SCCC blocks to M/H blocks, which are then outputted to the group formatter 303.

If the SCCC block mode value is equal to '00', the SCCC block is mapped at a one-to-one (1:1) correspondence with each M/H block within the data group. In another example, if the SCCC block mode value is equal to '01', each SCCC block is mapped with two M/H blocks within the data group. For example, the SCCC block SCB1 is mapped with (B1, B6), the SCCC block SCB2 is mapped with (B2, B7), the SCCC block SCB3 is mapped with (B3, B8), the SCCC block SCB4 is mapped with (B4, B9), and the SCCC block SCB5 is mapped with (B5, B10). The M/H block that is outputted from the SCCC block-M/H block converter 516 is configured of mobile service data and FEC redundancy. In the present invention, the mobile service data as well as the FEC redundancy of the M/H block will be collectively considered as mobile service data.

Group Formatter

The group formatter 303 inserts data of M/H blocks outputted from the block processor 302 to the corresponding M/H blocks within the data group, which is formed in accordance with a pre-defined rule. Also, in association with the data-deinterleaving process, the group formatter 303 inserts various place holders (or known data place holders) in the corresponding region within the data group. More specifically, apart from the encoded mobile service data outputted from the block processor 302, the group formatter 303 also inserts MPEG header place holders, non-systematic RS parity place holders, main service data place holders, which are associated with the data deinterleaving in a later process, as shown in FIG. 5.

Herein, the main service data place holders are inserted because the mobile service data bytes and the main service data bytes are alternately mixed with one another in regions B to D based upon the input of the data deinterleaver, as shown in FIG. 5. For example, based upon the data outputted after data deinterleaving, the place holder for the MPEG header may be allocated at the very beginning of each packet. Also, in order to configure an intended group format, dummy bytes may also be inserted. Furthermore, the group formatter 303 inserts initialization data (i.e., trellis initialization byte) of the trellis encoding module 256 in the corresponding regions. For example, the initialization data may be inserted in the beginning of the known data sequence. The initialization data is used for initializing memories within the trellis encoding module 256, and is not transmitted to the receiving system.

Additionally, the group formatter 303 may also insert signaling information, which are encoded and outputted from the signaling encoder 304, in corresponding regions within the data group. At this point, reference may be made to the signaling information when the group formatter 303 inserts each data type and respective place holders in the data group. The process of encoding the signaling information and inserting the encoded signaling information to the data group will be described in detail in a later process.

Figure 31:
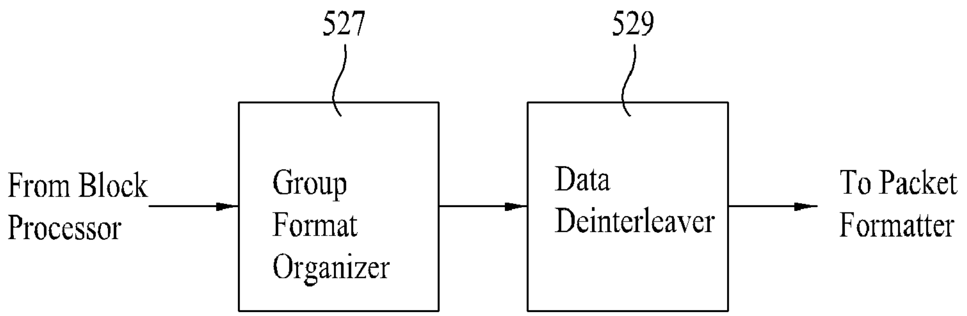
FIG. 31 illustrates a block diagram of a group formatter according to an embodiment of the present invention.

After inserting each data type and respective place holders in the data group, the group formatter 303 may deinterleave the data and respective place holders, which have been inserted in the data group, as an inverse process of the data interleaver, thereby outputting the deinterleaved data and respective place holders to the packet formatter 305. The group formatter 303 may include a group format organizer 527, and a data deinterleaver 529, as shown in FIG. 31. The group format organizer 527 inserts data and respective place holders in the corresponding regions within the data group, as described above. And, the data deinterleaver 529 deinterleaves the inserted data and respective place holders as an inverse process of the data interleaver.

The packet formatter 305 removes the main service data place holders and the RS parity place holders that were allocated for the deinterleaving process from the deinterleaved data being inputted. Then, the packet formatter 305 groups the remaining portion and inserts the 3-byte MPEG header place holder in an MPEG header having a null packet PID (or an unused PID from the main service data packet). Furthermore, the packet formatter 305 adds a synchronization data byte at the beginning of each 187-byte data packet. Also, when the group formatter 303 inserts known data place holders, the packet formatter 303 may insert actual known data in the known data place holders, or may directly output the known data place holders without any modification in order to make replacement insertion in a later process. Thereafter, the packet formatter 305 identifies the data within the packet-formatted data group, as described above, as a 188-byte unit mobile service data packet (i.e., MPEG TS packet), which is then provided to the packet multiplexer 240.

Based upon the control of the controller 201, the packet multiplexer 240 multiplexes the data group packet-formatted and outputted from the packet formatter 306 and the main service data packet outputted from the packet jitter mitigator 220. Then, the packet multiplexer 240 outputs the multiplexed data packets to the data randomizer 251 of the post-processor 250. More specifically, the controller 201 controls the time-multiplexing of the packet multiplexer 240. If the packet multiplexer 240 receives 118 mobile service data packets from the packet formatter 305, 37 mobile service data packets are placed before a place for inserting VSB field synchronization. Then, the remaining 81 mobile service data packets are placed after the place for inserting VSB field synchronization. The multiplexing method may be adjusted by diverse variables of the system design. The multiplexing method and multiplexing rule of the packet multiplexer 240 will be described in more detail in a later process.

Also, since a data group including mobile service data in-between the data bytes of the main service data is multiplexed (or allocated) during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet.

Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data in the object decoder is relatively small, the packet jitter may cause considerable problem. More specifically, due to the packet jitter, an overflow or underflow may occur in the buffer for the main service data of the receiving system (e.g., the buffer for the audio data). Therefore, the packet jitter mitigator 220 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible. Additionally, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 220 also performs the operation of modifying the PCR value. The output of the packet jitter mitigator 220 is inputted to the packet multiplexer 240. As described above, the packet multiplexer 240 multiplexes the main service data packet outputted from the packet jitter mitigator 220 with the mobile service data packet outputted from the pre-processor 230 into a burst structure in accordance with a pre-determined multiplexing rule. Then, the packet multiplexer 240 outputs the multiplexed data packets to the data randomizer 251 of the post-processor 250.

If the inputted data correspond to the main service data packet, the data randomizer 251 performs the same randomizing process as that of the conventional randomizer. More specifically, the synchronization byte within the main service data packet is deleted. Then, the remaining 187 data bytes are randomized by using a pseudo random byte generated from the data randomizer 251. Thereafter, the randomized data are outputted to the RS encoder/non-systematic RS encoder 252.

On the other hand, if the inputted data correspond to the mobile service data packet, the data randomizer 251 may randomize only a portion of the data packet. For example, if it is assumed that a randomizing process has already been performed in advance on the mobile service data packet by the pre-processor 230, the data randomizer 251 deletes the synchronization byte from the 4-byte MPEG header included in the mobile service data packet and, then, performs the randomizing process only on the remaining 3 data bytes of the MPEG header. Thereafter, the randomized data bytes are outputted to the RS encoder/non-systematic RS encoder 252. More specifically, the randomizing process is not performed on the remaining portion of the mobile service data excluding the MPEG header. In other words, the remaining portion of the mobile service data packet is directly outputted to the RS encoder/non-systematic RS encoder 252 without being randomized. Also, the data randomizer 251 may or may not perform a randomizing process on the known data (or known data place holders) and the initialization data included in the mobile service data packet.

The RS encoder/non-systematic RS encoder 252 performs an RS encoding process on the data being randomized by the data randomizer 251 or on the data bypassing the data randomizer 251, so as to add 20 bytes of RS parity data. Thereafter, the processed data are outputted to the data interleaver 253. Herein, if the inputted data correspond to the main service data packet, the RS encoder/non-systematic RS encoder 252 performs the same systematic RS encoding process as that of the conventional broadcasting system, thereby adding the 20-byte RS parity data at the end of the 187-byte data. Alternatively, if the inputted data correspond to the mobile service data packet, the RS encoder/non-systematic RS encoder 252 performs a non-systematic RS encoding process. At this point, the 20-byte RS parity data obtained from the non-systematic RS encoding process are inserted in a pre-decided parity byte place within the mobile service data packet.

The data interleaver 253 corresponds to a byte unit convolutional interleaver. The output of the data interleaver 253 is inputted to the parity replacer 254 and to the non-systematic RS encoder 255.

Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system. More specifically, the memory of the trellis encoding module 256 should first be initialized before the received known data sequence is trellis-encoded.

At this point, the beginning portion of the known data sequence that is received corresponds to the initialization data and not to the actual known data. Herein, the initialization data has been included in the data by the group formatter within the pre-processor 230 in an earlier process. Therefore, the process of replacing the initialization data with memory values within the trellis encoding module 256 are required to be performed immediately before the inputted known data sequence is trellis-encoded.

More specifically, the initialization data are replaced with the memory value within the trellis encoding module 256, thereby being inputted to the trellis encoding module 256. At this point, the memory value replacing the initialization data are process with (or calculated by) an exclusive OR (XOR) operation with the respective memory value within the trellis encoding module 256, so as to be inputted to the corresponding memory. Therefore, the corresponding memory is initialized to '0'. Additionally, a process of using the memory value replacing the initialization data to re-calculate the RS parity, so that the re-calculated RS parity value can replace the RS parity being outputted from the data interleaver 253, is also required.

Therefore, the non-systematic RS encoder 255 receives the mobile service data packet including the initialization data from the data interleaver 253 and also receives the memory value from the trellis encoding module 256.

Among the inputted mobile service data packet, the initialization data are replaced with the memory value, and the RS parity data that are added to the mobile service data packet are removed and processed with non-systematic RS encoding. Thereafter, the new RS parity obtained by performing the non-systematic RS encoding process is outputted to the parity replacer 255. Accordingly, the parity replacer 255 selects the output of the data interleaver 253 as the data within the mobile service data packet, and the parity replacer 255 selects the output of the non-systematic RS encoder 255 as the RS parity. The selected data are then outputted to the trellis encoding module 256.

Meanwhile, if the main service data packet is inputted or if the mobile service data packet, which does not include any initialization data that are to be replaced, is inputted, the parity replacer 254 selects the data and RS parity that are outputted from the data interleaver 253. Then, the parity replacer 254 directly outputs the selected data to the trellis encoding module 256 without any modification. The trellis encoding module 256 converts the byte-unit data to symbol units and performs a 12-way interleaving process so as to trellis-encode the received data. Thereafter, the processed data are outputted to the synchronization multiplexer 260.

Figure 32:
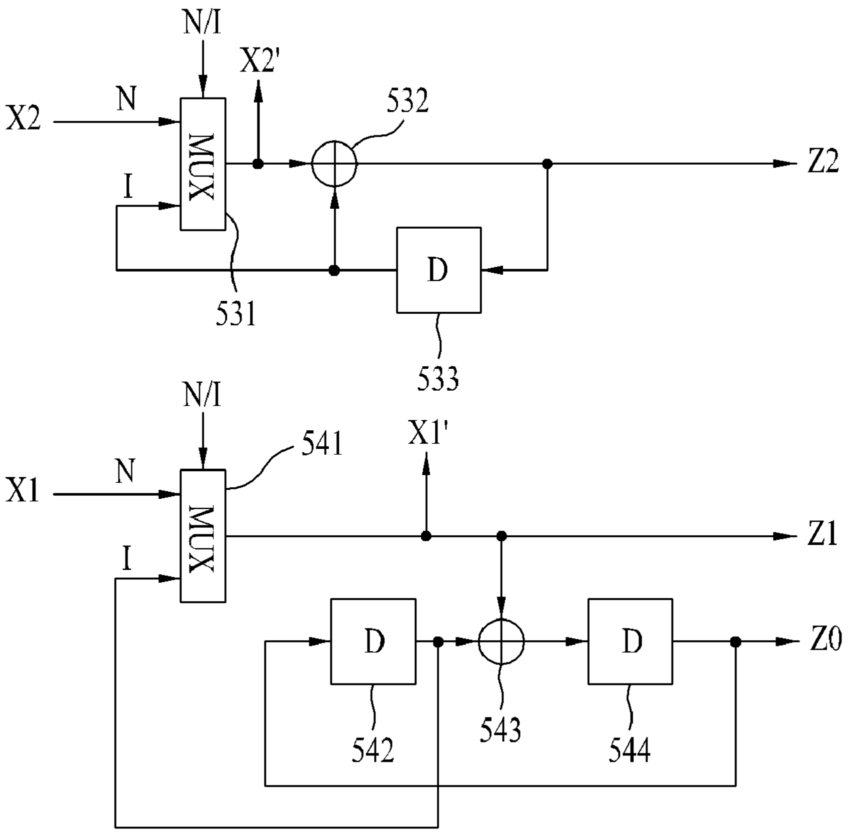
FIG. 32 illustrates a block diagram of a trellis encoder according to an embodiment of the present invention.

FIG. 32 illustrates a detailed diagram of one of 12 trellis encoders included in the trellis encoding module 256. Herein, the trellis encoder includes first and second multiplexers 531 and 541, first and second exclusive OR (XOR) gates 532 and 542, and first to third memories 533, 542, and 544.

More specifically, the first to third memories 533, 542, and 544 are initialized by the memory value instead of the initialization data from the parity replacer 254. More specifically, when the first symbol (i.e., two bits), which are converted from initialization data (i.e., each trellis initialization data byte), are inputted, the input bits of the trellis encoder will be replaced by the memory values of the trellis encoder, as shown in FIG. 32.

Since 2 symbols (i.e., 4 bits) are required for trellis initialization, the last 2 symbols (i.e., 4 bits) from the trellis initialization bytes are not used for trellis initialization and are considered as a symbol from a known data byte and processed accordingly.

When the trellis encoder is in the initialization mode, the input comes from an internal trellis status (or state) and not from the parity replacer 254. When the trellis encoder is in the normal mode, the input symbol (X2X1) provided from the parity replacer 254 will be processed. The trellis encoder provides the converted (or modified) input data for trellis initialization to the non-systematic RS encoder 255.

More specifically, when a selection signal designates a normal mode, the first multiplexer 531 selects an upper bit X2 of the input symbol. And, when a selection signal designates an initialization mode, the first multiplexer 531 selects the output of the first memory 533 and outputs the selected output data to the first XOR gate 532. The first XOR gate 532 performs XOR operation on the output of the first multiplexer 531 and the output of the first memory 533, thereby outputting the added result to the first memory 533 and, at the same time, as a most significant (or uppermost) bit Z2. The first memory 533 delays the output data of the first XOR gate 532 by 1 clock, thereby outputting the delayed data to the first multiplexer 531 and the first XOR gate 532.

Meanwhile, when a selection signal designates a normal mode, the second multiplexer 541 selects a lower bit X1 of the input symbol. And, when a selection signal designates an initialization mode, the second multiplexer 541 selects the output of the second memory 542, thereby outputting the selected result to the second XOR gate 543 and, at the same time, as a lower bit Z1. The second XOR gate 543 performs XOR operation on the output of the second multiplexer 541 and the output of the second memory 542, thereby outputting the added result to the third memory 544. The third memory 544 delays the output data of the second XOR gate 543 by 1 clock, thereby outputting the delayed data to the second memory 542 and, at the same time, as a least significant (or lowermost) bit Z0. The second memory 542 delays the output data of the third memory 544 by 1 clock, thereby outputting the delayed data to the second XOR gate 543 and the second multiplexer 541.

The select signal designates an initialization mode during the first two symbols that are converted from the initialization data.

For example, when the select signal designates an initialization mode, the first XOR gate 532 performs an XOR operation on the value of the first memory 533, which is provided through the first multiplexer 531, and on a memory value that is directly provided from the first memory 533. That is, the first XOR gate 532 performs an XOR operation on 2 bits having the same value. Generally, when only one of the two bits belonging to the operand is '1', the result of the XOR gate is equal to '1'. Otherwise, the result of the XOR gate becomes equal to '0'. Therefore, when the value of the first memory 533 is processed with an XOR operation, the result is always equal to '0'. Furthermore, since the output of the first XOR gate 532, i.e., '0', is inputted to the first memory 533, the first memory 533 is initialized to '0'.

Similarly, when the select signal designates an initialization mode, the second XOR gate 543 performs an XOR operation on the value of the second memory 542, which is provided through the second multiplexer 541, and on a memory value that is directly provided from the second memory 542. Therefore, the output of the second XOR gate 543 is also always equal to '0'. Since the output of the second XOR gate 543, i.e., '0', is inputted to the third memory 544, the third memory 544 is also initialized to '0'. The output of the third memory 544 is inputted to the second memory 542 in the next clock, thereby initializing the second memory 542 to '0'. In this case also, the select signal designates the initialization mode.

More specifically, when the first symbol being converted from the initialization data byte replaces the values of the first memory 533 and the second memory 542, thereby being inputted to the trellis encoder, each of the first and third memories 533 and 544 within the trellis encoder is initialized to '00'. Following the process, when the second symbol being converted from the initialization data byte replaces the values of the first memory 533 and the second memory 542, thereby being inputted to the trellis encoder, each of the first, second, and third memories 533, 542, and 544 within the trellis encoder is initialized to '000'.

As described above, 2 symbols are required to initialize the memory of the trellis encoder. At this point, while the select signal designates an initialization mode, the output bits (X2'X1') of the first and second memories 533 and 542 are inputted to the non-systematic RS encoder 255, so as to perform a new RS parity calculation process.

The synchronization multiplexer 260 inserts a field synchronization signal and a segment synchronization signal to the data outputted from the trellis encoding module 256 and, then, outputs the processed data to the pilot inserter 271 of the transmission unit 270. Herein, the data having a pilot inserted therein by the pilot inserter 271 are modulated by the modulator 272 in accordance with a pre-determined modulating method (e.g., a VSB method). Thereafter, the modulated data are transmitted to each receiving system though the radio frequency (RF) up-converter 273.

Multiplexing Method of Packet Multiplexer

Data of the error correction encoded and 1/H-rate encoded primary RS frame (i.e., when the RS frame mode value is equal to '00') or primary/secondary RS frame (i.e., when the RS frame mode value is equal to '01'), are divided into a plurality of data groups by the group formatter 303. Then, the divided data portions are assigned to at least one of regions A to D of each data group or to an M/H block among the M/H blocks B1 to B10, thereby being deinterleaved. Then, the deinterleaved data group passes through the packet formatter 305, thereby being multiplexed with the main service data by the packet multiplexer 240 based upon a de-decided multiplexing rule. The packet multiplexer 240 multiplexes a plurality of consecutive data groups, so that the data groups are assigned to be spaced as far apart from one another as possible within the sub-frame. For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively.

As described-above, in the assignment of the plurality of consecutive data groups, a plurality of parades are multiplexed and outputted so as to be spaced as far apart from one another as possible within a sub-frame. For example, the method of assigning data groups and the method of assigning parades may be identically applied to all sub-frames for each M/H frame or differently applied to each M/H frame.

FIG. 10 illustrates an example of a plurality of data groups included in a single parade, wherein the number of data groups included in a sub-frame is equal to '3', and wherein the data groups are assigned to an M/H frame by the packet multiplexer 240. Referring to FIG. 10, 3 data groups are sequentially assigned to a sub-frame at a cycle period of 4 slots. Accordingly, when this process is equally performed in the 5 sub-frames included in the corresponding M/H frame, 15 data groups are assigned to a single M/H frame. Herein, the 15 data groups correspond to data groups included in a parade.

When data groups of a parade are assigned as shown in FIG. 10, the packet multiplexer 240 may either assign main service data to each data group, or assign data groups corresponding to different parades between each data group. More specifically, the packet multiplexer 240 may assign data groups corresponding to multiple parades to one M/H frame. Basically, the method of assigning data groups corresponding to multiple parades is very similar to the method of assigning data groups corresponding to a single parade. In other words, the packet multiplexer 240 may assign data groups included in other parades to an M/H frame according to a cycle period of 4 slots. At this point, data groups of a different parade may be sequentially assigned to the respective slots in a circular method. Herein, the data groups are assigned to slots starting from the ones to which data groups of the previous parade have not yet been assigned. For example, when it is assumed that data groups corresponding to a parade are assigned as shown in FIG. 10, data groups corresponding to the next parade may be assigned to a sub-frame starting either from the $12^{th}$ slot of a sub-frame.

FIG. 11 illustrates an example of assigning and transmitting 3 parades (Parade #0, Parade #1, and Parade #2) to an M/H frame. For example, when the $1^{st}$ parade (Parade #0) includes 3 data groups for each sub-frame, the packet multiplexer 240 may obtain the positions of each data groups within the sub-frames by substituting values '0' to '2' for i in Equation 1. More specifically, the data groups of the $1^{st}$ parade (Parade #0) are sequentially assigned to the $1^{st}$, $5^{th}$, and $9^{th}$ slots (Slot #0, Slot #4, and Slot #8) within the sub-frame. Also, when the $2^{nd}$ parade includes 2 data groups for each sub-frame, the packet multiplexer 240 may obtain the positions of each data groups within the sub-frames by substituting values '3' and '4' for i in Equation 1. More specifically, the data groups of the 2nd parade (Parade #1) are sequentially assigned to the 2nd and 12th slots (Slot #3 and Slot #11) within the sub-frame. Finally, when the 3rd parade includes 2 data groups for each sub-frame, the packet multiplexer 240 may obtain the positions of each data groups within the sub-frames by substituting values '5' and '6' for i in Equation 1. More specifically, the data groups of the 3rd parade (Parade #2) are sequentially assigned and outputted to the 7th and 11th slots (Slot #6 and Slot #10) within the sub-frame.

As described above, the packet multiplexer 240 may multiplex and output data groups of multiple parades to a single M/H frame, and, in each sub-frame, the multiplexing process of the data groups may be performed serially with a group space of 4 slots from left to right. Therefore, a number of groups of one parade per sub-frame (NOG) may correspond to any one integer from '1' to '8'. Herein, since one M/H frame includes 5 sub-frames, the total number of data groups within a parade that can be allocated to an M/H frame may correspond to any one multiple of '5' ranging from '5' to '40'.

Processing Signaling Information

Figure 33:
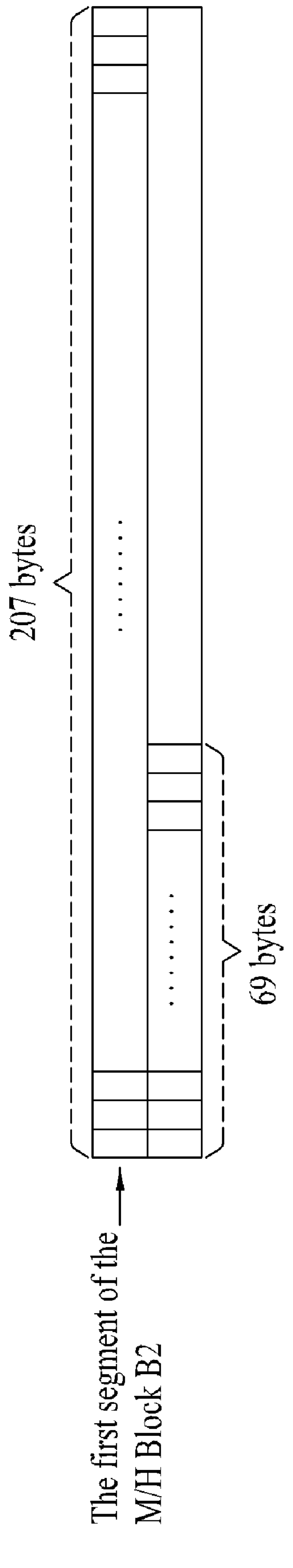
FIG. 33 illustrates an example of assigning signaling information area according to an embodiment of the present invention.

The present invention assigns signaling information areas for inserting signaling information to some areas within each data group. FIG. 33 illustrates an example of assigning signaling information areas for inserting signaling information starting from the 1st segment of the 4th M/H block (B4) to a portion of the 2nd segment. More specifically, 276(=207+69) bytes of the 4th M/H block (B4) in each data group are assigned as the signaling information area. In other words, the signaling information area consists of 207 bytes of the 1st segment and the first 69 bytes of the 2nd segment of the 4th M/H block (B4). For example, the 1st segment of the 4th M/H block (B4) corresponds to the 17th or 173rd segment of a VSB field.

The signaling information that is to be inserted in the signaling information area is FEC-encoded by the signaling encoder 304, thereby inputted to the group formatter 303. The signaling information may include a transmission parameter which is included in the payload region of an OM packet, and then received to the demultiplexer 210.

The group formatter 303 inserts the signaling information, which is FEC-encoded and outputted by the signaling encoder 304, in the signaling information area within the data group. Herein, the signaling information may be identified by two different types of signaling channels: a transmission parameter channel (TPC) and a fast information channel (FIC).

Herein, the TPC data corresponds to signaling information including transmission parameters, such as RS frame information, RS encoding information, FIC information, data group information, SCCC information, and M/H frame information and so on. However, the TPC data presented herein is merely exemplary. And, since the adding or deleting of signaling information included in the TPC may be easily adjusted and modified by one skilled in the art, the present invention will, therefore, not be limited to the examples set forth herein.

Furthermore, the FIC data is provided to enable a fast service acquisition of data receivers, and the FIC data includes cross layer information between the physical layer and the upper layer(s).

Figure 34:
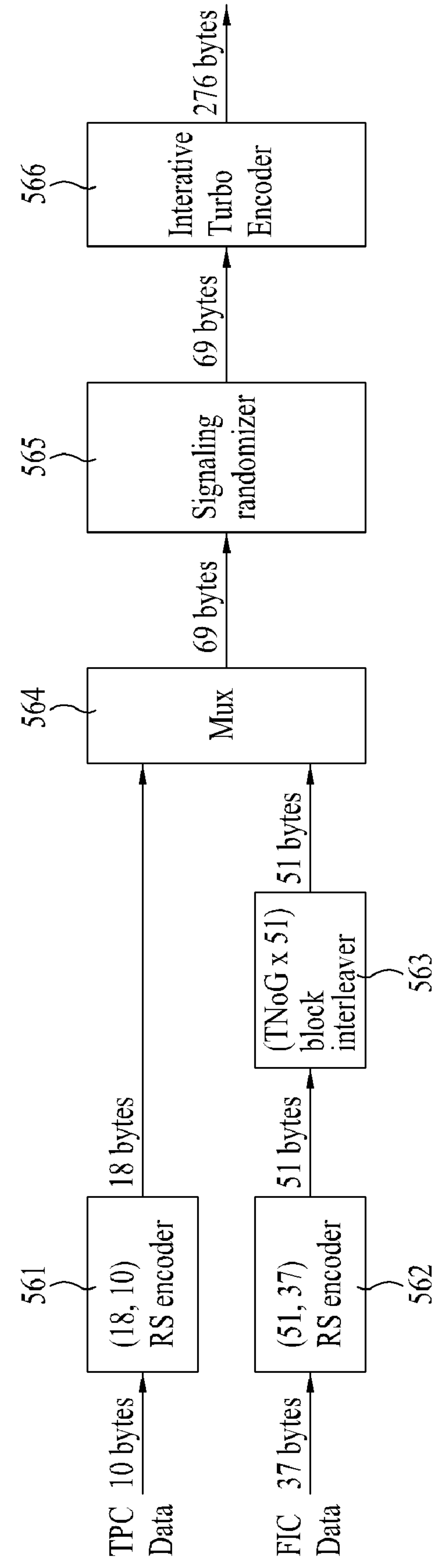
FIG. 34 illustrates a detailed block diagram of a signaling encoder according to the present invention.

FIG. 34 illustrates a detailed block diagram of the signaling encoder 304 according to the present invention. Referring to FIG. 34, the signaling encoder 304 includes a TPC encoder 561, an FIC encoder 562, a block interleaver 563, a multiplexer 564, a signaling randomizer 565, and an iterative turbo encoder 566.

The TPC encoder 561 receives 10-bytes of TPC data and performs (18,10)-RS encoding on the 10-bytes of TPC data, thereby adding 8 bytes of parity data to the 10 bytes of TPC data. The 18 bytes of RS-encoded TPC data are outputted to the multiplexer 564.

The FIC encoder 562 receives 37-bytes of FIC data and performs (51,37)-RS encoding on the 37-bytes of FIC data, thereby adding 14 bytes of parity data to the 37 bytes of FIC data. Thereafter, the 51 bytes of RS-encoded FIC data are inputted to the block interleaver 563, thereby being interleaved in predetermined block units. Herein, the block interleaver 563 corresponds to a variable length block interleaver. The block interleaver 563 interleaves the FIC data within each sub-frame in TNoG(column)×51(row) block units and then outputs the interleaved data to the multiplexer 564. Herein, the TNoG corresponds to the total number of data groups being assigned to a sub-frame. The block interleaver 563 is synchronized with the first set of FIC data in each sub-frame.

The block interleaver 563 writes 51 bytes of incoming (or inputted) RS codewords in a row direction (i.e., row-by-row) and left-to-right and up-to-down directions and reads 51 bytes of RS codewords in a column direction (i.e., column-by-column) and left-to-right and up-to-down directions, thereby outputting the RS codewords.

The multiplexer 564 multiplexes the RS-encoded TPC data from the TPC encoder 561 and the block-interleaved FIC data from the block interleaver 563 along a time axis. Then, the multiplexer 564 outputs 69 bytes of the multiplexed data to the signaling randomizer 565. The signaling randomizer 565 randomizes the multiplexed data and outputs the randomized data to the iterative turbo encoder 566. The signaling randomizer 565 may use the same generator polynomial of the randomizer used for mobile service data. Also, initialization occurs in each data group.

The iterative turbo encoder 566 corresponds to an inner encoder performing iterative turbo encoding in a PCCC method on the randomized data (i.e., signaling information data). The iterative turbo encoder 566 may include 6 even component encoders and 6 odd component encoders.

FIG. 35 illustrates an example of a syntax structure of TPC data being inputted to the TPC encoder 561. The TPC data are inserted in the signaling information area of each data group and then transmitted. The TPC data may include a sub-frame number field, a slot_number field, a parade_id field, a starting_group_number (SGN) field, a number_of_groups (NoG) field, a parade_repetition_cycle (PRC) field, an RS_frame_mode field, an RS_code_mode primary field, an RS_code_mode secondary field, an SCCC_block_mode field, an SCCC_outer_code_mode_A field, an SCCC_outer_code_mode_B field, an SCCC_outer_code_mode_C field, an SCCC_outer_code_mode_D field, an FIC_version field, a parade_continuity_counter field, and a TNoG field.

The Sub-Frame_number field corresponds to the current Sub-Frame number within the M/H frame, which is transmitted for M/H frame synchronization. The value of the Sub-Frame_number field may range from 0 to 4. The Slot_number field indicates the current slot number within the sub-frame, which is transmitted for M/H frame synchronization. Also, the value of the Sub-Frame_number field may range from 0 to 15. The Parade_id field identifies the parade to which this group belongs. The value of this field may be any 7-bit value. Each parade in a M/H transmission shall have a unique Parade_id field.

Communication of the Parade_id between the physical layer and the management layer may be performed by means of an Ensemble_id field formed by adding one bit to the left of the Parade_id field. If the Ensemble_id field is used for the primary Ensemble delivered through this parade, the added MSB shall be equal to '0'. Otherwise, if the Ensemble_id field is used for the secondary ensemble, the added MSB shall be equal to '1'. Assignment of the Parade_id field values may occur at a convenient level of the system, usually in the management layer. The starting_group_number (SGN) field shall be the first Slot_number for a parade to which this group belongs, as determined by Equation 1 (i.e., after the Slot numbers for all preceding parades have been calculated). The SGN and NoG shall be used according to Equation 1 to obtain the slot numbers to be allocated to a parade within the sub-frame.

The number_of_Groups (NoG) field shall be the number of groups in a sub-frame assigned to the parade to which this group belongs, minus 1, e.g., NoG=0 implies that one group is allocated (or assigned) to this parade in a sub-frame. The value of NoG may range from 0 to 7. This limits the amount of data that a parade may take from the main (legacy) service data, and consequently the maximum data that can be carried by one parade. The slot numbers assigned to the corresponding Parade can be calculated from SGN and NoG, using Equation 1. By taking each parade in sequence, the specific slots for each parade will be determined, and consequently the SGN for each succeeding parade. For example, if for a specific parade SGN=3 and NoG=3 (010b for 3-bit field of NoG), substituting i=3, 4, and 5 in Equation 1 provides slot numbers 12, 2, and 6.

The Parade repetition cycle (PRC) field corresponds to the cycle time over which the parade is transmitted, minus 1, specified in units of M/H frames, as described in Table 12.

TABLE 12

| PRC | Description |
| --- | --- |
| 000 | This parade shall be transmitted once every M/H frame. |
| 001 | This parade shall be transmitted once every 2 M/H frames. |
| 010 | This parade shall be transmitted once every 3 M/H frames. |
| 011 | This parade shall be transmitted once every 4 M/H frames. |
| 100 | This parade shall be transmitted once every 5 M/H frames. |
| 101 | This parade shall be transmitted once every 6 M/H frames. |
| 110 | This parade shall be transmitted once every 7 M/H frames. |
| 111 | Reserved |

For example, if PRC field value is equal to '001', this indicates that the parade shall be transmitted once every 2 M/H frame.

The RS_Frame_mode field shall be as defined in Table 1. The RS_Frame_mode field represents that one parade transmits one RS frame or two RS frames.

The RS_code_mode_primary field shall be the RS code mode for the primary RS frame. Herein, the RS_code_mode_primary field is defined in Table 6.

The RS_code_mode_secondary field shall be the RS code mode for the secondary RS frame. Herein, the RS_code_mode_secondary field is defined in Table 6.

The SCCC_Block_mode field represents how M/H blocks within a data group are assigned to SCCC block. The SCCC_Block_mode field shall be as defined in Table 7.

The SCCC_outer_code_mode_A field corresponds to the SCCC outer code mode for Region A within a data group. The SCCC outer code mode is defined in Table 8.

The SCCC_outer_code_mode_B field corresponds to the SCCC outer code mode for Region B within the data group. The SCCC_outer_code_mode_C field corresponds be the SCCC outer code mode for Region C within the data group. And, the SCCC_outer_code_mode_D field corresponds to the SCCC outer code mode for Region D within the data group.

The FIC_version field represents a version of FIC data.

The Parade_continuity_counter field counter may increase from 0 to 15 and then repeat its cycle. This counter shall increment by 1 every (PRC+1) M/H frames. For example, as shown in Table 12, PRC=011 (decimal 3) implies that Parade_continuity_counter increases every fourth M/H frame.

The TNoG field may be identical for all sub-frames in an M/H Frame.

However, the information included in the TPC data presented herein is merely exemplary. And, since the adding or deleting of information included in the TPC may be easily adjusted and modified by one skilled in the art, the present invention will, therefore, not be limited to the examples set forth herein.

Since the TPC data (excluding the Sub-Frame_number field and the Slot_number field) for each parade do not change their values during an M/H frame, the same information is repeatedly transmitted through all M/H groups belonging to the corresponding parade during an M/H frame. This allows very robust and reliable reception of the TPC data. Because the Sub-Frame_number and the Slot_number are increasing counter values, they also are robust due to the transmission of regularly expected values.

Furthermore, the FIC data is provided to enable a fast service acquisition of data receivers, and the FIC information includes cross layer information between the physical layer and the upper layer(s).

Figure 36:
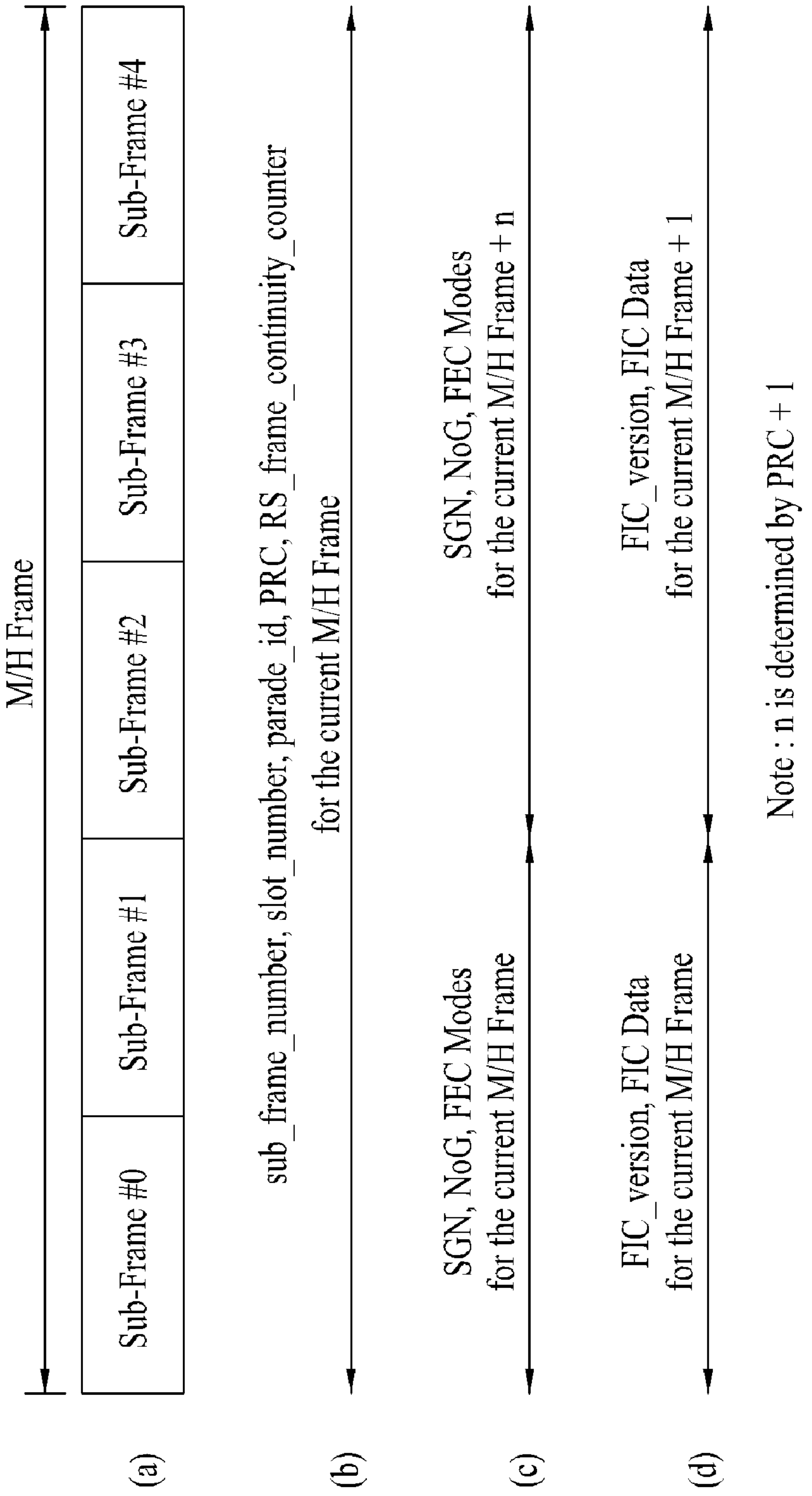
FIG. 36 illustrates an example of a transmission scenario of the TPC data and the FIC data level according to the present invention.

FIG. 36 illustrates an example of a transmission scenario of the TPC data and the FIC data. The values of the Sub-Frame_number field, Slot_number field, Parade_id field, Parade_repetition_cycle field, and Parade_continuity_counter field may corresponds to the current M/H frame throughout the 5 sub-frames within a specific M/H frame. Some of TPC parameters and FIC data are signaled in advance.

The SGN, NoG and all FEC modes may have values corresponding to the current M/H frame in the first two sub-frames. The SGN, NoG and all FEC modes may have values corresponding to the frame in which the parade next appears throughout the $3^{rd}$, $4^{th}$ and $5^{th}$ sub-frames of the current M/H frame. This enables the M/H receivers to receive (or acquire) the transmission parameters in advance very reliably.

For example, when Parade_repetition_cycle='000', the values of the $3^{rd}$, $4^{th}$, and $5^{th}$ sub-frames of the current M/H frame correspond to the next M/H frame. Also, when Parade_repetition_cycle='011', the values of the $3^{rd}$, $4^{th}$, and $5^{th}$ sub-frames of the current M/H frame correspond to the $4^{th}$ M/H frame and beyond.

The FIC_version field and the FIC_data field may have values that apply to the current M/H Frame during the $1^{st}$ sub-frame and the $2^{nd}$ sub-frame, and they shall have values corresponding to the M/H frame immediately following the current M/H frame during the $3^{rd}$, $4^{th}$, and $5^{th}$ sub-frames of the current M/H frame.

Figure 37:
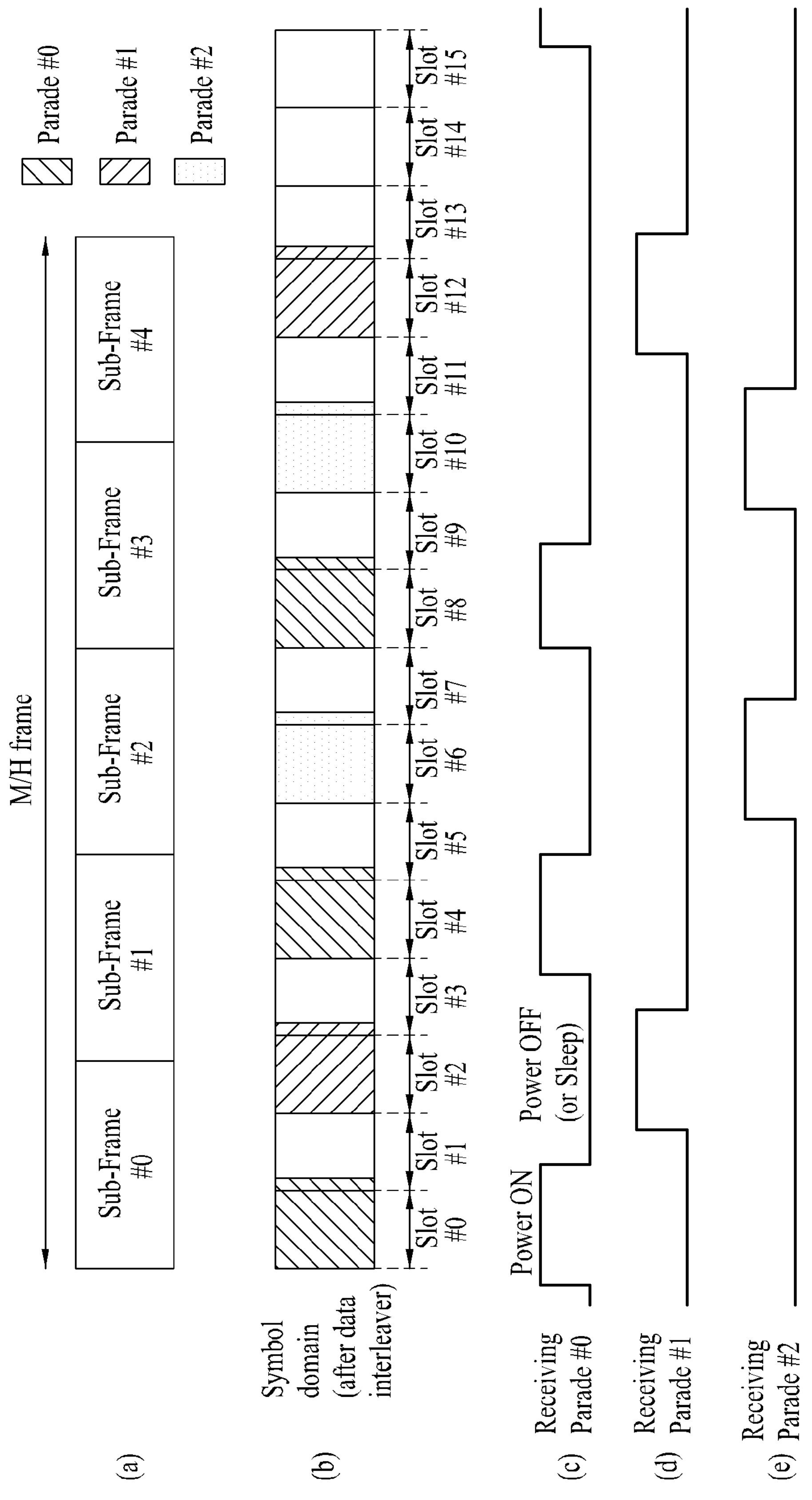
FIG. 37 illustrates an example of power saving of in a receiver when transmitting 3 parades to an M/H frame level according to the present invention.

Meanwhile, the receiving system may turn the power on only during a slot to which the data group of the designated (or desired) parade is assigned, and the receiving system may turn the power off during the remaining slots, thereby reducing power consumption of the receiving system. Such characteristic is particularly useful in portable or mobile receivers, which require low power consumption. For example, it is assumed that data groups of a $1^{st}$ parade with NOG=3, a $2^{nd}$ parade with NOG=2, and a $3^{rd}$ parade with NOG=3 are assigned to one M/H frame, as shown in FIG. 37. It is also assumed that the user has selected a mobile service included in the $1^{st}$ parade using the keypad provided on the remote controller or terminal. In this case, the receiving system turns the power on only during a slot that data groups of the $1^{st}$ parade is assigned, as shown in FIG. 37, and turns the power off during the remaining slots, thereby reducing power consumption, as described above. At this point, the power is required to be turned on briefly earlier than the slot to which the actual designated data group is assigned (or allocated). This is to enable the tuner or demodulator to converge in advance.

Assignment of Known Data (or Training Signal)

Figure 38:
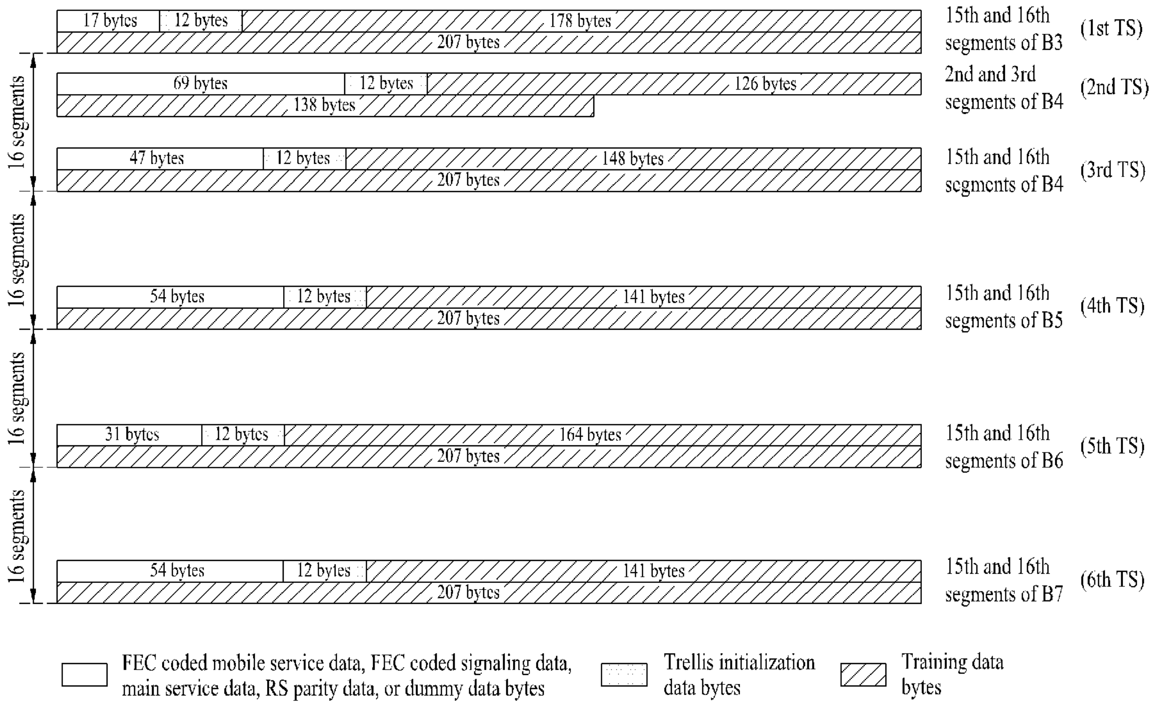
FIG. 38 illustrates an example of a training sequence at the byte level according to the present invention.

In addition to the payload data, the M/H transmission system inserts long and regularly spaced training sequences into each group. The regularity is an especially useful feature since it provides the greatest possible benefit for a given number of training symbols in high-Doppler rate conditions. The length of the training sequences is also chosen to allow fast acquisition of the channel during bursted power-saving operation of the demodulator. Each group contains 6 training sequences. The training sequences are specified before trellis-encoding. The training sequences are then trellis-encoded and these trellis-encoded sequences also are known sequences. This is because the trellis encoder memories are initialized to pre-determined values at the beginning of each sequence. The form of the 6 training sequences at the byte level (before trellis-encoding) is shown in FIG. 38. This is the arrangement of the training sequence at the group formatter 303. FIG. 76 illustrates an example of a known data (training) sequence represented using numbers at the byte level according to the present invention. In FIG. 76, known data (training) bytes include trellis initialization bytes.

The $1^{st}$ training sequence is located at the last 2 segments of the $3^{rd}$ M/H block (B3). The $2^{nd}$ training sequence may be inserted at the $2^{nd}$ and $3^{rd}$ segments of the $4^{th}$ M/H block (B4). The $2^{nd}$ training sequence is next to the signaling area, as shown in FIG. 5. Then, the $3^{rd}$ training sequence, the $4^{th}$ training sequence, the $5^{th}$ training sequence, and the $6^{th}$ training sequence may be placed at the last 2 segments of the $4^{th}$, $5^{th}$, $6^{th}$, and $7^{th}$ M/H blocks (B4, B5, B6, and B7), respectively. As shown in FIG. 38, the $1^{st}$ training sequence, the $3^{rd}$ training sequence, the $4^{th}$ training sequence, the $5^{th}$ training sequence, and the $6^{th}$ training sequence are spaced 16 segments apart from one another. Referring to FIG. 38, the dotted area indicates trellis initialization data bytes, the lined area indicates training data bytes, and the white area includes other bytes such as the FEC-coded M/H service data bytes, FEC-coded signaling data, main service data bytes, RS parity data bytes (for backwards compatibility with legacy ATSC receivers) and/or dummy data bytes.

Figure 39:
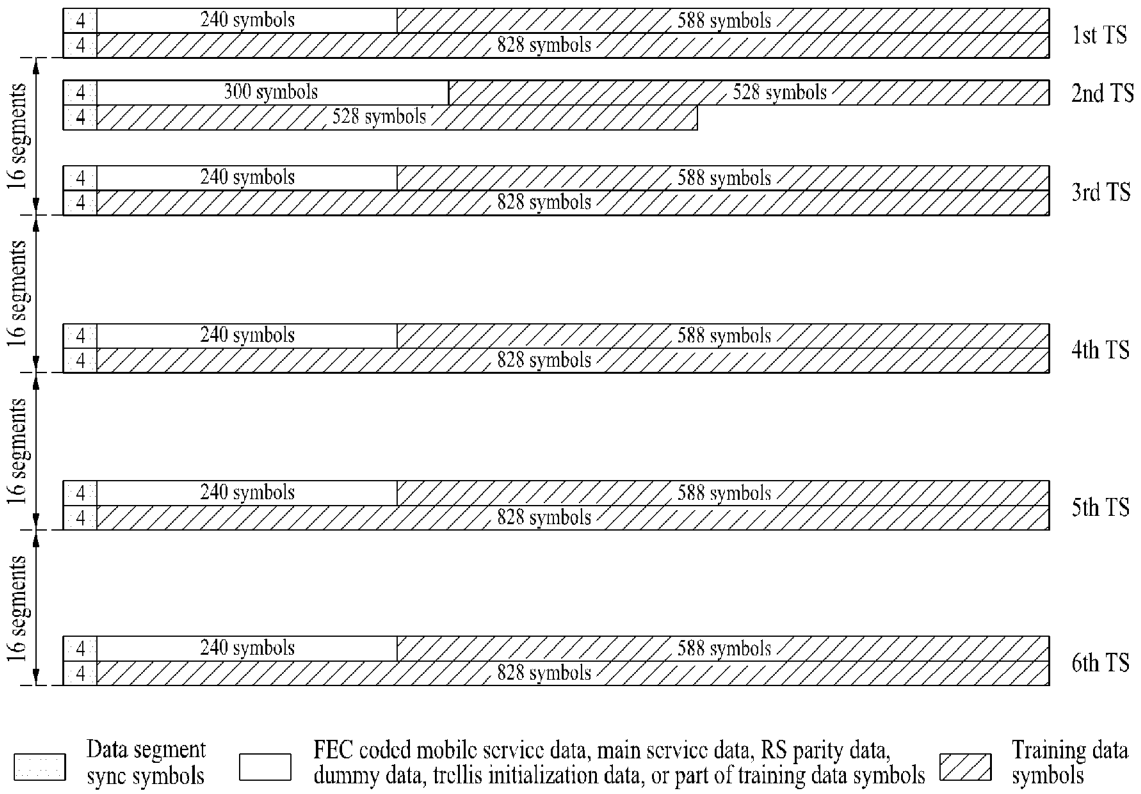
FIG. 39 illustrates an example of a training sequence at the symbol according to the present invention.

FIG. 39 illustrates the training sequences (at the symbol level) after trellis-encoding by the trellis encoder.

Referring to FIG. 39, the dotted area indicates data segment sync symbols, the lined area indicates training data symbols, and the white area includes other symbols, such as FEC-coded mobile service data symbols, FEC-coded signaling data, main service data symbols, RS parity data symbols (for backwards compatibility with legacy ATSC receivers), dummy data symbols, trellis initialization data symbols, and/or the first part of the training sequence data symbols. Due to the intra-segment interleaving of the trellis encoder, various types of data symbols will be mixed in the white area.

After the trellis-encoding process, the last 1416 (=588+828) symbols of the $1^{st}$ training sequence, the $3^{rd}$ training sequence, the $4^{th}$ training sequence, the $5^{th}$ training sequence, and the $6^{th}$ training sequence commonly share the same data pattern. Including the data segment synchronization symbols in the middle of and after each sequence, the total length of each common training pattern is 1424 symbols. The $2^{nd}$ training sequence has a first 528-symbol sequence and a second 528-symbol sequence that have the same data pattern. More specifically, the 528-symbol sequence is repeated after the 4-symbol data segment synchronization signal. At the end of each training sequence, the memory contents of the twelve modified trellis encoders shall be set to zero (0).

FIG. 77 illustrates an example of a training sequence represented using numbers at the symbol according to the present invention. In FIG. 77, a VSB level value −7 is mapped to number 0, a VSB level value −5 is mapped to number 1, a VSB level value −3 is mapped to number 2, a VSB level value −1 is mapped to number 3, a VSB level value 1 is mapped to number 4, a VSB level value 3 is mapped to number 5, a VSB level value 5 is mapped to number 6, and a VSB level value 7 is mapped to number 7.

Receiving System

Figure 40:
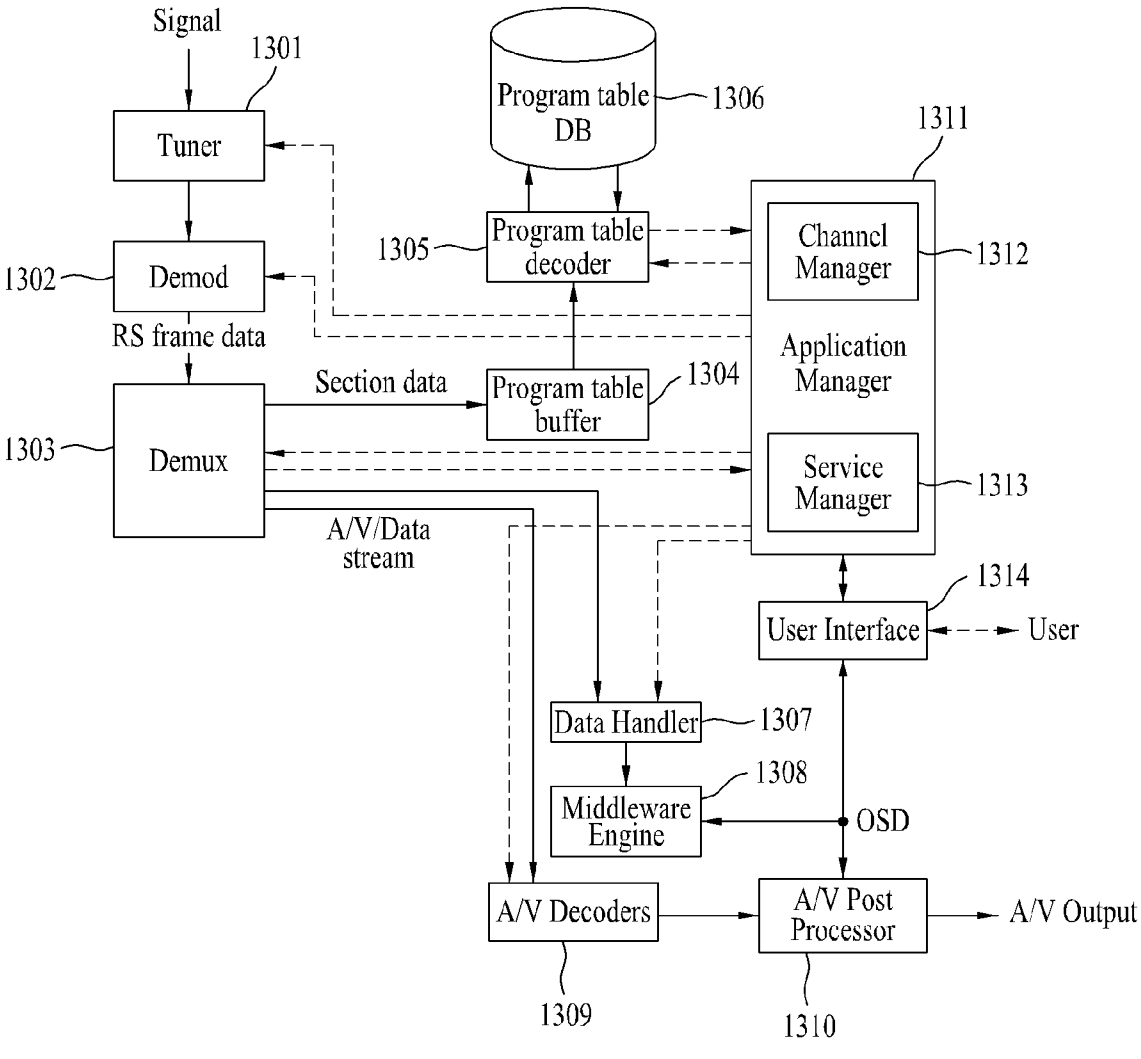
FIG. 40 illustrates a block diagram of a receiving system according to an embodiment of the present invention.

FIG. 40 is a block diagram illustrating a receiving system according to an embodiment of the present invention.

The receiving system of FIG. 40 includes a tuner 1301, a demodulating unit 1302, a demultiplexer 1303, a program table buffer 1304, a program table decoder 1305, a program table storage unit 1306, a data handler 1307, a middleware engine 1308, an A/V decoder 1309, an A/V post-processor 1310, an application manager 1311, and a user interface 1314. The application manager 1311 may include a channel manager 1312 and a service manager 1313.

In FIG. 40, solid lines indicate data flows and dotted lines indicate control flows.

The tuner 1301 tunes to a frequency of a specific channel through any of an antenna, a cable, or a satellite and down-converts the frequency to an Intermediate Frequency (IF) signal and outputs the IF signal to the demodulating unit 1302. Here, the tuner 1301 is controlled by the channel manager 1312 in the application manager 1311 and reports the result and strength of a broadcast signal of the tuned channel to the channel manager 1312. Data received through the frequency of the specific channel includes main service data, mobile service data, a transmission parameter, and program table information for decoding the main service data and the mobile service data.

The demodulating unit 1302 performs VSB demodulation, channel equalization, etc., on the signal output from the tuner 1301 and identifies and separately outputs main service data and mobile service data. The demodulating unit 1302 will be described in detail in a later.

On the other hand, the transmitter can transmit signaling information (or TPC information) including transmission parameters by inserting the signaling information into at least one of a field synchronization region, a known data region, and a mobile service data region. Accordingly, the demodulating unit 1302 can extract the transmission parameters from the field synchronization region, the known data region, and the mobile service data region.

The transmission parameters may include M/H frame information, sub-frame information, slot information, parade-related information (for example, a parade_id, a parade repeat period, etc.), information of data groups in a sub-frame, RS frame mode information, RS code mode information, SCCC block mode information, SCCC outer code mode information, FIC version information, etc.

The demodulating unit 1302 performs block decoding, RS frame decoding, etc., using the extracted transmission parameters. For example, the demodulating unit 1302 performs block decoding of each region in a data group with reference to SCCC-related information (for example, SCCC block mode information or an SCCC outer code mode) included in the transmission parameters and performs RS frame decoding of each region included in the data group with reference to RS-related information (for example, an RS code mode).

In the embodiment of the present invention, an RS frame including mobile service data demodulated by the demodulating unit 1302 is input to the demultiplexer 1303.

That is, data inputted to the demultiplexer 1303 has an RS frame data format as shown in FIG. 17(*a*) or FIG. 17(*b*). More specifically, the RS frame decoder of the demodulating unit 1302 performs the reverse of the encoding process performed at the RS frame encoder of the transmission system to correct errors in the RS frame and then outputs the error-corrected RS frame to a data derandomizer. The data derandomizer then performs derandomizing on the error-corrected RS frame through the reverse of the randomizing process performed at the transmission system to obtain an RS frame as shown in FIG. 17(*a*) or FIG. 17(*b*).

The demultiplexer 1303 may receive RS frames of all parades and may also receive only an RS frame of a parade including a mobile service that the user desires to receive through power supply control. For example, when RS frames of all parades are received, the demultiplexer 1303 can demultiplex a parade including a mobile service that the user desires to receive using a parade_id.

One parade carries one or two RS frames and one ensemble is mapped to one RS frame. Therefore, when one parade carries two RS frames, the demultiplexer 1303 needs to identify an RS frame carrying an ensemble including mobile service data to be decoded from a parade containing a mobile service that the user desires to receive. That is, when a received single parade or a parade demultiplexed from a plurality of parades carries a primary ensemble and a secondary ensemble, the demultiplexer 1303 selects one of the primary and secondary ensembles.

In an embodiment, the demultiplexer 1303 can demultiplex an RS frame carrying an ensemble including mobile service data to be decoded using an ensemble_id created by adding one bit to a left position of the parade_id.

The demultiplexer 1303 refers to the M/H header of the M/H service data packet within the RS frame corresponding to the ensemble including the mobile service data that are to be decoded, thereby identifying when the corresponding M/H service data packet is the program table information or the IP datagram of the mobile service data. Alternatively, when the program table information and the mobile service data are both configured in the form of IP datagrams, the demultiplexer 1303 may use the IP address in order to identify the IP datagram of the program table information and the mobile service data.

Herein, the identified program table information is outputted to the program table buffer 1304. And, audio/video/data streams are separated from the IP datagram of mobile service data that are to be selected among the IP datagrams of the identified mobile service data, thereby being respectively outputted to the A/V decoder 1309 and/or the data handler 1307.

According to an embodiment of the present invention, when the stuff_indicator field within the M/H header of the M/H service data packet indicates that stuffing bytes are inserted in the payload of the corresponding M/H service data packet, the demultiplexer 1303 removes the stuffing bytes from the payload of the corresponding M/H service data packet. Then, the demultiplexer 1303 identifies the program table information and the mobile service data. Thereafter, the demultiplexer 1303 identifies A/V/D streams from the identified mobile service data.

The program table buffer 1304 temporarily stores the section-type program table information and then outputs the section-type program table information to the program table decoder 1305.

The program table decoder 1305 identifies tables using a table_id and a section_length in the program table information and parses sections of the identified tables and produces and stores a database of the parsed results in the program table storage unit 1306. For example, the program table decoder 1305 collects sections having the same table identifier (table_id) to construct a table. The program table decoder 1305 then parses the table and produces and stores a database of the parsed results in the program table storage unit 1306.

The A/V decoder 1309 decodes the audio and video streams outputted from the demultiplexer 1303 using audio and video decoding algorithms, respectively. The decoded audio and video data is outputted to the A/V post-processor 1310.

Here, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm can be used as the audio decoding algorithm and at least one of an MPEG 2 video decoding algorithm, an MPEG 4 video decoding algorithm, an H.264 decoding algorithm, an SVC decoding algorithm, and a VC-1 decoding algorithm can be used as the audio decoding algorithm.

The data handler 8507 processes data stream packets required for data broadcasting among data stream packets separated (or identified) by the demultiplexer 1303 and provides the processed data stream packets to the middleware engine 1310 to allow the middleware engine 1310 to be multiplexed them with A/V data. In an embodiment, the middleware engine 1310 is a Java middleware engine.

The application manager 1311 receives a key input from the TV viewer and displays a Graphical User Interface (GUI) on the TV screen in response to a viewer request through a User Interface (UI). The application manager 1311 also writes and reads information regarding overall GUI control of the TV, user requests, and TV system states to and from a memory (for example, NVRAM or flash memory). In addition, the application manager 1311 can receive parade-related information (for example, a parade_id) from the demodulating unit 1302 to control the demultiplexer 1303 to select an RS frame of a parade including a required mobile service. The application manager 1311 can also receive an ensemble_id to control the demultiplexer 1303 to select an RS frame of an ensemble including mobile service data to be decoded from the parade. The application manager 1311 also controls the channel manager 1312 to perform channel-related operations (for example, channel map management and program table decoder operations).

The channel manager 1312 manages physical and logical channel maps and controls the tuner 1301 and the program table decoder 1305 to respond to a channel-related request of the viewer. The channel manager also requests that the program table decoder 1305 parse a channel-related table of a channel to be tuned and receives the parsing results from the program table decoder 1305.

Demodulating Unit within Receiving System

Figure 41:
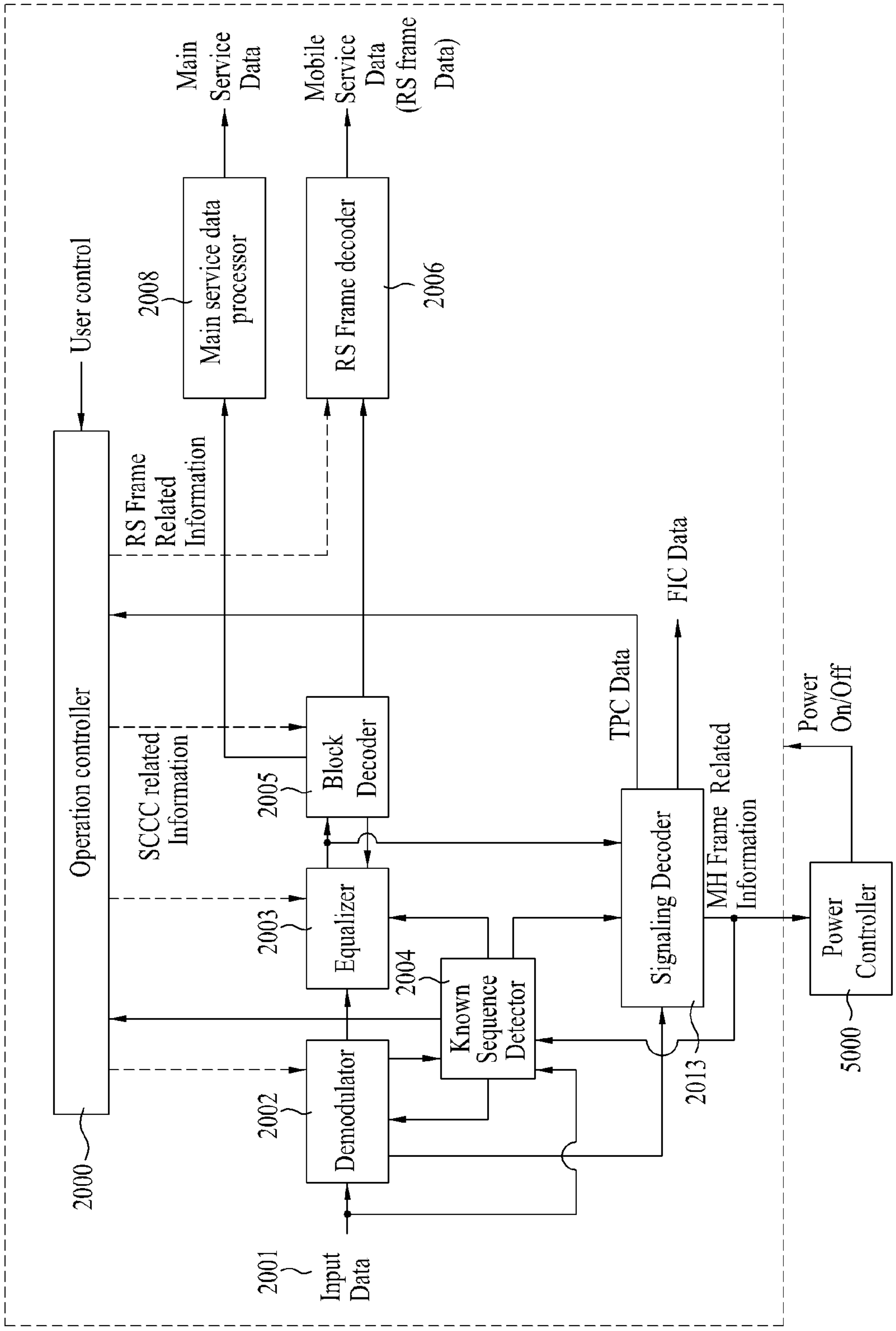
FIG. 41 is a block diagram showing an example of a demodulating unit in the receiving system.

FIG. 41 illustrates an example of a demodulating unit in a digital broadcast receiving system according to the present invention. The demodulating unit of FIG. 41 uses known data information, which is inserted in the mobile service data section and, then, transmitted by the transmitting system, so as to perform carrier synchronization recovery, frame synchronization recovery, and channel equalization, thereby enhancing the receiving performance. Also the demodulating unit may turn the power on only during a slot to which the data group of the designated (or desired) parade is assigned, thereby reducing power consumption of the receiving system.

Referring to FIG. 41, the demodulating unit includes an operation controller 2000, a demodulator 2002, an equalizer 2003, a known sequence detector 2004, a block decoder 2005, and a RS frame decoder 2006. The demodulating unit may further include a main service data processor 2008. The main service data processor 2008 may include a data deinterleaver, a RS decoder, and a data derandomizer. The demodulating unit may further include a signaling decoder 2013. The receiving system also may further include a power controller 5000 for controlling power supply of the demodulating unit.

More specifically, a frequency of a particular channel tuned by a tuner down converts to an intermediate frequency (IF) signal. Then, the down-converted data 2001 outputs the down-converted IF signal to the demodulator 2002 and the known sequence detector 2004. At this point, the down-converted data 2001 is inputted to the demodulator 2002 and the known sequence detector 2004 via analog/digital converter ADC (not shown). The ADC converts pass-band analog IF signal into pass-band digital IF signal.

The demodulator 2002 performs self gain control, carrier recovery, and timing recovery processes on the inputted pass-band digital IF signal, thereby modifying the IF signal to a base-band signal. Then, the demodulator 2002 outputs the newly created base-band signal to the equalizer 2003 and the known sequence detector 2004.

The equalizer 2003 compensates the distortion of the channel included in the demodulated signal and then outputs the error-compensated signal to the block decoder 2005.

At this point, the known sequence detector 2004 detects the known sequence position information inserted by the transmitting end from the input/output data of the demodulator 2002 (i.e., the data prior to the demodulation process or the data after the demodulation process). Thereafter, the position information along with the symbol sequence of the known data, which are generated from the detected position, is outputted to the operation controller 2000, the demodulator 2002, the equalizer 2003, and the signaling decoder 2013. Also, the known sequence detector 2004 outputs a set of information to the block decoder 2005. This set of information is used to allow the block decoder 2005 of the receiving system to identify the mobile service data that are processed with additional encoding from the transmitting system and the main service data that are not processed with additional encoding.

In addition, although the connection status is not shown in FIG. 41, the information detected from the known sequence detector 2004 may be used throughout the entire receiving system and may also be used in the RS frame decoder 2006.

The data demodulated in the demodulator 2002 or the data equalized in the channel equalizer 2003 is inputted to the signaling decoder 2013. The known data position information detected in the known sequence detector 2004 is inputted to the signaling decoder 2013.

The signaling decoder 2013 extracts and decodes signaling information (e.g., TPC information, and FIC information), which inserted and transmitted by the transmitting end, from the inputted data, the decoded signaling information provides to blocks requiring the signaling information.

More specifically, the signaling decoder 2013 extracts and decodes TPC data and FIC data, which inserted and transmitted by the transmitting end, from the equalized data, and then the decoded TPC data and FIC data outputs to the operation controller 2000, the known sequence detector 2004, and the power controller 5000. For example, the TPC data and FIC data is inserted in a signaling information region of each data group, and then is transmitted to a receiving system.

The signaling decoder 2013 performs signaling decoding as an inverse process of the signaling encoder shown in FIG. 34, so as to extract TPC data and FIC data. For example, the signaling decoder 2013 decodes the inputted data using the PCCC method and derandomizes the decoded data, thereby dividing the derandomized data into TPC data and FIC data. At this point, the signaling decoder 2013 performs RS-decoding on the divided TPC data, so as to correct the errors occurring in the TPC data. Subsequently, the signaling decoder 2013 deinterleaves the divided FIC data and then performs RS-decoding on the deinterleaved FIC data, so as to correct the error occurring in the FIC data. The error-corrected TPC data are then outputted to the operation controller 2000, the known sequence detector 2004, and the power controller 5000.

The TPC data may also include a transmission parameter which is inserted into the payload region of an OM packet by the service multiplexer 100, and then is transmitted to transmitter 200.

Herein, the TPC data may include RS frame information, SCCC information, M/H frame information, and so on, as shown in FIG. 35. The RS frame information may include RS frame mode information and RS code mode information. The SCCC information may include SCCC block mode information and SCCC outer code mode information. The M/H frame information may include M/H frame index information, and the TPC data may include sub-frame count information, slot count information, parade_id information, SGN information, NoG information, and so on.

At this point, the signaling decoder 2013 can know the signaling information region within a data group by using the known data information being outputted from the known sequence detector 2004. Namely, the $1^{st}$ known sequence (or training sequence) is located at the last 2 segments of the $3^{rd}$ M/H block (B3) within the data group. The $2^{nd}$ training sequence may be inserted at the $2^{nd}$ and $3^{rd}$ segments of the $4^{th}$ M/H block (B4). The $2^{nd}$ known sequence is located at between $2^{nd}$ and $3^{rd}$ segments of the $4^{th}$ M/H block (B4) within the data group. Since the $2^{nd}$ known sequence is inserted and received next to the signaling information area, the signaling decoder 2013 may extract and decode signaling information included in the signaling information region from the data being outputted in the demodulator 2002 or the channel equalizer 2003.

The power controller 5000 is inputted the M/H frame-associated information from the signaling decoder 2013, and controls power of the tuner and the demodulating unit. Alternatively, the power controller 5000 is inputted a power control information from the operation controller 2000, and controls power of the tuner and the demodulating unit.

According to the embodiment of the present invention, the power controller 5000 turns the power on only during a slot to which a slot of the parade including user-selected mobile service is assigned. The power controller 5000 then turns the power off during the remaining slots.

For example, it is assumed that data groups of a 1st parade with NOG=3, a 2nd parade with NOG=2, and a 3rd parade with NOG=3 are assigned to one M/H frame, as shown in FIG. 37. It is also assumed that the user has selected a mobile service included in the 1st parade using the keypad provided on the remote controller or terminal. In this case, the power controller 5000 turns the power on during a slot that data groups of the 1st parade is assigned, as shown in FIG. 37, and turns the power off during the remaining slots, thereby reducing power consumption.

The demodulator 2002 uses the known data symbol sequence during the timing and/or carrier recovery, thereby enhancing the demodulating performance. Similarly, the equalizer 2003 uses the known data so as to enhance the equalizing performance. Moreover, the decoding result of the block decoder 2005 may be fed-back to the equalizer 2003, thereby enhancing the equalizing performance.

Demodulator and Known Sequence Detector

At this point, the transmitting system may receive a data frame (or VSB frame) including a data group which known data sequence (or training sequence) is periodically inserted therein, as shown in FIG. 5. Herein, the data group is divided into regions A to D, as shown in FIG. 5. More specifically, in the example of the present invention, each region A, B, C, and D are further divided into M/H blocks B4 to B7, M/H blocks B3 and B8, M/H blocks B2 and B9, M/H blocks B1 and B10, respectively.

Referring to FIG. 38 and FIG. 39, known data sequence having the same pattern are included in each known data section that is being periodically inserted. Herein, the length of the known data sequence having identical data patterns may be either equal to or different from the length of the entire (or total) known data sequence of the corresponding known data section (or block). If the two lengths are different from one another, the length of the entire known data sequence should be longer than the length of the known data sequence having identical data patterns. In this case, the same known data sequences are included in the entire known data sequence.

As described above, when the known data are periodically inserted in-between the mobile service data, the channel equalizer of the receiving system may use the known data as training sequences, which may be used as accurate discriminant values. According to another embodiment of the present invention, the channel equalizer estimates a channel impulse response. Herein, the known data may be used in the process. According to yet another embodiment of the present invention, the channel equalizer may use the known data for updating filter coefficients (i.e., equalization coefficients).

Meanwhile, when known data sequence having the same pattern is periodically inserted, each known data sequence may be used as a guard interval in a channel equalizer according to the present invention. Herein, the guard interval prevents interference that occurs between blocks due to a multiple path channel. This is because the known data sequence located behind a mobile service data section (i.e., data block) may be considered as being copied in front of the mobile service data section.

The above-described structure is referred to as a cyclic prefix. This structure provides circular convolution in a time domain between a data block transmitted from the transmitting system and a channel impulse response. Accordingly, this facilitates the channel equalizer of the receiving system to perform channel equalization in a frequency domain by using a fast fourier transform (FFT) and an inverse fast fourier transform (IFFT).

More specifically, when viewed in the frequency domain, the data block received by the receiving system is expressed as a multiplication of the data block and the channel impulse response. Therefore, when performing the channel equalization, by multiplying the inverse of the channel in the frequency domain, the channel equalization may be performed more easily.

The known sequence detector 2004 detects the position of the known data being periodically inserted and transmitted as described above. At the same time, the known sequence detector 2004 may also estimate initial frequency offset during the process of detecting known data. In this case, the demodulator 2002 may estimate with more accuracy carrier frequency offset from the information on the known data position information and initial frequency offset estimation value, thereby compensating the estimated carrier frequency offset.

Meanwhile, when known data is transmitted, as shown in FIG. 5, the known sequence detector 2004 detects a position of second known data region by using known data of the second known data region that the same pattern is repeated twice.

At this point, since the known sequence detector 2004 is well-informed of the data group structure, when the position of the second known data region is detected, the known sequence detector 2004 can estimate positions of the first, third, fourth, fifth, and sixth known data regions of a corresponding data group by counting symbols or segments based upon the second known data region position. If the corresponding data group is a data group including field synchronization segment, the known sequence detector 2004 can estimate the position of the field synchronization segment of the corresponding data group, which is positioned chronologically before the second known data region, by counting symbols or segments based upon the second known data region position. Also, the known sequence detector 2004 may estimate the known data position information and the field synchronization position information from the parade including mobile service selected by a user based on the M/H frame-associated information outputted from the signaling decoder 2013.

At least one of the estimated known data poison information and field synchronization information is provided to the demodulator 2002, the channel equalizer 2003, the signaling decoder 2013, and the operation controller 2000.

Also, the known sequence detector 2004 may estimate initial frequency offset by using known data inserted in the second known data region (i.e., ACQ known data region). In this case, the demodulator 2002 may estimate with more accuracy carrier frequency offset from the information on the known data position information and initial frequency offset estimation value, thereby compensating the estimated carrier frequency offset.

Operation Controller

The operation controller 2000 receives the known data position information and the transmission parameter information and then forwards M/H frame time information, a presence or non-presence of a data group of a selected parade, position information of known data within the data group, power control information and the like to each block of the demodulating unit. The operation controller 2000, as shown in FIG. 41, controls operations of the demodulator 2002, the channel equalizer 2003, the block decoder 2005 and the RS frame decoder 2006. And, the operation controller 2000 is able to overall operations of the demodulating unit (not shown in the drawing). Moreover, the operation controller 2000 can be implemented with the separate block or can be included within a prescribed one of the blocks of the demodulating unit shown in FIG. 41.

Figure 42:
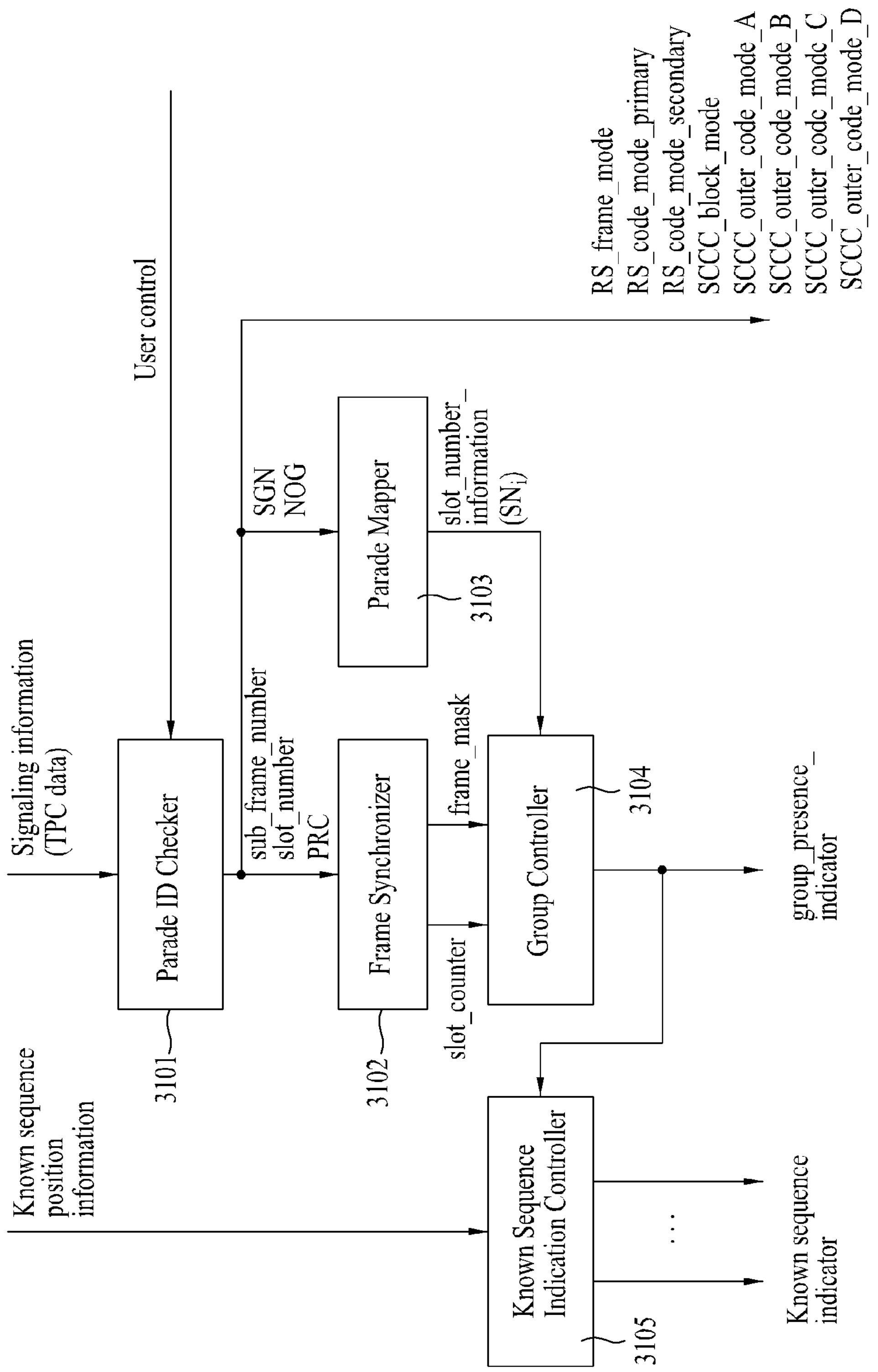
FIG. 42 is a block diagram showing an example of an operation controller of FIG. 41.

FIG. 42 is an overall block diagram of an operation controller 2000.

Referring to FIG. 42, the operation controller 2000 can include a parade ID checker 3101, a frame synchronizer 3102, a parade mapper 3103, a group controller 3104 and a known sequence indication controller 3105.

The operation controller 2000 receives known data position information from the known sequence detector 2004 and receives transmission parameter information from the signaling decoder 2013. The operation controller 2000 then generates a control signal necessary for a demodulating unit of a receiving system. For instance, the known data position information detected by the known sequence detector 2004 is inputted to the known sequence indication controller 3105. And, the transmission parameter information (i.e., TPC data) decoded by the signaling decoder 2013 is inputted to the parade ID checker 3101.

The parade ID checker 3101 compares a parade ID (parade ID selected by a user) contained in the user control signal to a parade ID inputted from the signaling decoder 2013. If the two parade IDs are not identical to each other, the parade ID checker stands by until a next transmission parameter is inputted from the signaling decoder 2013.

If the two parade IDs are identical to each other, the parade ID checker 3101 outputs the transmission parameter information to the blocks within the operation controller 2000 and the overall system.

If it is checked that the parade ID in the transmission parameter information inputted to the parade ID checker 3101 is identical to the parade ID selected by a user, the parade ID checker 3101 outputs starting_group_number (SGN) and number_of_groups (NOG) to the parade mapper 3103, outputs sub_frame_number, slot_number and parade_repetition_cycle PRC) to the frame synchronizer 3102, outputs SCCC_block_mode, SCCC_outer_code_mode_A, SCCC_outer_code_mode_B, SCCC_outer_code_mode_C and SCCC_outer_code_mode_D to the block decoder 2005, and outputs RS_frame_mode, RS_code_mode_primary and Rs_code_mode_secondary to the RS frame decoder 2006.

The parade mapper 3103 receives the SGN and the NOG from the parade ID checker as inputs, decides a data group is carried by which one of sixteen slots within a Sub-frame, and then outputs the corresponding information. Data group number transmitted every sub-frame is set to an integer consecutive between SGN and (SGN+NOG−1). For instance, if SGN=3 and NOG=4, four groups, of which group numbers are 3, 4, 5 and 6, are transmitted for the corresponding sub-frames, respectively. The parade mapper finds a slot number j for transmitting a data group according to Equation 1 with a group number i obtained from SGN and NOG.

In the above example, in case of SGN=3 and NOG=4, if they are inserted in Equation 1, slot numbers of groups transmitted according to the above formula sequentially become 12, 2, 6 and 10.

The parade mapper 3103 then outputs the found slot number information.

For example of outputting slot numbers, a method of using a bit vector having 16 bits is available.

A bit vector SNi (i=0~15) can be set to 1 if there exists a group transmitted for an $i^{th}$ slot. A bit vector SNi (i=0~15) can be set to 0 if a group transmitted for an $i^{th}$ slot does not exist. And, this bit vector can be outputted as slot number information.

The frame synchronizer 3102 receives the sub_frame_number, slot-number and PRC from the parade ID checker and then sends slot_counter and frame_mask signals as outputs. The slot_counter is the signal indicating a slot_number at a current timing point at which a receiver is operating. And, the frame_mask is the signal indicating whether a corresponding parade is transmitted for a current frame. The frame synchronizer 3102 performs a process for initializing slot_counter, sub_frame_number and frame_counter in receiving signaling information initially. A counter value of a current timing point is generated from adding a delayed slot number L according to a time taken to decode signaling from demodulation together with the signaling information inputted in this process. After completion of the initialization process, slot_counter is updated every single slot period, updates sub_frame_counter every period of the slot_counter value, and updates frame_counter every period of the sub_frame_counter. By referring to the frame_counter information and the PRC information, a frame_mask signal is generated. For example, if a corresponding parade is being transmitted for a current frame, '1' is outputted as the frame_mask. Otherwise, it is able to output '0'.

The group controller 3104 receives the slot number information from the parade mapper 3103. The group controller 3104 receives the slot_counter and frame_mask information from the frame synchronizer 3102. The group controller 3104 then outputs group_presence_indicator indicating whether an M/H group is being transmitted. For instance, if the slot number information inputted from the parade mapper 3103 corresponds to 12, 2, 6 and 10, when the frame_mask information inputted from the frame synchronizer 3102 is 1 and the slot_counter inputted from the frame synchronizer 3102 includes 2, 6, 10 and 12, '1' is outputted as the group_presence_indicator. Otherwise, it is able to output 0.

The known sequence indication controller 3105 outputs position information of another known data, group start position information and the like with position information of specific inputted known data. In this case, since the known data are present at a previously appointed position within the data group, if position data of one of a plurality of known data sequences, it is able to know data position information of another known sequence, data group start position information and the like. The known sequence indication controller 3105 can output known data and data group position information necessary for the demodulating unit of the receiving system using the group_presence_indicator information only if the data group is transmitted. Alternatively, the known sequence detector 2004 can perform operations of the known sequence indication controller 3105.

Channel Equalizer

The data demodulated by the demodulator 2002 by using the known data are inputted to the equalizer 2003. Additionally, the demodulated data may also be inputted to the known sequence detector 2004. At this point, a data group that is inputted for the equalization process may be divided into region A to region D, as shown in FIG. 5. More specifically, according to the embodiment of the present invention, region A includes M/H block B4 to M/H block B7, region B includes M/H block B3 and M/H block B8, region C includes M/H block B2 and M/H block B9, and region D includes M/H block B1 and M/H block B10. In other words, one data group is divided into M/H blocks from B1 to B10, each M/H block having the length of 16 segments. Also, a long training sequence (i.e., known data sequence) is inserted at the starting portion of the M/H blocks B4 to B8. Furthermore, two data groups may be allocated (or assigned) to one VSB field. In this case, field synchronization data are positioned in the $37^{th}$ segment of one of the two data groups.

The present invention may use known data, which have position and content information based upon an agreement between the transmitting system and the receiving system, and/or field synchronization data for the channel equalization process.

The channel equalizer 2003 may perform channel equalization using a plurality of methods. According to the present invention, the channel equalizer 2003 uses known data and/or field synchronization data, so as to estimate a channel impulse response (CIR), thereby performing channel equalization.

Most particularly, an example of estimating the CIR in accordance with each region within the data group, which is hierarchically divided and transmitted from the transmitting system, and applying each CIR differently will also be described herein.

At this point, a data group can be assigned and transmitted a maximum the number of 4 in a VSB frame in the transmitting system. In this case, all data group do not include field synchronization data. In the present invention, the data group including the field synchronization data performs channel-equalization using the field synchronization data and known data. And the data group not including the field synchronization data performs channel-equalization using the known data.

For example, the data of the M/H block B3 including the field synchronization data performs channel-equalization using the CIR calculated from the field synchronization data area and the CIR calculated from the first known data area. Also, the data of the M/H blocks B1 and B2 performs channel-equalization using the CIR calculated from the field synchronization data area and the CIR calculated from the first known data area. Meanwhile, the data of the M/H blocks B1 to B3 not including the field synchronization data performs channel-equalization using CIRS calculated from the first known data area and the third known data area.

As described above, the present invention uses the CIR estimated from the known data region in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations.

Figure 43:
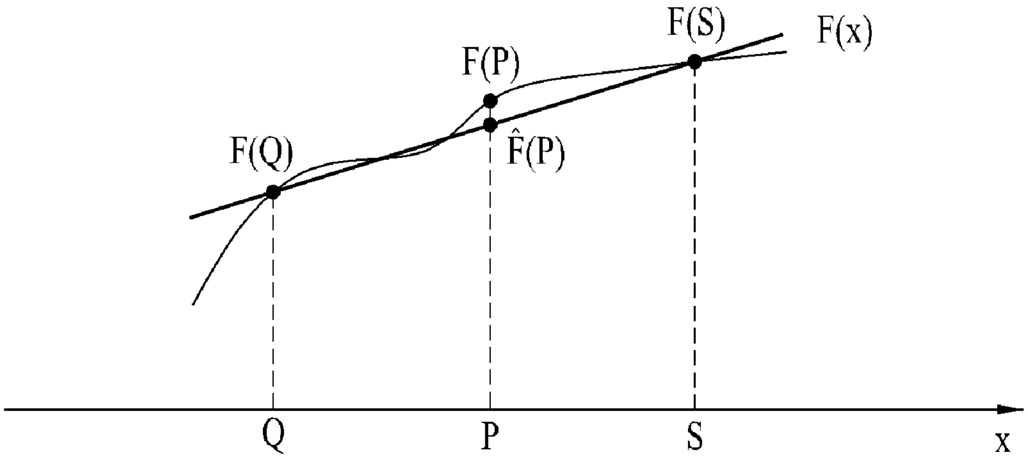
FIG. 43 illustrates an example of linear interpolation according to the present invention.

FIG. 43 illustrates an example of linear interpolation. More specifically, in a random function F(x), when given the values F(Q) and F(S) each from points x=Q and x=S, respectively, the approximate value $\hat{F}(P)$ of the F(x) function at point x=P may be estimated by using Equation 7 below. In other words, since the values of F(Q) and F(S) respective to each point x=Q and x=S are known (or given), a straight line passing through the two points may be calculated so as to obtain the approximate value $\hat{F}(P)$ of the corresponding function value at point P. At this point, the straight line passing through points (Q,F(Q)) and (S,F(S)) may be obtained by using Equation 7 below.

$$\hat{F}(x) = \frac{F(S) - F(Q)}{S - Q}(x - Q) + F(Q) \quad \text{Equation 7}$$

Accordingly, Equation 8 below shows the process of substituting p for x in Equation 7, so as to calculate the approximate value $\hat{F}(P)$ of the function value at point P.

$$\hat{F}(P) = \frac{F(S) - F(Q)}{S - Q}(P - Q) + F(Q) \quad \text{Equation 8}$$

$$\hat{F}(P) = \frac{S - P}{S - Q}F(Q) + \frac{P - Q}{S - Q}F(S)$$

The linear interpolation method of Equation 8 is merely the simplest example of many other linear interpolation methods. Therefore, since any other linear interpolation method may be used, the present invention will not be limited only to the examples given herein.

Alternatively, when a value F(Q) of a function F(x) at a particular point Q and a value F(S) of the function F(x) at another particular point S are known (or given), extrapolation refers to estimating a function value of a point outside of the section between points Q and S. Herein, the simplest form of extrapolation corresponds to linear extrapolation.

Figure 44:
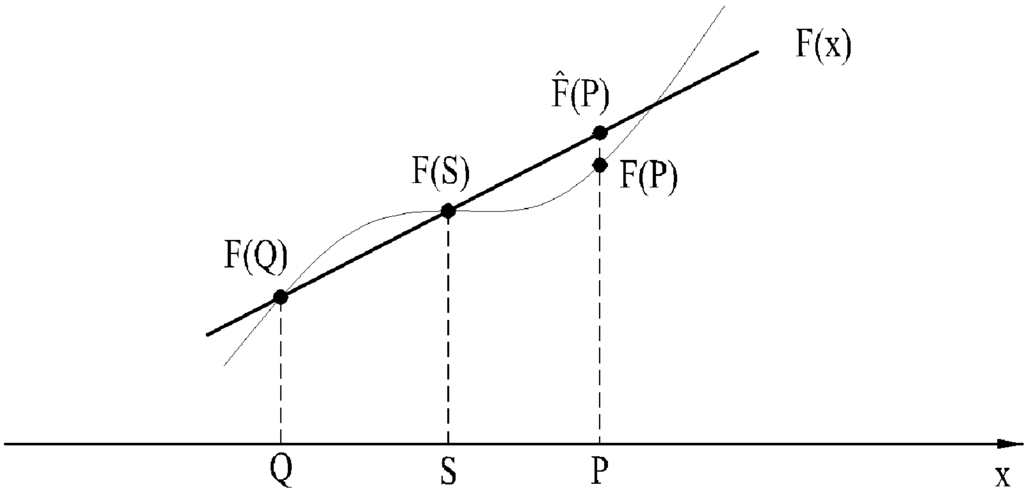
FIG. 44 illustrates an example of linear extrapolation according to the present invention.

FIG. 44 illustrates an example of linear extrapolation. As described above, for linear extrapolation as well as linear interpolation, in a random function F(x), when given the values F(Q) and F(S) each from points x=Q and x=S, respectively, the approximate value $\hat{F}(P)$ of the corresponding function value at point P may be obtained by calculating a straight line passing through the two points. Herein, linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

Figure 45:
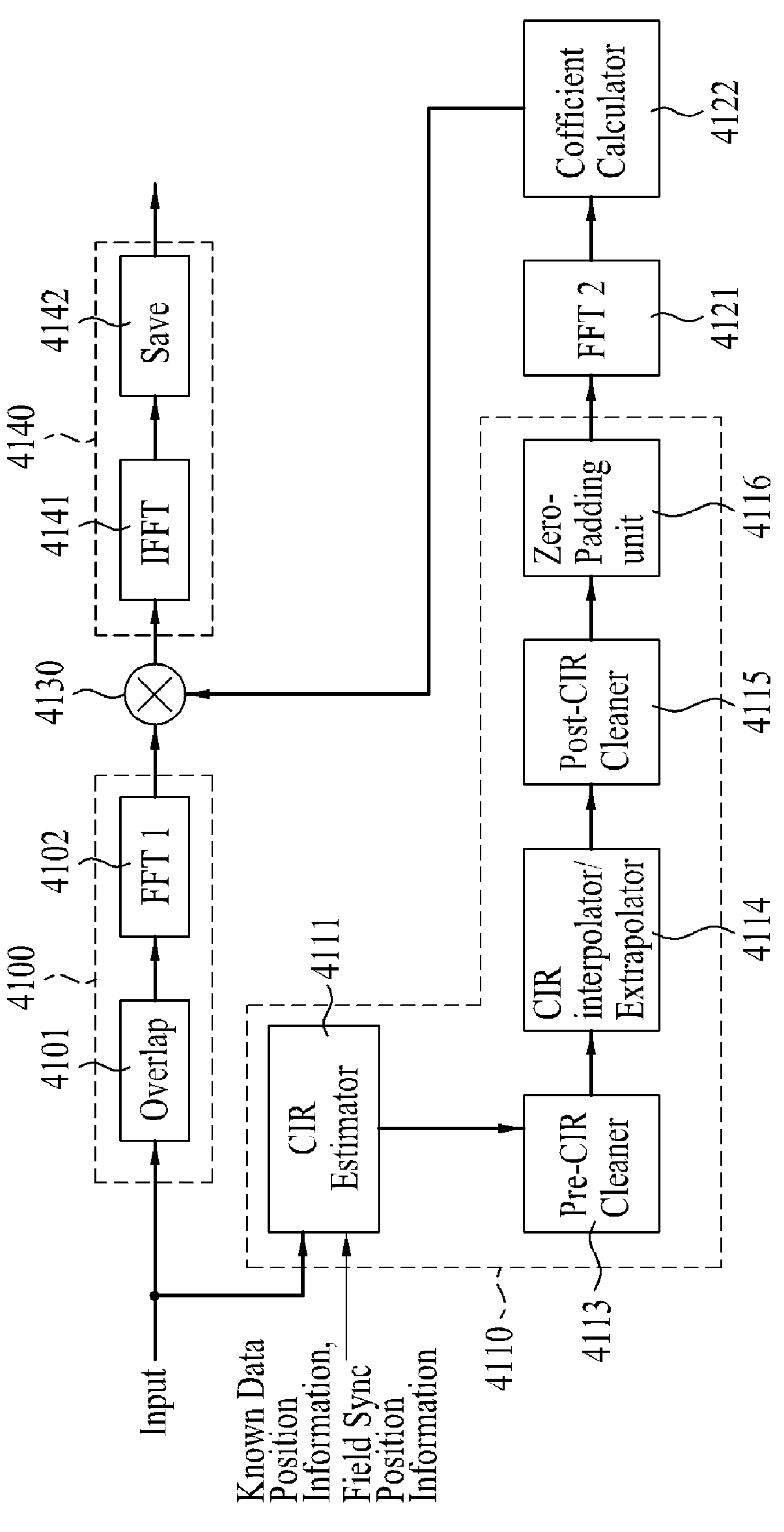
FIG. 45 illustrates a block diagram of a channel equalizer according to an embodiment of the present invention.

FIG. 45 illustrates a block diagram of a channel equalizer according to an embodiment of the present invention. Referring to FIG. 45, the channel equalizer includes a first frequency domain converter 4100, a channel estimator 4110, a second frequency domain converter 4121, a coefficient calculator 4122, a distortion compensator 4130, and a time domain converter 4140. Herein, the channel equalizer may further include a remaining carrier phase error remover, a noise canceller (NC), and a decision unit.

The first frequency domain converter 4100 includes an overlap unit 4101 overlapping inputted data, and a fast fourier transform (FFT) unit 4102 converting the data outputted from the overlap unit 4101 to frequency domain data.

The channel estimator 4110 includes a CIR estimator 4111, a first cleaner 4113, a CIR calculator 4114, a second cleaner, and a zero-padding unit. herein, the channel estimator 4110 may further include a phase compensator compensating a phase of the CIR which estimated in the CIR estimator 4111.

The second frequency domain converter 4121 includes a fast fourier transform (FFT) unit converting the CIR being outputted from the channel estimator 4110 to frequency domain CIR.

The time domain converter 4140 includes an IFFT unit 4141 converting the data having the distortion compensated by the distortion compensator 4130 to time domain data, and a save unit 4142 extracting only valid data from the data outputted from the IFFT unit 4141. The output data from the save unit 4142 corresponds to the channel-equalized data.

If the remaining carrier phase error remover is connected to an output terminal of the time domain converter 4140, the remaining carrier phase error remover estimates the remaining carrier phase error included in the channel-equalized data, thereby removing the estimated error. If the noise remover is connected to an output terminal of the time domain converter 4140, the noise remover estimates noise included in the channel-equalized data, thereby removing the estimated noise.

More specifically, the receiving data demodulated in FIG. 45 are overlapped by the overlap unit 4101 of the first frequency domain converter 4100 at a pre-determined overlapping ratio, which are then outputted to the FFT unit 4102. The FFT unit 4102 converts the overlapped time domain data to overlapped frequency domain data through by processing the data with FFT. Then, the converted data are outputted to the distortion compensator 4130.

The distortion compensator 4130 performs a complex number multiplication on the overlapped frequency domain data outputted from the FFT unit 4102 included in the first frequency domain converter 4100 and the equalization coefficient calculated from the coefficient calculator 4122, thereby compensating the channel distortion of the overlapped data outputted from the FFT unit 4102. Thereafter, the compensated data are outputted to the IFFT unit 4141 of the time domain converter 4140. The IFFT unit 4141 performs IFFT on the overlapped data having the channel distortion compensated, thereby converting the overlapped data to time domain data, which are then outputted to the save unit 4142. The save unit 4142 extracts valid data from the data of the channel-equalized and overlapped in the time domain, and outputs the extracted valid data.

Meanwhile, the received data are inputted to the overlap unit 4101 of the first frequency domain converter 4100 included in the channel equalizer and, at the same time, inputted to the CIR estimator 4111 of the channel estimator 4110.

The CIR estimator 4111 uses a training sequence, for example, data being inputted during the known data section and the known data in order to estimate the CIR. If the data to be channel-equalizing is the data within the data group including field synchronization data, the training sequence using in the CIR estimator 4111 may become the field synchronization data and known data. Meanwhile, if the data to be channel-equalizing is the data within the data group not including field synchronization data, the training sequence using in the CIR estimator 4111 may become only the known data.

For example, the CIR estimator 4111 estimates CIR using the known data correspond to reference known data generated during the known data section by the receiving system in accordance with an agreement between the receiving system and the transmitting system. For this, the CIR estimator 4111 is provided known data position information from the known sequence detector 2004. Also the CIR estimator 4111 may be provided field synchronization position information from the known sequence detector 2004.

The estimated CIR passes through the first cleaner (or pre-CIR cleaner) 4113 or bypasses the first cleaner 4113, thereby being inputted to the CIR calculator (or CIR interpolator-extrapolator) 4114. The CIR calculator 4114 either interpolates or extrapolates an estimated CIR, which is then outputted to the second cleaner (or post-CIR cleaner) 4115.

The first cleaner 4113 may or may not operate depending upon whether the CIR calculator 4114 interpolates or extrapolates the estimated CIR. For example, if the CIR calculator 4114 interpolates the estimated CIR, the first cleaner 4113 does not operate. Conversely, if the CIR calculator 4114 extrapolates the estimated CIR, the first cleaner 4113 operates.

More specifically, the CIR estimated from the known data includes a channel element that is to be obtained as well as a jitter element caused by noise. Since such jitter element deteriorates the performance of the equalizer, it preferable that a coefficient calculator 4122 removes the jitter element before using the estimated CIR. Therefore, according to the embodiment of the present invention, each of the first and second cleaners 4113 and 4115 removes a portion of the estimated CIR having a power level lower than the predetermined threshold value (i.e., so that the estimated CIR becomes equal to '0'). Herein, this removal process will be referred to as a "CIR cleaning" process.

The CIR calculator 4114 performs CIR interpolation by multiplying CIRs estimated from the CIR estimator 4111 by each of coefficients, thereby adding the multiplied values. At this point, some of the noise elements of the CIR may be added to one another, thereby being cancelled. Therefore, when the CIR calculator 4114 performs CIR interpolation, the original (or initial) CIR having noise elements remaining therein. In other words, when the CIR calculator 4114 performs CIR interpolation, the estimated CIR bypasses the first cleaner 4113 and is inputted to the CIR calculator 4114. Subsequently, the second cleaner 4115 cleans the CIR interpolated by the CIR interpolator-extrapolator 4114.

Conversely, the CIR calculator 4114 performs CIR extrapolation by using a difference value between two CIRs, so as to estimate a CIR positioned outside of the two CIRs. Therefore, in this case, the noise element is rather amplified. Accordingly, when the CIR calculator 4114 performs CIR extrapolation, the CIR cleaned by the first cleaner 4113 is used. More specifically, when the CIR calculator 4114 performs CIR extrapolation, the extrapolated CIR passes through the second cleaner 4115, thereby being inputted to the zero-padding unit 4116.

Meanwhile, when a second frequency domain converter (or fast fourier transform (FFT2)) 4121 converts the CIR, which has been cleaned and outputted from the second cleaner 4115, to a frequency domain, the length and of the inputted CIR and the FFT size may not match (or be identical to one another). In other words, the CIR length may be smaller than the FFT size. In this case, the zero-padding unit 4116 adds a number of zeros '0's corresponding to the difference between the FFT size and the CIR length to the inputted CIR, thereby outputting the processed CIR to the second frequency domain converter (FFT2) 4121. Herein, the zero-padded CIR may correspond to one of the interpolated CIR, extrapolated CIR, and the CIR estimated in the known data section.

The second frequency domain converter 4121 performs FFT on the CIR being outputted from the zero padding unit 4116, thereby converting the CIR to a frequency domain CIR. Then, the second frequency domain converter 4121 outputs the converted CIR to the coefficient calculator 4122.

The coefficient calculator 4122 uses the frequency domain CIR being outputted from the second frequency domain converter 4121 to calculate the equalization coefficient. Then, the coefficient calculator 4122 outputs the calculated coefficient to the distortion compensator 4130. Herein, for example, the coefficient calculator 4122 calculates a channel equalization coefficient of the frequency domain that can provide minimum mean square error (MMSE) from the CIR of the frequency domain, which is outputted to the distortion compensator 4130.

The distortion compensator 4130 performs a complex number multiplication on the overlapped data of the frequency domain being outputted from the FFT unit 4102 of the first frequency domain converter 4100 and the equalization coefficient calculated by the coefficient calculator 4122, thereby compensating the channel distortion of the overlapped data being outputted from the FFT unit 4102.

Block Decoder

Meanwhile, if the data being inputted to the block decoder 2005, after being channel-equalized by the equalizer 2003, correspond to the data having both block encoding and trellis encoding performed thereon (i.e., the data within the RS frame, the signaling information data, etc.) by the transmitting system, trellis decoding and block decoding processes are performed on the inputted data as inverse processes of the transmitting system. Alternatively, if the data being inputted to the block decoder 2005 correspond to the data having only trellis encoding performed thereon (i.e., the main service data), and not the block encoding, only the trellis decoding process is performed on the inputted data as the inverse process of the transmitting system.

The trellis decoded and block decoded data by the block decoder 2005 are then outputted to the RS frame decoder 2006. More specifically, the block decoder 2005 removes the known data, data used for trellis initialization, and signaling information data, MPEG header, which have been inserted in the data group, and the RS parity data, which have been added by the RS encoder/non-systematic RS encoder or non-systematic RS encoder of the transmitting system.

Then, the block decoder 2005 outputs the processed data to the RS frame decoder 2006. Herein, the removal of the data may be performed before the block decoding process, or may be performed during or after the block decoding process.

Meanwhile, the data trellis-decoded by the block decoder 2005 are outputted to the data deinterleaver of the main service data processor 2008. At this point, the data being trellis-decoded by the block decoder 2005 and outputted to the data deinterleaver may not only include the main service data but may also include the data within the RS frame and the signaling information. Furthermore, the RS parity data that are added by the transmitting system after the pre-processor 230 may also be included in the data being outputted to the data deinterleaver.

According to another embodiment of the present invention, data that are not processed with block decoding and only processed with trellis encoding by the transmitting system may directly bypass the block decoder 2005 so as to be outputted to the data deinterleaver. In this case, a trellis decoder should be provided before the data deinterleaver. More specifically, if the inputted data correspond to the data having only trellis encoding performed thereon and not block encoding, the block decoder 2005 performs Viterbi (or trellis) decoding on the inputted data so as to output a hard decision value or to perform a hard-decision on a soft decision value, thereby outputting the result.

Meanwhile, if the inputted data correspond to the data having both block encoding process and trellis encoding process performed thereon, the block decoder 2005 outputs a soft decision value with respect to the inputted data.

In other words, if the inputted data correspond to data being processed with block encoding by the block processor 302 and being processed with trellis encoding by the trellis encoding module 256, in the transmitting system, the block decoder 2005 performs a decoding process and a trellis decoding process on the inputted data as inverse processes of the transmitting system. At this point, the RS frame encoder of the pre-processor included in the transmitting system may be viewed as an outer (or external) encoder. And, the trellis encoder may be viewed as an inner (or internal) encoder. When decoding such concatenated codes, in order to allow the block decoder 2005 to maximize its performance of decoding externally encoded data, the decoder of the internal code should output a soft decision value.

Figure 46:
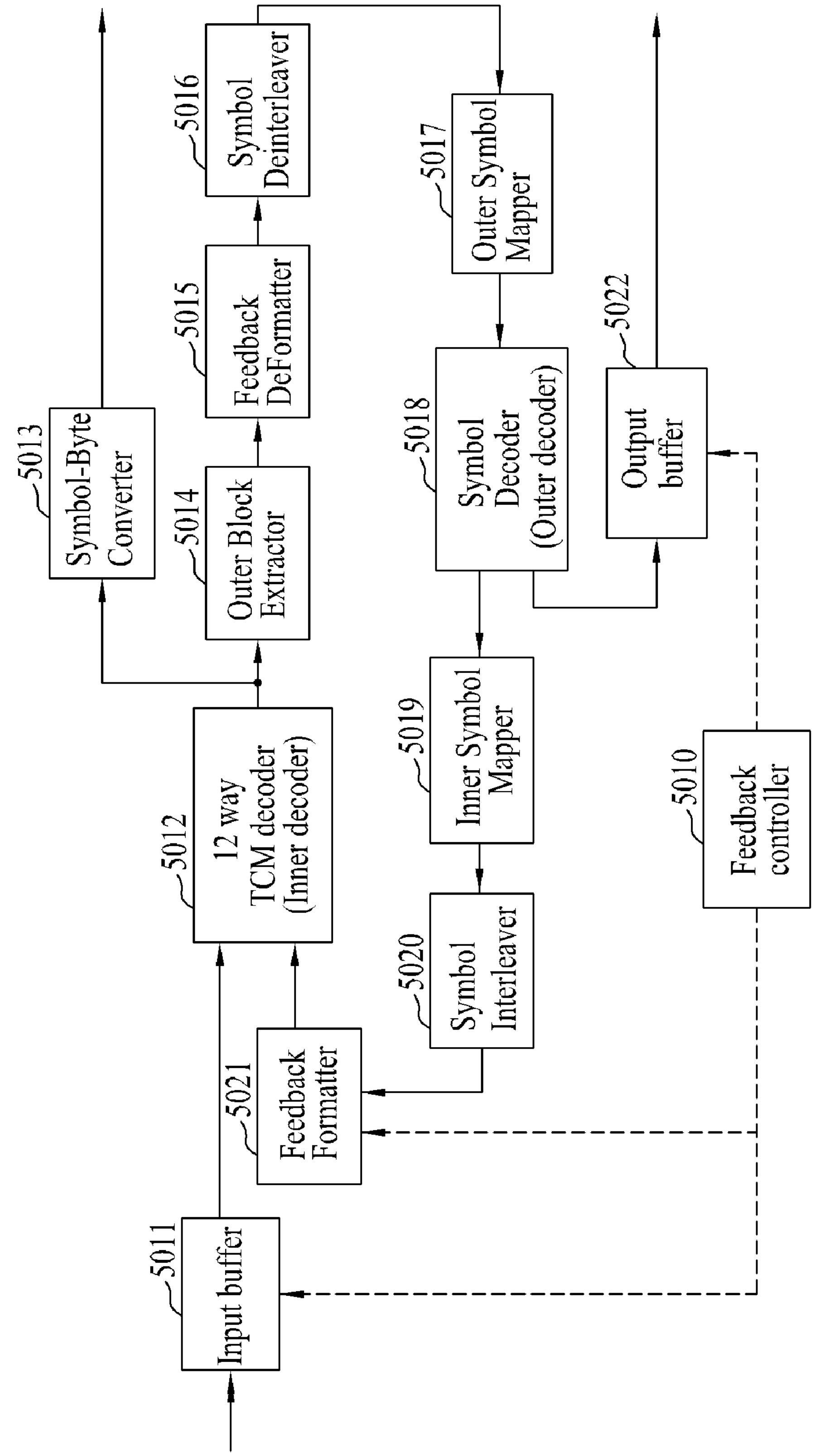
FIG. 46 illustrates a block diagram of a block decoder according to an embodiment of the present invention.

FIG. 46 illustrates a detailed block diagram of the block decoder 2005 according to an embodiment of the present invention. Referring to FIG. 46, the block decoder 2005 includes a feedback controller 4010, an input buffer 4011, a trellis decoding unit (or 12-way trellis coded modulation (TCM) decoder or inner decoder) 4012, a symbol-byte converter 4013, an outer block extractor 4014, a feedback deformatter 4015, a symbol deinterleaver 4016, an outer symbol mapper 4017, a symbol decoder 4018, an inner symbol mapper 4019, a symbol interleaver 4020, a feedback formatter 4021, and an output buffer 4022. Herein, just as in the transmitting system, the trellis decoding unit 4012 may be viewed as an inner (or internal) decoder. And, the symbol decoder 4018 may be viewed as an outer (or external) decoder.

The input buffer 4011 temporarily stores the mobile service data symbols being channel-equalized and outputted from the equalizer 2003. (Herein, the mobile service data symbols may include symbols corresponding to the signaling information, RS parity data symbols and CRC data symbols added during the encoding process of the RS frame.) Thereafter, the input buffer 4011 repeatedly outputs the stored symbols for M number of times to the trellis decoding unit 4012 in a turbo block (TDL) size required for the turbo decoding process.

The turbo decoding length (TDL) may also be referred to as a turbo block. Herein, a TDL should include at least one SCCC block size. Therefore, as defined in FIG. 5, when it is assumed that one M/H block is a 16-segment unit, and that a combination of 10 M/H blocks form one SCCC block, a TDL should be equal to or larger than the maximum possible combination size. For example, when it is assumed that 2 M/H blocks form one SCCC block, the TDL may be equal to or larger than 32 segments (i.e., 828×32=26496 symbols). Herein, M indicates a number of repetitions for turbo-decoding pre-decided by the feed-back controller 4010.

Also, M represents a number of repetitions of the turbo decoding process, the number being predetermined by the feedback controller 4010.

Additionally, among the values of symbols being channel-equalized and outputted from the equalizer 2003, the input symbol values corresponding to a section having no mobile service data symbols (including RS parity data symbols during RS frame encoding and CRC data symbols) included therein, bypass the input buffer 4011 without being stored. More specifically, since trellis-encoding is performed on input symbol values of a section wherein SCCC block-encoding has not been performed, the input buffer 4011 inputs the inputted symbol values of the corresponding section directly to the trellis encoding module 4012 without performing any storage, repetition, and output processes. The storage, repetition, and output processes of the input buffer 4011 are controlled by the feedback controller 4010. Herein, the feedback controller 4010 refers to SCCC-associated information (e.g., SCCC block mode and SCCC outer code mode), which are outputted from the signaling decoder 2013 or the operation controller 2000, in order to control the storage and output processes of the input buffer 4011.

The trellis decoding unit 4012 includes a 12-way TCM decoder. Herein, the trellis decoding unit 4012 performs 12-way trellis decoding as inverse processes of the 12-way trellis encoder.

More specifically, the trellis decoding unit 4012 receives a number of output symbols of the input buffer 4011 and soft-decision values of the feedback formatter 4021 equivalent to each TDL, so as to perform the TCM decoding process.

At this point, based upon the control of the feedback controller 4010, the soft-decision values outputted from the feedback formatter 4021 are matched with a number of mobile service data symbol places so as to be in a one-to-one (1:1) correspondence. Herein, the number of mobile service data symbol places is equivalent to the TDL being outputted from the input buffer 4011.

More specifically, the mobile service data being outputted from the input buffer 4011 are matched with the turbo decoded data being inputted, so that each respective data place can correspond with one another. Thereafter, the matched data are outputted to the trellis decoding unit 4012. For example, if the turbo decoded data correspond to the third symbol within the turbo block, the corresponding symbol (or data) is matched with the third symbol included in the turbo block, which is outputted from the input buffer 4011. Subsequently, the matched symbol (or data) is outputted to the trellis decoding unit 4012.

In order to do so, while the regressive turbo decoding is in process, the feedback controller 4010 controls the input buffer 4011 so that the input buffer 4011 stores the corresponding turbo block data. Also, by delaying data (or symbols), the soft decision value (e.g., LLR) of the symbol outputted from the symbol interleaver 4020 and the symbol of the input buffer 4011 corresponding to the same place (or position) within the block of the output symbol are matched with one another to be in a one-to-one correspondence. Thereafter, the matched symbols are controlled so that they can be inputted to the TCM decoder through the respective path. This process is repeated for a predetermined number of turbo decoding cycle periods. Then, the data of the next turbo block are outputted from the input buffer 4011, thereby repeating the turbo decoding process.

The output of the trellis decoding unit 4012 signifies a degree of reliability of the transmission bits configuring each symbol. For example, in the transmitting system, since the input data of the trellis encoding module correspond to two bits as one symbol, a log likelihood ratio (LLR) between the likelihood of a bit having the value of '1' and the likelihood of the bit having the value of '0' may be respectively outputted (in bit units) to the upper bit and the lower bit. Herein, the log likelihood ratio corresponds to a log value for the ratio between the likelihood of a bit having the value of '1' and the likelihood of the bit having the value of '0'. Alternatively, a LLR for the likelihood of 2 bits (i.e., one symbol) being equal to "00", "01", "10", and "11" may be respectively outputted (in symbol units) to all 4 combinations of bits (i.e., 00, 01, 10, 11). Consequently, this becomes the soft decision value that indicates the degree of reliability of the transmission bits configuring each symbol. A maximum a posteriori probability (MAP) or a soft-out Viterbi algorithm (SOYA) may be used as a decoding algorithm of each TCM decoder within the trellis decoding unit 4012.

The output of the trellis decoding unit 4012 is inputted to the symbol-byte converter 4013 and the outer block extractor 4014.

The symbol-byte converter 4013 performs a hard-decision process of the soft decision value that is trellis decoded and outputted from the trellis decoding unit 4012. Thereafter, the symbol-byte converter 4013 groups 4 symbols into byte units, which are then outputted to the data deinterleaver of the main service data processor 2008 of FIG. 41. More specifically, the symbol-byte converter 4013 performs hard-decision in bit units on the soft decision value of the symbol outputted from the trellis decoding unit 4012. Therefore, the data processed with hard-decision and outputted in bit units from the symbol-byte converter 4013 not only include main service data, but may also include mobile service data, known data, RS parity data, and MPEG headers.

Among the soft decision values of TDL size of the trellis decoding unit 4012, the outer block extractor 4014 identifies the soft decision values of B size of corresponding to the mobile service data symbols (wherein symbols corresponding to signaling information, RS parity data symbols that are added during the encoding of the RS frame, and CRC data symbols are included) and outputs the identified soft decision values to the feedback deformatter 4015.

The feedback deformatter 4015 changes the processing order of the soft decision values corresponding to the mobile service data symbols. This is an inverse process of an initial change in the processing order of the mobile service data symbols, which are generated during an intermediate step, wherein the output symbols outputted from the block processor 302 of the transmitting system are being inputted to the trellis encoding module 256 (e.g., when the symbols pass through the group formatter, the data deinterleaver, the packet formatter, and the data interleaver). Thereafter, the feedback deformatter 2015 performs reordering of the process order of soft decision values corresponding to the mobile service data symbols and, then, outputs the processed mobile service data symbols to the symbol deinterleaver 4016.

This is because a plurality of blocks exist between the block processor 302 and the trellis encoding module 256, and because, due to these blocks, the order of the mobile service data symbols being outputted from the block processor 302 and the order of the mobile service data symbols being inputted to the trellis encoding module 256 are not identical to one another. Therefore, the feedback deformatter 4015 reorders (or rearranges) the order of the mobile service data symbols being outputted from the outer block extractor 4014, so that the order of the mobile service data symbols being inputted to the symbol deinterleaver 4016 matches the order of the mobile service data symbols outputted from the block processor 302 of the transmitting system. The reordering process may be embodied as one of software, middleware, and hardware.

The symbol deinterleaver 4016 performs deinterleaving on the mobile service data symbols having their processing orders changed and outputted from the feedback deformatter 4015, as an inverse process of the symbol interleaving process of the symbol interleaver 514 included in the transmitting system. The size of the block used by the symbol deinterleaver 4016 during the deinterleaving process is identical to interleaving size of an actual symbol (i.e., B) of the symbol interleaver 514, which is included in the transmitting system. This is because the turbo decoding process is performed between the trellis decoding unit 4012 and the symbol decoder 4018. Both the input and output of the symbol deinterleaver 4016 correspond to soft decision values, and the deinterleaved soft decision values are outputted to the outer symbol mapper 4017.

The operations of the outer symbol mapper 4017 may vary depending upon the structure and coding rate of the convolution encoder 513 included in the transmitting system. For example, when data are 1/2-rate encoded by the convolution encoder 513 and then transmitted, the outer symbol mapper 4017 directly outputs the input data without modification. In another example, when data are 1/4-rate encoded by the convolution encoder 513 and then transmitted, the outer symbol mapper 4017 converts the input data so that it can match the input data format of the symbol decoder 4018. For this, the outer symbol mapper 4017 may be inputted SCCC-associated information (i.e., SCCC block mode and SCCC outer code mode) from the signaling decoder 2013. Then, the outer symbol mapper 4017 outputs the converted data to the symbol decoder 4018.

The symbol decoder 4018 (i.e., the outer decoder) receives the data outputted from the outer symbol mapper 4017 and performs symbol decoding as an inverse process of the convolution encoder 513 included in the transmitting system. At this point, two different soft decision values are outputted from the symbol decoder 4018. One of the outputted soft decision values corresponds to a soft decision value matching the output symbol of the convolution encoder 513 (hereinafter referred to as a "first decision value"). The other one of the outputted soft decision values corresponds to a soft decision value matching the input bit of the convolution encoder 513 (hereinafter referred to as a "second decision value").

More specifically, the first decision value represents a degree of reliability the output symbol (i.e., 2 bits) of the convolution encoder 513. Herein, the first soft decision value may output (in bit units) a LLR between the likelihood of 1 bit being equal to '1' and the likelihood of 1 bit being equal to '0' with respect to each of the upper bit and lower bit, which configures a symbol. Alternatively, the first soft decision value may also output (in symbol units) a LLR for the likelihood of 2 bits being equal to "00", "01", "10", and "11" with respect to all possible combinations. The first soft decision value is fed-back to the trellis decoding unit 4012 through the inner symbol mapper 4019, the symbol interleaver 4020, and the feedback formatter 4021. On the other hand, the second soft decision value indicates a degree of reliability the input bit of the convolution encoder 513 included in the transmitting system. Herein, the second soft decision value is represented as the LLR between the likelihood of 1 bit being equal to '1' and the likelihood of 1 bit being equal to '0'. Thereafter, the second soft decision value is outputted to the outer buffer 4022. In this case, a maximum a posteriori probability (MAP) or a soft-out Viterbi algorithm (SOYA) may be used as the decoding algorithm of the symbol decoder 4018.

The first soft decision value that is outputted from the symbol decoder 4018 is inputted to the inner symbol mapper 4019. The inner symbol mapper 4019 converts the first soft decision value to a data format corresponding the input data of the trellis decoding unit 4012. Thereafter, the inner symbol mapper 4019 outputs the converted soft decision value to the symbol interleaver 4020. The operations of the inner symbol mapper 4019 may also vary depending upon the structure and coding rate of the convolution encoder 513 included in the transmitting system.

The symbol interleaver 4020 performs symbol interleaving, as shown in FIG. 30, on the first soft decision value that is outputted from the inner symbol mapper 4019. Then, the symbol interleaver 4020 outputs the symbol-interleaved first soft decision value to the feedback formatter 4021. Herein, the output of the symbol interleaver 4020 also corresponds to a soft decision value.

With respect to the changed processing order of the soft decision values corresponding to the symbols that are generated during an intermediate step, wherein the output symbols outputted from the block processor 302 of the transmitting system are being inputted to the trellis encoding module (e.g., when the symbols pass through the group formatter, the data deinterleaver, the packet formatter, the RS encoder, and the data interleaver), the feedback formatter 4021 alters (or changes) the order of the output values outputted from the symbol interleaver 4020. Subsequently, the feedback formatter 4020 outputs values to the trellis decoding unit 4012 in the changed order. The reordering process of the feedback formatter 4021 may configure at least one of software, hardware, and middleware.

The soft decision values outputted from the symbol interleaver 4020 are matched with the positions of mobile service data symbols each having the size of TDL, which are outputted from the input buffer 4011, so as to be in a one-to-one correspondence. Thereafter, the soft decision values matched with the respective symbol position are inputted to the trellis decoding unit 4012. At this point, since the main service data symbols or the RS parity data symbols and known data symbols of the main service data do not correspond to the mobile service data symbols, the feedback formatter 4021 inserts null data in the corresponding positions, thereby outputting the processed data to the trellis decoding unit 4012. Additionally, each time the symbols having the size of TDL are turbo decoded, no value is fed-back by the symbol interleaver 4020 starting from the beginning of the first decoding process. Therefore, the feedback formatter 4021 is controlled by the feedback controller 4010, thereby inserting null data into all symbol positions including a mobile service data symbol. Then, the processed data are outputted to the trellis decoding unit 4012.

The output buffer 4022 receives the second soft decision value from the symbol decoder 4018 based upon the control of the feedback controller 4010. Then, the output buffer 4022 temporarily stores the received second soft decision value. Thereafter, the output buffer 4022 outputs the second soft decision value to the RS frame decoder 2006. For example, the output buffer 4022 overwrites the second soft decision value of the symbol decoder 4018 until the turbo decoding process is performed for M number of times. Then, once all M number of turbo decoding processes is performed for a single TDL, the corresponding second soft decision value is outputted to the RS frame decoder 2006.

The feedback controller 4010 controls the number of turbo decoding and turbo decoding repetition processes of the overall block decoder, shown in FIG. 46. More specifically, once the turbo decoding process has been repeated for a predetermined number of times, the second soft decision value of the symbol decoder 4018 is outputted to the RS frame decoder 2006 through the output buffer 4022. Thus, the block decoding process of a turbo block is completed. In the description of the present invention, this process is referred to as a regressive turbo decoding process for simplicity.

At this point, the number of regressive turbo decoding rounds between the trellis decoding unit 4012 and the symbol decoder 4018 may be defined while taking into account hardware complexity and error correction performance. Accordingly, if the number of rounds increases, the error correction performance may be enhanced. However, this may lead to a disadvantageous of the hardware becoming more complicated (or complex).

Meanwhile, the main service data processor 2008 corresponds to block required for receiving the main service data. Therefore, the above-mentioned blocks may not be necessary (or required) in the structure of a digital broadcast receiving system for receiving mobile service data only.

The data deinterleaver of the main service data processor 2008 performs an inverse process of the data interleaver included in the transmitting system. In other words, the data deinterleaver deinterleaves the main service data outputted from the block decoder 2005 and outputs the deinterleaved main service data to the RS decoder. The data being inputted to the data deinterleaver include main service data, as well as mobile service data, known data, RS parity data, and an MPEG header. At this point, among the inputted data, only the main service data and the RS parity data added to the main service data packet may be outputted to the RS decoder. Also, all data outputted after the data derandomizer may all be removed with the exception for the main service data. In the embodiment of the present invention, only the main service data and the RS parity data added to the main service data packet are inputted to the RS decoder.

The RS decoder performs a systematic RS decoding process on the deinterleaved data and outputs the processed data to the data derandomizer.

The data derandomizer receives the output of the RS decoder and generates a pseudo random data byte identical to that of the randomizer included in the digital broadcast transmitting system. Thereafter, the data derandomizer performs a bitwise exclusive OR (XOR) operation on the generated pseudo random data byte, thereby inserting the MPEG synchronization bytes to the beginning of each packet so as to output the data in 188-byte main service data packet units.

RS Frame Decoder

The data outputted from the block decoder 2005 are in portion units. More specifically, in the transmitting system, the RS frame is divided into several portions, and the mobile service data of each portion are assigned either to regions A/B/C/D within the data group or to any one of regions A/B and regions C/D, thereby being transmitted to the receiving system. Therefore, the RS frame decoder 2006 groups several portions included in a parade so as to form an RS frame. Alternatively, the RS frame decoder 2006 may also group several portions included in a parade so as to form two RS frames. Thereafter, error correction decoding is performed in RS frame units.

Figure 47:
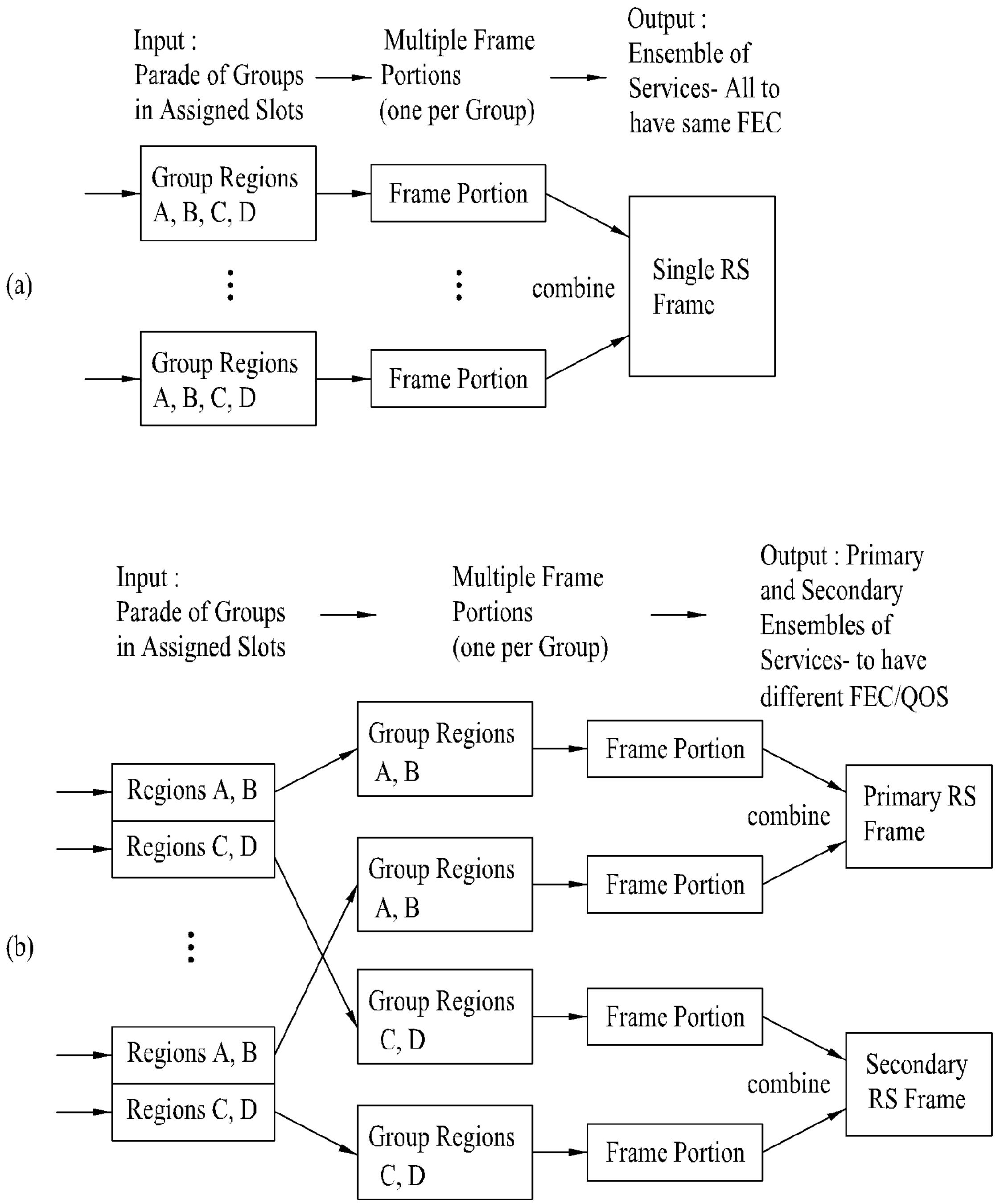
FIG. 47(*a*) and FIG. 47(*b*) illustrate an exemplary process of configuring one or two RS frame by collecting a plurality of portions according to the present invention.

For example, when the RS frame mode value is equal to '00', then one parade transmits one RS frame. At this point, one RS frame is divided into several portions, and the mobile service data of each portion are assigned to regions A/B/C/D of the corresponding data group, thereby being transmitted. In this case, the RS frame decoder 2006 extracts mobile service data from regions A/B/C/D of the corresponding data group, as shown in FIG. 47(*a*). Subsequently, the RS frame decoder 2006 may perform the process of forming (or creating) a portion on a plurality of data group within a parade, thereby forming several portions. Then, the several portions of mobile service data may be grouped to form an RS frame. Herein, if stuffing bytes are added to the last portion, the RS frame may be formed after removing the stuffing byte.

In another example, when the RS frame mode value is equal to '01', then one parade transmits two RS frames (i.e., a primary RS frame and a secondary RS frame). At this point, a primary RS frame is divided into several primary portions, and the mobile service data of each primary portion are assigned to regions A/B of the corresponding data group, thereby being transmitted. Also, a secondary RS frame is divided into several secondary portions, and the mobile service data of each secondary portion are assigned to regions C/D of the corresponding data group, thereby being transmitted.

In this case, the RS frame decoder 2006 extracts mobile service data from regions A/B of the corresponding data group, as shown in FIG. 47(*b*). Subsequently, the RS frame decoder 2006 may perform the process of forming (or creating) a primary portion on a plurality of data group within a parade, thereby forming several primary portions. Then, the several primary portions of mobile service data may be grouped to form a primary RS frame. Herein, if stuffing bytes are added to the last primary portion, the primary RS frame may be formed after removing the stuffing byte. Also, the RS frame decoder 2006 extracts mobile service data from regions C/D of the corresponding data group. Subsequently, the RS frame decoder 2006 may perform the process of forming (or creating) a secondary portion on a plurality of data group within a parade, thereby forming several secondary portions. Then, the several secondary portions of mobile service data may be grouped to form a secondary RS frame. Herein, if stuffing bytes are added to the last secondary portion, the secondary RS frame may be formed after removing the stuffing byte.

More specifically, the RS frame decoder 2006 receives the RS-encoded and/or CRC-encoded mobile service data of each portion from the block decoder 2005. Then, the RS frame decoder 2006 groups several portions, which are inputted based upon RS frame-associated information outputted from the signaling decoder 2013 or the operation controller 2000, thereby performing error correction. By referring to the RS frame mode value included in the RS frame-associated information, the RS frame decoder 2006 may form an RS frame and may also be informed of the number of RS code parity data bytes and the code size. Herein, the RS code is used to configure (or form) the RS frame. The RS frame decoder 2006 also refers to the RS frame-associated information in order to perform an inverse process of the RS frame encoder, which is included in the transmitting system, thereby correcting the errors within the RS frame. Thereafter, the RS frame decoder 2006 adds 1 MPEG synchronization data byte to the error-correction mobile service data packet. In an earlier process, the 1 MPEG synchronization data byte was removed from the mobile service data packet during the RS frame encoding process. Finally, the RS frame decoder 2006 performs a derandomizing process on the processed mobile service data packet.

Figure 48:
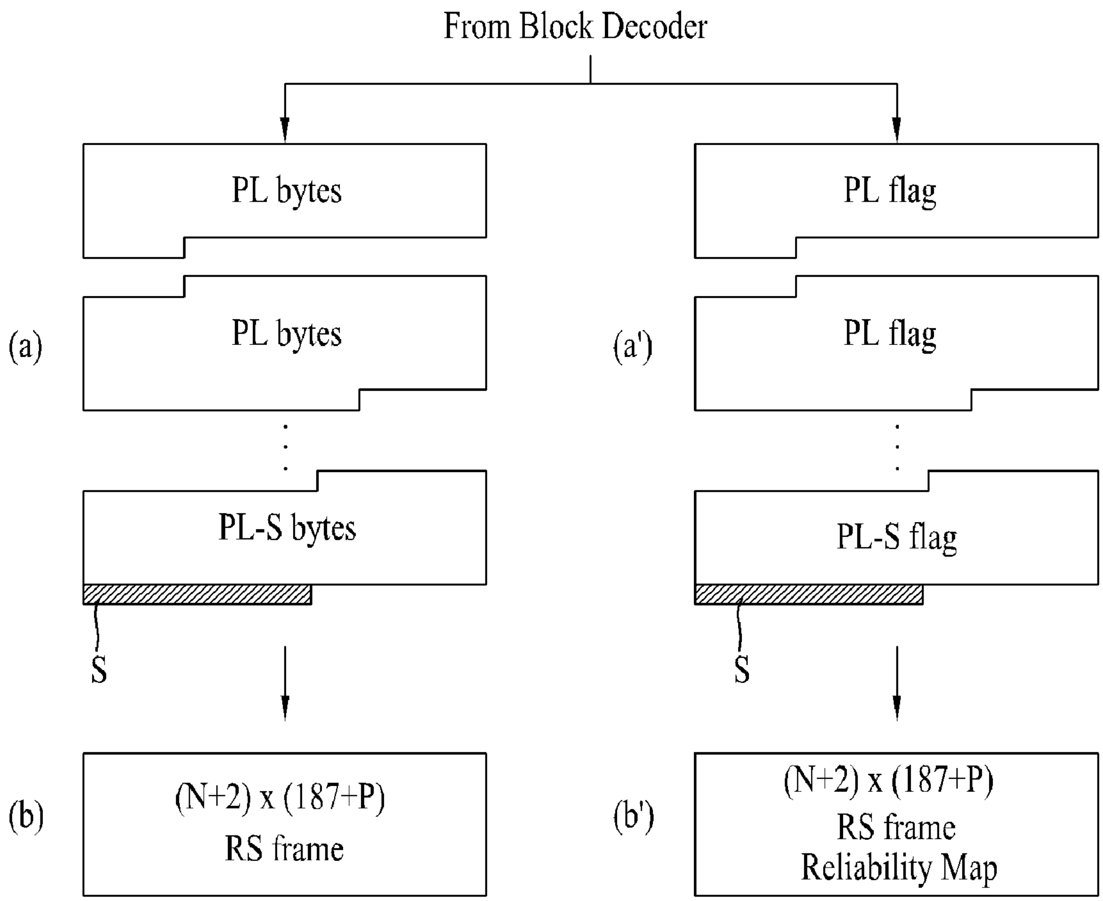
FIG. 48 and FIG. 49 illustrate process steps of error correction decoding according to an embodiment of the present invention.

FIG. 48 illustrates, when the RS frame mode value is equal to '00', an exemplary process of grouping several portion being transmitted to a parade, thereby forming an RS frame and an RS frame reliability map.

More specifically, the RS frame decoder 2006 receives and groups a plurality of mobile service data bytes, so as to form an RS frame. According to the present invention, in transmitting system, the mobile service data correspond to data RS-encoded in RS frame units. At this point, the mobile service data may already be error correction encoded (e.g., CRC-encoded). Alternatively, the error correction encoding process may be omitted.

It is assumed that, in the transmitting system, an RS frame having the size of $(N+2)\times(187+P)$ bytes is divided into M number of portions, and that the M number of mobile service data portions are assigned and transmitted to regions A/B/C/D in M number of data groups, respectively. In this case, in the receiving system, each mobile service data portion is grouped, as shown in FIG. 48(*a*), thereby forming an RS frame having the size of $(N+2)\times(187+P)$ bytes. At this point, when stuffing bytes (S) are added to at least one portion included in the corresponding RS frame and then transmitted, the stuffing bytes are removed, thereby configuring an RS frame and an RS frame reliability map. For example, as shown in FIG. 27, when S number of stuffing bytes are added to the corresponding portion, the S number of stuffing bytes are removed, thereby configuring the RS frame and the RS frame reliability map.

Herein, when it is assumed that the block decoder 2005 outputs a soft decision value for the decoding result, the RS frame decoder 2006 may decide the '0' and '1' of the corresponding bit by using the codes of the soft decision value. 8 bits that are each decided as described above are grouped to create 1 data byte. If the above-described process is performed on all soft decision values of several portions (or data groups) included in a parade, the RS frame having the size of (N+2)×(187+P) bytes may be configured.

Additionally, the present invention uses the soft decision value not only to configure the RS frame but also to configure a reliability map.

Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure one data byte, is determined to be unreliable, the corresponding data byte is marked on the reliability map as an unreliable data byte.

Herein, determining the reliability of one data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the one data byte are determined to be reliable (i.e., when the absolute value of the soft decision values of all 8 bits included in the one data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of (N+2)×(187+P) bytes, the reliability map is also configured to have the size of (N+2)×(187+P) bytes. FIG. 48(*a'*) and FIG. 48(*b'*) respectively illustrate the process steps of configuring the reliability map according to the present invention.

Subsequently, the RS frame reliability map is used on the RS frames so as to perform error correction.

Figure 49:
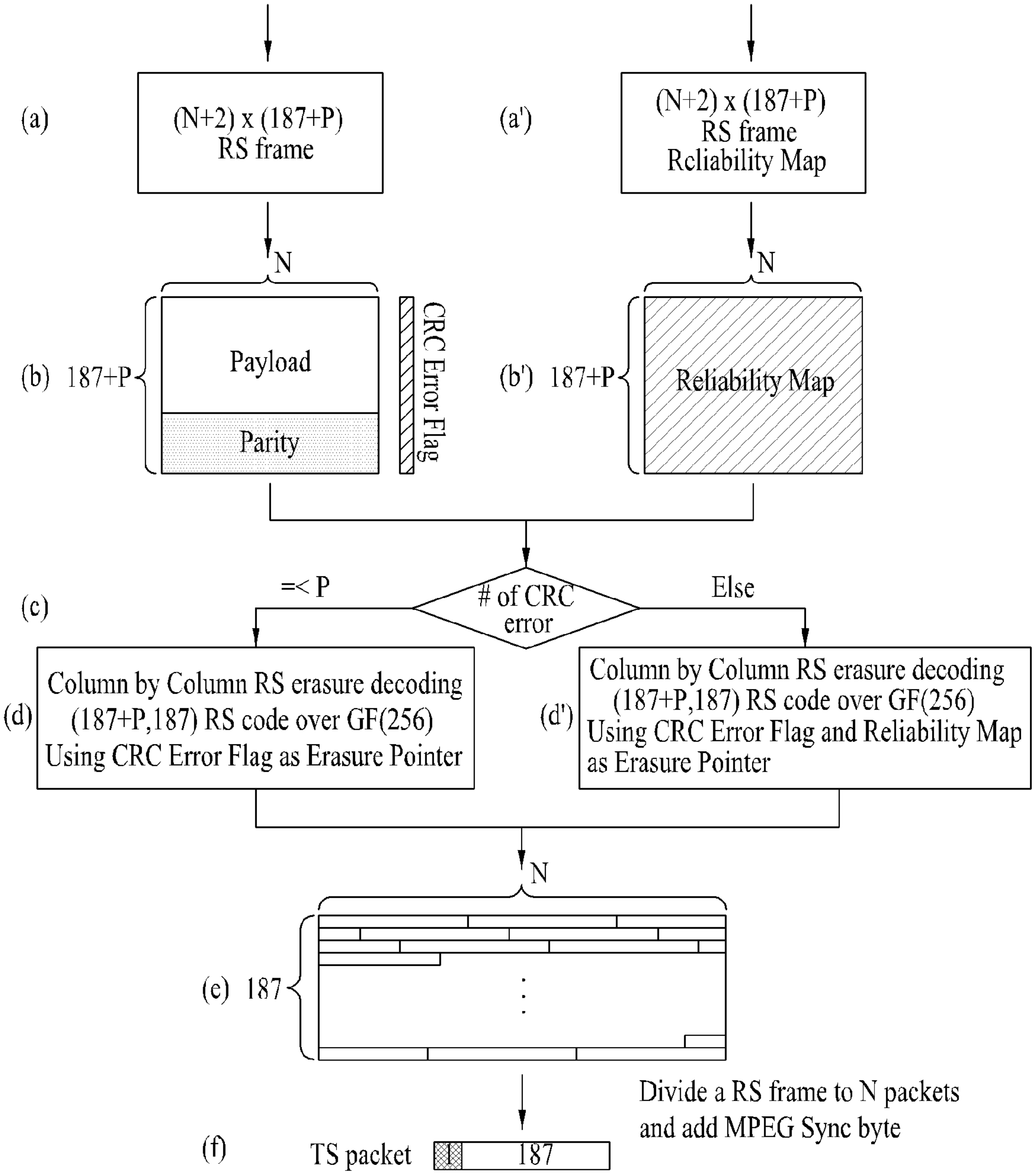

FIG. 49 illustrates example of the error correction processed according to embodiments of the present invention. FIG. 49 illustrates an example of performing an error correction process when the transmitting system has performed both RS encoding and CRC encoding processes on the RS frame.

As shown in FIG. 49(*a*) and FIG. 49(*a'*), when the RS frame having the size of (N+2)×(187+P) bytes and the RS frame reliability map having the size of (N+2)×(187+P) bytes are created, a CRC syndrome checking process is performed on the created RS frame, thereby verifying whether any error has occurred in each row. Subsequently, as shown in FIG. 49(*b*), a 2-byte checksum is removed to configure an RS frame having the size of N×(187+P) bytes. Herein, the presence (or existence) of an error is indicated on an error flag corresponding to each row. Similarly, since the portion of the reliability map corresponding to the CRC checksum has hardly any applicability, this portion is removed so that only N×(187+P) number of the reliability information bytes remain, as shown in FIG. 49(*b'*).

After performing the CRC syndrome checking process, as described above, a RS decoding process is performed in a column direction. Herein, a RS erasure correction process may be performed in accordance with the number of CRC error flags. More specifically, as shown in FIG. 49(*c*), the CRC error flag corresponding to each row within the RS frame is verified. Thereafter, the RS frame decoder 2006 determines whether the number of rows having a CRC error occurring therein is equal to or smaller than the maximum number of errors on which the RS erasure correction may be performed, when performing the RS decoding process in a column direction. The maximum number of errors corresponds to P number of parity bytes inserted when performing the RS encoding process. In the embodiment of the present invention, it is assumed that 48 parity bytes have been added to each column (i.e., P=48).

If the number of rows having the CRC errors occurring therein is smaller than or equal to the maximum number of errors (i.e., 48 errors according to this embodiment) that can be corrected by the RS erasure decoding process, a (235,187)-RS erasure decoding process is performed in a column direction on the RS frame having (187+P) number of N-byte rows (i.e., 235 N-byte rows), as shown in FIG. 49(*b*). Thereafter, as shown in FIG. 49(*e*), the 48-byte parity data that have been added at the end of each column are removed. Conversely, however, if the number of rows having the CRC errors occurring therein is greater than the maximum number of errors (i.e., 48 errors) that can be corrected by the RS erasure decoding process, the RS erasure decoding process cannot be performed. In this case, the error may be corrected by performing a general RS decoding process. In addition, the reliability map, which has been created based upon the soft decision value along with the RS frame, may be used to further enhance the error correction ability (or performance) of the present invention.

More specifically, the RS frame decoder 2006 compares the absolute value of the soft decision value of the block decoder 2005 with the pre-determined threshold value, so as to determine the reliability of the bit value decided by the code of the corresponding soft decision value. Also, bits, each being determined by the code of the soft decision value, are grouped to form one data byte. Accordingly, the reliability information on this one data byte is indicated on the reliability map. Therefore, as shown in FIG. 49(*c*), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points. Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is also assumed that the number of erasure points decided based upon the reliability information of the reliability map is indicated as 40 erasure points in the first column and as erasure points in the second column. In this case, a (235,187)-RS erasure decoding process is performed on the first column. Alternatively, a (235,187)-RS decoding process is performed on the second column. When error correction decoding is performed on all column directions within the RS frame by using the above-described process, the 48-byte parity data which were added at the end of each column are removed, as shown in FIG. 49(*e*).

As described above, even though the total number of CRC errors corresponding to each row within the RS frame is greater than the maximum number of errors that can be corrected by the RS erasure decoding process, when the number of bytes determined to have a low reliability level, based upon the reliability information on the reliability map within a particular column, while performing error correction decoding on the particular column. Herein, the difference between the general RS decoding process and the RS erasure decoding process is the number of errors that can be corrected. More specifically, when performing the general RS decoding process, the number of errors corresponding to half of the number of parity bytes (i.e., (number of parity bytes)/2) that are inserted during the RS encoding process may be error corrected (e.g., 24 errors may be corrected). Alternatively, when performing the RS erasure decoding process, the number of errors corresponding to the number of parity bytes that are inserted during the RS encoding process may be error corrected (e.g., 48 errors may be corrected).

After performing the error correction decoding process, as described above, a RS frame configured of 187 N-byte rows (or packet) may be obtained as shown in FIG. 49(*e*). The RS frame having the size of N×187 bytes is outputted by the order of N number of 187-byte units. At this point, 1 MPEG synchronization byte, which had been removed by the transmitting system, is added to each 187-byte packet, as shown in FIG. 49(*f*). Therefore, a 188-byte unit mobile service data packet is outputted.

At this point, the RS frame decoded mobile service data is performed a derandomizing process, which corresponds to the inverse process of the randomizer included in the transmitting system and then the derandomized data are outputted, thereby obtaining the mobile service data transmitted from the transmitting system. In the present invention, the RS frame decoder 2006 may perform the data derandomizing function.

An RS frame decoder may be configured of M number of RS frame decoders provided in parallel, wherein the number of RS frame encoders is equal to the number of parades (=M) within an M/H frame, a multiplexer for multiplexing each portion and being provided to each input end of the M number of RS frame decoders, and a demultiplexer for demultiplexing each portion and being provided to each output end of the M number of RS frame decoders.

In the present invention, a parade refers to a collection of groups being included in a single M/H frame. Herein, a parade transmits data of one or two RS frames depending upon the respective RS frame mode. Also, an RS frame refers to a collection of multiple portions, and, depending upon the respective RS frame mode, a portion is allocated to a partial region within a data group. Since the RS frame mode has already been described above in detail, the description of the same will be omitted herein for simplicity.

Furthermore, data groups for multiple parades may be allocated to one M/H frame.

Figure 50:
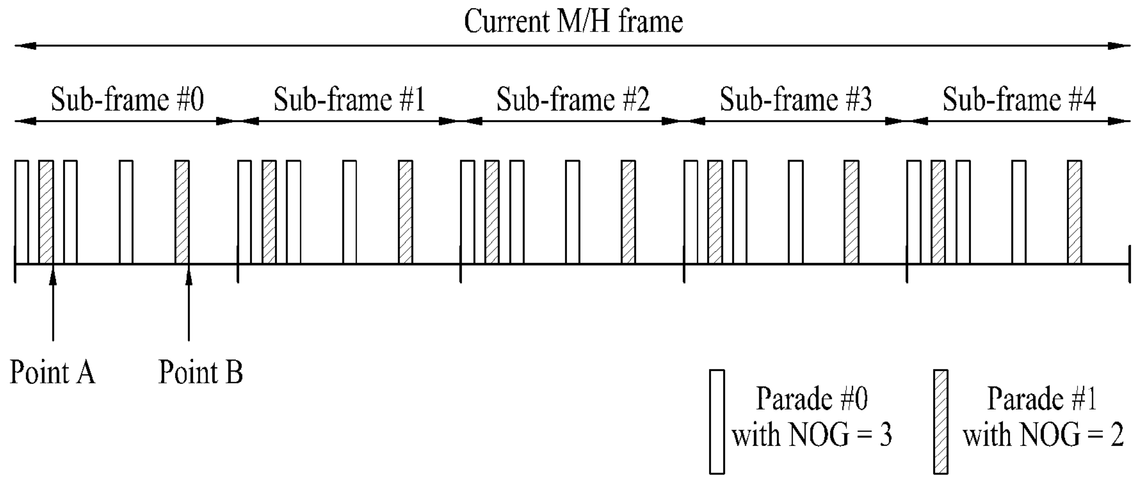
FIG. 50 illustrates an example of a generation point of a parade change command within the M/H frame according to the present invention.

FIG. 50 illustrates an example where to parades (Parade #0 and Parade #1) are allocated to a single M/H frame, thereby being transmitted. For example, if the first parade (Parade #0) transmits one RS frame, and if 3 data groups are included for each sub-frame, the position of each data group within the corresponding sub-frame may be obtained by substituting the value i in Equation 1 shown above with values ranging from 0 to 2. More specifically, the data groups of the first parade (Parade #0) are sequentially allocated to a first slot, a fifth slot, and a ninth slot (Slot #0, Slot #4, and Slot #8) within the sub-frame. In this case, NOG is equal to '3' (i.e., NOG=3), and the RS frame mode value is equal to '00'.

Also, if the second parade (Parade #1) transmits one RS frame, and if 2 data groups are included for each sub-frame, the position of each data group within the corresponding sub-frame may be obtained by substituting the value i in Equation 1 shown above with values ranging from 3 to 4. More specifically, the data groups of the second parade (Parade #0) are sequentially allocated to a second slot and a twelfth slot (Slot #1 and Slot #11) within the sub-frame. In this case, NOG is equal to '2' (i.e., NOG=2), and the RS frame mode value is equal to '00'.

At this point, it is assumed that a mobile service included in the RS frame that is being received in the first parade (Parade #0) is provided to the user. In this case, the block decoder 2005 performs block-decoding on each portion allocated to the data groups of the first parade (Parade #0), thereby outputting the block-decoded portions to the RS frame decoder 2006. The RS frame decoder 2006 collects data of multiple portions being inputted therein depending upon the information related to the RS frame being outputted from the operation controller 2000 (or the signaling decoder 2013), thereby configuring the RS frame of the first parade (Parade #0). According to an embodiment of the present invention, when configuring the RS frame, a reliability map indicating whether each data byte within the RS frame is reliable or not is generated. Since the method of generating the reliability map has already been described above, the detailed description of the same will be omitted for simplicity.

Thereafter, errors occurring in the RS frame may be corrected by performing CRC-decoding and RS-decoding on the RS frame of the first parade (Parade #0). The error-corrected RS frame includes mobile service data for at least one or more mobile services. And, mobile service data for the mobile service selected by the user or the system are audio-/video-decoded, thereby being provided to the user.

In the meantime, while the mobile service (or services) included in the RS frame, which is received by the first parade (Parade #0), is being provided to the user, if the user or system selects a mobile service included in an RS frame being received by the second parade (Parade #1), a parade change command is generated. More specifically, the parade change command may be generated by a channel-switching, reserved viewing, reserved recording, and so on.

Accordingly, the data groups of the second parade (Parade #1) are received by the tuner 1301, demodulator 2002, and the equalizer 2003 within the receiving system. Thereafter, the received data groups are demodulated and channel-equalized, thereby being outputted to the block decoder 2005. The block decoder 2005 performs block-decoding on each portion allocated to the data groups of the second parade (Parade #1), thereby outputting the block-decoded portions to the RS frame decoder 2006. The RS frame decoder 2006 collects data of multiple portions being inputted therein depending upon the information related to the RS frame being outputted from the operation controller 2000 (or the signaling decoder 2013), thereby configuring the RS frame of the second parade (Parade #1).

For example, it is assumed that the RS frame being received by the second parade (Parade #1) corresponds to an RS frame having the size of (N+2)×235 bytes, wherein 2 bytes of CRC data are added to each row of an RS frame payload having the size of N×187 bytes, and wherein 48 bytes of RS parity data are added to each column of the RS frame payload. It is also assumed that the RS frame having the size of (N+2)×235 bytes is divided into 10 portions, that the data of the 10 portions (i.e., data including mobile service data, CRC data, RS parity data within the corresponding RS frame) are allocated to regions A/B/C/D of 10 respective data groups, and also that 2 of the 10 data groups are allocated to each sub-frame, as shown in FIG. 50, thereby being transmitted.

In this case, the block decoder 2005 performs block-decoding on the data of the 10 portions allocated to regions A/B/C/D of the 10 data groups. Thereafter, the RS frame decoder 2006 configures the RS frame having the size of (N+2)×235 bytes by collecting data of the 10 portions. Subsequently, the RS frame decoder 2006 performs CRC-decoding on the configured RS frame (i.e., performs a CRC syndrome check process) so as to verify whether any error exists in each row, thereby indicating the existence of an error on a CRC error flag respective to each row. After performing the CRC-decoding process, the RS frame decoder 2006 removes the 2-byte CRC data from the RS frame.

Figure 51:
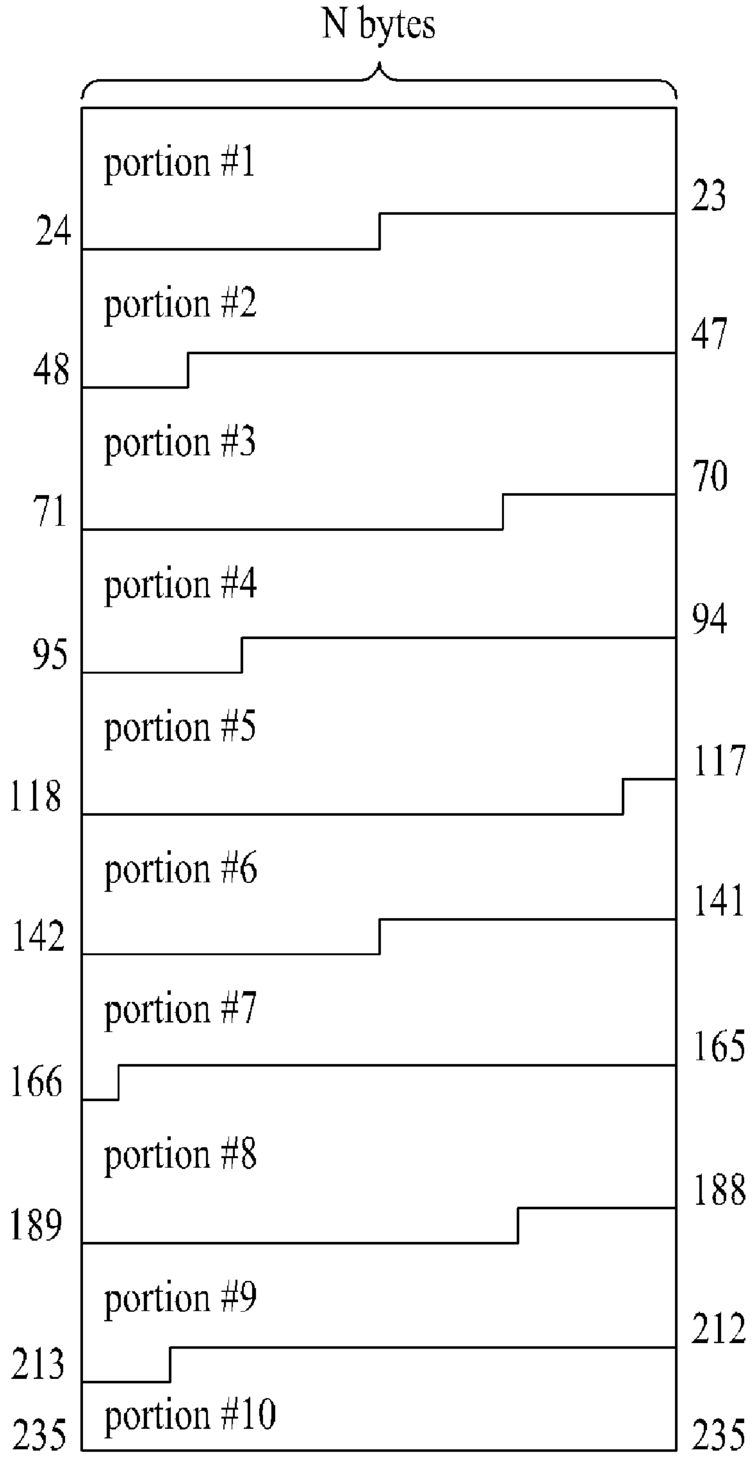
FIG. 51 illustrates an RS frame configuration according to another embodiment of the present invention.

FIG. 51 illustrates an exemplary RS frame configuration, when the RS frame is configured by collecting data of 10 portions, and when the 2-byte CRC data are removed from the RS frame after performing CRC-decoding. The number of data byes in each portion shown in FIG. 51 is merely exemplary and given to facilitate the understanding of the present invention. Therefore, the scope and spirit of the present invention will not be limited only to the numbers given in the description of the present invention.

Also, as shown in FIG. 51, one of a general RS-decoding process and an RS-erasure decoding process is performed on each of column of the RS frame having the CRC data removed therefrom, thereby correcting the errors occurred in the RS frame. More specifically, one of the general RS-decoding process and the RS-erasure decoding process is selected depending upon the number of CRC errors existing in the RS frame and also depending upon the reliability information of the reliability map. Herein, according to an embodiment of the present invention, the number of CRC errors is estimated by counting the number of CRC error flags indicating the presence of an error among the total CRC error flags corresponding to each row. The RS frame having its errors corrected by RS-decoding includes mobile service data for at least one or more mobile services, and the mobile service data for the at least one or more mobile services selected by the user or the system are audio-/video-decoded, thereby being provided to the user.

At this point, the parade change command may be generated at any point within the M/H frame. For example, if a parade change command ordering a change from the first parade (Parade #0) to the second parade (Parade #1) is generated from point A, as shown in FIG. 50, the first data group of the second parade (Parade #1) has already passed chronologically. In this case, if the RS frame is configured starting from the second data groups being received by the current M/H frame, the data of the portion allocated to the first data group are omitted, thereby causing the RS frame configuration to be incomplete. However, of the system waits until the next M/H frame is received, so as to configure the RS frame starting from the data groups of the second parade (Parade #1) of the next M/H frame, an excessive amount of time, which corresponds to the waiting time, is wasted. Thus, a respective time delay may be caused when performing a channel-switching process, wherein the parade is changed (or changed). Such time delay eventually leads to an inconvenience for the user.

Therefore, in order to resolve such disadvantage, in the present invention, when a parade change command is generated at the starting point of the M/H frame, the current M/H frame, from which the parade change command has been generated, receives the data groups of the change-designated parade, thereby configuring the RS frame. At this point, according to an embodiment of the present invention, if data groups incapable of receiving data occur, when configuring the RS frame, null data are allocated to the data positions of the portion, which is allocated to the corresponding data group that is incapable of receiving data. Thus, the RS frame configuration is completed.

Herein, the null data may be given a pre-decided value, an arbitrary value, or a specific value. Alternatively, the null data may be given the value of '0' or '1'. Also, according to the embodiment of the present invention, when performing the CRC-decoding process on the RS frame, the CRC error flag corresponding to the row including the null data indicates the existence of the error in the corresponding row, thereby performing RS-decoding. For example, when the CRC error flag value is equal to '0', this indicates that no error exists. Alternatively, when the CRC error flag value is equal to '1', this indicates that an error exists in the corresponding row.

Also, according to the embodiment of the present invention, when generating a reliability map that indicates reliability levels of each data byte within the RS frame, the reliability information corresponding to the null data byte within the reliability map is indicated as unreliable (or having no reliability).

More specifically, the information related to the RS frame, which is provided from the operation controller 2000 to the RS frame decoder 2006, not only include information for configuring the corresponding RS frame but also includes information on the data group including the data that are currently being received. Therefore, the RS frame decoder 2006 configures the RS frame, as shown in FIG. 51, based upon such information related to the RS frame. At this point, the accurate data positions of each data group may also be known.

Accordingly, when a parade change command is generated from point A of FIG. 50, the RS frame is configured starting from the data group being received after point A (i.e., starting from the data of the portions allocated to the second data group). Also, null data are written in the position corresponding to the data of the portion allocated to the first data group.

Figure 52:
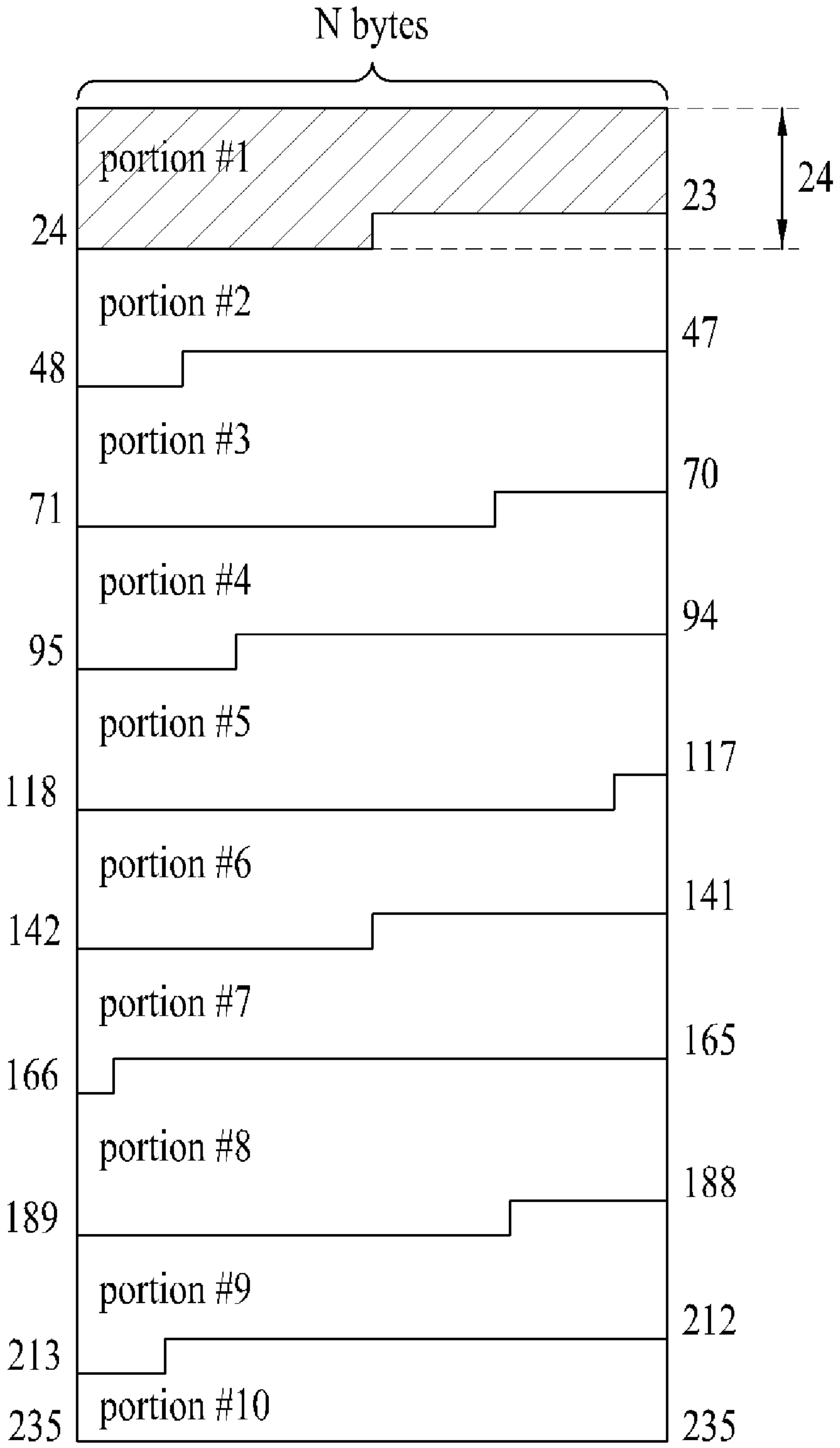
FIG. 52 illustrates an exemplary CRC decoding result, when data of a first portion have not been received in the RS frame of FIG. 50.

Referring to FIG. 52, the area marked with slanted lines corresponds to the portion allocated to the first data group of the second parade (Parade #1), and null data are written in this area when configuring the RS frame. Also, when performing CRC-decoding, the CRC error flag of the row including the null data indicates the existence of an error. In FIG. 52, when it is assumed that no error is included in any other data group, 24 CRC error flags respectively indicate the existence of an error.

In the example shown in FIG. 52, it can be known that the occupation rate of the portion allocated to the first data group within the respective RS frame corresponds to 10% of the entire RS frame. Therefore, even though the CRC error flag of each row including the data of the portion allocated to the first data group indicates the existence of an error, if it is verified that there are no error in other data groups, all data of the portions that have not been received (i.e., non-received portions) during the RS-decoding of the RS frame may be recovered regardless of the RS code mode.

However, when a parade change command is generated from point B of FIG. 50, the RS frame is configured starting from the data group being received after point B (i.e., starting from the data of the portions allocated to the third data group). Also, null data are written in the position corresponding to the data of the portions allocated to the first data group and the second data group.

Figure 53:
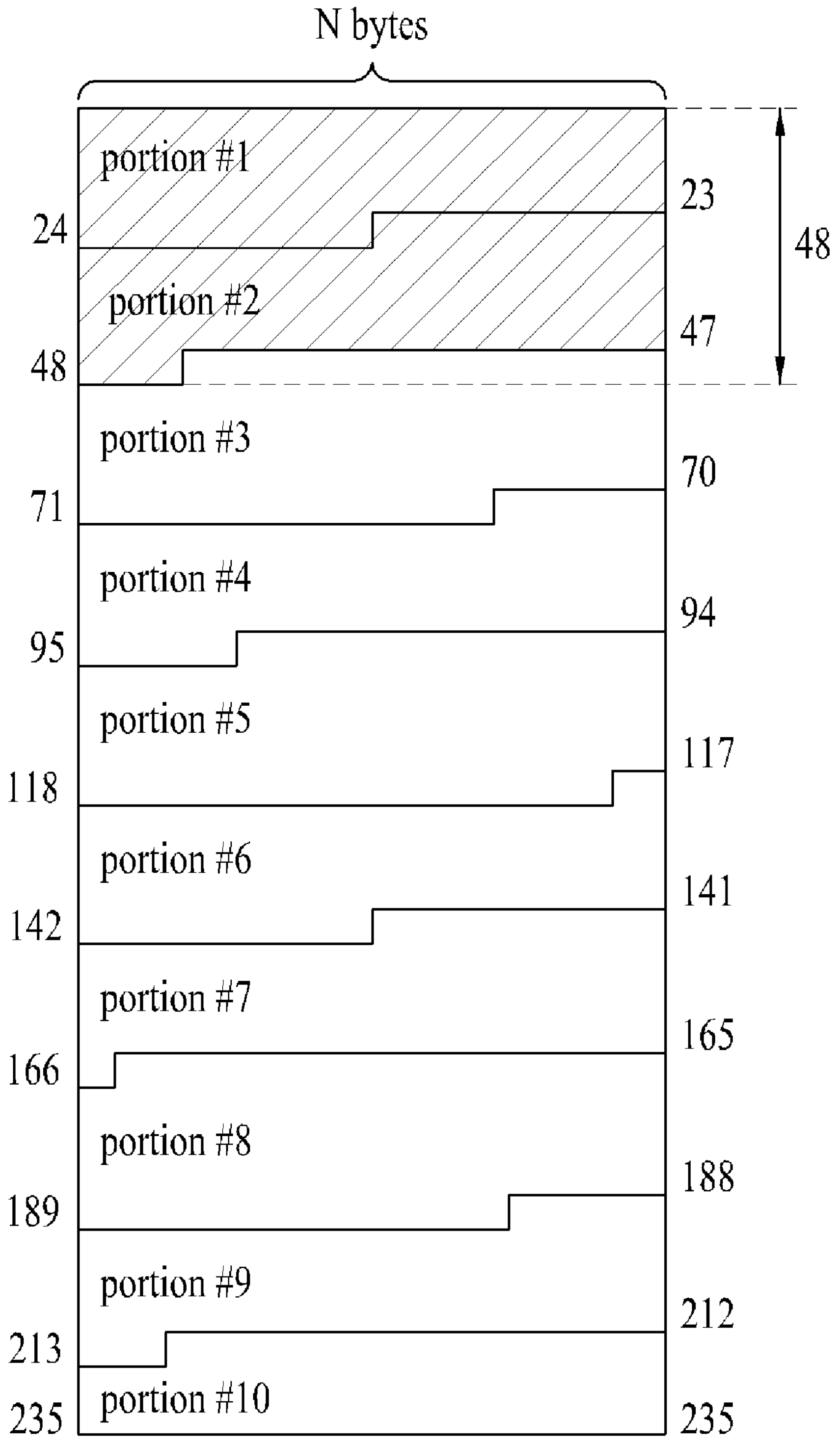
FIG. 53 illustrates an exemplary CRC decoding result, when data of a first portion and data of a second portion have not been received in the RS frame of FIG. 50.

Referring to FIG. 53, the area marked with slanted lines corresponds to the portions allocated to the first and second data groups of the second parade (Parade #1), and null data are written in this area when configuring the RS frame. Also, when performing CRC-decoding, the CRC error flag of the row including the null data indicates the existence of an error. In FIG. 53, when it is assumed that no error is included in any other data group, 48 CRC error flags respectively indicate the existence of an error.

At this point, when it is assumed that the RS code mode is equal to '10' (i.e., when the number of RS parities added to the corresponding RS frame is equal to 48), even though the CRC error flag of each row including the data of the portions allocated to the first and second data groups indicates the existence of an error, if it is verified that there are no error in other data groups, all data of the portions that have not been received during the RS-decoding of the RS frame may be recovered regardless of the RS code mode.

As described above, when a parade change command is generated, an RS frame is configured by writing null data in positions for data of the portion allocated to the non-received data group. Then, when performing CRC-decoding on the RS frame, the CRC error flag of each row including the null data indicates the existence of an error. Thereafter, the RS decoding process is performed. At this point, if the number of CRC errors within the RS frame is less than or equal to the number of RS parity data bytes added to each column of the corresponding RS frame, the data of the non-received portion may all be recovered.

Therefore, when the parade change command is generated at the starting point of the M/H frame (e.g., at the point where the first data group or the second data group is received), the present invention may immediately provide a respective mobile service to the user without having to wait until the next M/H frame, wherein the mobile service is included in the RS frame being received in the change-designated parade (i.e., the designated parade to which the initial parade is to be changed). More specifically, the channel-switching time may be reduced.

According to an embodiment of the present invention, when the parade change command is generated within the first sub-frame of the M/H frame, the RS frame may be configured from the data groups that are being received to the change-designated parade of the current M/H frame, thereby performing CRC-decoding and RS-decoding. More specifically, when the parade change command is generated in sub-frames within the M/H frame excluding the first sub-frame, the system waits until the next M/H frame. Thereafter, the system receives the data groups of the change-designated parade of the next M/H frame, thereby performing CRC-decoding and RS-decoding.

Figure 54:
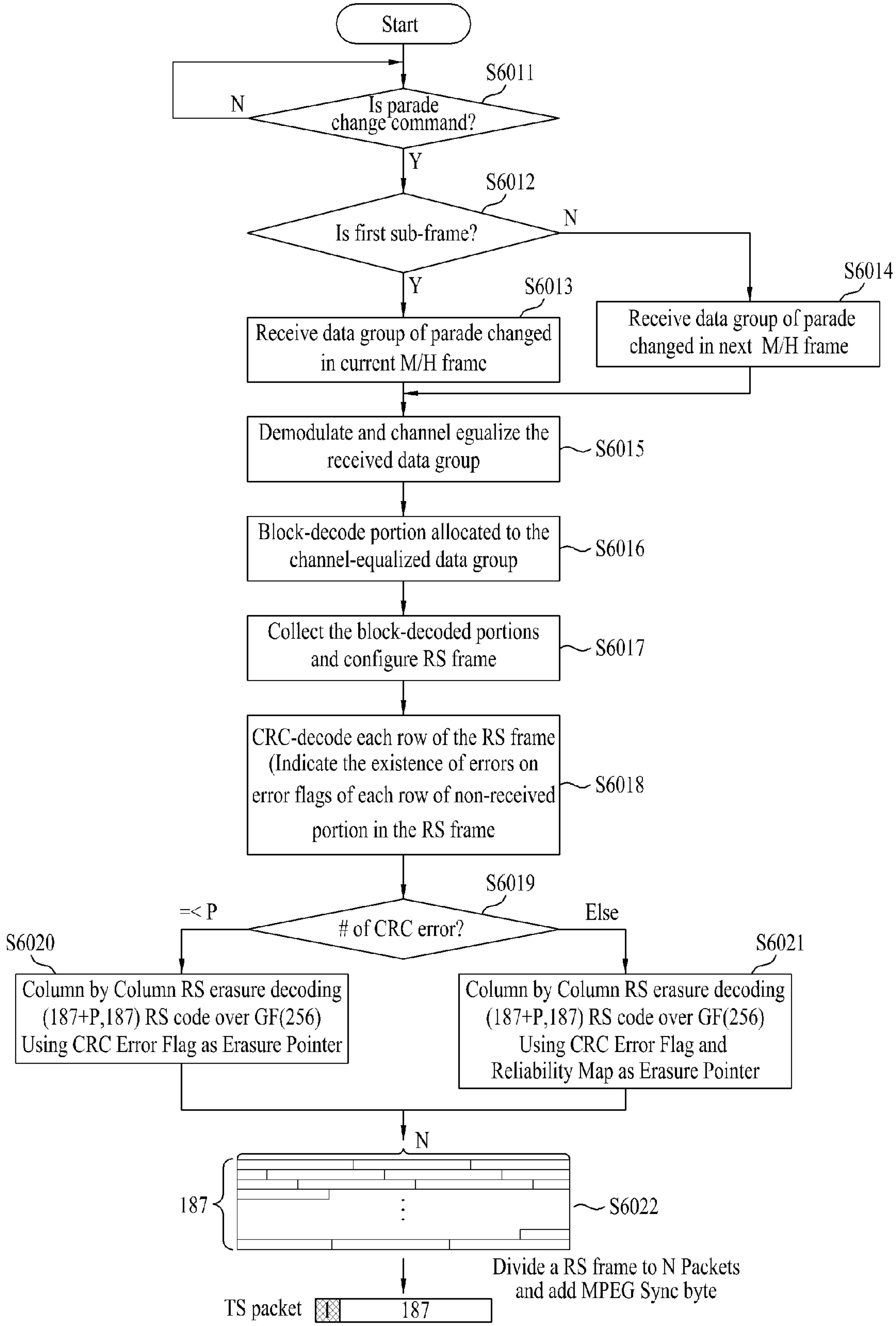
FIG. 54 illustrates a flow chart showing the RS frame decoding process in accordance with the parade change command according to an embodiment of the present invention.

FIG. 54 illustrates a flow chart showing the RS frame decoding process according to an embodiment of the present invention. Herein, FIG. 54 shows an example of the RS frame decoding process, when a parade change command designating a parade change from the first parade (Parade #0) to the second parade (Parade #1). More specifically, when a parade change command designating a parade change from the first parade (Parade #0) to the second parade (Parade #1) is generated (S6011), the system determines whether the point of generation of the parade change command is within the first sub-frame of the current M/H frame (S6012). If it is determined that the command generation point is within the first sub-frame, the system receives data groups of the second parade in the current M/H frame (S6013). Meanwhile, if it is determined that the command generation point is not within the first sub-frame, the system waits until the next M/H frame, so as to receive data groups of the second parade in the next M/H frame (S6014). The above-described error correction decoding process may be directly used without modification as the process steps subsequent to step 6014.

For example, when it is assumed that a parade change command designating a parade change from the first parade (Parade #0) to the second parade (Parade #1) is generated in point A, as shown in FIG. 50, the system receives data from the second data group of the second parade within the current M/H frame, thereby performing demodulation and channel-equalization on the received data group (S6015). Subsequently, the system performs block-decoding on the portion allocated to the channel-equalized data group (S6016). When the block-decoding process is performed on each portion of all data groups within the second parade, which is received in the current M/H frame, the system collects the data of each portion so as to configure an RS frame (S6017). At this point, null data are written in the data position of the non-received portion (i.e., data position of the portion allocated to the first data group), thereby configuring the RS frame. Also, when performing CRC-decoding on the RS frame configured as described above, the CRC error flags of each row including the null data indicate the existence of an error (S6018).

After performing the CRC-decoding process, the system counts the number of CRC error flags indicating the existence of an error in the RS frame, thereby obtaining the CRC errors (S6019). At this point, depending upon the number of CRC errors, a general RS decoding process may be performed on each column or an RS erasure decoding process may be performed on each column. When deciding which one of the general RS decoding process and the RS erasure decoding process to perform, the present invention may refer to the reliability information of the reliability map.

If the number of CRC errors is less than or equal to a maximum number of errors correctable by RS erasure decoding, the system performs RS erasure decoding on all columns of the RS frame (S6020). The maximum number of errors corresponds to a number of RS parity bytes (P) that have been inserted during the RS encoding process. Herein, the number of RS parity bytes (P) may vary depending upon the RS code mode value. According to an embodiment of the present invention, it is assumed that the number of parity bytes (P) being added for to column is equal to 48 (i.e., the RS code mode value is equal to '10'). For example, if the size of an RS frame that is to be RS-decoded is equal to N×235, in step 6020, a (235,187)-RS erasure decoding process is performed in a column direction on the RS frame having (187+P) number of N-byte rows (i.e., 235 N-byte rows). Thereafter, the 48 bytes of parity data that were added at the end of each column are removed.

Meanwhile, if the number of CRC errors is greater than a maximum number of errors correctable by RS erasure decoding, the system cannot perform RS erasure decoding on all columns of the RS frame. In this case, error correction may be performed by using the general RS decoding process. Also, the present invention may use the reliability map, which was created when configuring the RS frame, thereby enhancing the error correction performance.

For example, in a row having CRC errors, only the data bytes marked to be unreliable (or non-reliable) are respectively set as erasure points. Thereafter, for each column, if the number of erasure points (i.e., errors) is less than or equal to the maximum number of errors correctable by RS erasure decoding (i.e., 48 errors correctable by RS erasure decoding), the system performs RS erasure decoding on the respective column (S6021). Alternatively, for each column, if the number of erasure points (i.e., errors) is greater than to the maximum number of errors correctable by RS erasure decoding (i.e., 48 errors correctable by RS erasure decoding), the system performs general RS-decoding on the respective column.

More specifically, for example, it is assumed that the total number of CRC errors of the RS frame is greater than 48. Herein, the total number of CRC errors comprises CRC errors indicated on CRC error flags of each row including the data of portions allocated to the first data group, which is not received in the RS frame. Herein, it is also assumed that 40 erasure points are marked in the first column and that 50 erasure points are marked in the second column. Herein, the number of erasure points is decided by the reliability information of the reliability map. Accordingly, (235,187)-RS erasure decoding is performed on the first column, and (235,187)-RS decoding is performed on the second column. When error correction decoding is performed on all columns within the RS frame by performing the above-described process, the 48 bytes of parity data that were added at the end of each column are removed.

After performing error correction decoding, as described above, the system may obtain an RS frame having the size of N×187 bytes (S6022). Herein, the RS frame having the size of N×187 bytes is sequentially outputted in N number of 187-byte units (or packets). At this point, a 1 byte of MPEG synchronization byte, which had been deleted by the transmitting system, is added to each 187-byte packet, thereby outputting a mobile service data packet of 188 bytes. As described above, the RS-decoded mobile service data are derandomized, as an inverse process of the randomizer included in the transmitting system, thereby being outputted. Thus, the mobile service data transmitted by the transmitting system may be obtained.

When a parade change command is generated in a sub-frame other than the first sub-frame, the present invention no longer receives any further data groups and waits until the next M/H frame. Thereafter, the present invention receives the data groups of a change-designated parade in the next M/H frame, thereby configuring the RS frame. Therefore, even when the parade change command is generated in the last sub-frame, the present invention no longer receives any further data groups in the current M/H frame and waits until the next M/H frame. However, the data groups of the previous parade are received until the generation point of the parade change command and are also demodulated and decoded accordingly.

Figure 55:
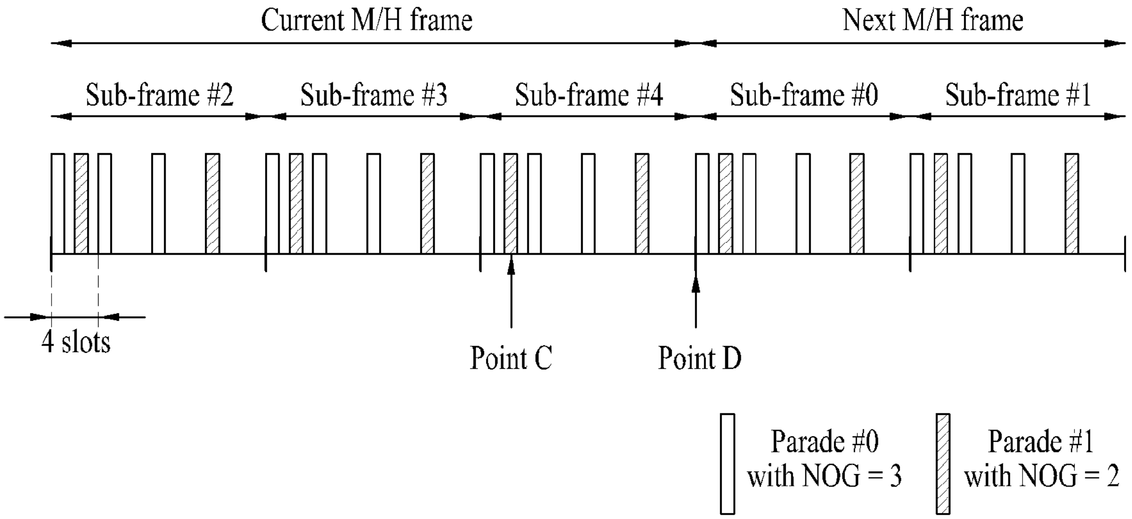
FIG. 55 illustrates another example of a generation point of a parade change command within the M/H frame according to the present invention.

For example, as shown in FIG. 55, when a parade change command ordering a change from the first parade (Parade #0) to the second parade (Parade #1) is generated from point C, the data groups of the first parade are no longer received. Subsequently, the system waits until point D so as to receive data groups of the second parade starting from point D. Then, the system performs demodulating, channel-equalizing, block-decoding process of the received data groups of the second parade, thereby configuring the RS frame. After performing CRC-decoding and RS-decoding on the RS frame, the mobile service included in the processed RS frame is provided to the user. However, in point C, wherein the parade change command has been generated, among the total of 15 data groups corresponding to the first parade, 13 groups have already been received.

Therefore, according to an embodiment of the present invention, in this case, instead of discarding (or deleting) the 13 data groups of the current M/H frame without processing, the present invention further receives the remaining two data groups of the current M/H frame, so as to configure the RS frame of the first parade. Then, the present invention receives the data groups of the second parade in the next M/H frame, so as to configure the RS frame of the second parade. In this case, the mobile service included in the RS frame of the first parade is provided to the user until the end of the current M/H frame. Then, the mobile service included in the RS frame of the second parade is provided to the user starting from the next M/H frame. Thus, the present invention becomes advantageous in that the user may be provided with uninterrupted mobile services.

According to another embodiment of the present invention, when the present invention is unable to receive the remaining two data groups of the current M/H frame, null data are written in the data positions of the portions allocated to the two non-received data groups, thereby configuring the RS frame. Thereafter, when performing CRC-decoding on the RS frame, CRC error flags of each row including the null data indicate the existence of an error, thereby performing RS-decoding. Depending upon the number of CRC errors, and also depending upon the reliability information of the reliability map, one of a general RS-decoding process and a RS erasure decoding process may be used as the RS-decoding process.

If there are no errors in the other data groups, and if the number of rows including the null data are less than or equal to the maximum number of errors correctable by RS erasure decoding, the data of the portions of the two non-received data groups may be fully recovered during the RS decoding process of the RS frame. In this case also, the mobile service included in the RS frame of the first parade is provided to the user until the end of the current M/H frame. Then, the mobile service included in the RS frame of the second parade is provided to the user starting from the next M/H frame. Thus, the present invention becomes advantageous in that the user may be provided with uninterrupted mobile services.

Figure 56:
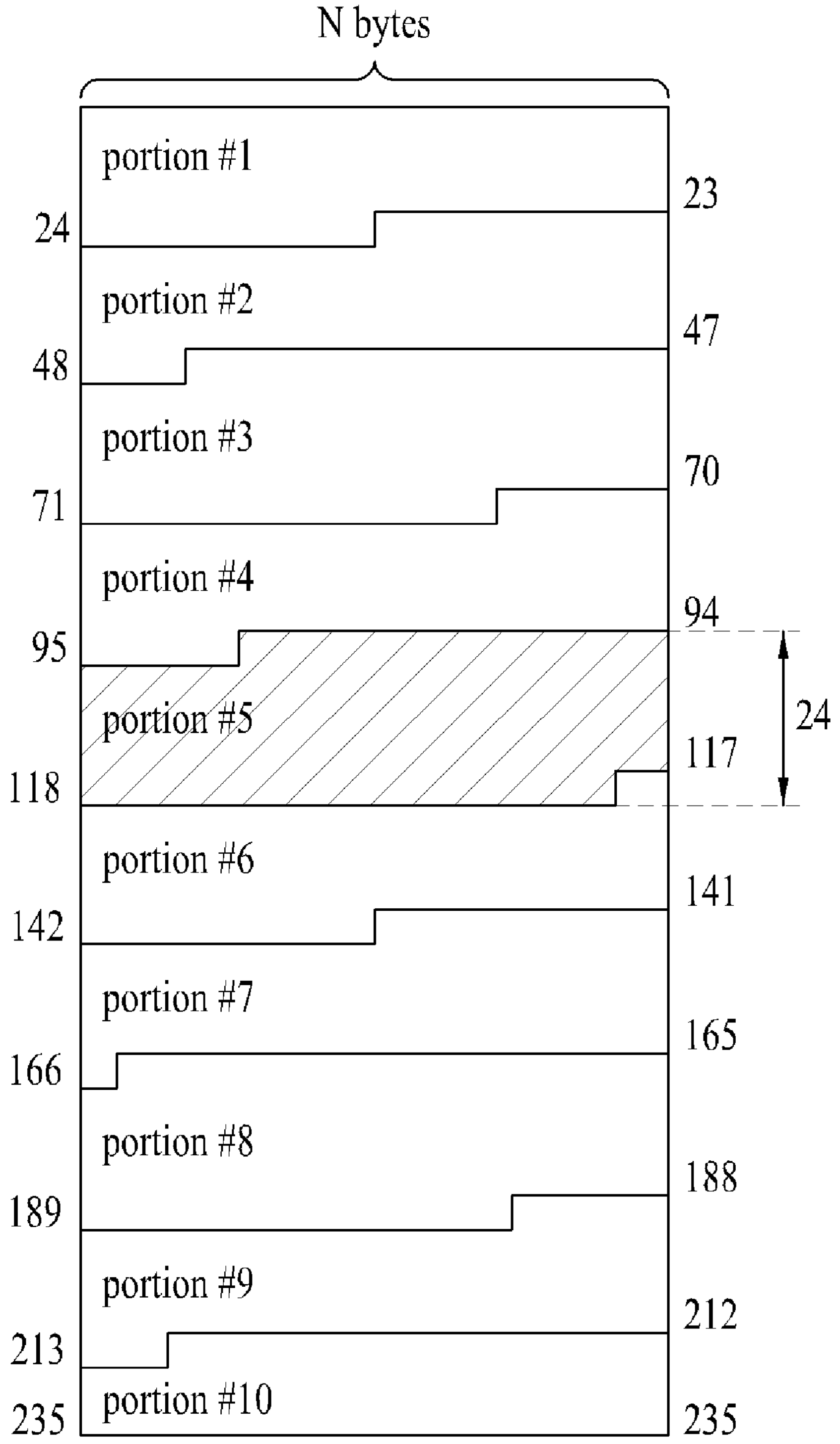
FIG. 56 illustrates an exemplary CRC decoding result, when data of a fifth portion have not been received in the RS frame of FIG. 50.

Meanwhile, among the data groups received through a parade, even when some data groups are not received (or unable to be received) depending upon the condition of the receiving system, the present invention may configure the RS frame by using the above-described method, thereby performing CRC-decoding and RS-decoding. For example, as shown in FIG. 56, it is assumed that the present invention successfully receives the first to $4^{th}$ data groups, then fails to receive the $5^{th}$ data group due to poor reception, and finally resumes successful reception starting from the $6^{th}$ data group.

In this case also, null data are written in the data position of the portion allocated to the $5^{th}$ data group. Then, the portion data of all of the data groups excluding the $5^{th}$ data group are collected, so as to configure the RS frame. Also, when performing CRC-decoding, CRC error flags of each row including the null data indicate the existence of an error. Referring to FIG. 56, when it is assumed that there are no errors in the other data groups, 24 CRC error flags respectively indicate the existence of an error.

Therefore, even when the CRC error flags of each row including data of the portion allocated to the $5^{th}$ data group respectively indicate the existence of an error, if there are no error in the other data groups, regardless of the RS code mode, the data of the non-received portions may be fully recovered when performing RS-decoding (i.e., RS erasure decoding) of the RS frame. Also, when 2 data groups are non-received, and the number of rows including the data of the portions allocated to the 2 data groups is less than or equal to 48, and when the RS code mode is equal to '10' (i.e., 48), and when there are no error in the other data groups, in this case also, RS erasure decoding is performed on all columns, thereby being able to fully recover the data of the portions allocated to the 2 non-received data groups.

As described above, the digital broadcasting system and the method for processing a broadcast signal have the following advantages. More specifically, the digital broadcasting system and the method for processing a broadcast signal according to the present invention are robust (or strong) against any error that may occur when transmitting mobile service data through a channel. And, the present invention is also highly compatible to the conventional receiving system. Moreover, the present invention may also receive the mobile service data without any error occurring, even in channels having severe ghost effect and noise.

When a parade change command is generated at the starting portion of the current M/H frame, the current M/H frame receives data groups of a change-designated parade, so as to configure the RS frame. At this point, null data are inserted in data positions of portions allocated to the non-received data groups, thereby configuring the RS frame. Then, when performing CRC-decoding, the CRC error flags of each row including the null data respectively indicate the existence of an error, thereby performing RS-decoding. Thus, when the parade change command is generated, the parade change is immediately performed without having to wait until the next M/H frame. Thus, the channel-switching time according to the parade change may be reduced.

When a parade change command is generated at the ending portion of the current M/H frame, the RS frame is configured with data groups of a previously received parade in the current M/H frame. At this point, when performing CRC-decoding, the CRC error flags of each row including the null data respectively indicate the existence of an error, thereby performing RS-decoding. Thus, when the parade change command is generated, the present invention may provide the user with a mobile service included in the RS frame of a previous parade during the current M/H frame. And, the present invention may provide the user with a mobile service included in the RS frame of a changed parade starting from the next M/H frame. Thus, the present invention may provide the user with uninterrupted mobile services.

Finally, the present invention is even more effective when applied to mobile and portable receivers, which are also liable to frequent change in channels, and which require strength (or robustness) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A receiving system, comprising:

a signal receiving unit, when a parade change command ordering parade change from a first parade to a second parade is generated, receiving a broadcast signal including data groups of the second parade starting from a generation point of the parade change command, while receiving the broadcast signal including a transmission frame transmitting the first and second parades;

a signaling decoder decoding signaling information included in the data groups and outputting RS frame-related information;

a block decoder performing turbo-decoding in block units on data of a portion included in the data groups; and an RS frame decoder inserting null data in data positions of a portion included in non-received data group within an RS frame of the second parade, while configuring the RS frame of the second parade by collecting data of the turbo-decoded portions based upon the RS frame-related information, performing CRC-decoding by indicating the existence of errors on CRC error flags of each row including the null data within the RS frame, and performing RS-decoding on the CRC-decoded RS frame.

2. The receiving system of claim 1, wherein the RS frame decoder counts a number of CRC error flags indicating the existence of an error, among the CRC error flags corresponding to each row within the RS frame, thereby estimating a number of CRC errors.

3. The receiving system of claim 2, wherein the RS frame decoder generates a reliability map indicating reliability information on each data within the RS frame, and wherein the reliability information corresponding to the null data is marked to be unreliable.

4. The receiving system of claim 3, wherein, when the number of CRC errors is less than or equal to a maximum number of errors correctable by RS erasure decoding, the RS frame decoder performs RS erasure decoding on all columns of the RS frame.

5. The receiving system of claim 3, wherein, when the number of CRC errors is greater than a maximum number of errors correctable by RS erasure decoding, the RS frame decoder refers to the reliability information of the reliability map, and performs any one of general RS-decoding and RS erasure decoding for each column of the RS frame.

6. The receiving system of claim 1, wherein, when the parade change command ordering the parade change from the first parade to the second parade is generated, the signal receiving unit receives a broadcast signal including data groups of the second parade from a next transmission frame.

7. The receiving system of claim 6, wherein the RS frame decoder collects data of a portion included in data groups of the first parade, the first parade being received until the generation point of the parade change command and being turbo-decoded, so as to configure an RS frame, and inserts null data in data positions of a portion included in non-received data groups within the RS frame of the first parade.

8. The receiving system of claim 6, wherein the RS frame decoder performs CRC-decoding by indicating the existence of errors on CRC error flags of each row including the null data within the RS frame of the first parade, and performs RS-decoding on the CRC-decoded RS frame.

9. A method for processing a broadcast signal of a receiving system, comprising:

when a parade change command ordering parade change from a first parade to a second parade is generated, receiving a broadcast signal including data groups of the second parade starting from a generation point of the parade change command, while receiving the broadcast signal including a transmission frame transmitting the first and second parades;

decoding signaling information included in the data groups and outputting RS frame-related information;

performing turbo-decoding in block units on data of a portion included in the data groups; and inserting null data in data positions of a portion included in non-received data group within an RS frame of the second parade, while configuring the RS frame of the second parade by collecting data of the turbo-decoded portions based upon the RS frame-related information, performing CRC-decoding by indicating the existence of errors on CRC error flags of each row including the null data within the RS frame, and performing RS-decoding on the CRC-decoded RS frame.

10. The method of claim 9, wherein, in the decoding signaling information, a number of CRC error flags indicating the existence of an error is counted, among the CRC error flags corresponding to each row within the RS frame, thereby estimating a number of CRC errors.

11. The method of claim 10, wherein the configuring the RS frame further includes a step of generating a reliability map indicating reliability information on each data within the RS frame, and wherein the reliability information corresponding to the null data is marked to be unreliable.

12. The method of claim 11, wherein, when the number of CRC errors is less than or equal to a maximum number of errors correctable by RS erasure decoding, RS erasure decoding is performed on all columns of the RS frame.

13. The method of claim 11, wherein, when the number of CRC errors is greater than a maximum number of errors correctable by RS erasure decoding, the reliability information of the reliability map is referred to so as to perform any one of general RS-decoding and RS erasure decoding for each column of the RS frame.

14. The method of claim 9, further comprising:

receiving a broadcast signal including data groups of the second parade from a next transmission frame, when the parade change command ordering the parade change from the first parade to the second parade is generated.

15. The method of claim 14, wherein configuring the RS frame collects data of a portion included in data groups of the first parade, the first parade being received until the generation point of the parade change command and being turbo-decoded, so as to configure an RS frame, and inserts null data in data positions of a portion included in non-received data groups within the RS frame of the first parade.

16. The method of claim 15, further comprising:

performing CRC-decoding by indicating the existence of errors on CRC error flags of each row including the null data within the RS frame of the first parade; and performing RS-decoding on the CRC-decoded RS frame.

* * * * *